United States Patent
Tsuchimura et al.

(10) Patent No.: US 8,895,222 B2
(45) Date of Patent: *Nov. 25, 2014

(54) ACTINIC RAY-SENSITIVE OR RADIATION-SENSITIVE RESIN COMPOSITION AND RESIST FILM AND PATTERN FORMING METHOD USING THE COMPOSITION

(75) Inventors: Tomotaka Tsuchimura, Shizuoka (JP); Hidenori Takahashi, Shizuoka (JP); Takayuki Ito, Shizuoka (JP); Takeshi Inasaki, Shizuoka (JP); Shohei Kataoka, Shizuoka (JP)

(73) Assignee: FUJIFILM Corporation, Tokyo (JP)

(*) Notice: Subject to any disclaimer, the term of this patent is extended or adjusted under 35 U.S.C. 154(b) by 111 days.

This patent is subject to a terminal disclaimer.

(21) Appl. No.: 12/729,336

(22) Filed: Mar. 23, 2010

(65) Prior Publication Data

US 2010/0248149 A1    Sep. 30, 2010

(30) Foreign Application Priority Data

Mar. 25, 2009  (JP) .................................. 2009-075253
Mar. 5, 2010   (JP) .................................. 2010-049872

(51) Int. Cl.
| | | |
|---|---|---|
| *G03F 7/004* | (2006.01) | |
| *G03F 7/028* | (2006.01) | |
| *G03F 7/029* | (2006.01) | |
| *G03F 7/039* | (2006.01) | |
| *G03F 7/20* | (2006.01) | |
| *C08F 224/00* | (2006.01) | |

(52) U.S. Cl.
CPC ............ *C08F 224/00* (2013.01); *G03F 7/0045* (2013.01); *G03F 7/0392* (2013.01); *G03F 7/029* (2013.01); *G03F 7/2037* (2013.01); *Y10S 430/122* (2013.01)
USPC ........................................ 430/270.1; 430/921

(58) Field of Classification Search
USPC ........ 430/270.1, 326, 921, 925; 526/256, 257
See application file for complete search history.

(56) References Cited

U.S. PATENT DOCUMENTS

| | | | | |
|---|---|---|---|---|
| 5,847,218 | A | * 12/1998 | Ohsawa et al. ............... 564/430 |
| 5,945,250 | A | * 8/1999 | Aoai et al. ................... 430/270.1 |
| 7,833,690 | B2 | * 11/2010 | Gonsalves et al. ......... 430/270.1 |
| 2003/0224284 | A1 | * 12/2003 | Tao .............................. 430/270.1 |
| 2006/0194147 | A1 | * 8/2006 | Kawanishi ................. 430/270.1 |
| 2007/0117043 | A1 | 5/2007 | Gonsalves |
| 2008/0102407 | A1 | * 5/2008 | Ohsawa et al. ............ 430/286.1 |
| 2010/0055608 | A1 | * 3/2010 | Ohashi et al. .............. 430/270.1 |

FOREIGN PATENT DOCUMENTS

| | | | |
|---|---|---|---|
| JP | 2006-178317 | * | 7/2006 |
| JP | 2008-133448 A | | 6/2008 |

OTHER PUBLICATIONS

Office Action dated Nov. 19, 2013, issued by the Japanese Patent Office in counterpart Japanese Application No. 2010-049872.

* cited by examiner

*Primary Examiner* — Anca Eoff
(74) *Attorney, Agent, or Firm* — Sughrue Mion, PLLC

(57) ABSTRACT

Provided is an actinic ray-sensitive or radiation-sensitive resin composition including (P) a resin which contains (A) a repeating unit having an ionic structure moiety capable of producing an acid anion on the side chain upon irradiation with an actinic ray or radiation, wherein a cation moiety of the ionic structure moiety has an acid-decomposable group or an alkali-decomposable group.

10 Claims, No Drawings

ACTINIC RAY-SENSITIVE OR RADIATION-SENSITIVE RESIN COMPOSITION AND RESIST FILM AND PATTERN FORMING METHOD USING THE COMPOSITION

BACKGROUND OF THE INVENTION

1. Field of the Invention

The present invention relates to an actinic ray-sensitive or radiation-sensitive resin composition suitable for use in an ultramicrolithography process such as production of VLSI or a high-capacity microchip or in other photofabrication processes, and a resist film and a pattern forming method using the composition.

2. Description of the Related Art

In the process of producing a semiconductor device such as IC and LSI, microprocessing by lithography using a photoresist composition has been conventionally performed. Recently, the integration degree of an integrated circuit becomes higher and formation of an ultrafine pattern in the sub-micron or quarter-micron region is required. To cope with this requirement, the exposure wavelength also tends to become shorter, for example, from g line to i line or further to KrF excimer laser light. At present, other than the excimer laser light, development of lithography using an electron beam, an X ray or EUV light is also proceeding.

Above all, the electron beam lithography is positioned as the next or next-next generation pattern formation technique, and a positive resist having high sensitivity and high resolution is demanded. Particularly, in order to shorten the wafer processing time, the elevation of sensitivity is very important, but in a positive resist for electron beam lithography, when higher sensitivity is sought for, not only reduction in the resolution but also worsening of line edge roughness are brought about, and development of a resist satisfying all of these properties at the same time is strongly demanded. The line edge roughness as used herein means that the resist edge at the interface between the pattern and the substrate irregularly fluctuates in the direction perpendicular to the line direction due to the resist properties and when the pattern is viewed from right above, the edge gives an uneven appearance. This unevenness is transferred in an etching step using the resist as a mask and causes deterioration of electric property, giving rise to decrease in the yield. In particular, in an ultrafine region of 0.25 μm or less, the improvement of line edge roughness is a very important problem to be solved. High sensitivity is in a trade-off relationship with high resolution, good pattern profile and good line edge roughness, and it is very important how satisfy all of these requirements at the same time.

Also in the lithography using X-ray or EUV light, it is similarly a very important task to satisfy all of high sensitivity, high resolution, good pattern profile and good line edge roughness at the same time, and this task needs to be solved.

Furthermore, in the case of using a light source that emits EUV light, the wavelength of light belongs to an extreme-ultraviolet region and unlike conventional light sources, high energy of the light brings about a prominent outgassing problem of a compound in the resist film being destroyed by fragmentation to volatize as a low molecular component during exposure and contaminate the environment in the exposure apparatus.

For example, US 2007/0117043 has proposed a technique of bonding a moiety capable of generating an acid upon exposure to an acid-decomposable resin in a resist, where a resist enabling achieving high sensitivity, high contrast, high resolution and/or high dry etching resistance is supposed to be obtained.

SUMMARY OF THE INVENTION

As in the technique described in US 2007/0117043, when an acid-generating moiety corresponding to an acid generator is incorporated into a resin, this tends to reduce the problem that the resolution is impaired due to, for example, insufficient miscibility of the acid generator for the resin or diffusion of an acid generated from the acid generator upon exposure into an unintended region (e.g., unexposed area). Furthermore, thanks to absence of a low molecular acid generator, even when, for example, EUV light is irradiated, outgassing attributable to a low molecular component is liable to be more reduced. However, particularly in the lithography using electron beam, X-ray or EUV light, as a matter of fact, more improvements are required with respect to resolution and outgassing and at the same time, good performance is demanded also in terms of sensitivity, line edge roughness and pattern profile.

Accordingly, an object of the present invention is to provide an actinic ray-sensitive or radiation-sensitive resin composition that satisfies, at a high level, all of high sensitivity, high resolution, good pattern profile and good line edge roughness in the ultrafine region, particularly in the electron beam, X-ray or EUV light lithography, and satisfactorily reduces the outgassing problem at the exposure, and a resist film and a pattern forming method using the composition.

The problems were solved by the following means.
(1) An actinic ray-sensitive or radiation-sensitive resin composition comprising (P) a resin containing (A) a repeating unit having an ionic structure moiety capable of producing an acid anion on the side chain upon irradiation with an actinic ray or radiation, wherein a cation moiety of the ionic structure moiety has an acid-decomposable group or an alkali-decomposable group.
(2) The actinic ray-sensitive or radiation-sensitive resin composition as described in (1) above, wherein the resin (P) further contains (B) a repeating unit having a group capable of decomposing by the action of an acid to produce an alkali-soluble group.
(3) The actinic ray-sensitive or radiation-sensitive resin composition as described in (1) or (2) above, wherein the resin (P) further contains (C) a repeating unit represented by the following formula (VI):

wherein each of $R_{01}$, $R_{02}$ and $R_{03}$ independently represents a hydrogen atom, an alkyl group, a cycloalkyl group, a halogen atom, a cyano group or an alkoxycarbonyl group, or $R_{03}$ may represent an alkylene group and combine with $Ar_1$ to form a 5- or 6-membered ring, $Ar_1$ represents (n+1) valent aromatic ring group, provided that $Ar_1$ represents (n+2) valent aromatic ring group when $Ar_1$ combines with $R_{03}$ to form a ring, and n represents an integer of 1 to 4.

(4) The actinic ray-sensitive or radiation-sensitive resin composition as described in (2) or (3) above, wherein the repeating unit (B) is a repeating unit represented by the following formula (I):

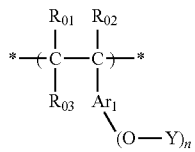

(I)

wherein each of $R_{01}$, $R_{02}$ and $R_{03}$ independently represents a hydrogen atom, an alkyl group, a cycloalkyl group, a halogen atom, a cyano group or an alkoxycarbonyl group, or $R_{03}$ may represent an alkylene group and combine with $Ar_1$ to form a 5- or 6-membered ring, $Ar_1$ represents (n+1) valent aromatic ring group, provided that $Ar_1$ represents (n+2) valent aromatic ring group when $Ar_1$ combines with $R_{03}$ to form a ring, each of n Ys independently represents a hydrogen atom or a group capable of leaving by the action of an acid, provided that at least one Y represents a group capable of leaving by the action of an acid, and n represents an integer of 1 to 4.

(5) The actinic ray-sensitive or radiation-sensitive resin composition as described in (4) above, wherein Y in formula (I) is represented by the following formula (II):

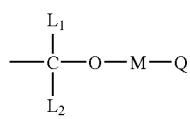

(II)

wherein each of $L_1$ and $L_2$ independently represents a hydrogen atom, an alkyl group, a cycloalkyl group, an aryl group or an aralkyl group, M represents a single bond or a divalent linking group, Q represents an alkyl group, an alicyclic group which may contain a heteroatom, an aromatic ring group which may contain a heteroatom, an amino group, an ammonium group, a mercapto group, a cyano group or an aldehyde group, and at least two members of Q, M and $L_1$ may combine to form a ring.

(6) The actinic ray-sensitive or radiation-sensitive resin composition as described in any one of (1) to (5) above, wherein the cation moiety of the ionic structure moiety has an acid-decomposable group.

(7) The actinic ray-sensitive or radiation-sensitive resin composition as described in any one of (1) to (5) above, wherein the acid-decomposable group or alkali-decomposable group contained in the cation moiety of the ionic structure moiety is a group obtained by replacing a hydrogen atom of an alkali-soluble group with a group which is capable of leaving by the action of an acid or an alkali and has a carbon number of 6 or more.

(8) The actinic ray-sensitive or radiation-sensitive resin composition as described in any one of (1) to (5) above, wherein the cation moiety of the ionic structure moiety is represented by formula (a) or (b):

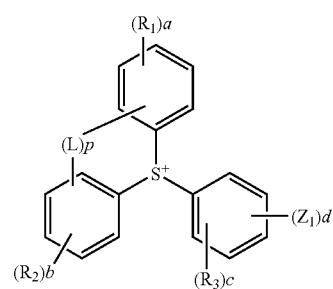

(a)

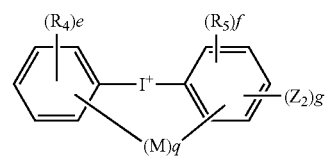

(b)

[wherein each of $Z_1$ and $Z_2$ independently represents the above-described acid-decomposable group or alkali-decomposable group, each of $R_1$ to $R_5$ independently represents a monovalent substituent, each of L and M independently represents a single bond or a divalent linking group, each of p and q independently represents 0 or 1, each of a and b independently represents an integer of 0 to (5-p), e represents an integer of 0 to (5-q), each of d and g independently represents an integer of 1 to 5, c represents an integer of 0 to (5-d), and f represents an integer of 0 to (5-g-q), provided that g+q≤5].

(9) The actinic ray-sensitive or radiation-sensitive resin composition as described in any one of (1) to (8) above, which is exposed to an electron beam, X-ray or EUV light.

(10) A resist film formed using the actinic ray-sensitive or radiation-sensitive resin composition described in any one of (1) to (9) above.

(11) A pattern forming method comprising a step of exposing the resist film described in (10) above, and a step of developing the exposed film.

Furthermore, the present invention preferably includes the following configurations.

(12) The actinic ray-sensitive or radiation-sensitive resin composition as described in any one of (1) to (9) above, wherein the repeating unit (A) is a repeating unit represented by any one of the following formulae (III) to (V):

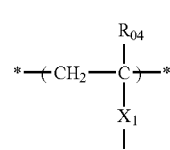

(III)

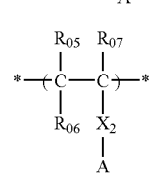

(IV)

-continued

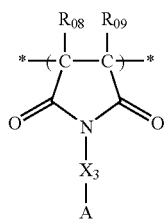

(V)

wherein each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group;

$R_{06}$ represents a cyano group, a carboxyl group, —CO—$OR_{25}$ or —CO—N($R_{26}$)($R_{27}$), and $R_{26}$ and $R_{27}$ may combine to form a ring together with the nitrogen atom;

each of $X_1$ to $X_3$ independently represents a single bond, an arylene group, an alkylene group, a cycloalkylene group, —O—, —$SO_2$—, —CO—, —N($R_{33}$)— or a divalent linking group formed by combining a plurality of these groups;

$R_{25}$ represents an alkyl group, a cycloalkyl group, an alkenyl group, an aryl group or an aralkyl group;

each of $R_{26}$, $R_{27}$ and $R_{33}$ independently represents a hydrogen atom, an alkyl group, a cycloalkyl group, an alkenyl group, an aryl group or an aralkyl group; and A represents the above-described ionic structure moiety capable of producing an acid anion on the side chain upon irradiation with an actinic ray or radiation, in which the counter cation is a cation having an acid-decomposable group or an alkali-decomposable group.

(13) The pattern forming method as described in (11) above, wherein the exposure is performed with an electron beam, an X-ray or EUV light.

DETAILED DESCRIPTION OF THE INVENTION

The present invention is described in detail below.

In the context of the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

In the present invention, the term "actinic ray" or "radiation" indicates, for example, a bright line spectrum of a mercury lamp, a far ultraviolet ray typified by an excimer laser, an extreme-ultraviolet ray (EUV light), an X-ray or an electron beam. Also, in the present invention, the "light" means an actinic ray or radiation.

Furthermore, in the present invention, unless otherwise indicated, the "exposure" includes not only exposure to a mercury lamp, a far ultraviolet ray typified by excimer laser, an X-ray, EUV light or the like but also lithography with a particle beam such as electron beam and ion beam.

<Resin (P)>

The resin (P) added in the actinic ray-sensitive or radiation-sensitive resin composition contains (A) a repeating unit having an ionic structure moiety capable of producing an acid anion on the side chain upon irradiation with an actinic ray or radiation, and the cation moiety of the ionic structure moiety has an acid-decomposable group or an alkali-decomposable group.

That is, the ionic structure moiety having an anion moiety and a cation moiety contained in the repeating unit (A) is characterized in that the cation moiety of the ionic structure moiety decomposes upon irradiation with an actinic ray or radiation to produce an acid anion derived from the anion moiety on the side chain of the repeating unit.

(1) Repeating Unit (A)

As for the repeating unit (A), any repeating unit may be used as long as it has an ionic structure moiety capable of producing an acid anion on the side chain upon irradiation with an actinic ray or radiation and the cation moiety of the ionic structure moiety has an acid-decomposable group or an alkali-decomposable group.

Examples of such a cation moiety include a sulfonium salt having an acid-decomposable group or an alkali-decomposable group, an iodonium salt having an acid-decomposable group or an alkali-decomposable group, and a diazonium salt having an acid-decomposable group or an alkali-decomposable group.

The acid-decomposable group or alkali-decomposable group as used herein is a group capable of decomposing by the action of an acid or an alkali to produce an alkali-soluble group.

The acid-decomposable group or alkali-decomposable group is preferably, for example, a group obtained by replacing a hydrogen atom of an alkali-soluble group such as —COOH group and —OH group with a group capable of leaving by the action of an acid or an alkali.

Examples of the group capable of leaving by the action of an acid include —C($R_{36}$)($R_{37}$)($R_{38}$), —C(=O)—O—C($R_{36}$)($R_{37}$)($R_{38}$), —C($R_{01}$)($R_{02}$)($OR_{39}$), —C($R_{01}$)($R_{02}$)—C(=O)—O—C($R_{36}$)($R_{37}$)($R_{38}$) and —CH($R_{36}$)(Ar).

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

Ar represents an aryl group.

The alkyl group of $R_{36}$ to $R_{39}$, $R_{01}$ and $R_{02}$ is preferably an alkyl group having a carbon number of 1 to 8, and examples thereof include a methyl group, an ethyl group, a propyl group, an n-butyl group, a sec-butyl group, a hexyl group and an octyl group.

The cycloalkyl group of $R_{36}$ to $R_{39}$, $R_{01}$ and $R_{02}$ may be either monocyclic or polycyclic. The monocyclic cycloalkyl group is preferably a cycloalkyl group having a carbon number of 3 to 10, and examples thereof include a cyclopropyl group, a cyclobutyl group, a cyclopentyl group, a cyclohexyl group and a cyclooctyl group. The polycyclic cycloalkyl group is preferably a cycloalkyl group having a carbon number of 6 to 20, and examples thereof include an adamantyl, a norbornyl group, an isoboronyl group, a camphanyl group, a dicyclopentyl group, an α-pinel group, a tricyclodecanyl group, a tetracyclododecyl group and an androstanyl group. Incidentally, a part of carbon atoms in the cycloalkyl group may be substituted by a heteroatom such as oxygen atom.

The aryl group of $R_{36}$ to $R_{39}$, $R_{01}$, $R_{02}$ and Ar is preferably an aryl group having a carbon number of 6 to 10, and examples thereof include a phenyl group, a naphthyl group and an anthryl group.

The aralkyl group of $R_{36}$ to $R_{39}$, $R_{01}$ and $R_{02}$ is preferably an aralkyl group having a carbon number of 7 to 12, and examples thereof include a benzyl group, a phenethyl group and a naphthylmethyl group.

The alkenyl group of $R_{36}$ to $R_{39}$, $R_{01}$ and $R_{02}$ is preferably an alkenyl group having a carbon number of 2 to 8, and examples thereof include a vinyl group, an allyl group, a butenyl group and a cyclohexenyl group.

The ring formed by combining $R_{36}$ and $R_{37}$ with each other may be either monocyclic or polycyclic. The monocyclic ring is preferably a cycloalkane structure having a carbon number of 3 to 10, and examples thereof include a cyclopropane structure, a cyclobutane structure, a cyclopentane structure, a cyclohexane structure, a cycloheptane structure and a cyclooctane structure. The polycyclic ring is preferably a cycloalkane structure having a carbon number of 6 to 20, and examples thereof include an adamantane structure, a norbornane structure, a dicyclopentane structure, a tricyclodecane structure and a tetracyclododecane structure. Incidentally, a part of carbon atoms in the cycloalkane may be substituted by a heteroatom such as oxygen atom.

Each of the groups as $R_{36}$ to $R_{39}$, $R_{01}$, $R_{02}$ and Ar may have a substituent, and examples of the substituent include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group. The carbon number of the substituent is preferably 8 or less.

The group capable of leaving by the action of an acid is preferably —C(=O)—O—C($R_{36}$)($R_{37}$)($R_{38}$), —C($R_{01}$)($R_{02}$)(O$R_{39}$) or —C($R_{01}$)($R_{02}$)—C(=O)—O—C($R_{36}$)($R_{37}$)($R_{38}$). Each of $R_{36}$ to $R_{39}$ is independently preferably an alkyl group or a cycloalkyl group, and in view of outgas reduction, more preferably has at least one cycloalkyl group (which may be either monocyclic or polycyclic).

Each of $R_{01}$ and $R_{02}$ is independently preferably a hydrogen atom, an alkyl group or a cycloalkyl group.

Examples of the acid-decomposable group contained in the cation moiety, containing those corresponding the above and not corresponding the above, include a tertiary alkoxy group such as tert-butoxy group; a carbonic acid ester group such as tert-butoxycarbonyloxy group; a tertiary carboxylic acid ester group such as tert-butoxycarbonylmethyloxy group; a trialkylsilyloxy group such as trimethylsilyloxy group, triethylsilyloxy group and tert-butyldimethylsilyloxy group; and an acetal or ketal group such as tetrahydrofuranyloxy group, tetrahydropyranyloxy group, 2-methoxytetrahydropyranyloxy group, methoxymethyloxy group, 1-ethoxyethoxy group, 1-propoxyethoxy group, 1-n-butoxyethoxy group, 1-iso-butoxyethoxy group, 1-sec-butoxyethoxy group, 1-tert-butoxyethoxy group, 1-amyloxyethoxy group, 1-ethoxy-1-methyl-ethoxy group, 1-propoxy-1-methyl-ethoxy group, 1-n-butoxy-1-methyl-ethoxy group, 1-iso-butoxy-1-methyl-ethoxy group, 1-sec-butoxy-1-methyl-ethoxy group, 1-tert-butoxy-1-methyl-ethoxy group and 1-amyloxy-1-methyl-ethoxy group.

The alkali-decomposable group contained in the cation moiety includes a group having lactone, a group having an acid anhydride, and an ester group, with a group having lactone being preferred.

The lactone ring in the lactone-containing group is preferably a 4- to 8-membered ring, more preferably a 5- to 7-membered ring. The lactone ring may contain a double bond.

Examples of the substituent which the lactone ring may have include an alkyl group, an alkoxy group, an acyl group, an oxy group (>C=O), a hydroxyl group, and those of the substituent as A, and the substituent may be a group substituted by other substituents.

Specific examples of the lactone ring include, but are not limited to, the structures of the following formulae (LC1-1) to (LC1-17).

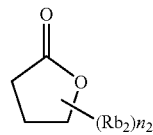

LC1-1

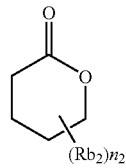

LC1-2

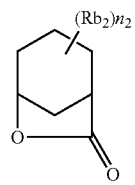

LC1-3

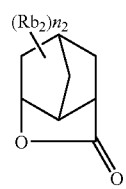

LC1-4

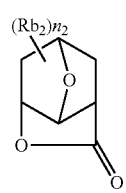

LC1-5

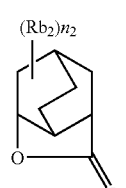

LC1-6

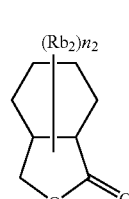

LC1-7

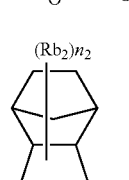

LC1-8

LC1-9
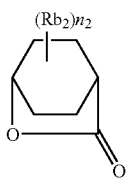

LC1-10
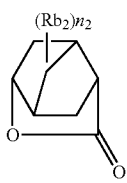

LC1-11
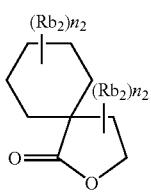

LC1-12
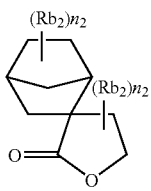

LC1-13
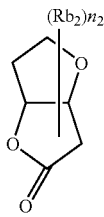

LC1-14
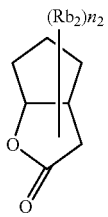

LC1-15
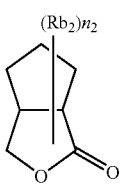

LC1-16
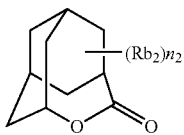

LC1-17
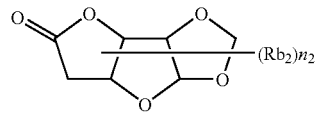

In the formulae above, the lactone structure moiety may or may not have a substituent ($Rb_2$).

Preferred examples of the substituent ($Rb_2$) include an alkyl group having a carbon number of 1 to 8, a cycloalkyl group having a carbon number of 3 to 7, an alkoxy group having a carbon number of 1 to 8, an alkoxycarbonyl group having a carbon number of 1 to 8, a carboxy group, a halogen atom, a hydroxyl group, a cyano group and an acid-decomposable group.

$n_2$ represents an integer of 0 to 4. When $n_2$ is an integer of 2 or more, each substituent ($Rb_2$) may be the same as or different from every other substituent ($Rb_2$). Also, in this case, the plurality of substituents ($Rb_2$) may combine with each other to form a ring structure.

More specific examples include the following lactone structures.

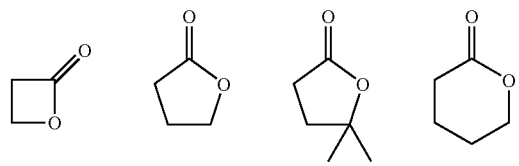

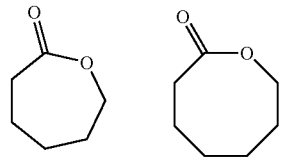

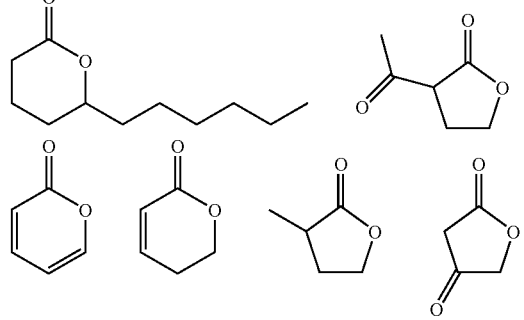

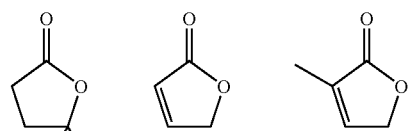

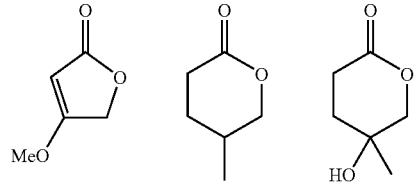

-continued

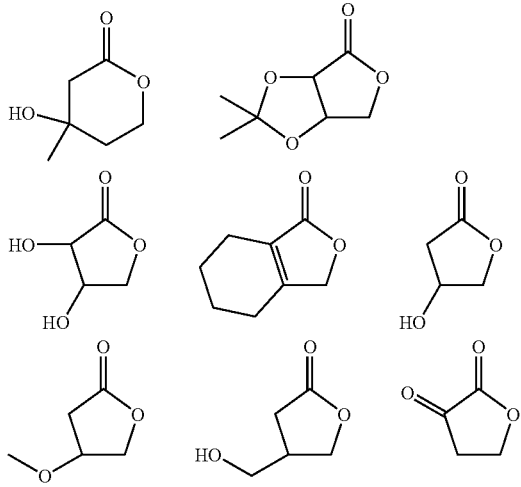

The cation moiety of the ionic structure moiety preferably has an acid-decomposable group in view of sensitivity and resolution.

In view of reducing the outgassing, the acid-decomposable group or alkali-decomposable group contained in the cation moiety of the ionic structure moiety is preferably a group obtained by replacing a hydrogen atom of an alkali-soluble group with a group which is capable of leaving by the action of an acid or an alkali and has a carbon number of 6 or more. Accordingly, out of the groups exemplified above as the acid-decomposable group or alkali-decomposable group, those where the carbon number of the group capable of leaving by the action of an acid or an alkali is 6 or more are preferred. Incidentally, a lactone-containing group exemplified as the alkali-decomposable group is not included in the group obtained by replacing a hydrogen atom of an alkali-soluble group with a group capable of leaving by the action of an acid or an alkali.

The cation moiety having an acid-decomposable group or an alkali-decomposable group is preferably a cation moiety represented by the following formula (a) or (b):

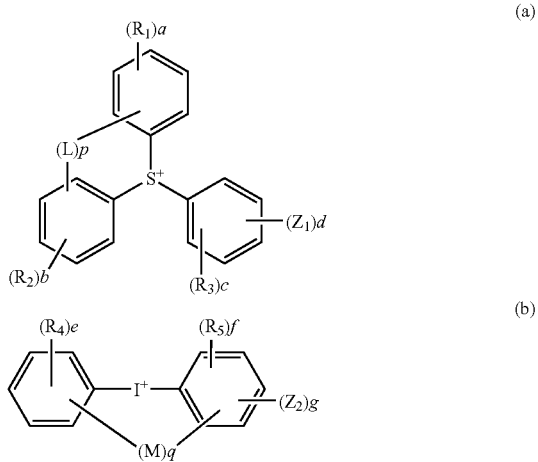

[wherein each of $Z_1$ and $Z_2$ independently represents an acid-decomposable group or an alkali-decomposable group, each of $R_1$ to $R_5$ independently represents a monovalent substituent, each of L and M independently represents a single bond or a divalent linking group, each of p and q independently represents 0 or 1, each of a and b independently represents an integer of 0 to (5−p), e represents an integer of 0 to (5−q), each of d and g independently represents an integer of 1 to 5, c represents an integer of 0 to (5−d), and f represents an integer of 0 to (5−g−q), provided that g+q≤5].

Specific examples and preferred examples of the acid-decomposable group or alkali-decomposable group in formulae (a) and (b) are the same as those described above.

Each of a, b and e is independently, preferably an integer of 0 to 4, more preferably 0 or 1, and most preferably 0.

Each of c and f is independently, preferably 0 to 1, more preferably 0.

Each of d and g is independently, preferably an integer of 1 to 3, more preferably 1 or 2, and most preferably 1.

The monovalent substituent in $R_1$ to $R_5$ is not particularly limited, but examples thereof include a halogen atom, an alkyl group (preferably having a carbon number of 1 to 10), a cycloalkyl group (preferably having a carbon number of 3 to 15, including a bicycloalkyl group and a tricycloalkyl group), an alkenyl group (preferably having a carbon number of 2 to 12, including a cycloalkenyl group and a bicycloalkenyl group), an alkynyl group (preferably having a carbon number of 2 to 12), an aryl group (preferably having a carbon number of 6 to 20), a heterocyclic group (which may be called a hetero ring group; preferably having a carbon number of 3 to 15), a cyano group, a hydroxyl group, a nitro group, a carboxyl group, an alkoxy group (preferably having a carbon number of 1 to 10), an aryloxy group (preferably having a carbon number of 6 to 20), a heterocyclic oxy group (preferably having a carbon number of 3 to 15), an acyloxy group (preferably having a carbon number of 2 to 10), a carbamoyloxy group, an alkoxycarbonyloxy group (preferably having a carbon number of 2 to 10), an aryloxycarbonyloxy group (preferably having a carbon number of 7 to 20), an amino group (including an anilino group), an ammonio group, an acylamino group (preferably having a carbon number of 2 to 10), an aminocarbonylamino group, an alkoxycarbonylamino group (preferably having a carbon number of 2 to 10), an aryloxycarbonylamino group (preferably having a carbon number of 7 to 20), a sulfamoylamino group, an alkyl-, cycloalkyl- or aryl-sulfonylamino group (preferably having a carbon number of 1 to 20), a mercapto group, an alkylthio group (preferably having a carbon number of 1 to 10), an arylthio group (preferably having a carbon number of 6 to 20), a heterocyclic thio group (preferably having a carbon number of 3 to 15), a sulfamoyl group, a sulfo group, an alkyl-, cycloalkyl- or aryl-sulfonyl group (preferably having a carbon number of 1 to 20), an alkyl-cycloalkyl- or aryl-sulfonyl group, an acyl group (preferably having a carbon number of 1 to 20), an acyl group (preferably having a carbon number of 2 to 10), an aryloxycarbonyl group (preferably having a carbon number of 7 to 20), an alkoxycarbonyl group (preferably having a carbon number of 2 to 10), a carbamoyl group, an aryl or heterocyclic azo group (preferably having a carbon number of 3 to 20), a sulfato group ($-OSO_3H$), an acid-decomposable group, an alkali-decomposable group, and other known substituents. Specific examples of the acid-decomposable or alkali-decomposable group are the same as those described above.

Each of $R_1$ to $R_5$ is preferably a hydrogen atom, a halogen atom, an alkyl group, a cycloalkyl group (including a bicycloalkyl group and a tricycloalkyl group), an alkenyl group (including a cycloalkenyl group and a bicycloalkenyl group), an alkynyl group, an aryl group, a cyano group, a hydroxyl group, a carboxyl group, an alkoxy group (including a cycloalkoxy group), an aryloxy group, an acyloxy group, a carbamoyloxy group, an acylamino group, an aminocarbonylamino group, an alkoxycarbonylamino group (including a cycloalkoxycarbonylamino group), an aryloxycarbonylamino group, a sulfamoylamino group, an alkyl-, cycloalkyl- or aryl-sulfonylamino group, an alkylthio group (including a cycloalkylthio group), an arylthio group, a sulfamoyl group, an alkyl-, cycloalkyl- or aryl-sulfonyl group, an aryloxycarbonyl group, an alkoxycarbonyl group (including a cycloalkoxycarbonyl group), a carbamoyl group, or the above-described acid-decomposable or alkali-decomposable group.

Each of $R_1$ to $R_5$ is more preferably a hydrogen atom, a halogen atom, an alkyl group, a cycloalkyl group (including a bicycloalkyl group and a tricycloalkyl group), a cyano group, a hydroxyl group, an alkoxy group (including a cycloalkoxy group), an acyloxy group, an acylamino group, an aminocarbonylamino group, an alkoxycarbonylamino group (including a cycloalkoxycarbonylamino group), an alkyl-, cycloalkyl- or aryl-sulfonylamino group, an alkylthio group (including a cycloalkylthio group), a sulfamoyl group, an alkyl-, cycloalkyl- or aryl-sulfonyl group, an alkoxycarbonyl group (including a cycloalkoxycarbonyl group), a carbamoyl group or the above-described acid-decomposable or alkali-decomposable group.

Each of $R_1$ to $R_5$ is still more preferably a hydrogen atom, an alkyl group, a cycloalkyl group (including a bicycloalkyl group and a tricycloalkyl group), a cyano group, a hydroxyl group, an alkoxy group (including a cycloalkoxy group), a halogen atom or the above-described acid-decomposable or alkali-decomposable group.

The monovalent substituent above may be bonded through a divalent organic linking group. Examples of the divalent organic linking group include an alkylene group (e.g., methylene, ethylene, propylene, butylene, hexylene, octylene), a cycloalkylene group (e.g., cyclopentylene, cyclohexylene), an alkenylene group (e.g., vinylene, propenylene, butenylene), an arylene group (e.g., phenylene, tolylene, naphthylene), an azo group, —S—, —O—, —CO—, —SO—, —SO$_2$—, —N(R$_0$)— (wherein R$_0$ represents a hydrogen atom or an alkyl group having a carbon number of 1 to 8), and a divalent linking group formed by combining a plurality of these groups.

Each of p and q is preferably 1, whereby generation of outgassing can be more reduced.

Examples of the divalent linking group of L and M include an alkylene group, an arylene group, —O—, a carbonyl group, a sulfide group, a sulfonyl group, —COO—, —CONH—, —SO$_2$NH—, —CF$_2$—, —CF$_2$CF$_2$—, —OCF$_2$O—, —CF$_2$OCF$_2$—, —SS—, —CH$_2$SO$_2$CH$_2$—, —CH$_2$COCH$_2$—, —COCF$_2$CO—, —COCO—, —OCOO—, —OSO$_2$O—, an ether group, a thioether group, an amino group, an acyl group, an alkylsulfonyl group, —CH=CH—, an aminocarbonylamino group and an aminosulfonylamino group, and each of these groups may have a substituent. Examples of the substituent include the above-described monovalent substituents for $R_1$ to $R_5$.

The carbon number of the linking group as L and M is preferably 15 or less, more preferably 10 or less.

L is preferably a single bond, a carbonyl group, —O—, a sulfide group, a sulfonyl group, —O—, —COO—, —CONH—, —SO$_2$NH—, —CF$_2$—, —CF$_2$CF$_2$—, —OCF$_2$O—, —CF$_2$OCF$_2$—, —SS—, —CH$_2$SO$_2$CH$_2$—, —CH$_2$COCH$_2$—, —COCF$_2$CO—, —COCO—, —OCOO— or —OSO$_2$O—, more preferably a single bond, a carbonyl group, a sulfide group, a sulfonyl group, —COO—, —CONH—, —SO$_2$NH—, —CF$_2$—, —CF$_2$CF$_2$— or —COCO—, still more preferably a single bond, a carbonyl group, a sulfide group, a sulfonyl group or —O—, and most preferably a single bond, a sulfonyl group or —O—.

M is preferably a single bond, a carbonyl group, a sulfide group, a sulfonyl group, —O—, —COO—, —CONH—, —SO$_2$NH—, —CF$_2$—, —CF$_2$CF$_2$—, —OCF$_2$O—, —CF$_2$OCF$_2$—, —SS—, —CH$_2$SO$_2$CH$_2$—, —CH$_2$COCH$_2$—, —COCF$_2$CO—, —COCO—, —OCOO— or —OSO$_2$O—, more preferably a single bond, a carbonyl group, a sulfide group, a sulfonyl group, —O—, —COO—, —CONH—, —SO$_2$NH—, —CF$_2$—, —CF$_2$CF$_2$— or —COCO—, still more preferably a single bond, a carbonyl group, a sulfide group, a sulfonyl group or —O—, and most preferably a single bond, a sulfonyl group or —O—.

Here, when each of p and q is 0, this means that a single bond or a divalent linking group as L or M is not present. That is, in formulae (a) and (b), two benzene rings are not connected to each other by a single bond or a divalent linking group.

Specific examples of the cation moiety represented by formulae (a) and (b) are set forth below, but the present invention is not limited thereto.

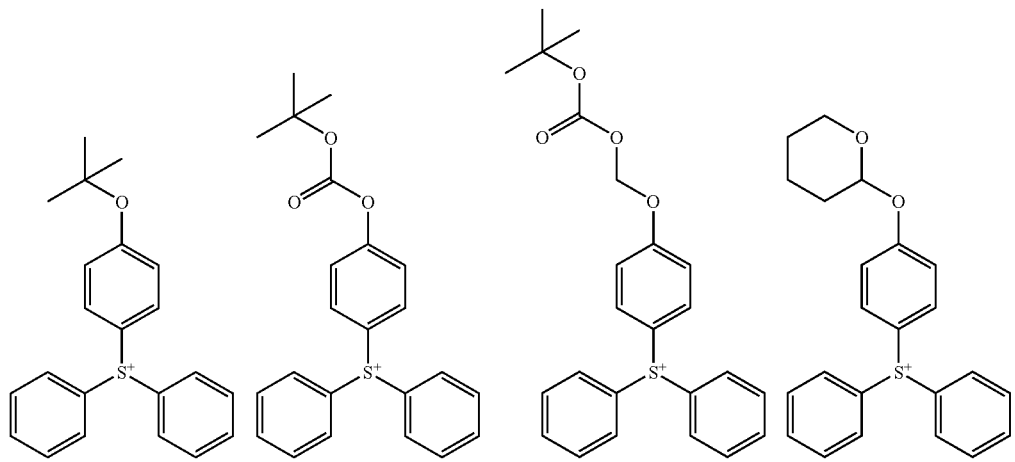

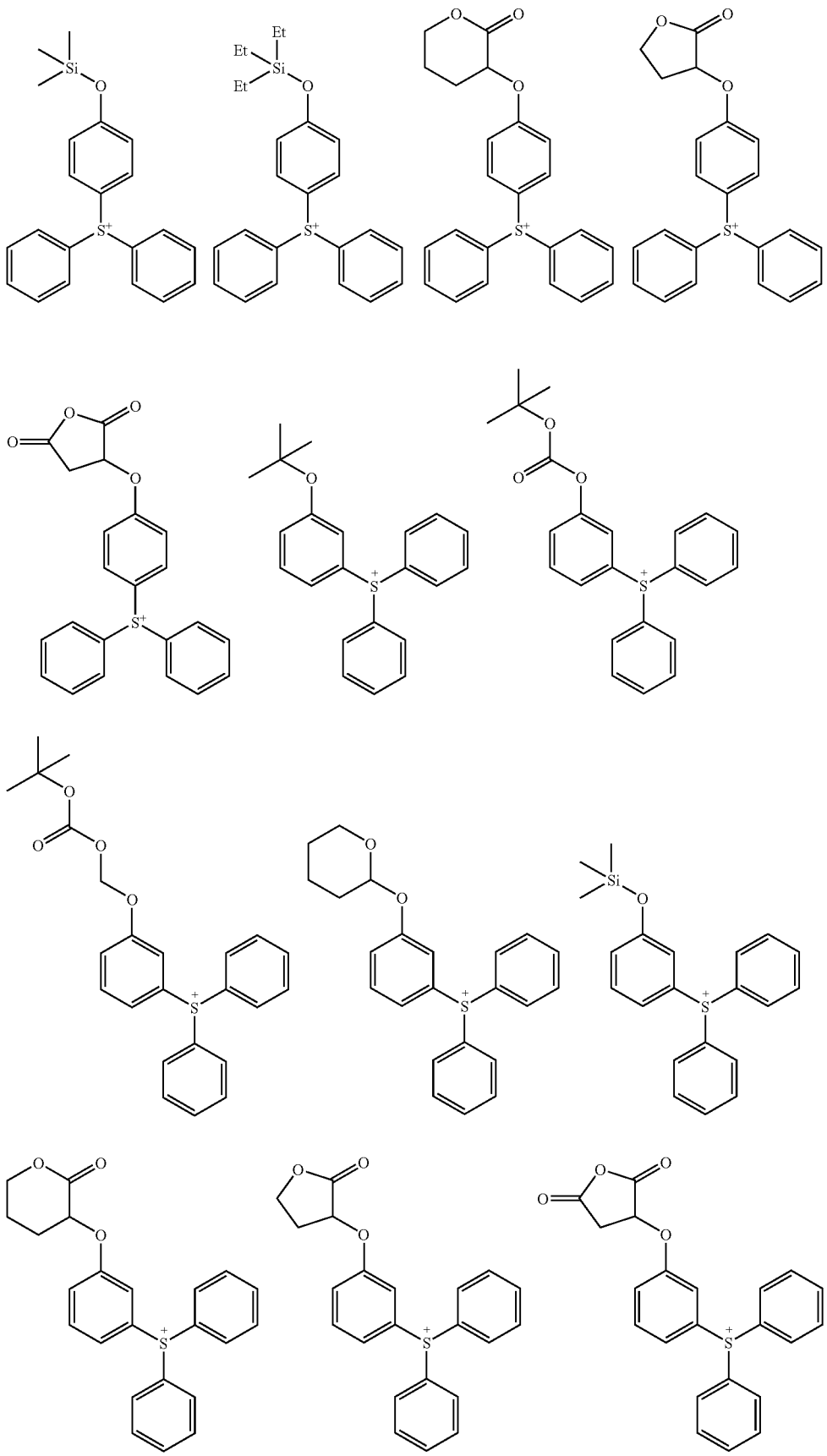

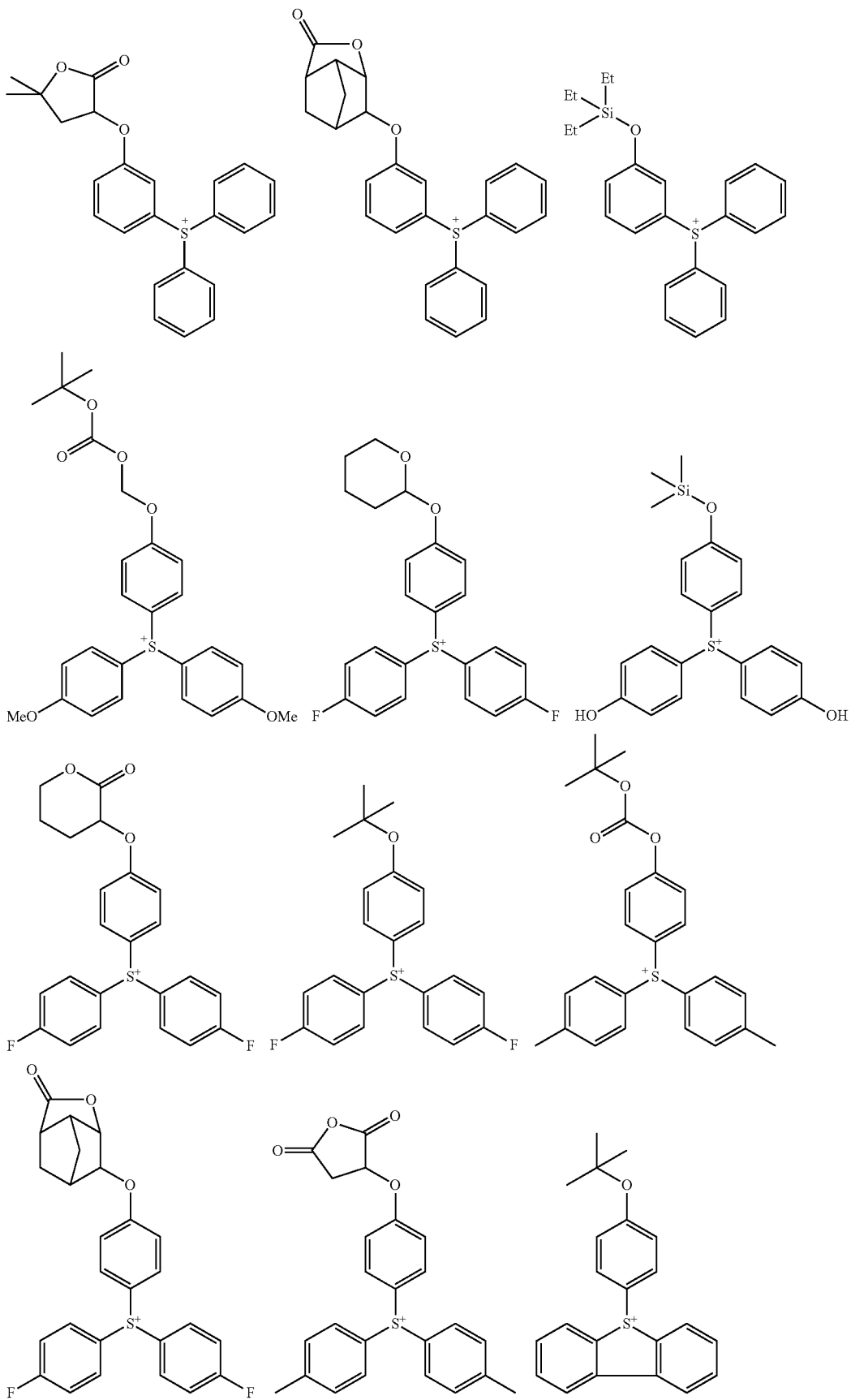

-continued
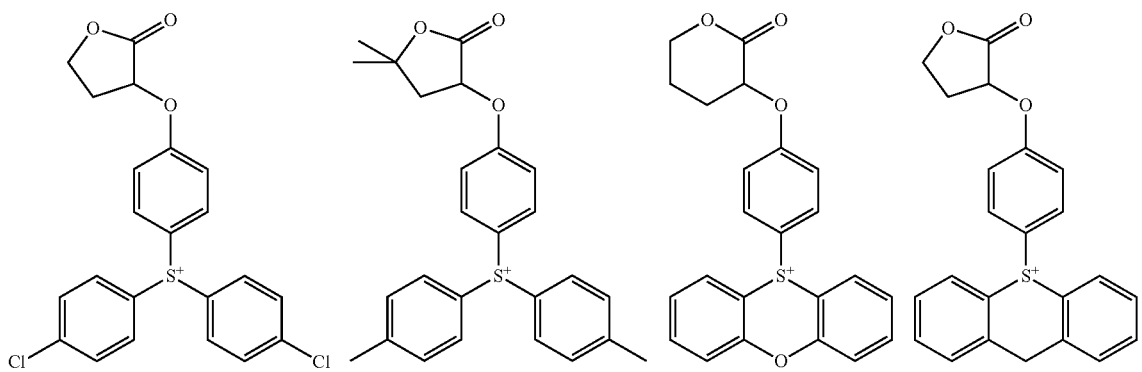
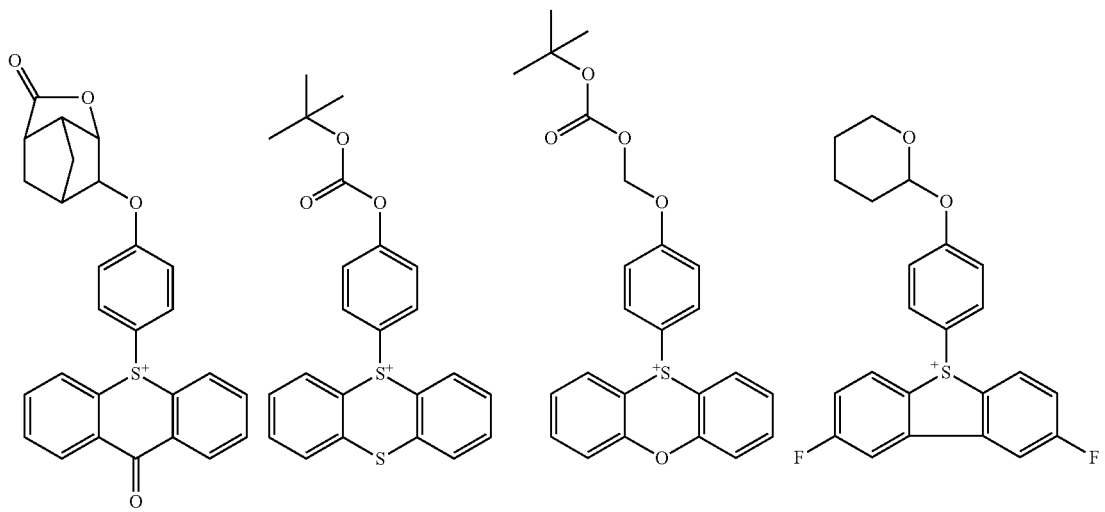
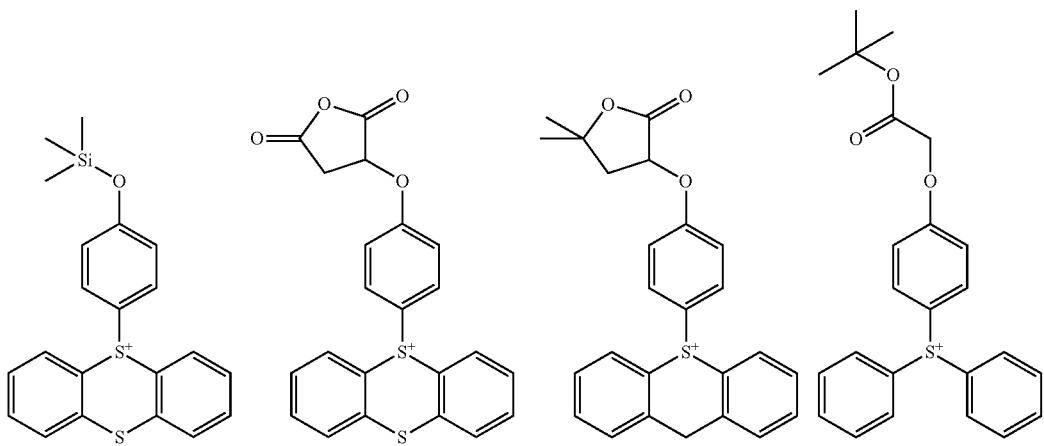

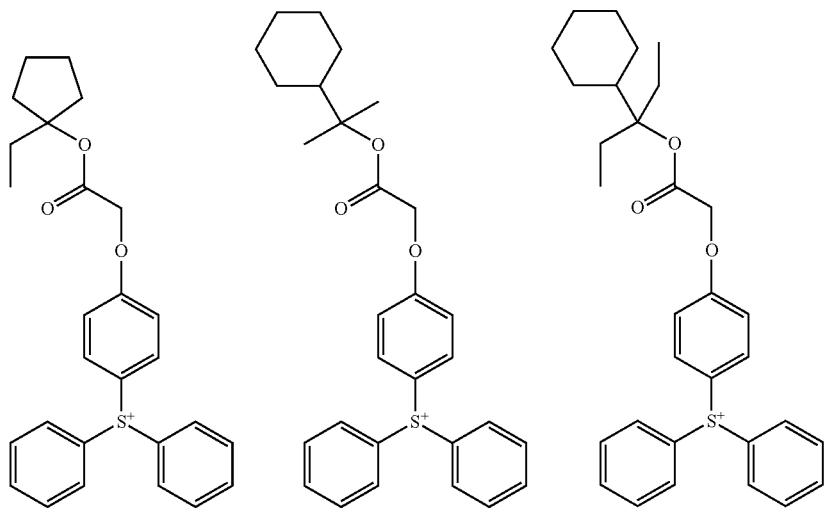
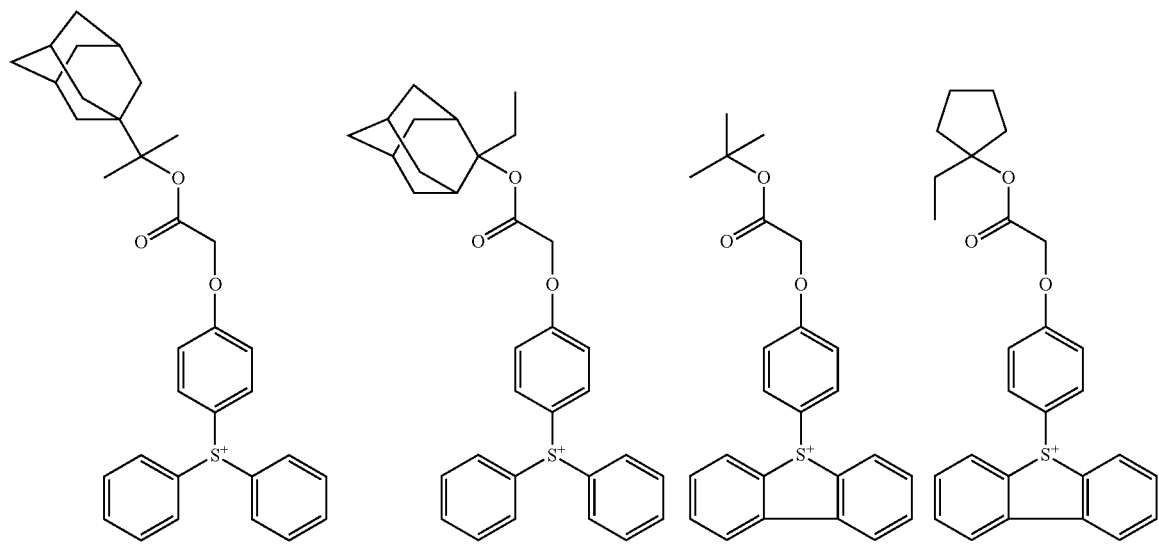
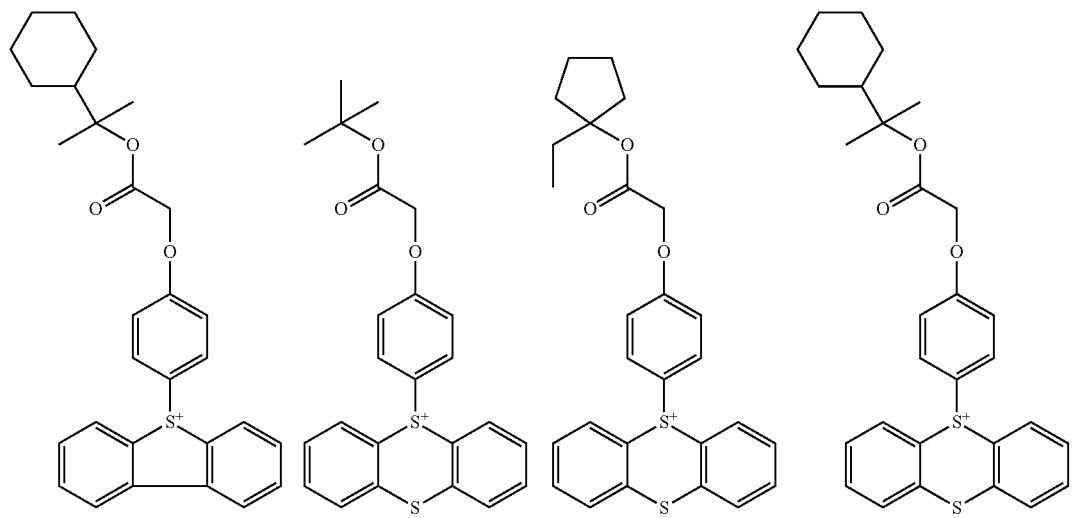

-continued
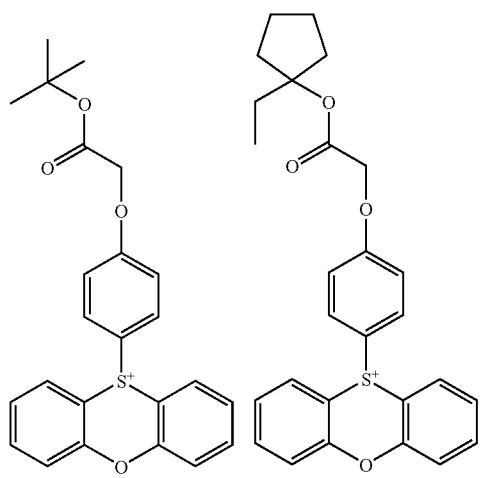
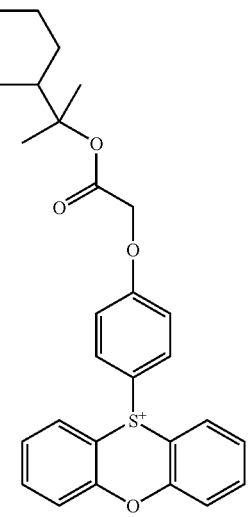
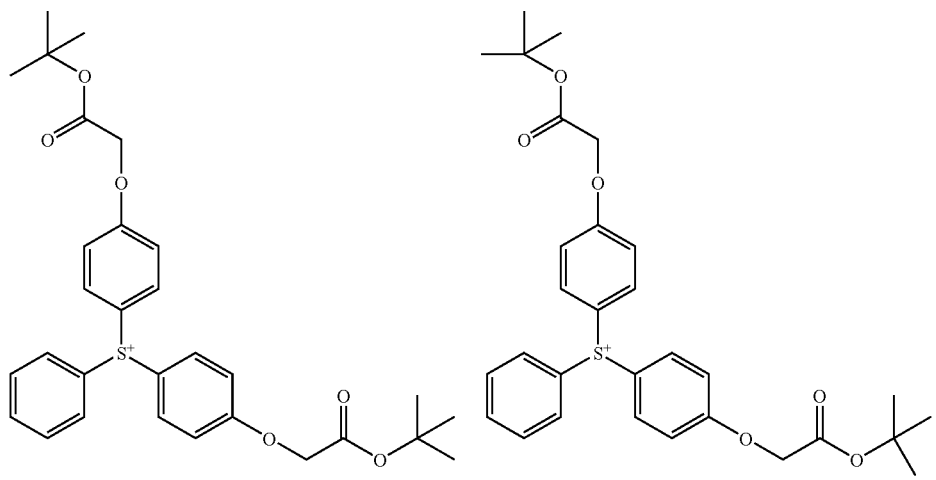
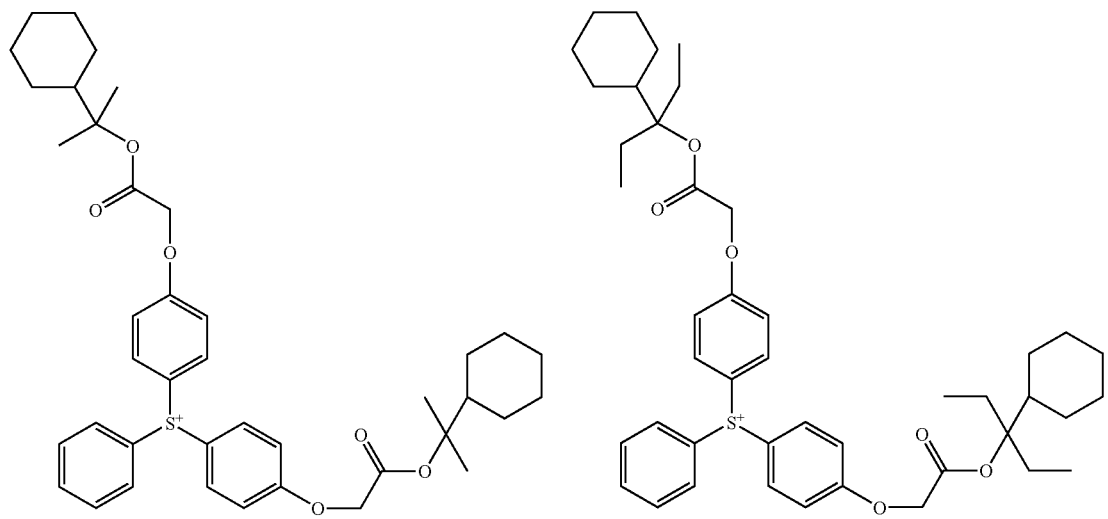

-continued
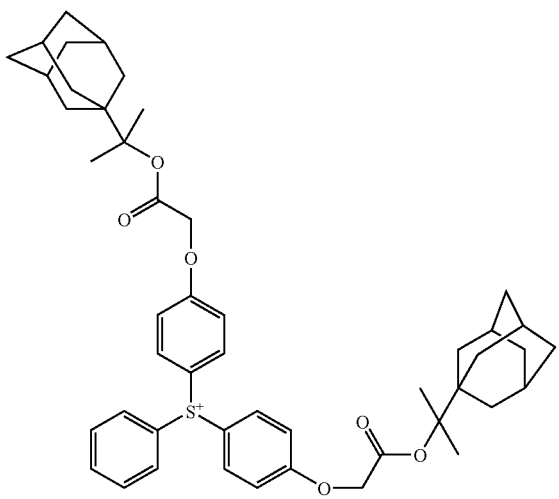
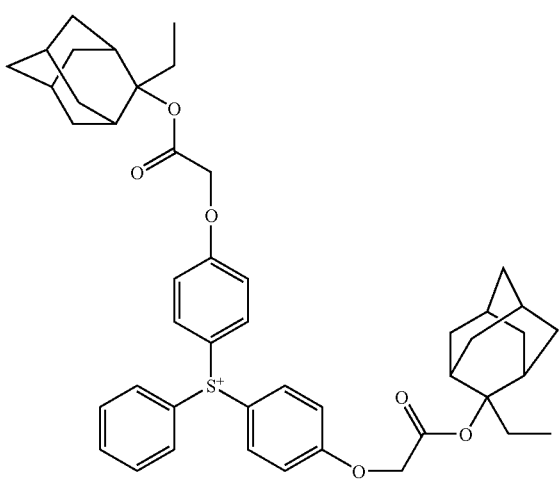
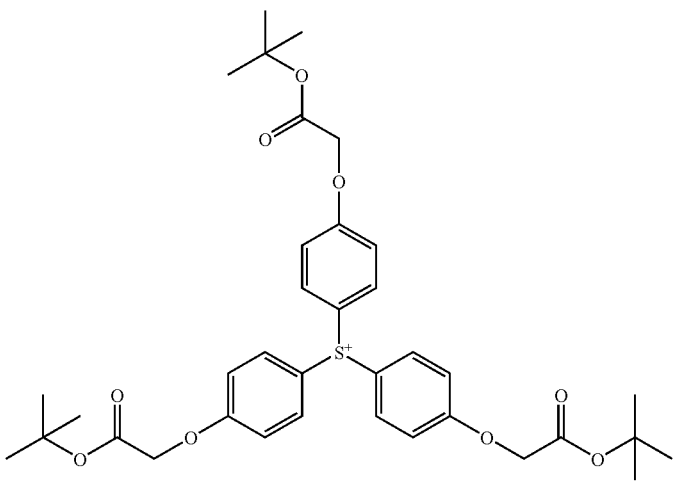

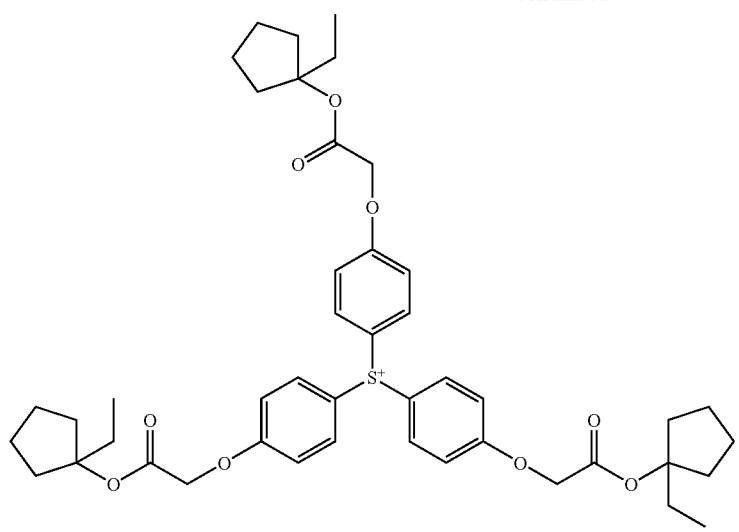
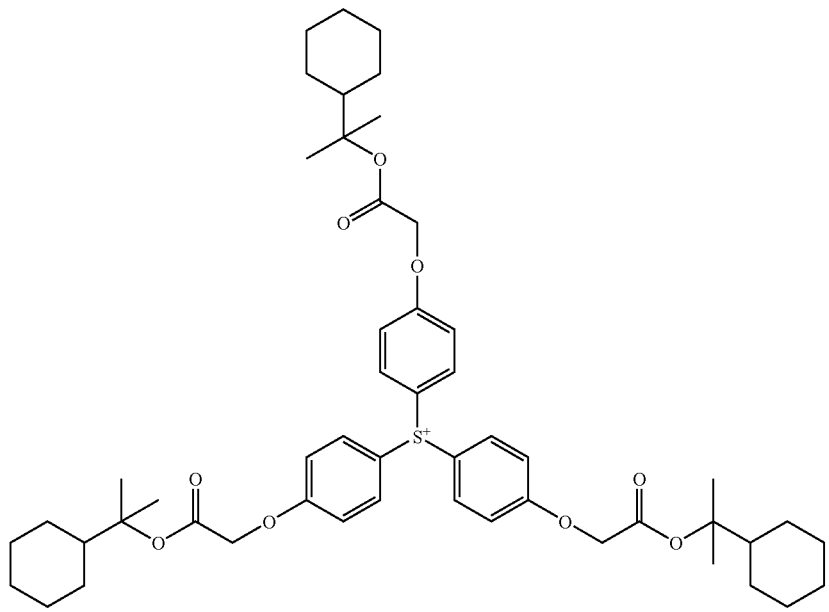
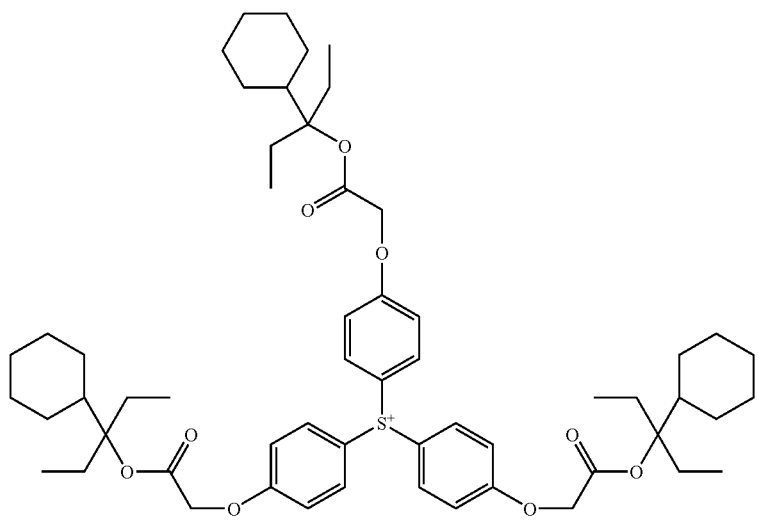

-continued
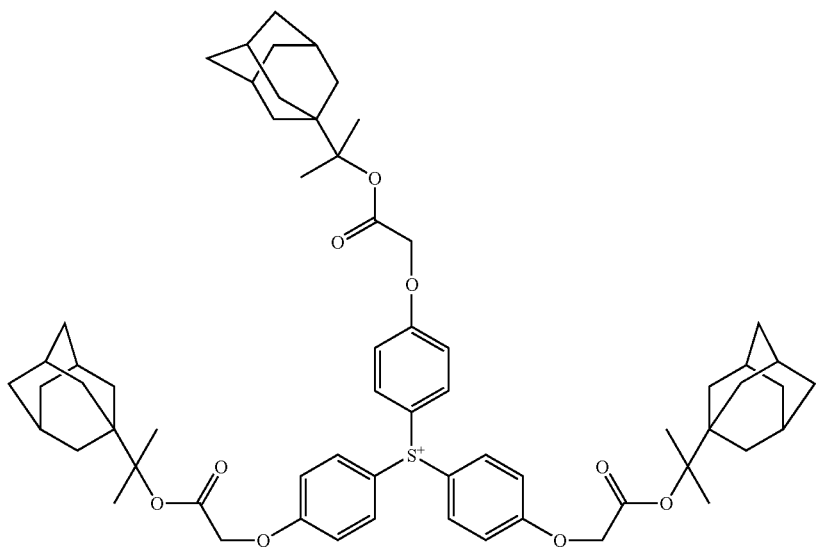
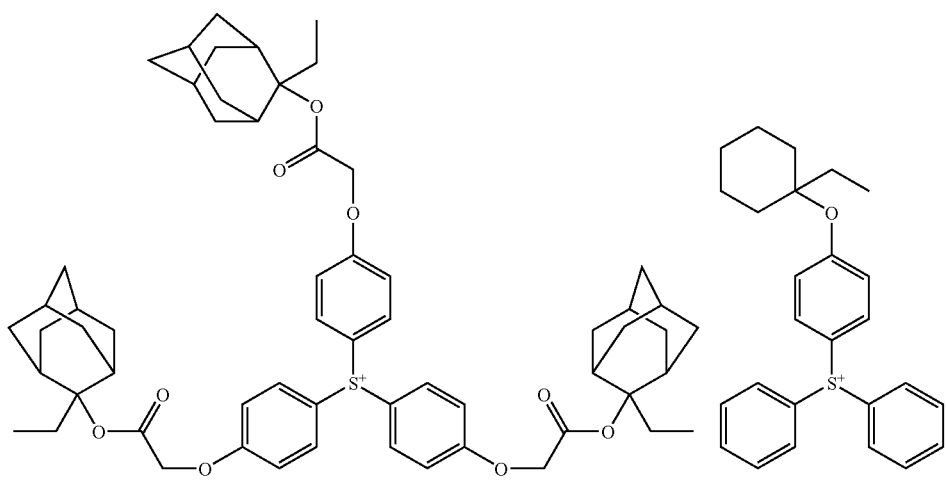
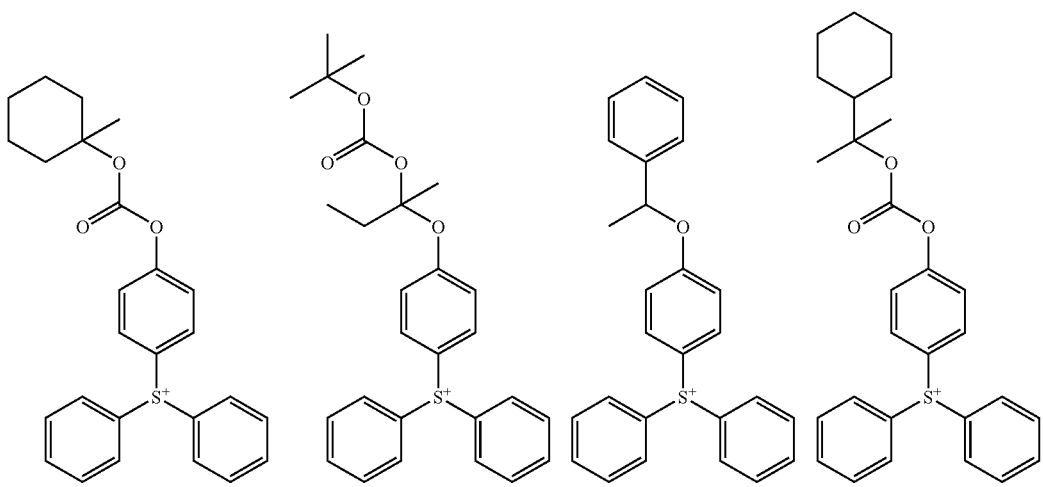

-continued
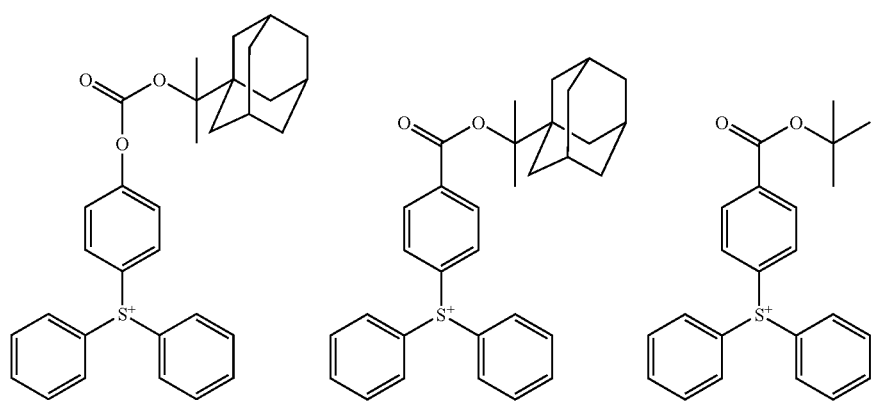
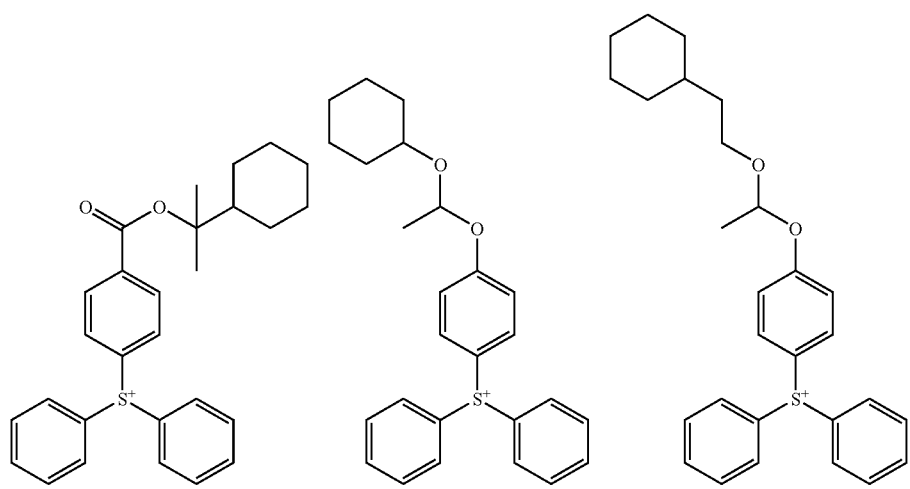
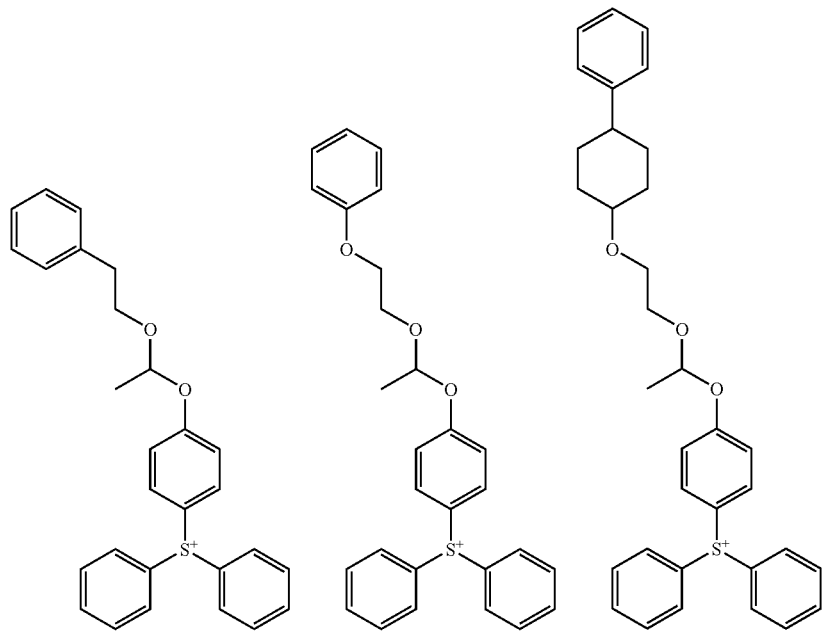

-continued
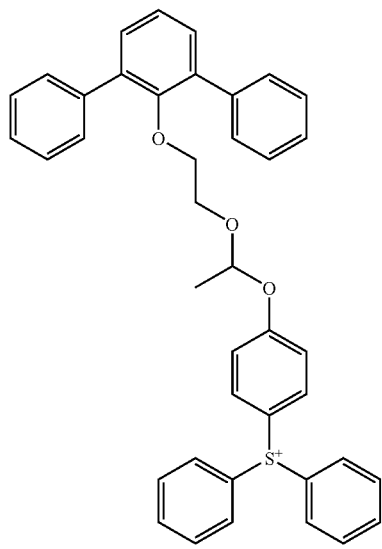
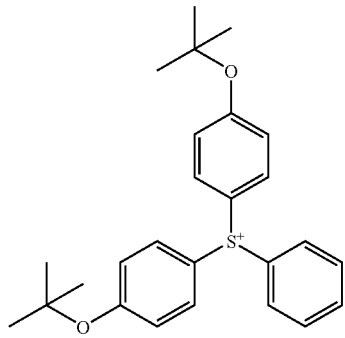
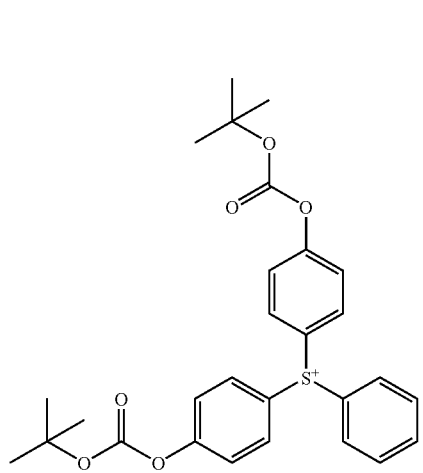
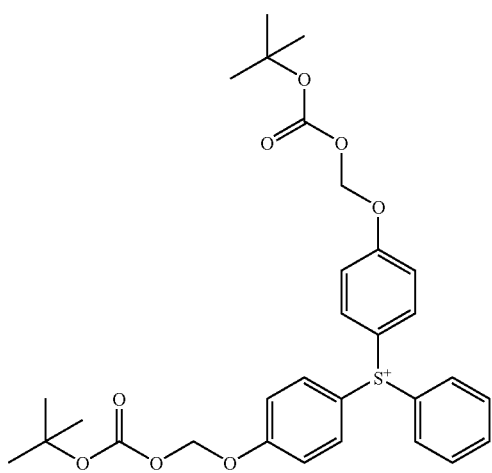
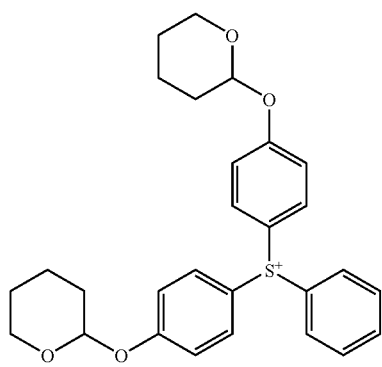
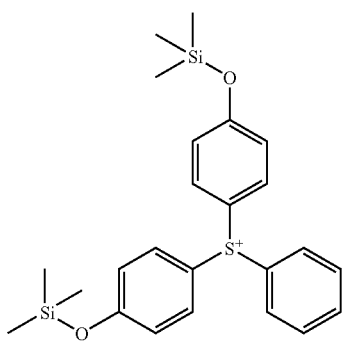
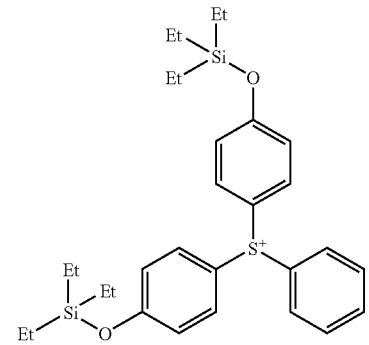

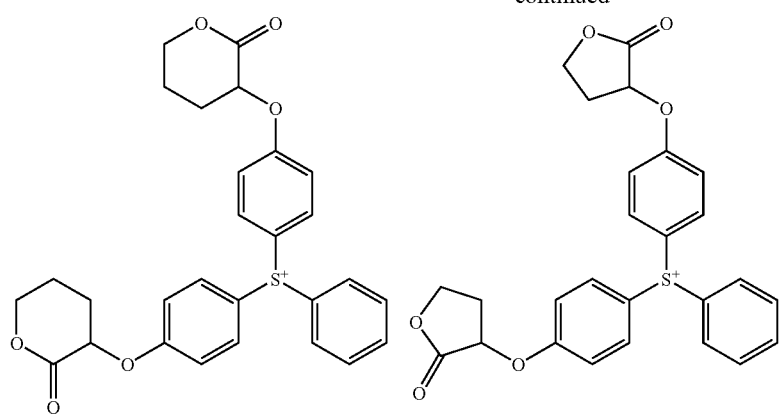
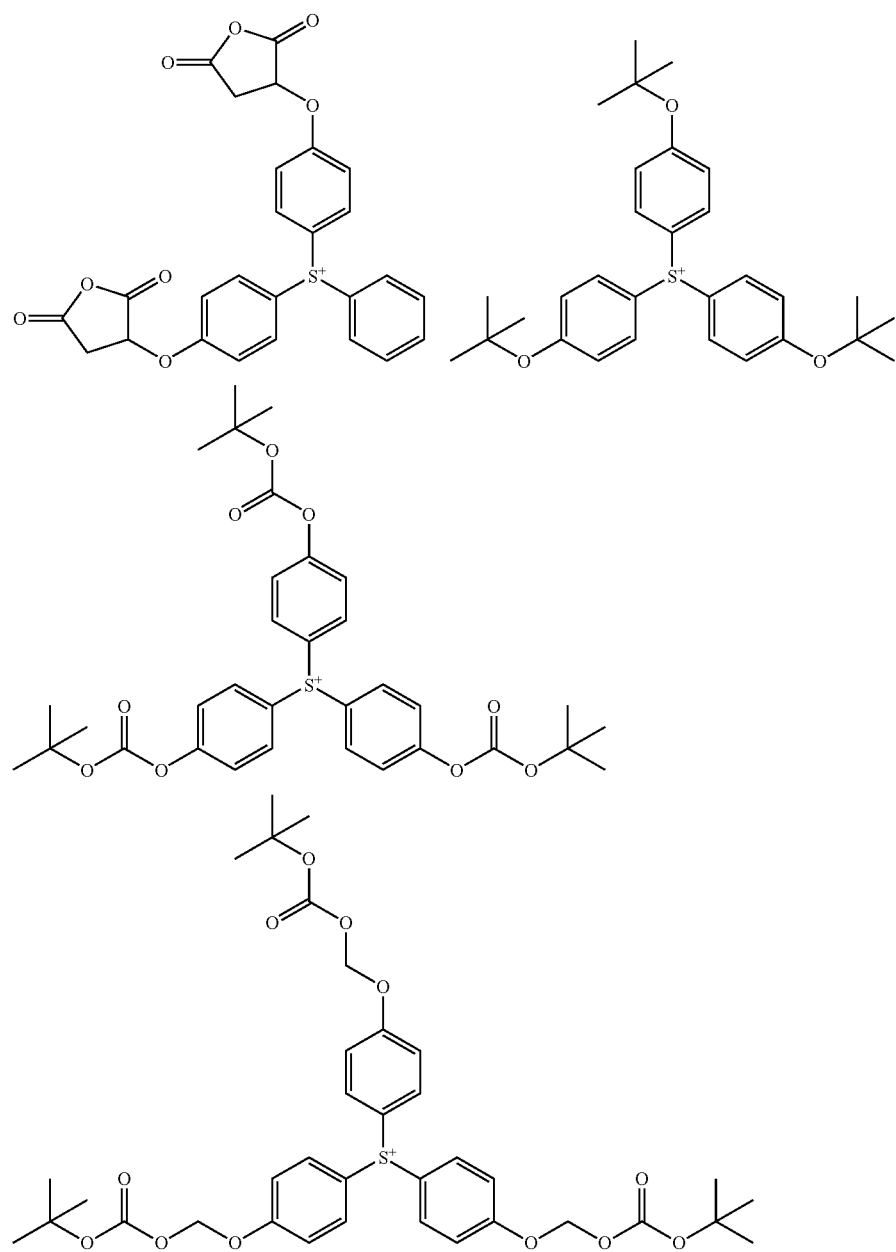

-continued
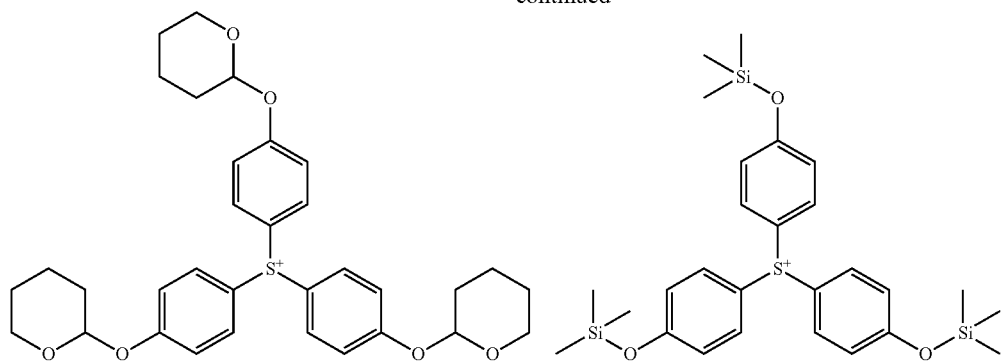
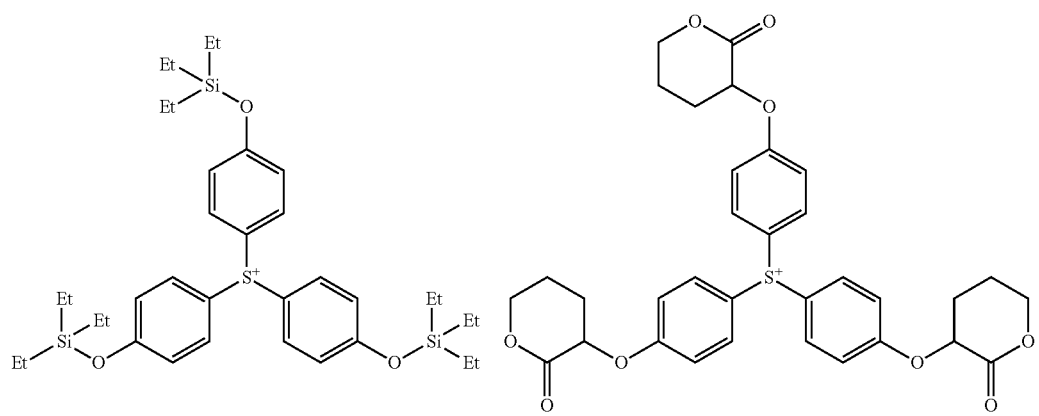
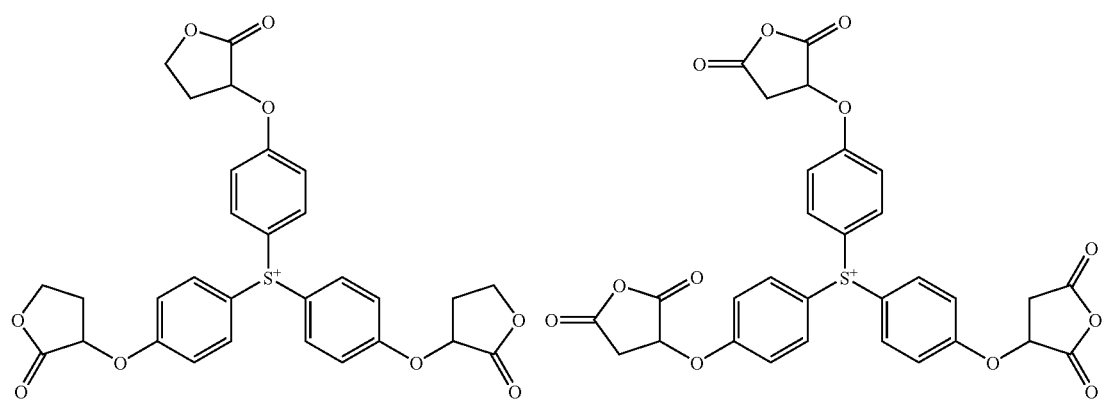
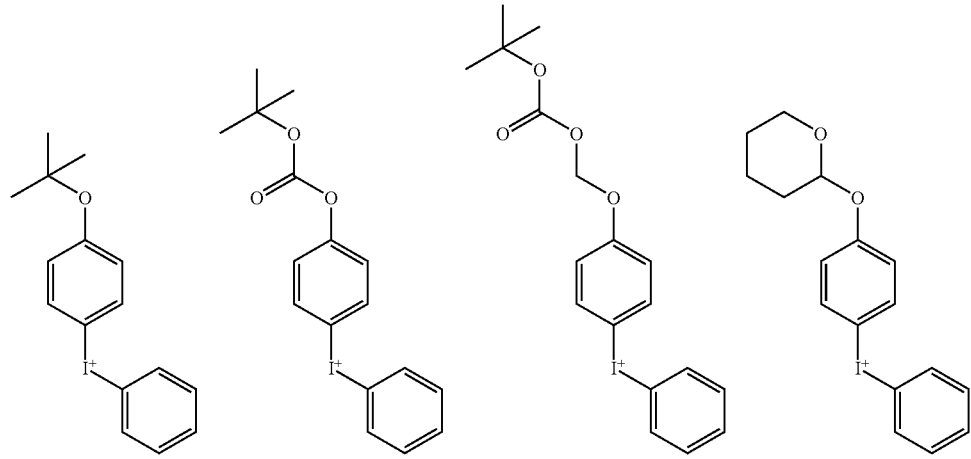

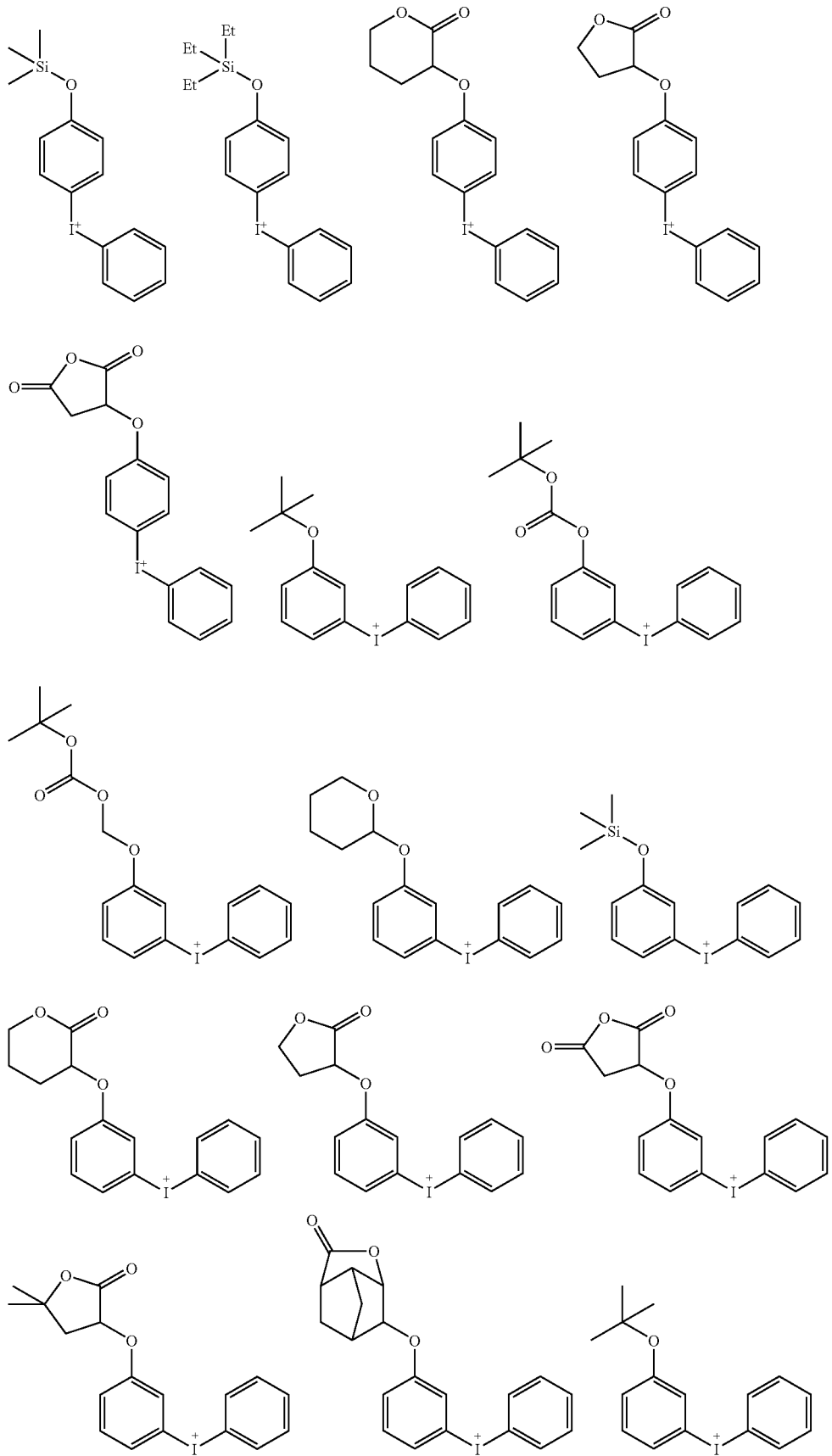

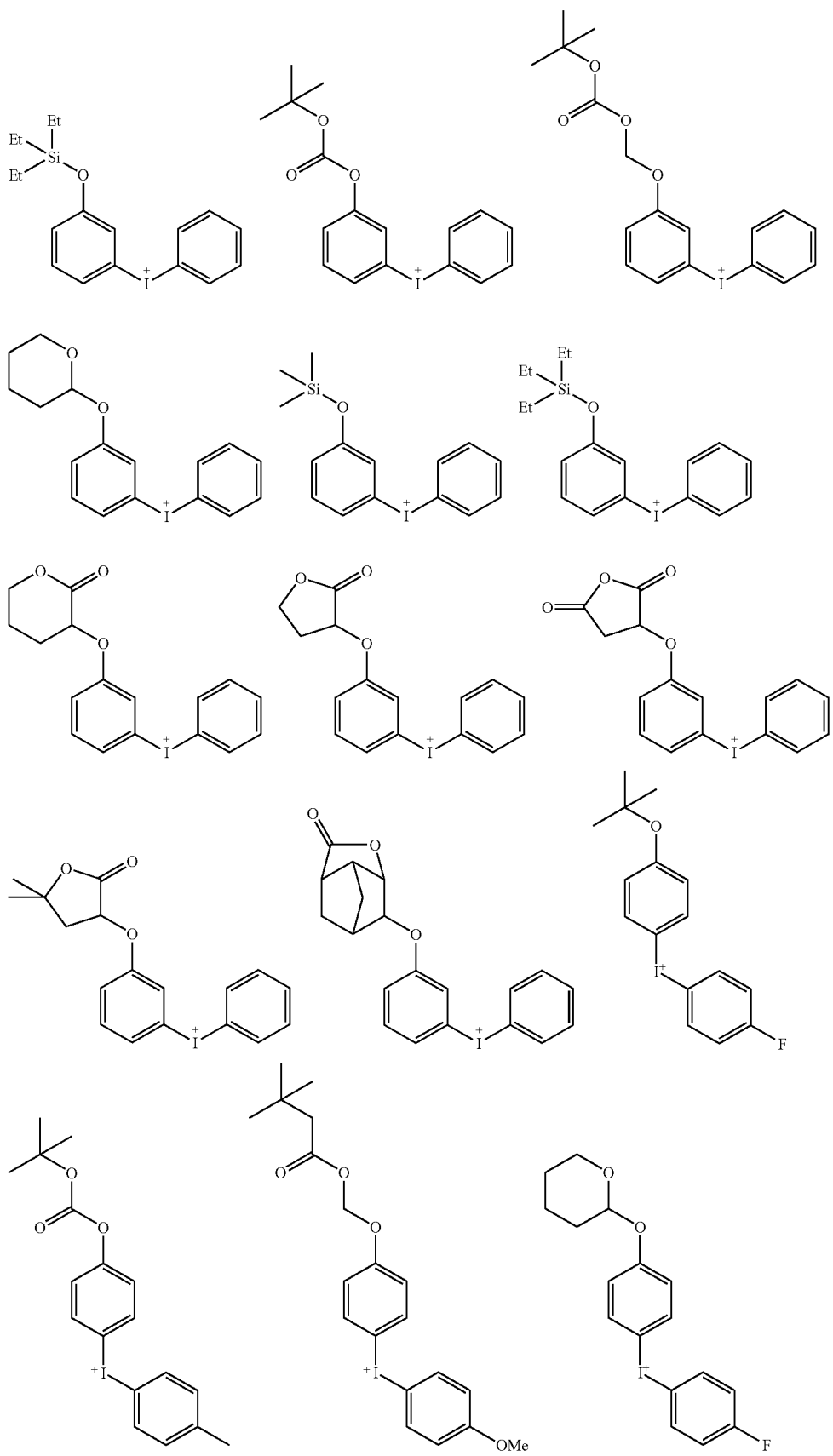

-continued
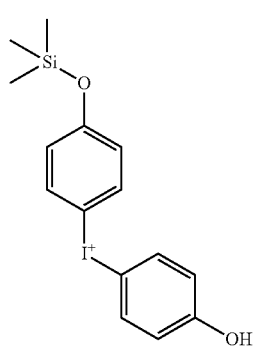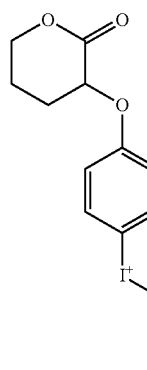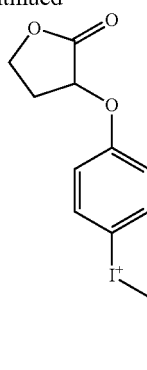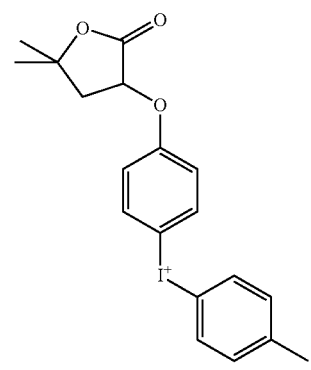
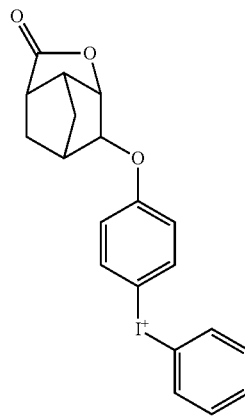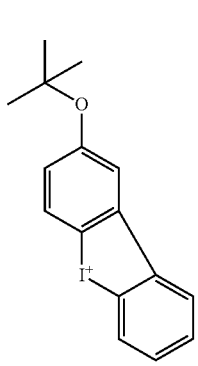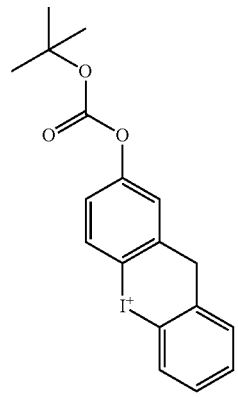
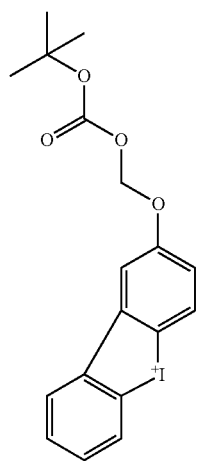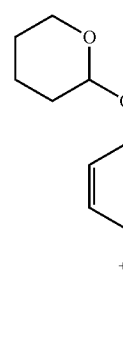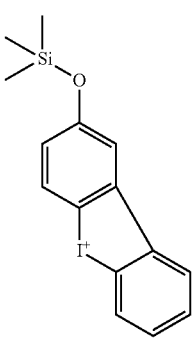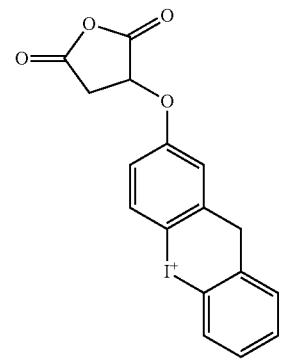
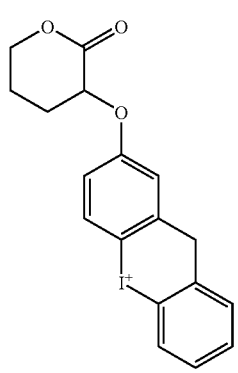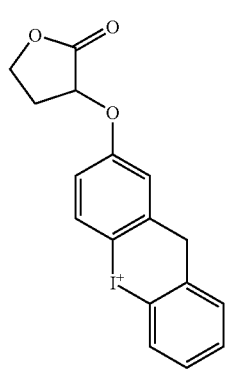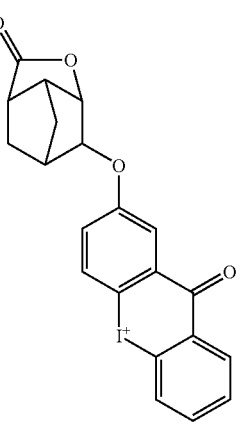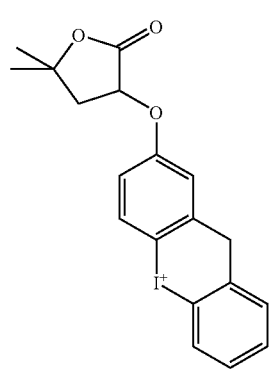

-continued
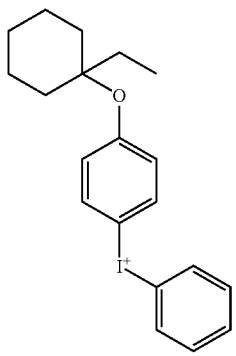 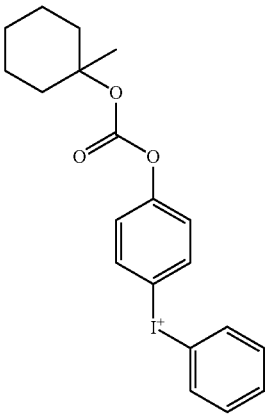 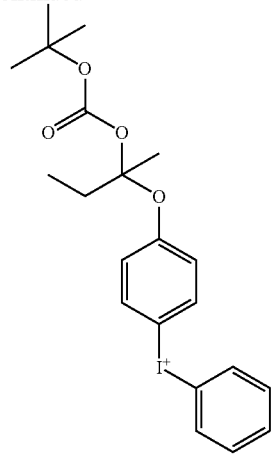 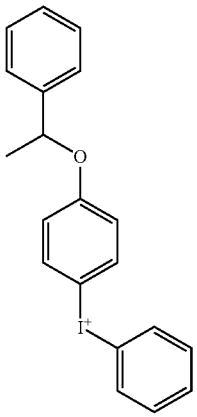
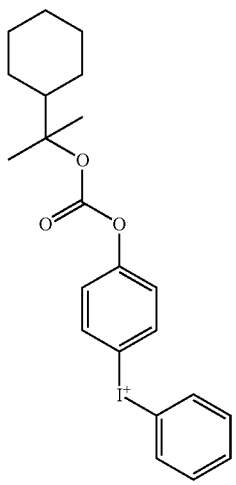 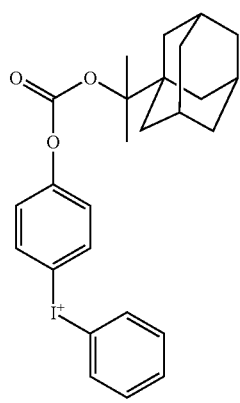 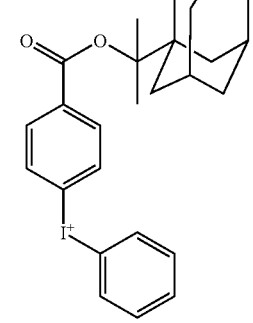 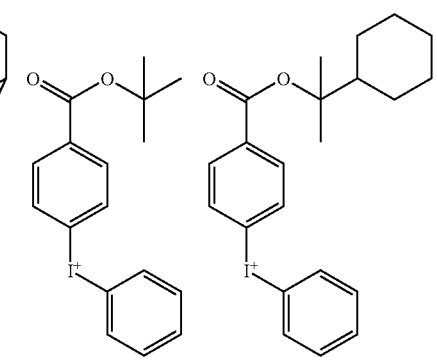
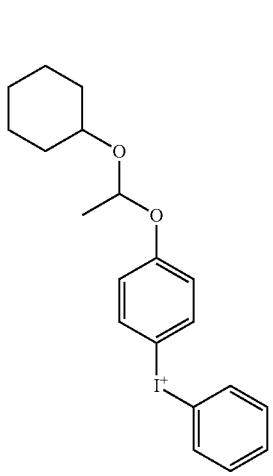 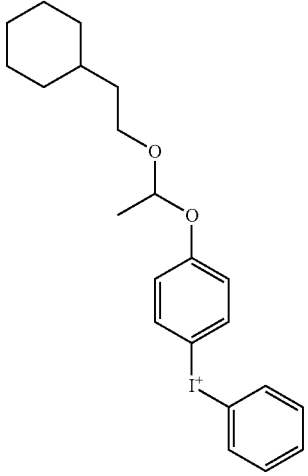 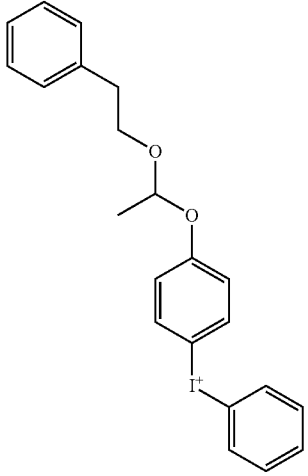

-continued
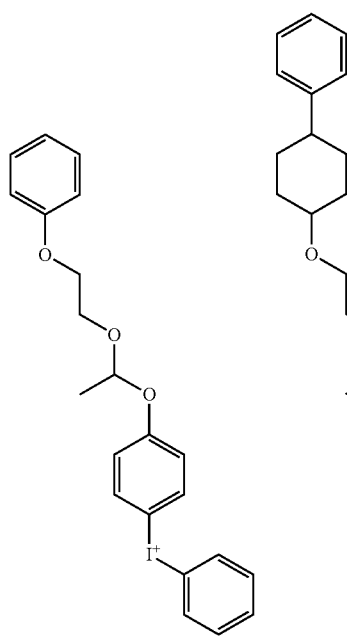
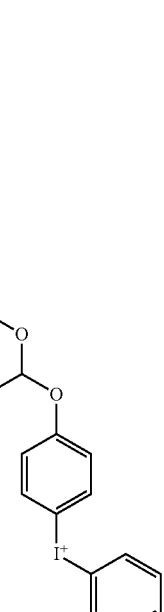
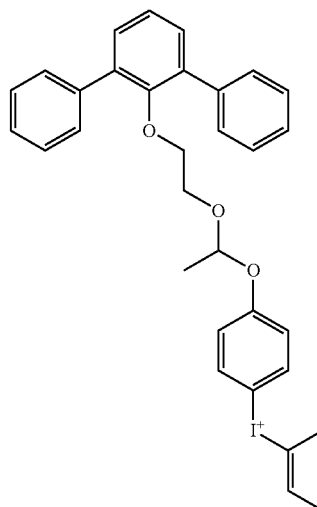
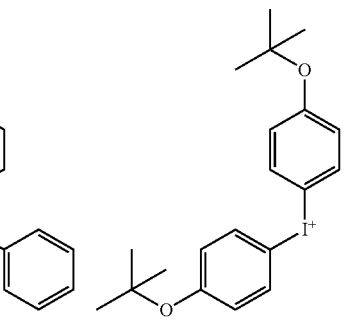
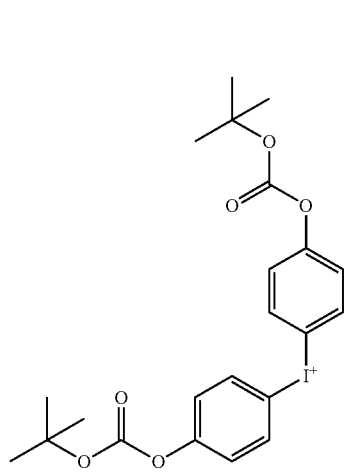
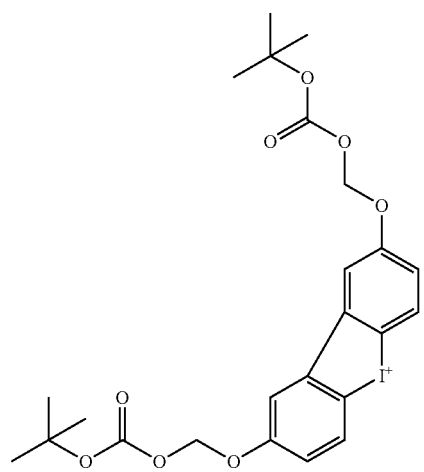
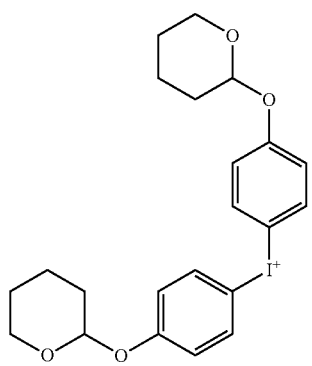
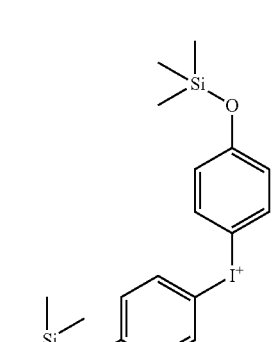
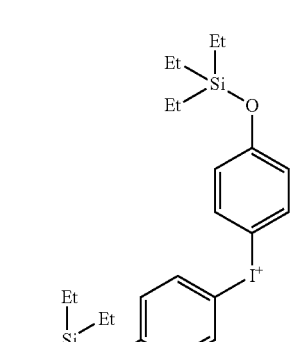
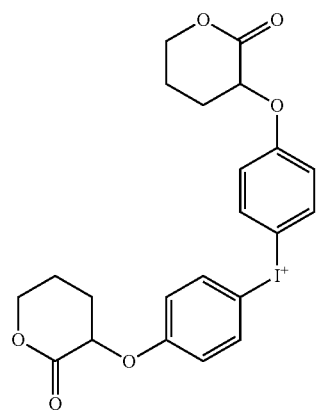

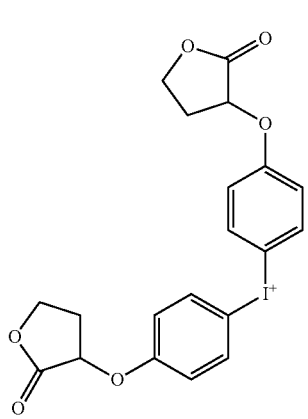
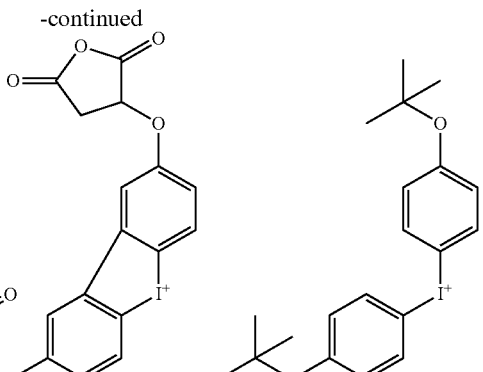
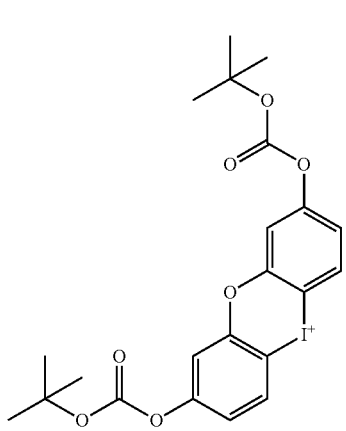
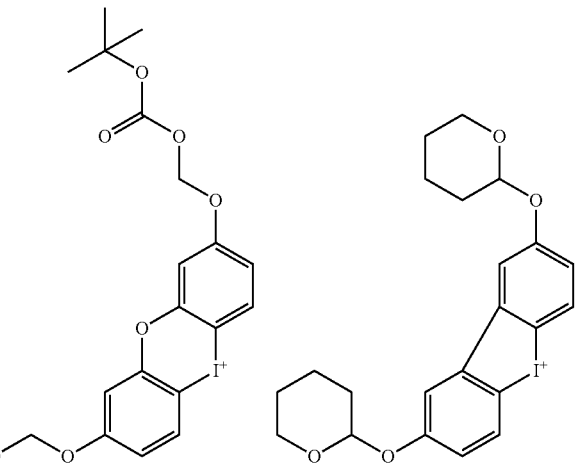
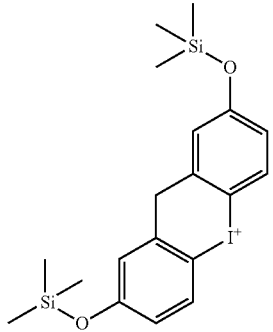
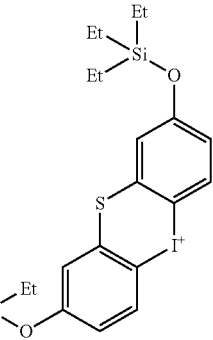

The repeating unit (A) is preferably a repeating unit represented by any one of the following formulae (III) to (V):

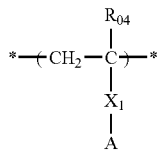

(III)

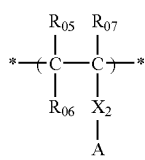

(IV)

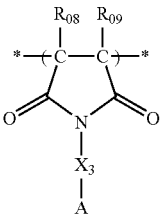

(V)

In the formulae (III) to (V), each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group.

$R_{06}$ represents a cyano group, a carboxyl group, —CO—$OR_{25}$ or —CO—N($R_{26}$)($R_{27}$). $R_{26}$ and $R_{27}$ may combine to form a ring together with the nitrogen atom.

Each of $X_1$ to $X_3$ independently represents a single bond, an arylene group, an alkylene group, a cycloalkylene group, —O—, —SO$_2$—, —CO—, —N(R$_{33}$)— or a divalent linking group formed by combining a plurality of these groups.

$R_{25}$ represents an alkyl group, a cycloalkyl group, an alkenyl group, an aryl group or an aralkyl group.

Each of $R_{26}$, $R_{27}$ and $R_{33}$ independently represents a hydrogen atom, an alkyl group, a cycloalkyl group, an alkenyl group, an aryl group or an aralkyl group.

A represents the above-described ionic structure moiety which produces an acid anion on the side chain upon irradiation with an actinic ray or radiation and in which the counter cation is a cation having an acid-decomposable group or an alkali-decomposable group.

In formulae (III) to (V), the alkyl group of $R_{04}$, $R_{05}$ and $R_{07}$ to $R_{09}$ is preferably an alkyl group having a carbon number of 20 or less which may have a substituent, such as methyl group, ethyl group, propyl group, isopropyl group, n-butyl group, sec-butyl group, hexyl group, 2-ethylhexyl group, octyl group and dodecyl group, more preferably an alkyl group having a carbon number of 8 or less.

The cycloalkyl group includes a cycloalkyl group which may be either monocyclic or polycyclic and is preferably a monocyclic cycloalkyl group having a carbon number of 3 to 8 which may have a substituent, such as cyclopropyl group, cyclopentyl group and cyclohexyl group.

The halogen atom includes a fluorine atom, a chlorine atom, a bromine atom and an iodine atom and is preferably a fluorine atom.

As for the alkyl group contained in the alkoxycarbonyl group, the same as those for the alkyl group in $R_{04}$, $R_{05}$ and $R_{07}$ to $R_{09}$ are preferred.

The alkyl group of $R_{25}$ to $R_{27}$ and $R_{33}$ is preferably an alkyl group having a carbon number of 20 or less which may have a substituent, such as methyl group, ethyl group, propyl group, isopropyl group, n-butyl group, sec-butyl group, hexyl group, 2-ethylhexyl group, octyl group and dodecyl group, more preferably an alkyl group having a carbon number of 8 or less.

The cycloalkyl group includes a cycloalkyl group which may be either monocyclic or polycyclic and is preferably a monocyclic cycloalkyl group having a carbon number of 3 to 8 which may have a substituent, such as cyclopropyl group, cyclopentyl group and cyclohexyl group.

The alkenyl group is preferably an alkenyl group having a carbon number of 2 to 6 which may have a substituent, such as vinyl group, propenyl group, allyl group, butenyl group, pentenyl group, hexenyl group and cyclohexenyl group.

The aryl group is preferably a monocyclic or polycyclic aromatic group having a carbon number of 6 to 14 which may have a substituent, and specific examples thereof include a phenyl group, a tolyl group, a chlorophenyl group, a methoxyphenyl group and a naphthyl group. The aryl groups may combine with each other to form a heterocyclic ring.

The aralkyl group includes an aralkyl group having a carbon number of 7 to 15 which may have a substituent, such as benzyl group, phenethyl group and cumyl group.

The ring formed together with the nitrogen atom by combining $R_{26}$ and $R_{27}$ is preferably a 5- to 8-membered ring, and specific examples thereof include pyrrolidine, piperidine and piperazine.

The arylene group of $X_1$ to $X_3$ is preferably an arylene group having a carbon number of 6 to 14 which may have a substituent, and specific examples thereof include a phenylene group, a tolylene group and a naphthylene group.

The alkylene group is preferably an alkylene group having a carbon number of 1 to 8, such as methylene group, ethylene group, propylene group, butylene group, hexylene group and octylene group.

The cycloalkylene group is preferably a cycloalkylene group having a carbon number of 5 to 8 which may have a substituent, such as cyclopentylene group and cyclohexylene group.

Each of the groups in formulae (III) to (V) may have a substituent, and preferred examples of the substituent include a hydroxyl group, a halogen atom (e.g., fluorine, chlorine, bromine, iodine), a nitro group, a cyano group, an amido group, a sulfonamido group, the alkyl group described for $R_{04}$ to $R_{09}$, $R_{25}$ to $R_{27}$ and $R_{33}$, an alkoxy group (e.g., methoxy, ethoxy, hydroxyethoxy, propoxy, hydroxypropoxy, butoxy), an alkoxycarbonyl group (e.g., methoxycarbonyl, ethoxycarbonyl), an acyl group (e.g., formyl, acetyl, benzoyl), an acyloxy group (e.g., acetoxy, butyryloxy), and a carboxy group. The carbon number of the substituent is preferably 8 or less.

The repeating unit (A) preferably has an ionic structure moiety which decomposes upon irradiation with an actinic ray or radiation to produce an acid anion on the resin side chain and in which the counter cation is represented by formula (a) or (b). More specifically, the repeating unit (A) is preferably a group represented by the following formulae (III-1) to (VI-3):

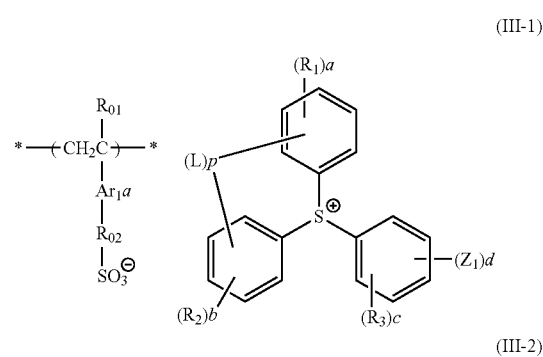

(III-1)

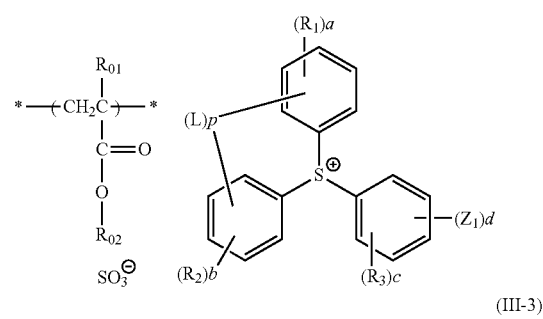

(III-2)

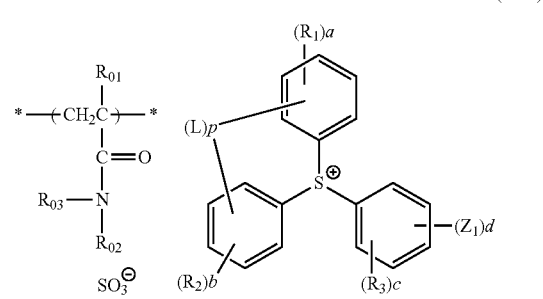

(III-3)

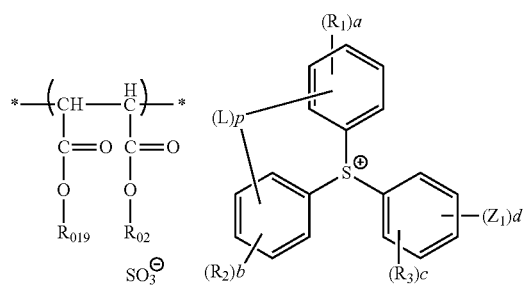

(IV-1)

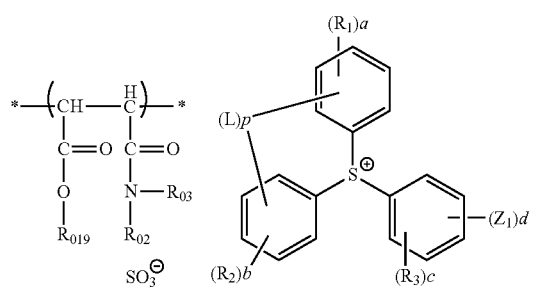

(IV-2)

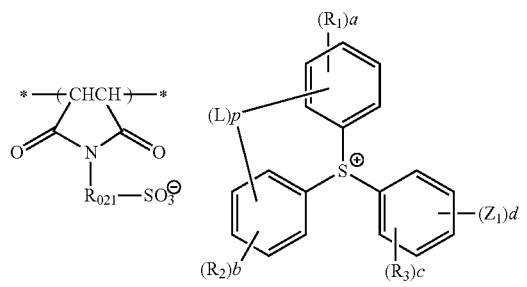

(IV-3)

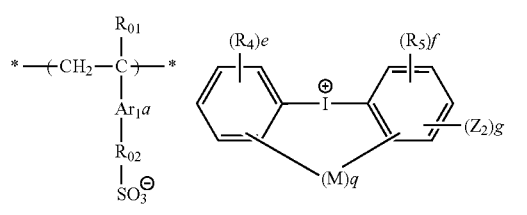

(V-1)

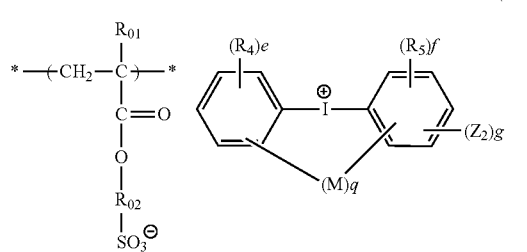

(V-2)

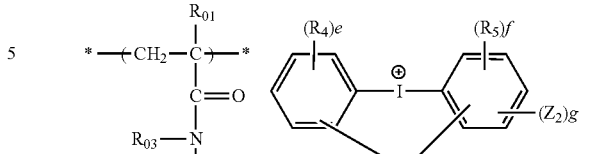

(V-3)

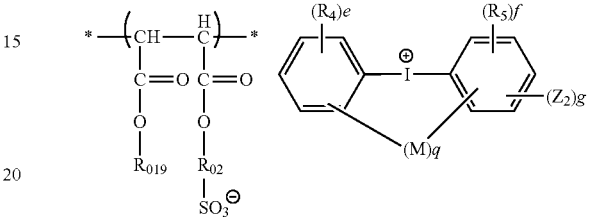

(VI-1)

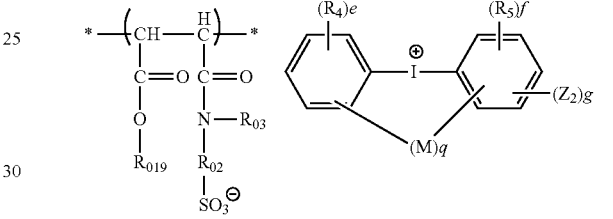

(VI-2)

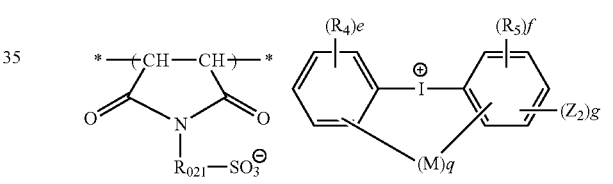

(VI-3)

In the formulae above, $Ar_1a$ represents an arylene group which may have a substituent, similar to the arylene group of $X_1$ to $X_3$.

$R_{01}$ represents a hydrogen atom, a methyl group, a chloromethyl group, a trifluoromethyl group or a cyano group.

Each of $R_{02}$ and $R_{021}$ represents a single bond, an arylene group, an alkylene group, a cycloalkylene group, —O—, —SO$_2$—, —CO—, —N(R$_{33}$)— or a divalent linking group formed by combining a plurality of these groups, similar to those of $X_1$ to $X_3$. Preferred examples and specific examples are also the same as those described for $X_1$ to $X_3$. $R_{33}$ is as described above.

Each of $R_{03}$ and $R_{019}$ independently represents a hydrogen atom, an alkyl group, a cycloalkyl group, an aryl group or an aralkyl group. Examples of the alkyl group and cycloalkyl group are the same as those of the alkyl group and cycloalkyl group as $R_{01}$ to $R_{03}$ in formula (I) described later, and examples of the aryl group and aralkyl group are the same as those of the aryl group and aralkyl group as $L_1$ and $L_2$ in formula (II) described later.

$R_1$ to $R_5$, $Z_1$, $Z_2$, L, M, a to g, p and q are the same as those in formulae (a) and (b).

Specific preferred examples of the repeating unit (A) having an anion moiety (corresponding to an acid anion produced upon irradiation with an actinic ray or radiation) of the ionic structure moiety are set forth below.

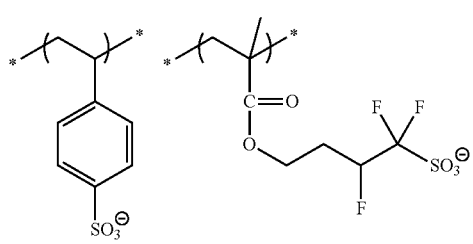
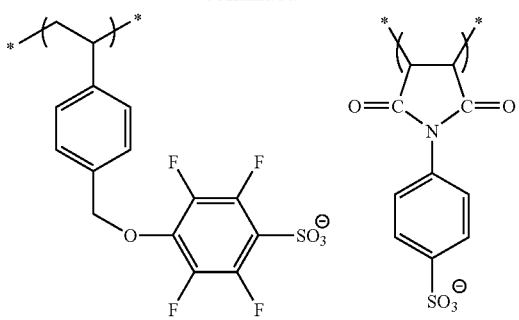
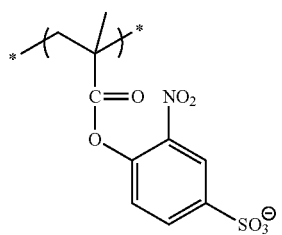
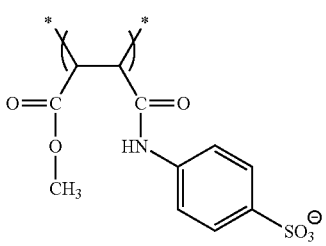
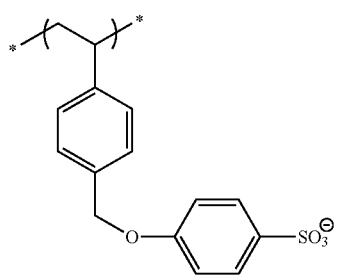
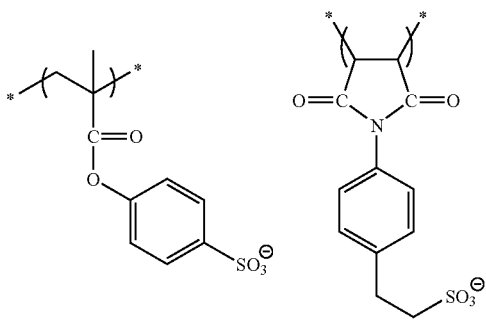
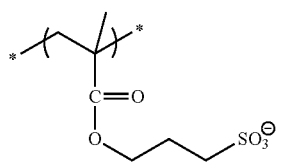
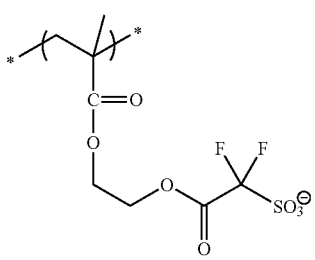
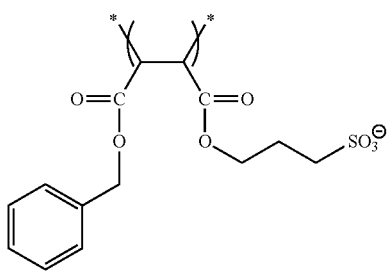
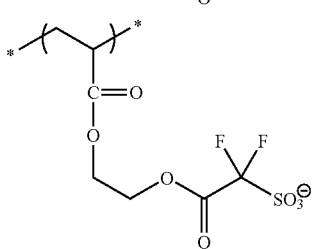
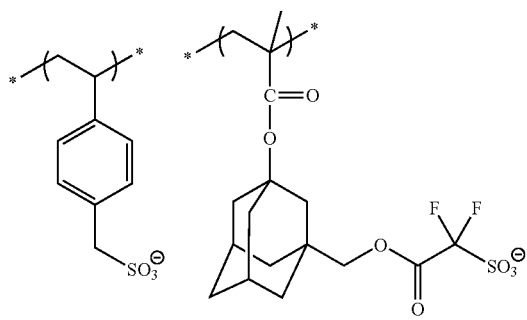
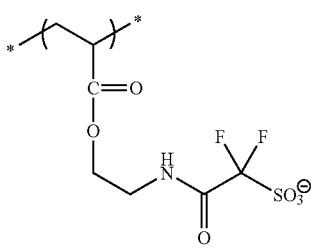

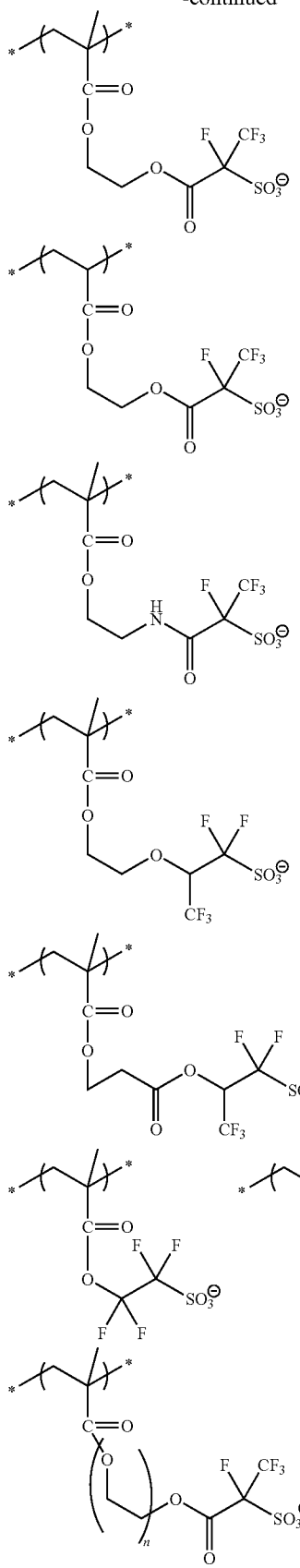
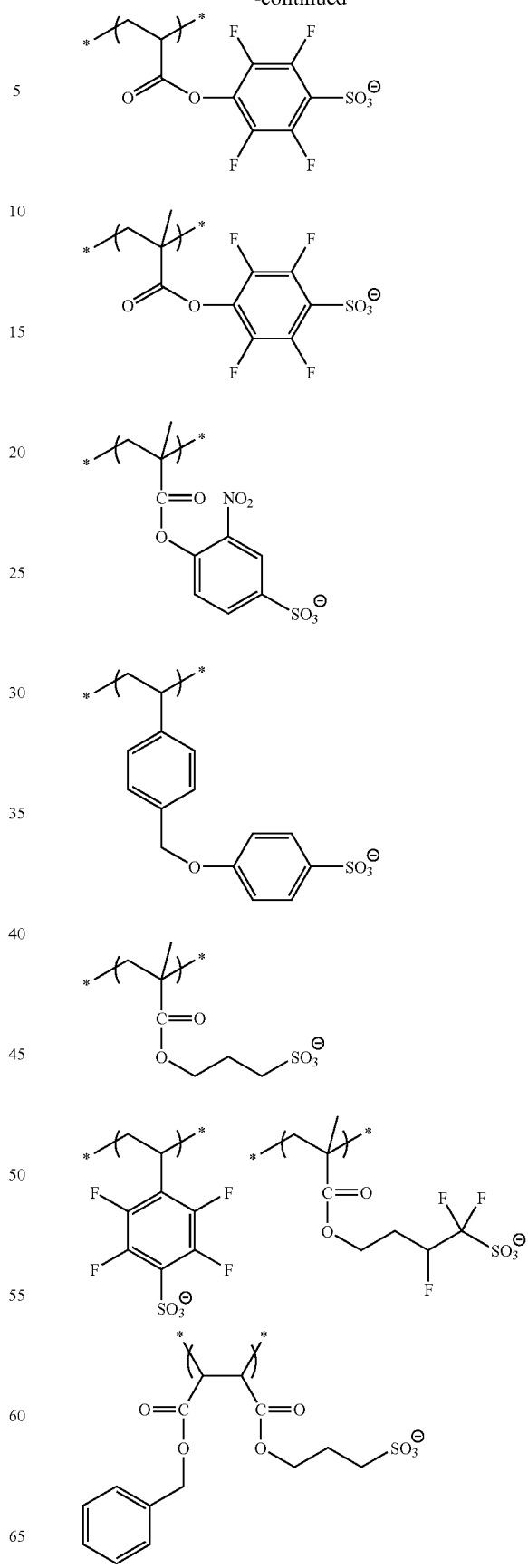
n is an integer of 0 to 10.

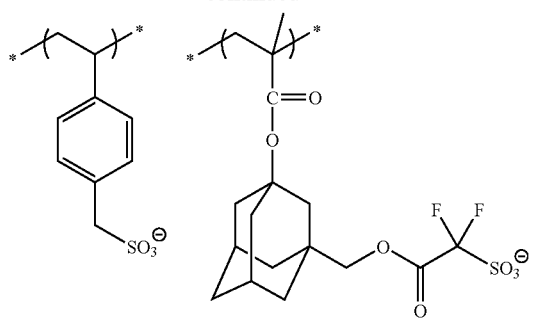
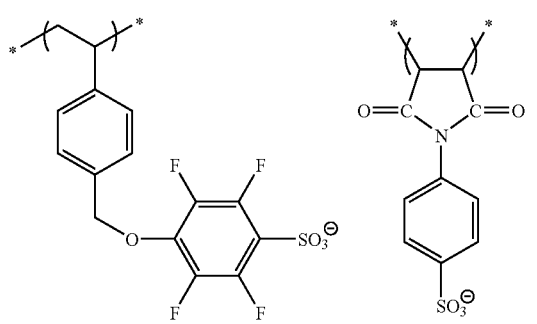
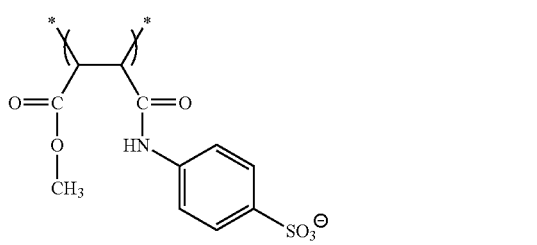
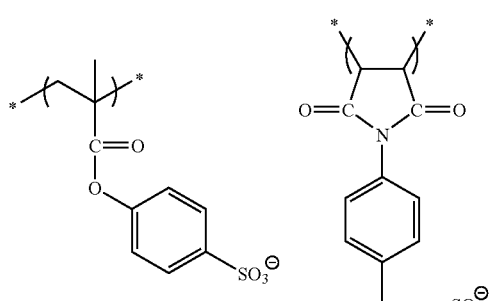
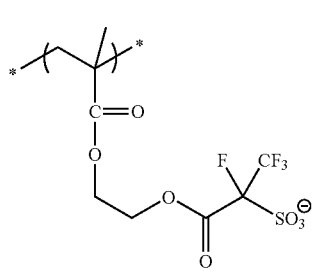
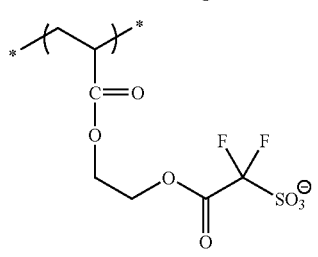
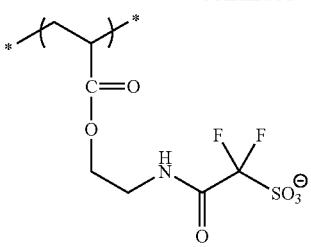
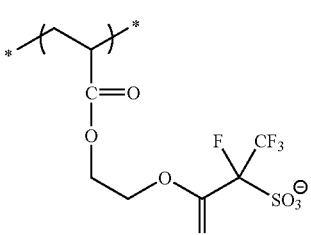
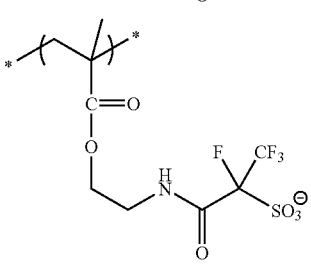
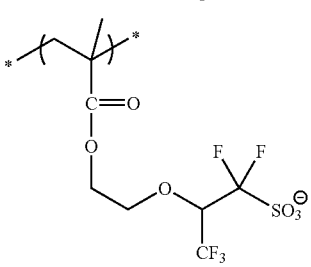
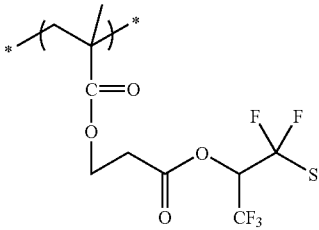
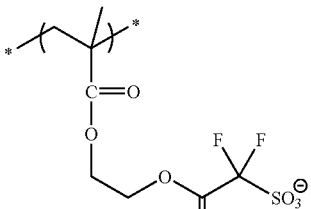
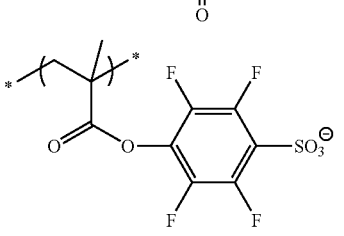

-continued

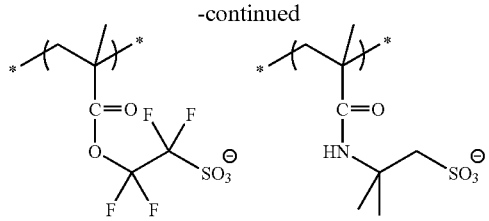

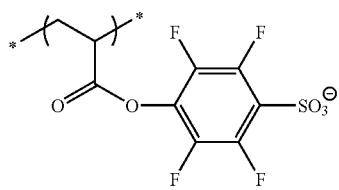

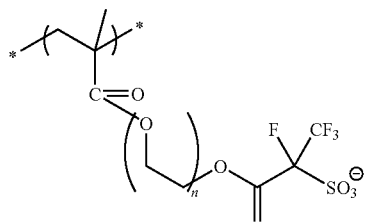

n is an integer of 0 to 10.

The content of the repeating unit (A) in the resin of the present invention is preferably from 0.5 to 80 mol %, more preferably from 1 to 60 mol %, still more preferably from 3 to 40 mol %, based on all repeating units.

The method for synthesizing a monomer corresponding to the repeating unit (A) is not particularly limited, but examples thereof include a method of exchanging a polymerizable unsaturated bond-containing acid anion corresponding to the repeating unit with a halide of a known onium salt.

More specifically, a metal ion salt (e.g., sodium ion, potassium ion) or ammonium salt (e.g., ammonium salt, triethylammonium salt) of a polymerizable unsaturated bond-containing acid corresponding to the repeating unit is subjected to an anion exchange reaction with an onium salt having a halogen ion (e.g., chloride ion, bromide ion, iodide ion) under stirring in the presence of water or methanol and then to a liquid separation/washing operation using an organic solvent such as dichloromethane, chloroform, ethyl acetate, methyl isobutyl ketone and tetrahydroxyfuran, and water, whereby a monomer corresponding to the objective repeating unit (A) can be synthesized.

The monomer may also be synthesized by performing the anion exchange reaction under stirring in the presence of an organic solvent separable from water, such as dichloromethane, chloroform, ethyl acetate, methyl isobutyl ketone and tetrahydroxyfuran, and water and then subjecting the reaction product to a liquid separation/washing operation using water.

Specific examples of the repeating unit represented by any one of formulae (III) to (V) are set forth below, but the present invention is not limited thereto.

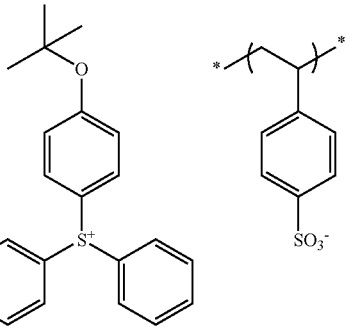

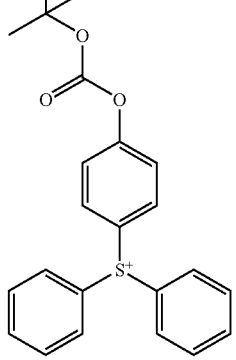

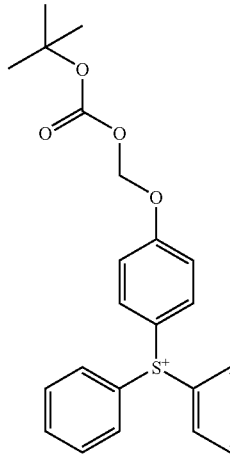

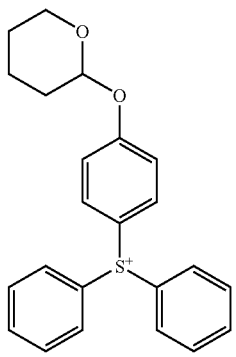

63
-continued
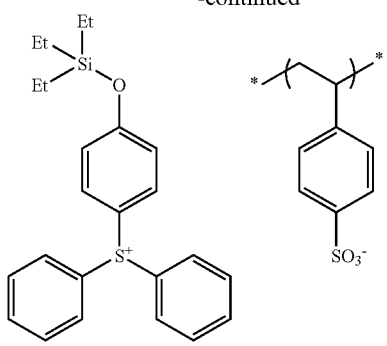
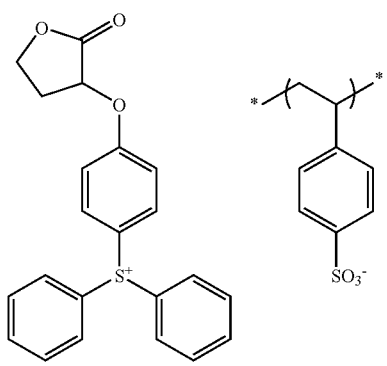
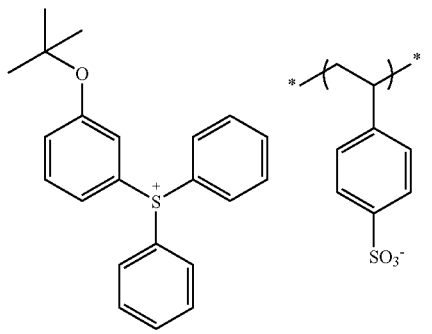
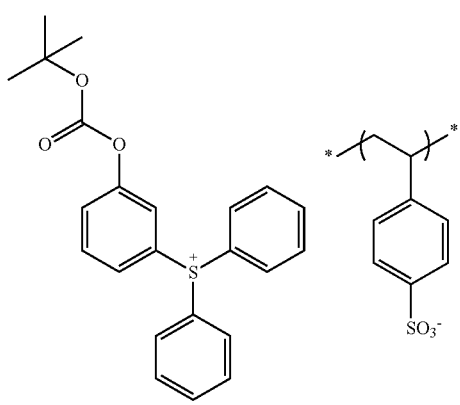
64
-continued
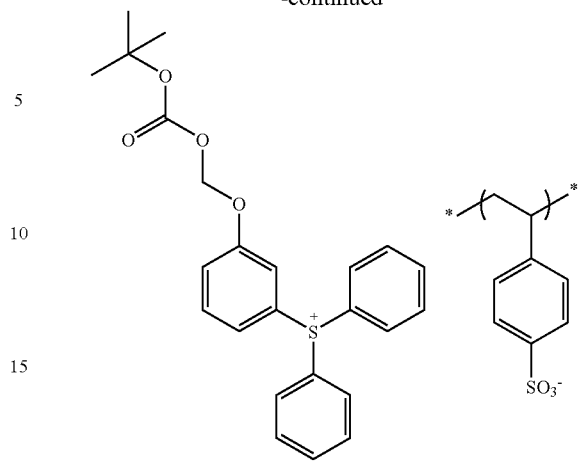

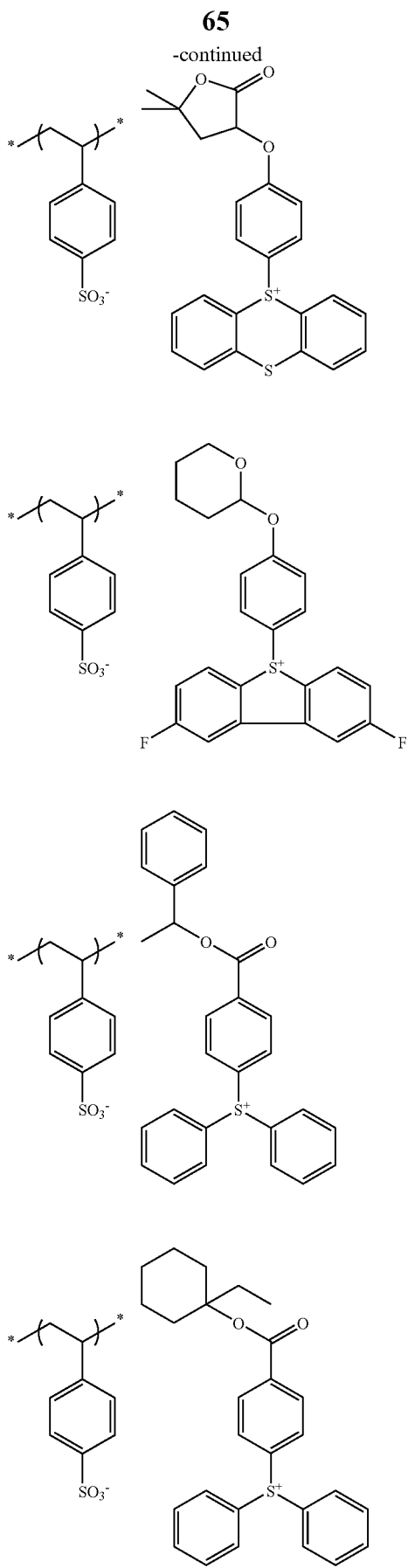
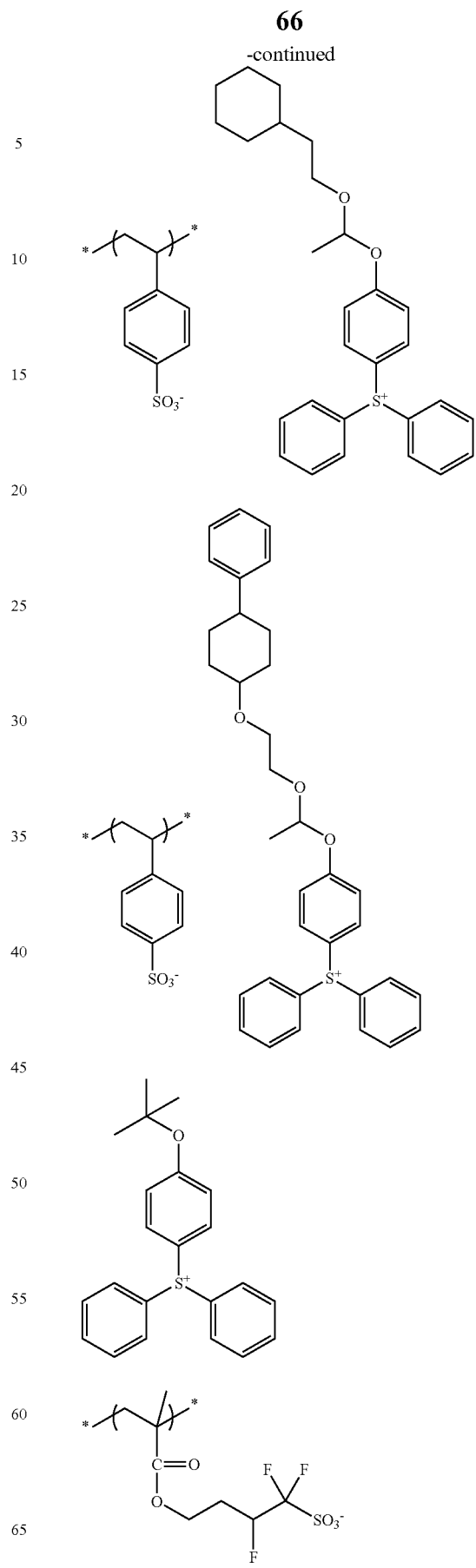

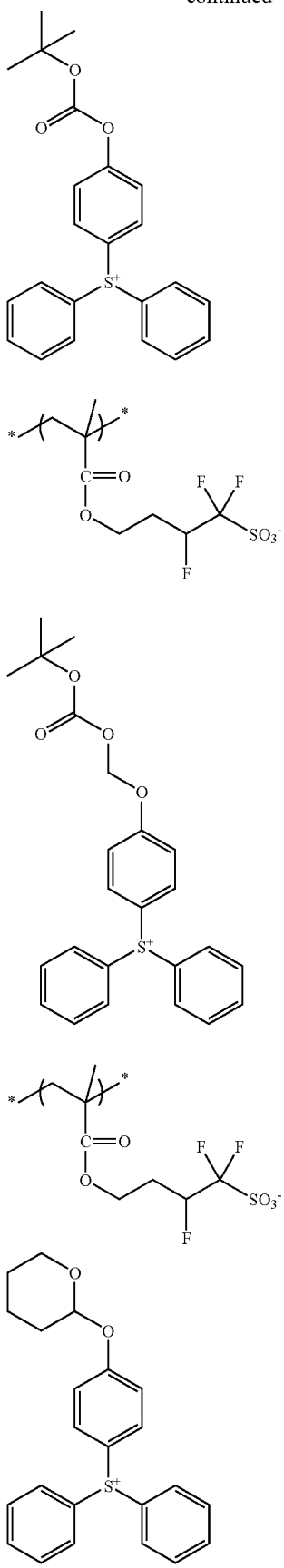
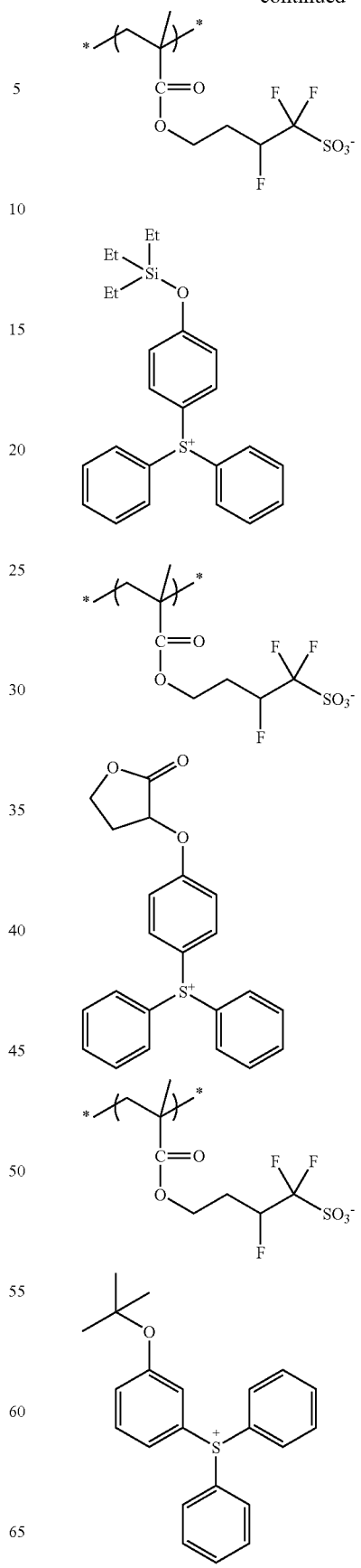

69
-continued
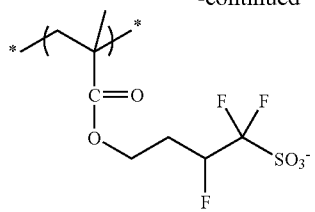
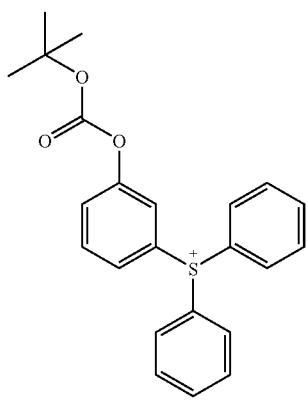
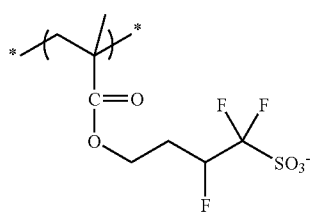
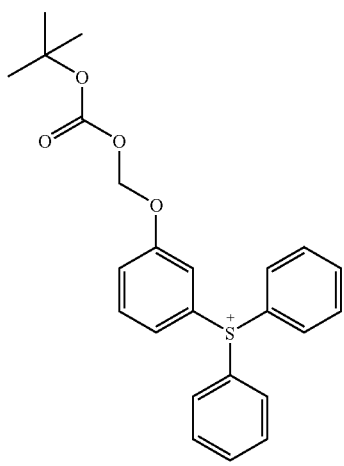
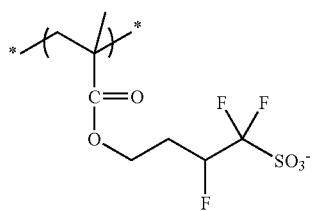
70
-continued
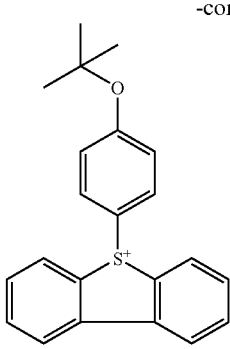
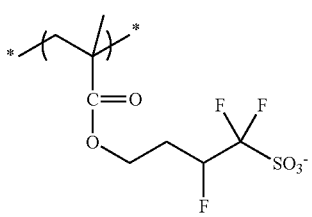
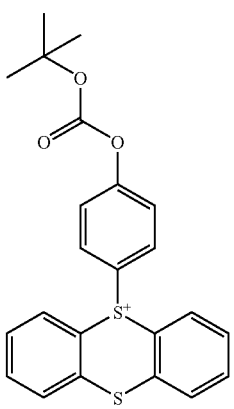
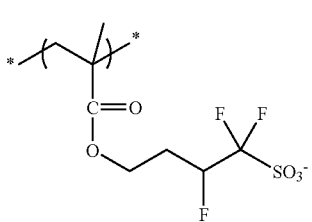
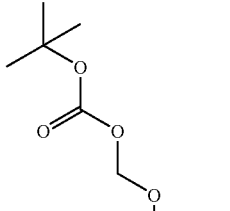
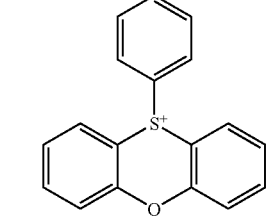

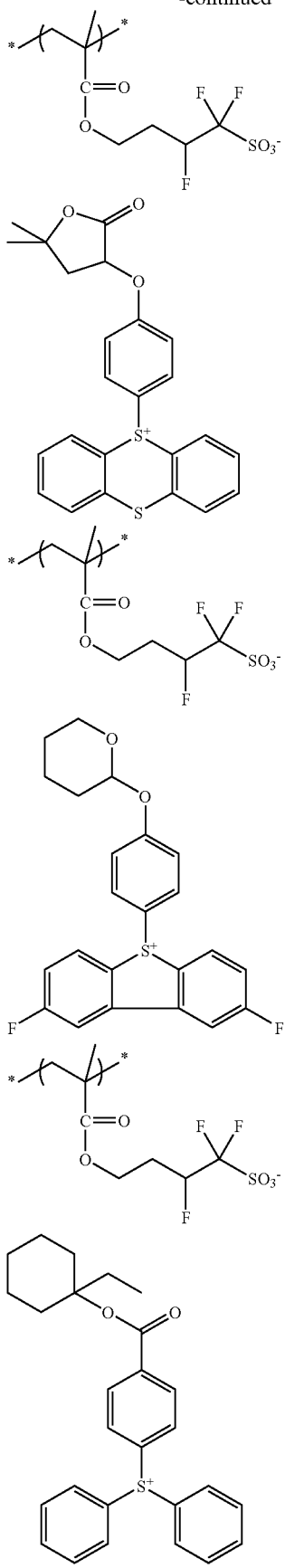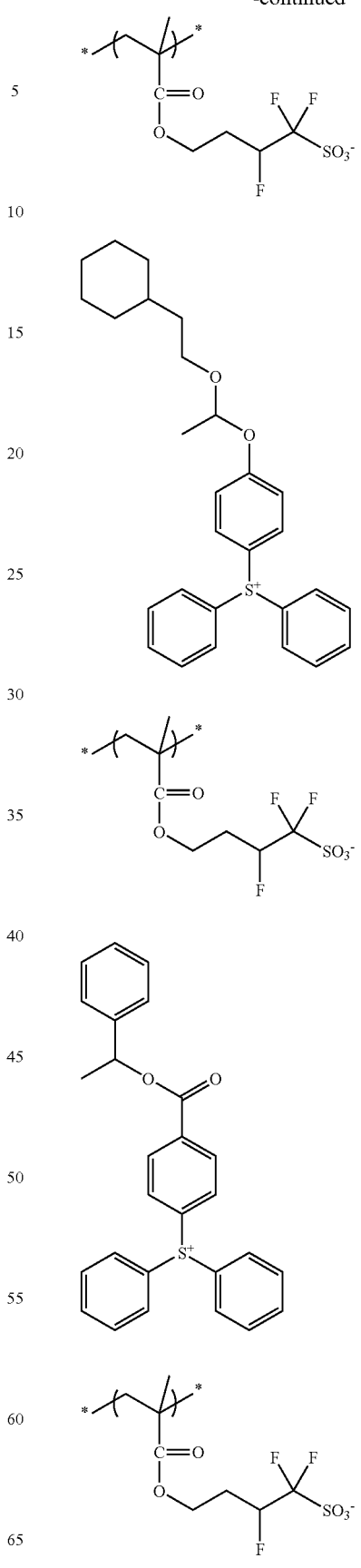

73
-continued
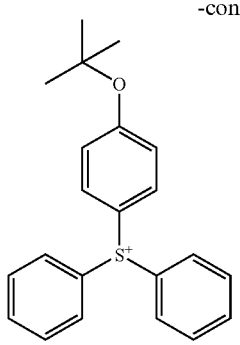
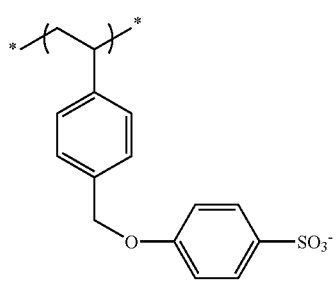
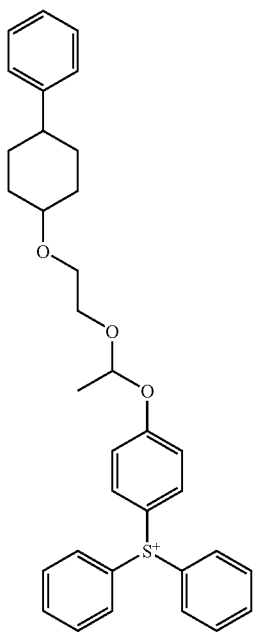
74
-continued
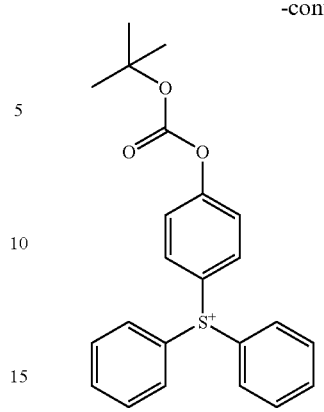
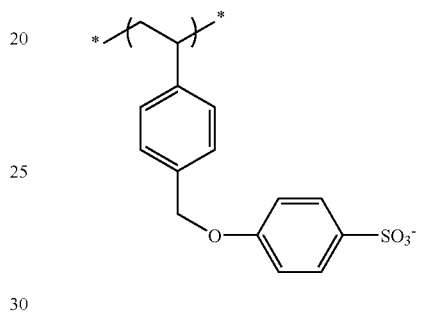
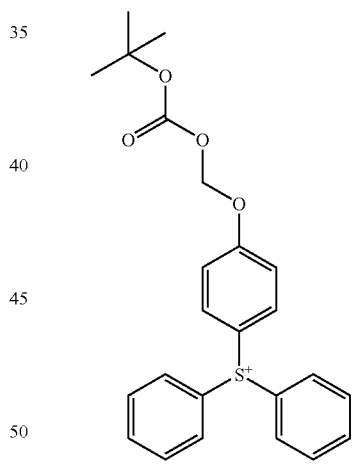
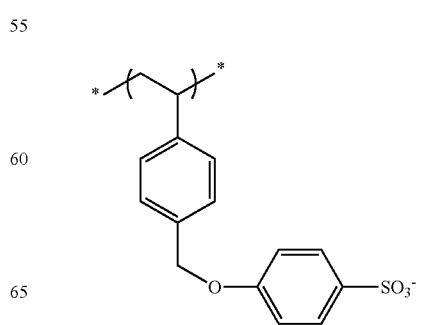
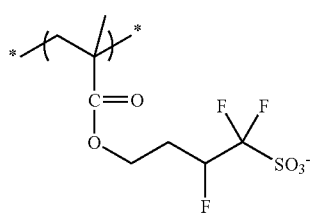

75
-continued
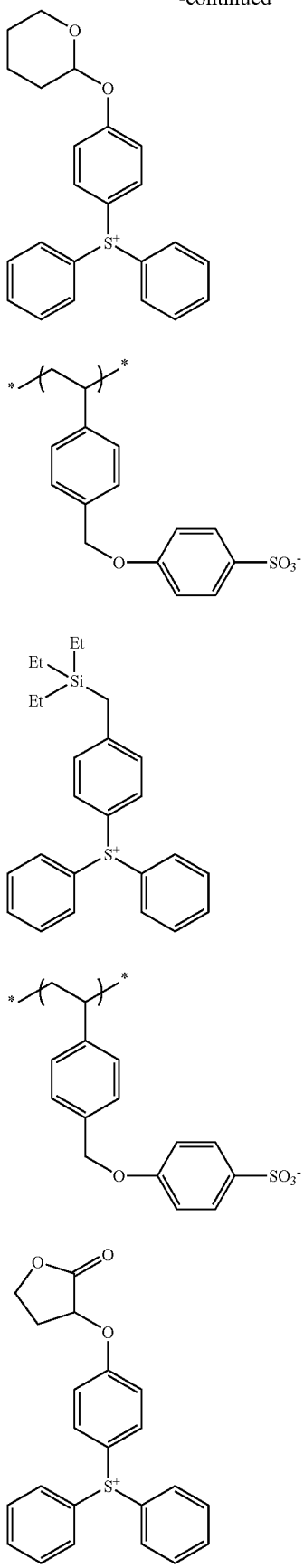
76
-continued
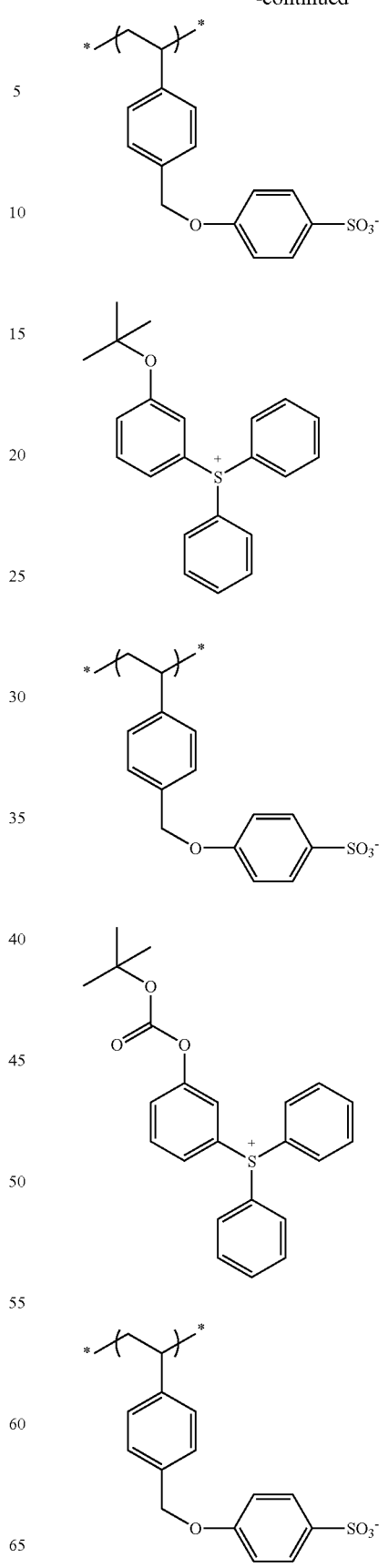

77
-continued
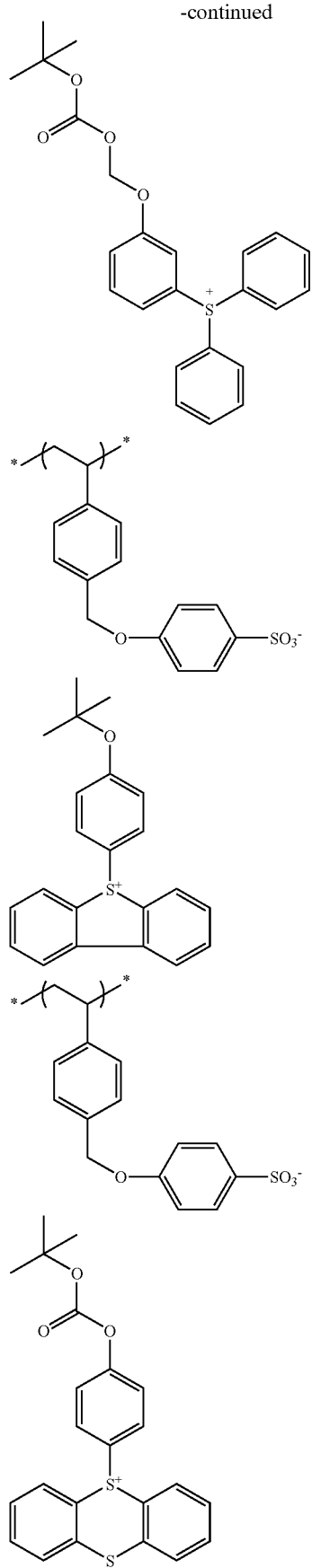
78
-continued
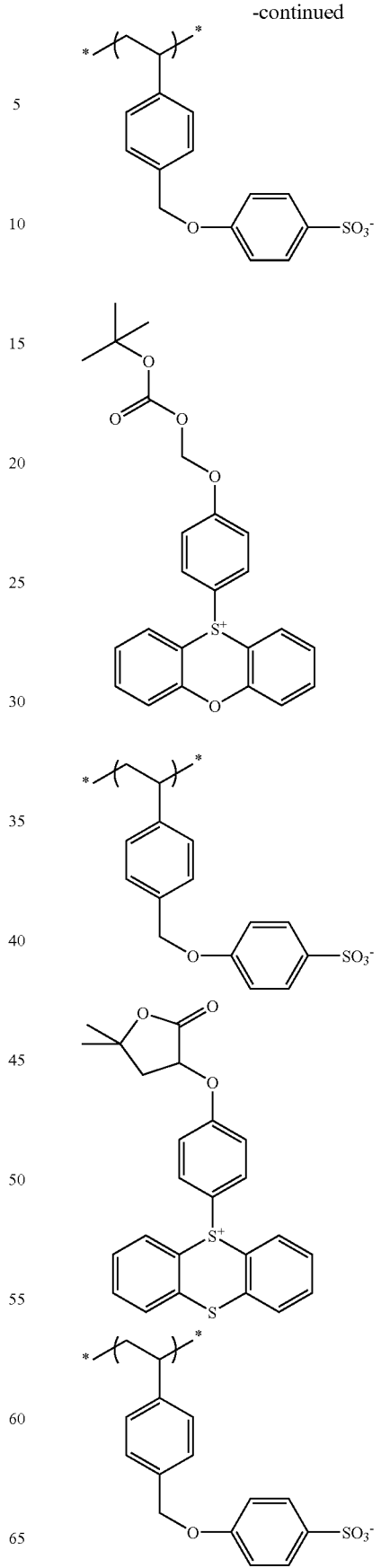

79
-continued
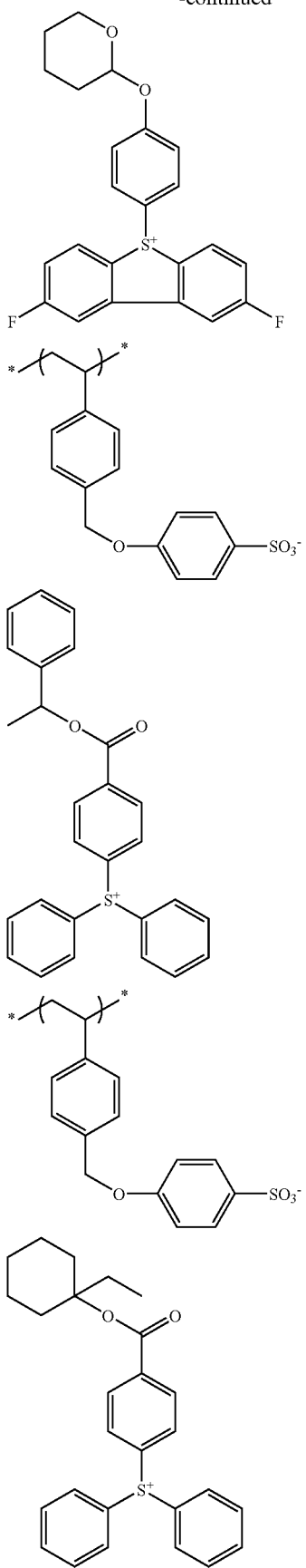
80
-continued
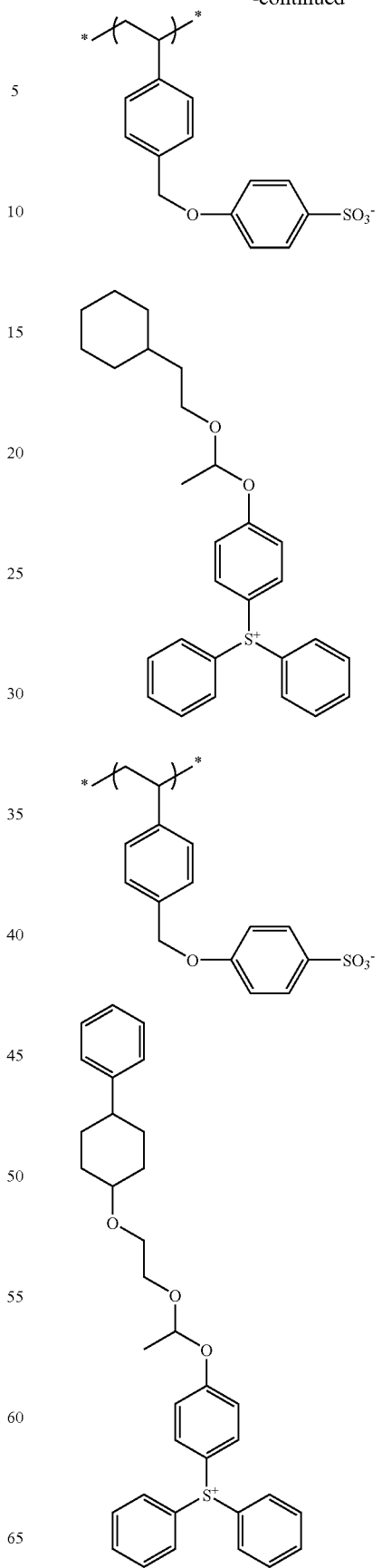

81
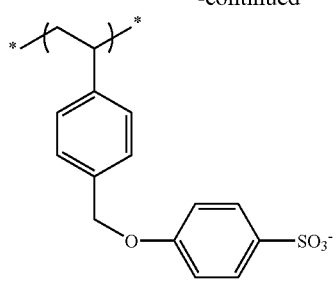
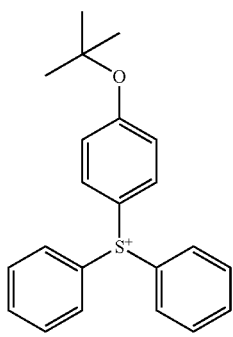
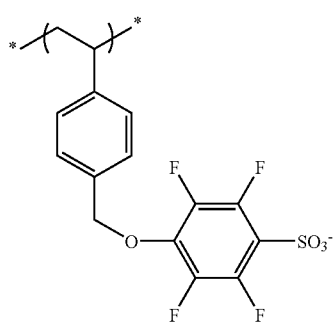
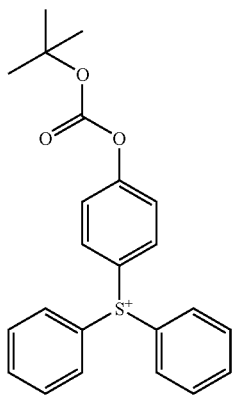
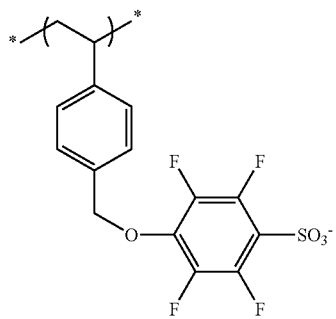
82
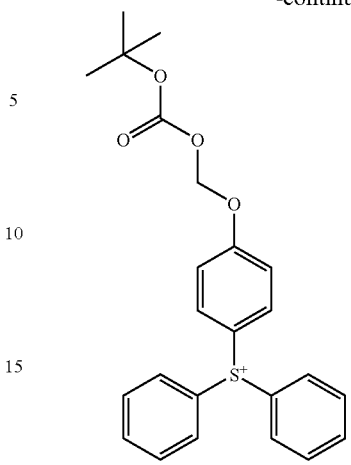
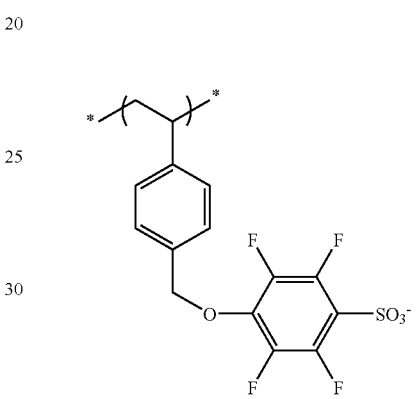
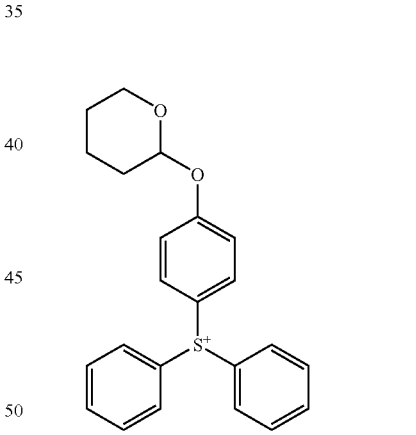
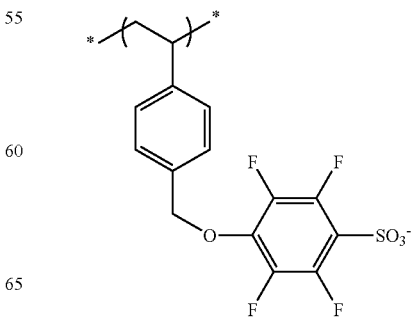

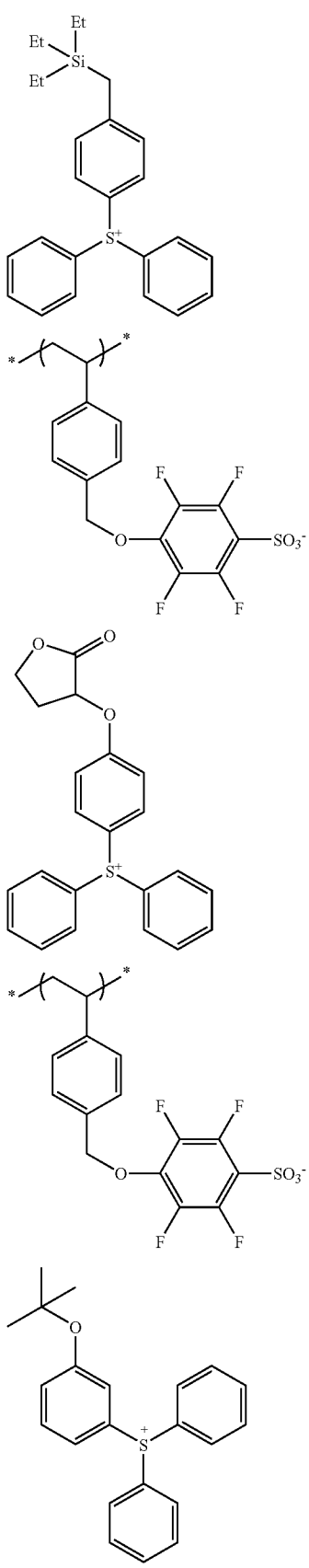
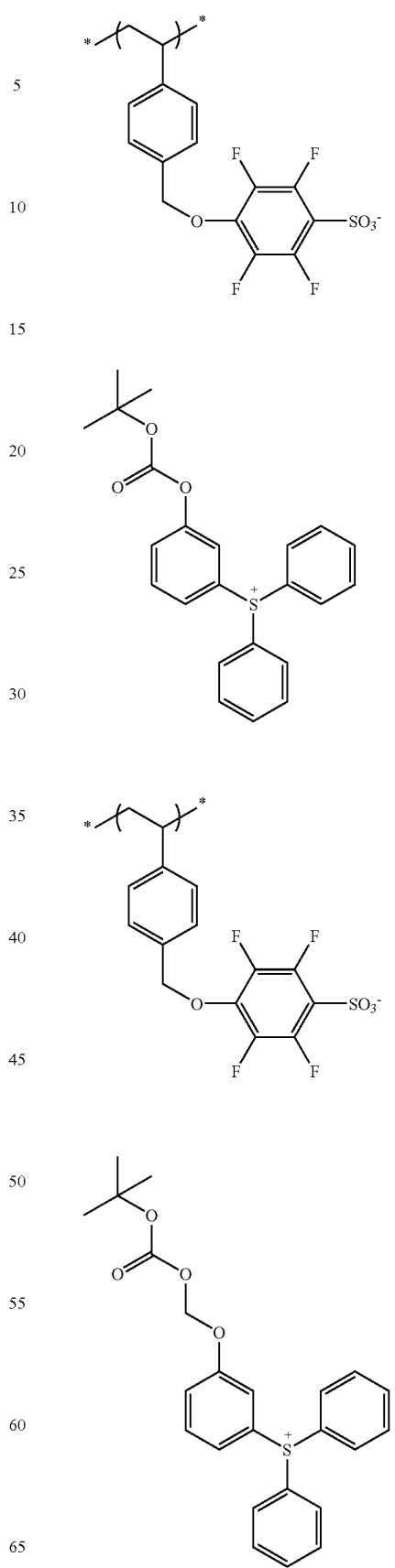

85
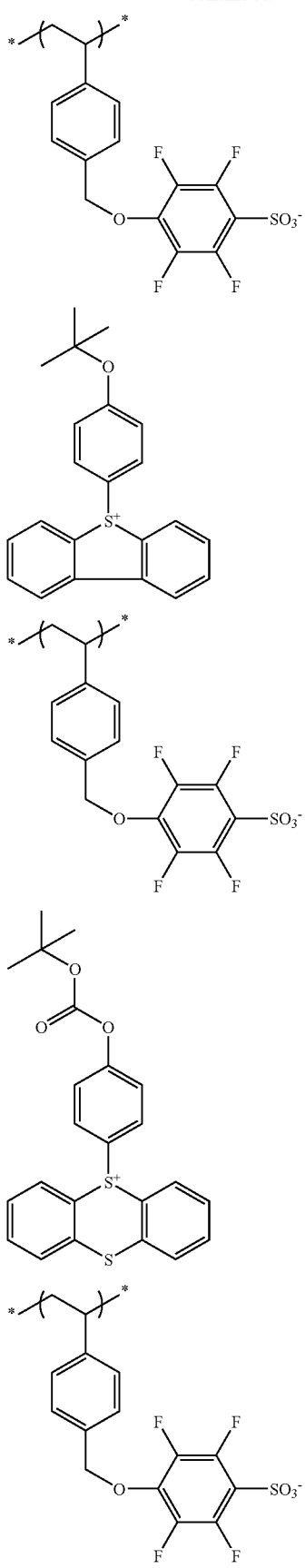
86
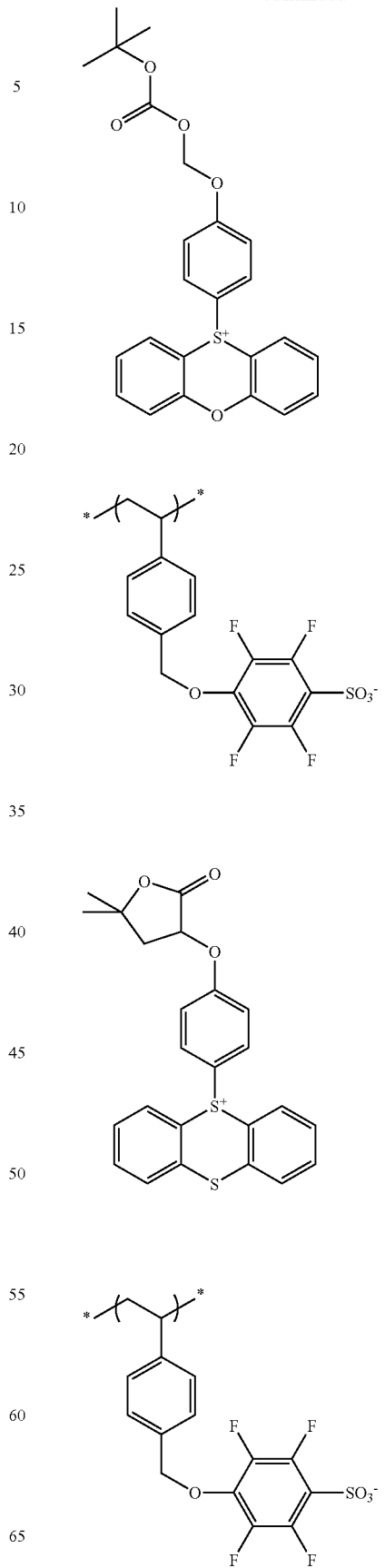

87
-continued
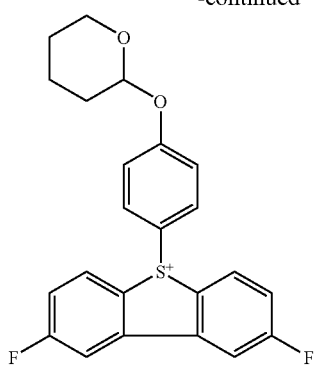
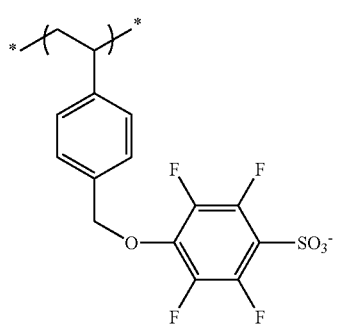
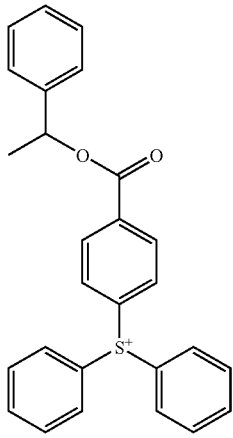
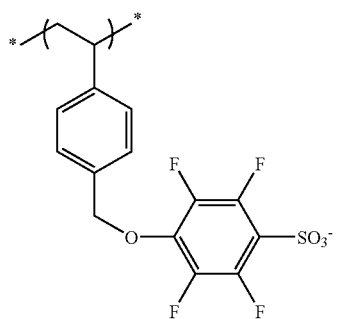
88
-continued
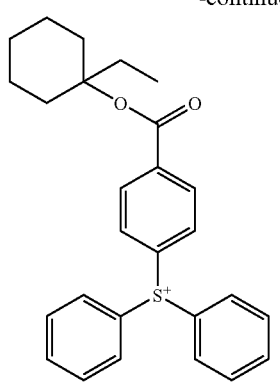
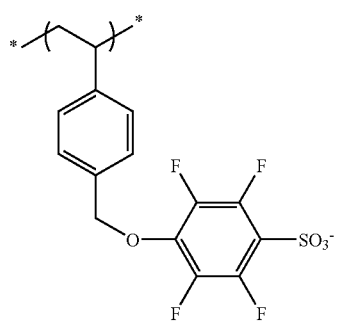
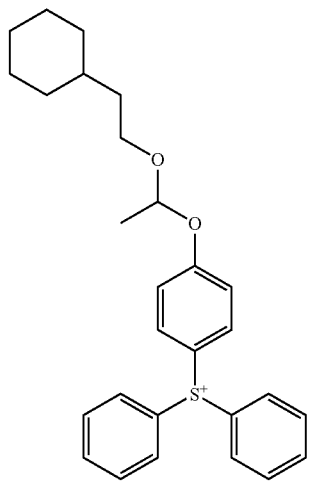
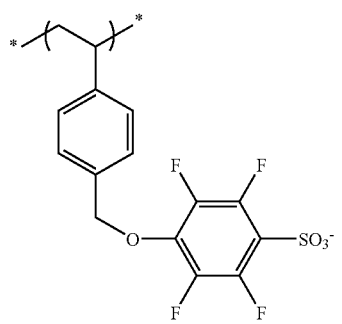

89
-continued
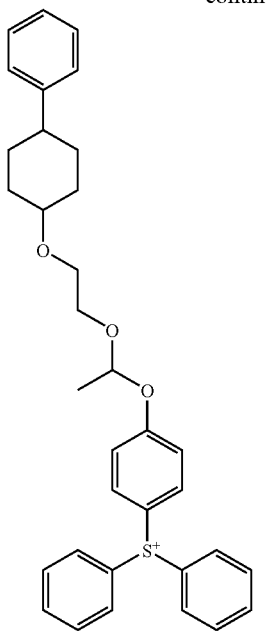
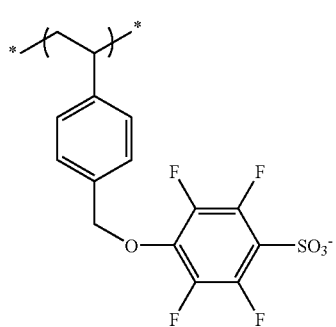
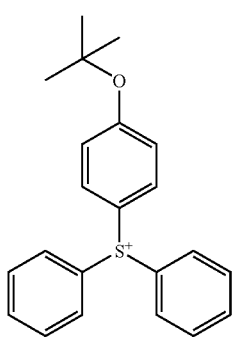
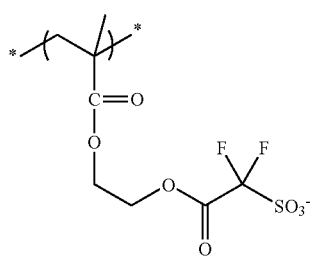
90
-continued
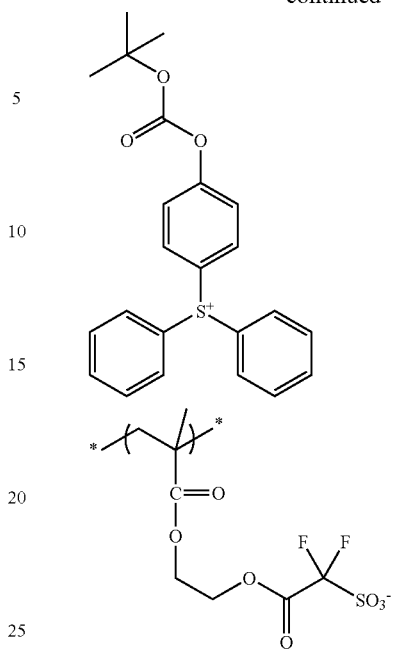
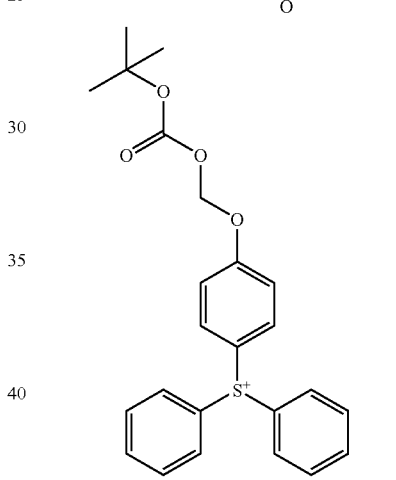
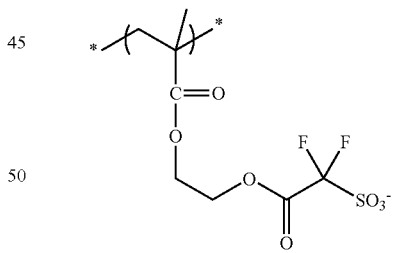
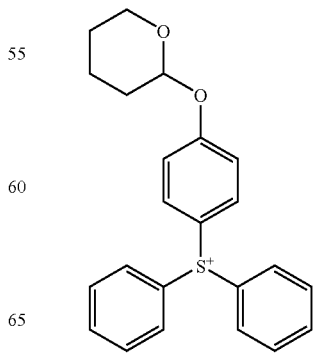

91
-continued
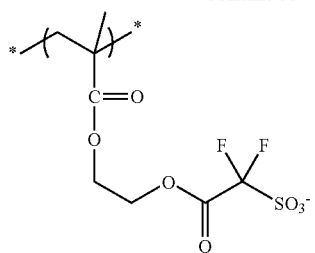
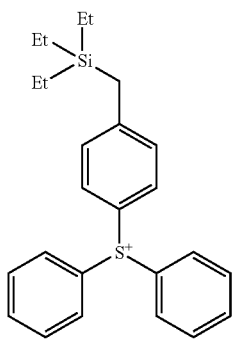
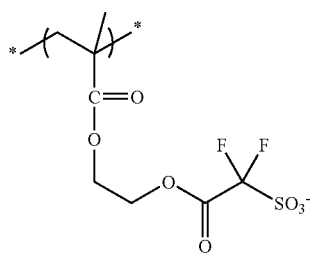
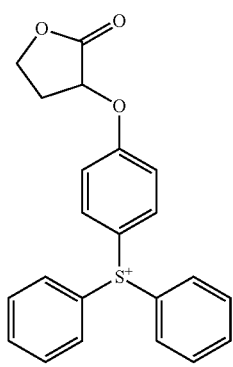
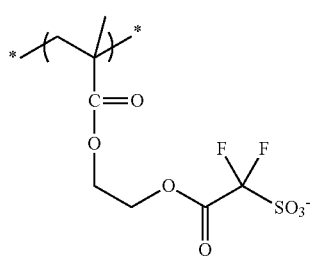
92
-continued
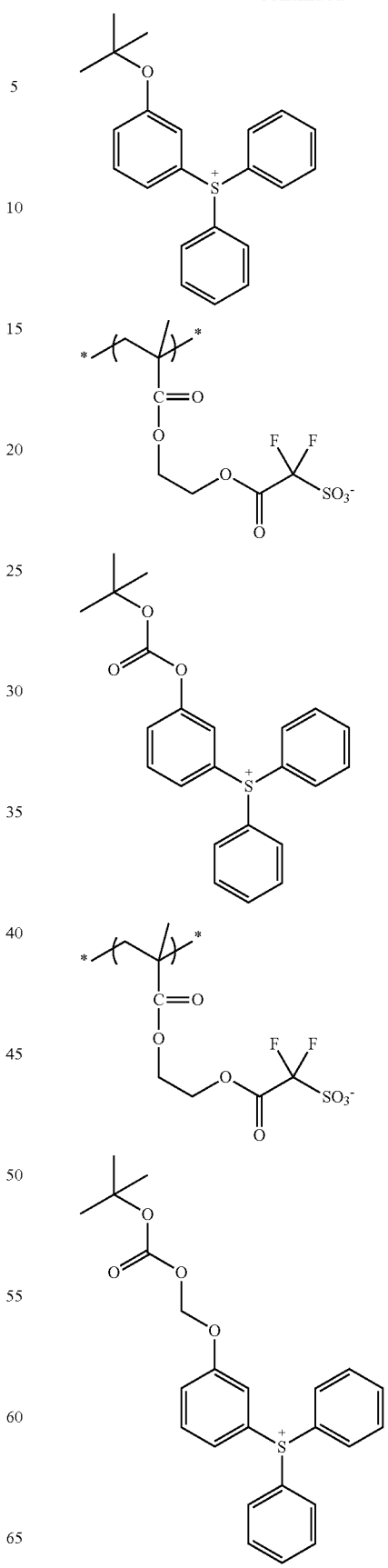

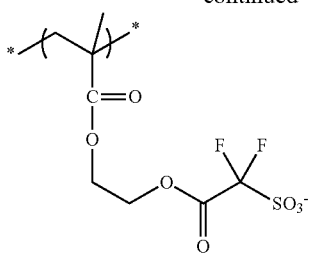
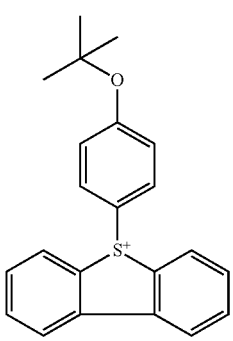
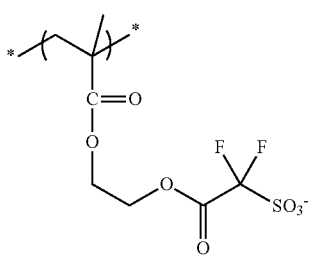
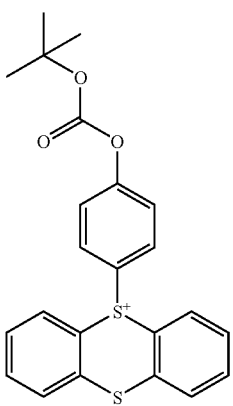
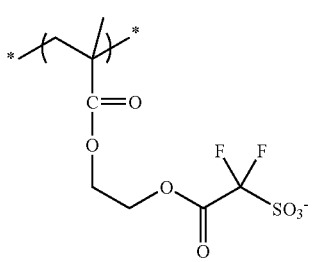
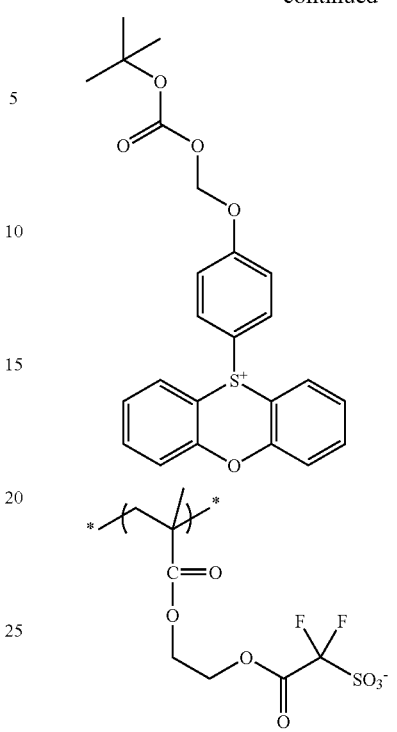
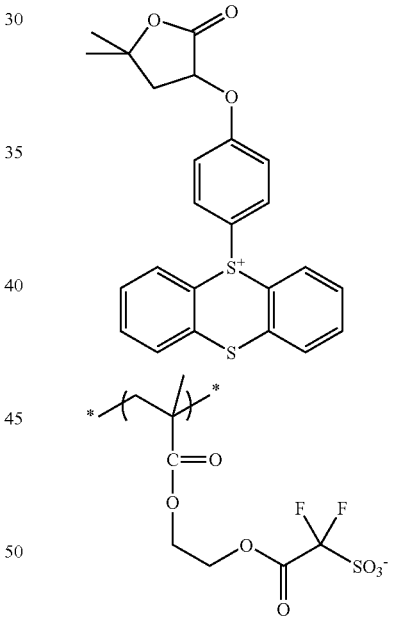
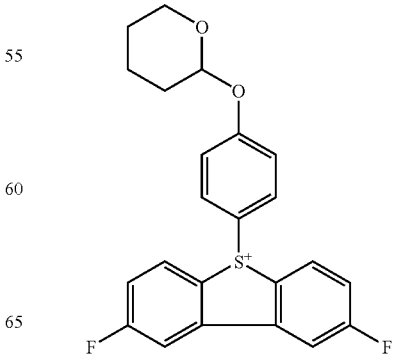

95
-continued
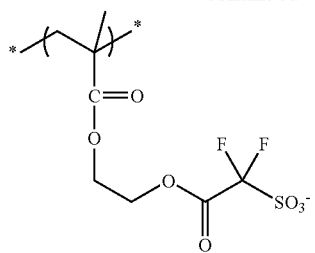
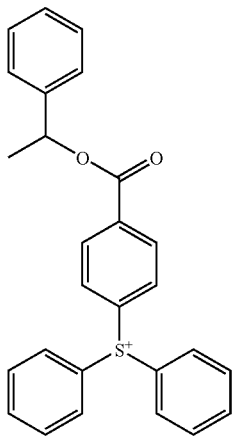
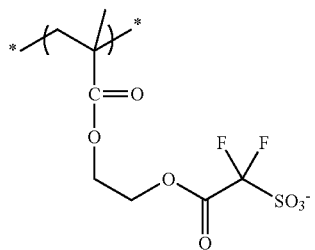
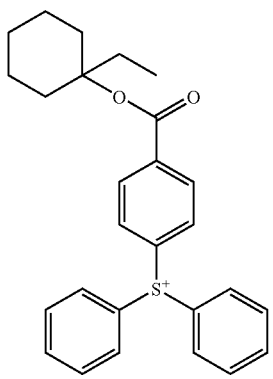
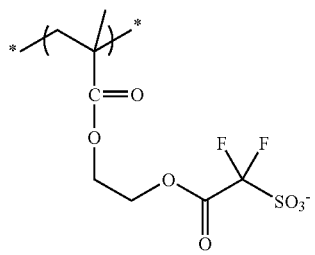
96
-continued
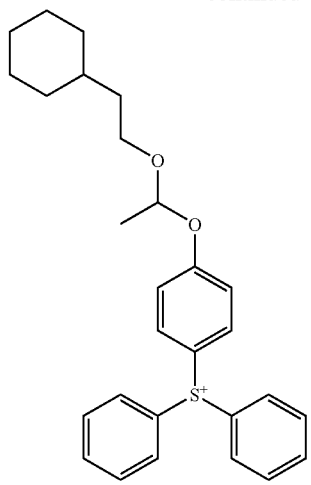
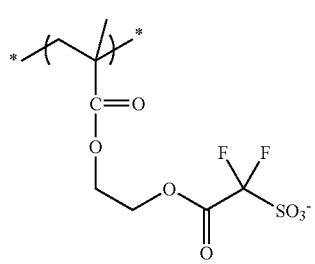
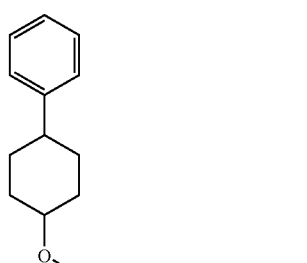
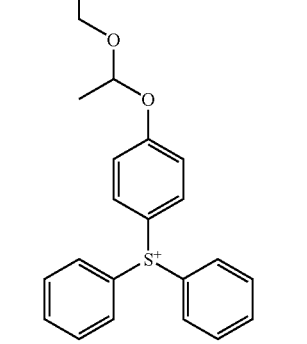
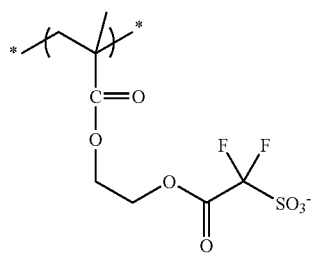

97
-continued
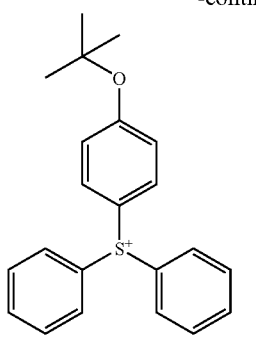
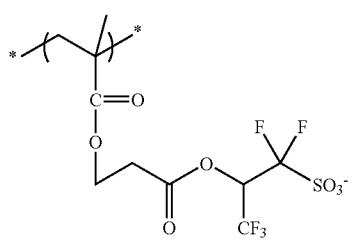
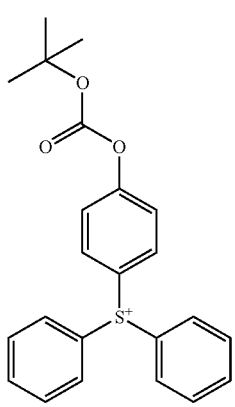
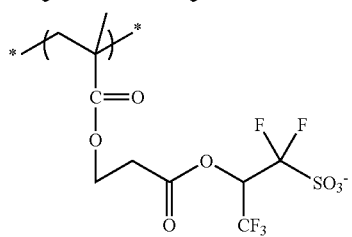
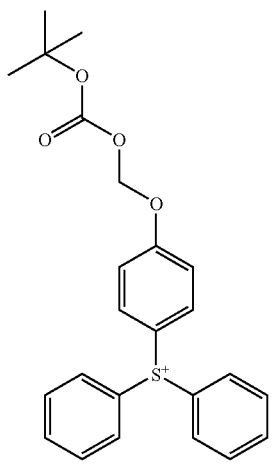
98
-continued
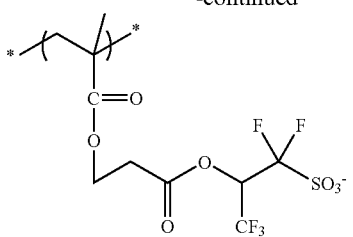
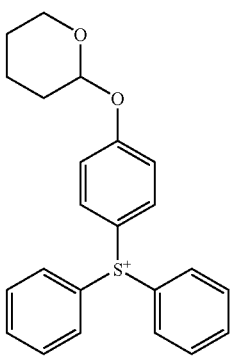
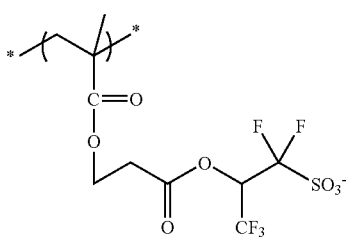
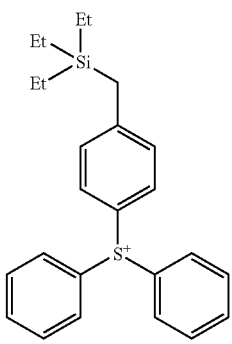
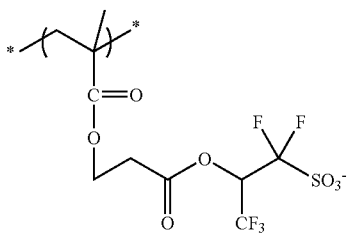

99
-continued
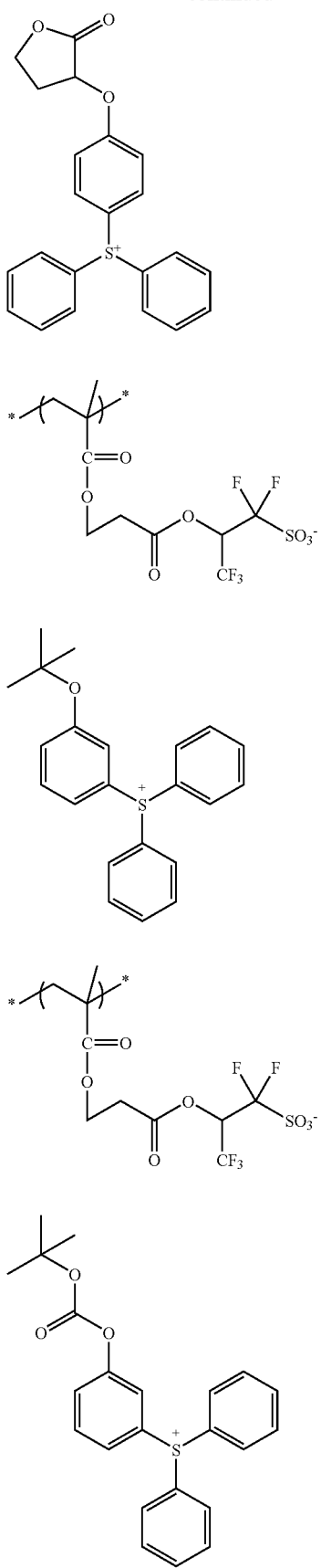
100
-continued
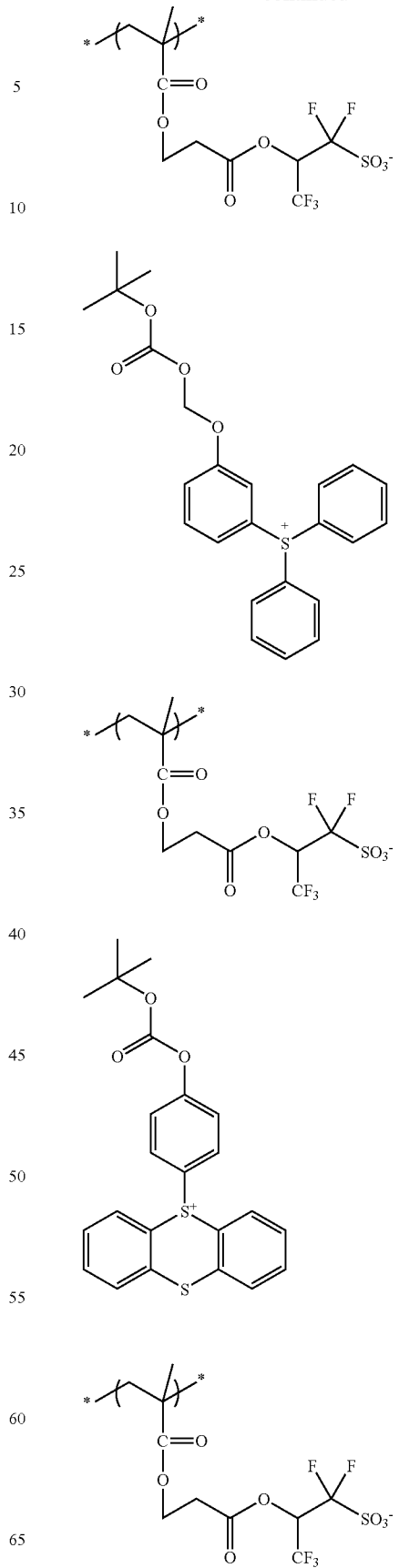

101
-continued
102
-continued
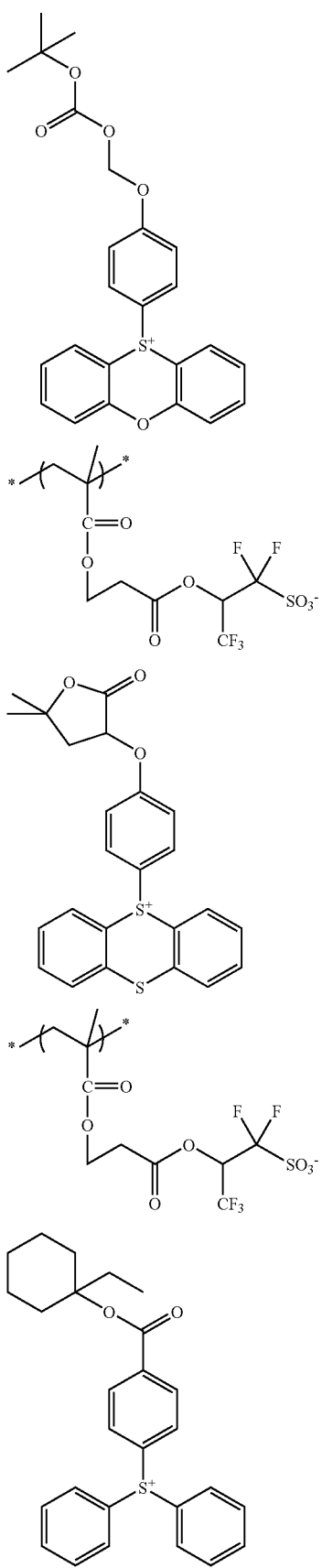
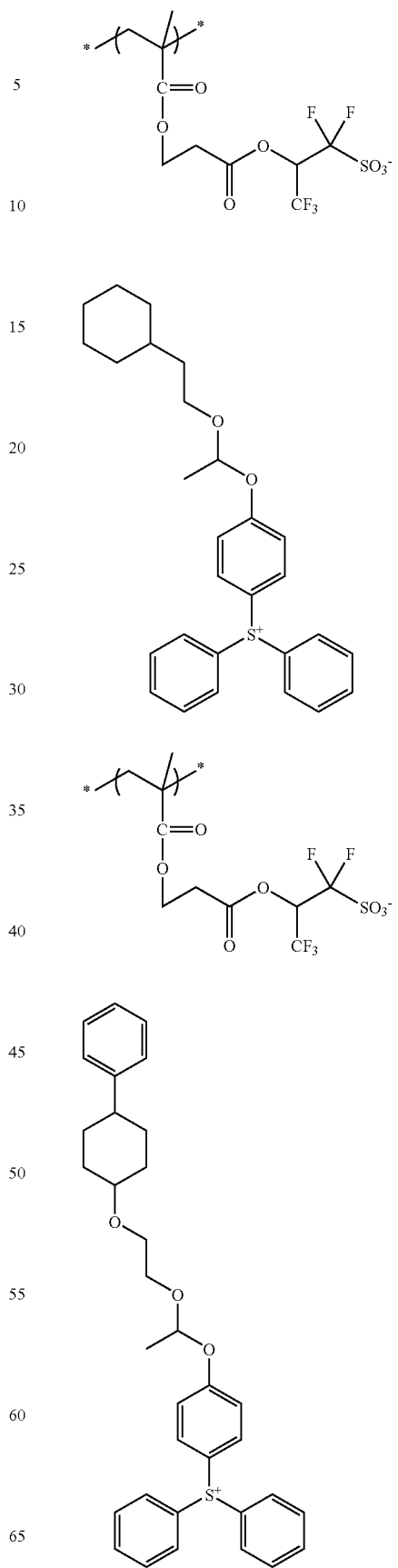

103
-continued
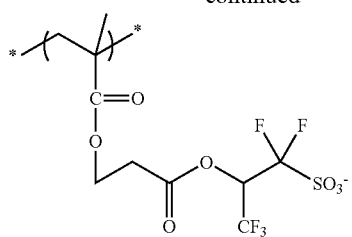
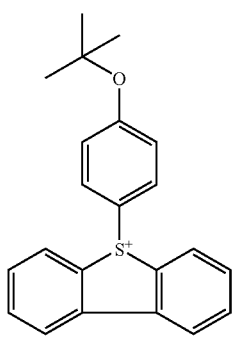
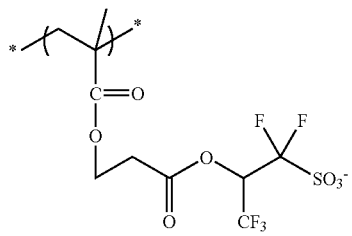
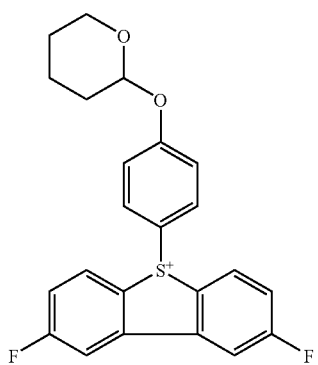
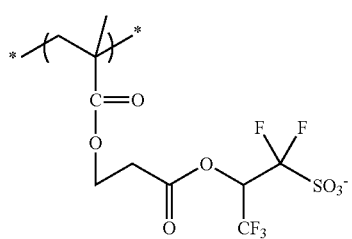
104
-continued
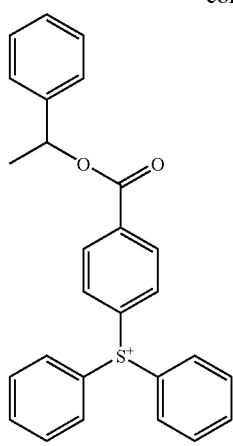
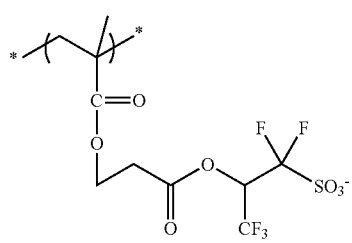
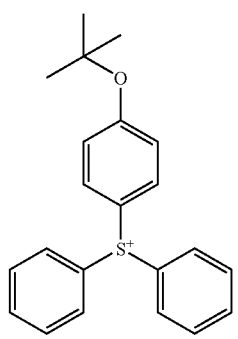
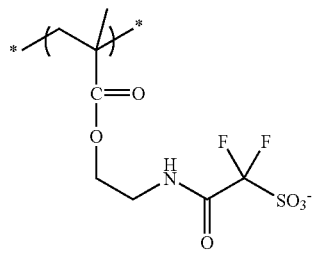
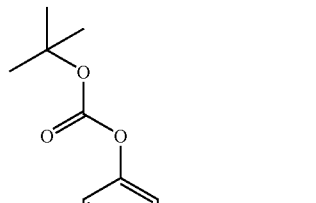
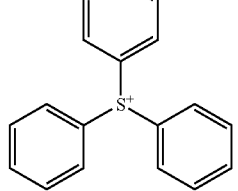

105
-continued
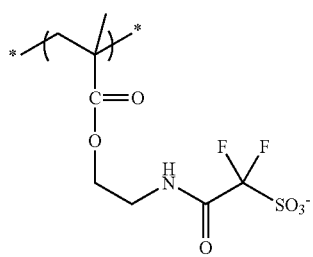
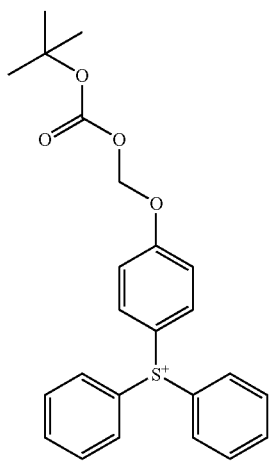
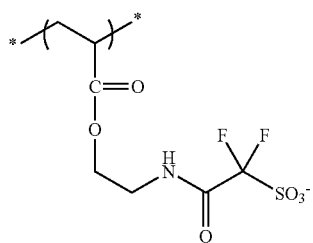
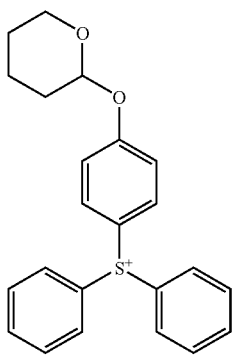
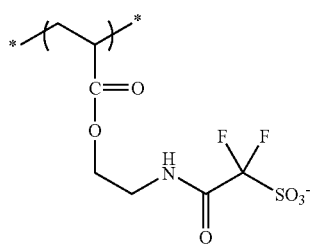
106
-continued
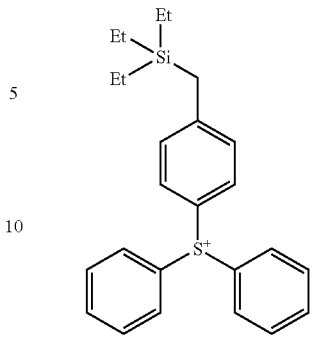
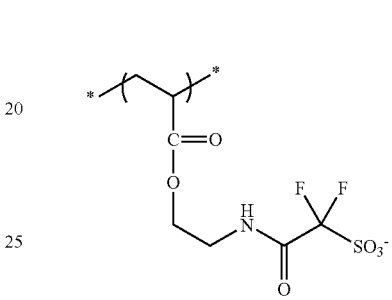
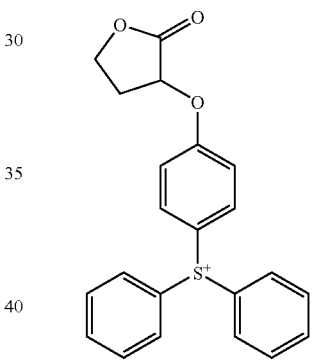
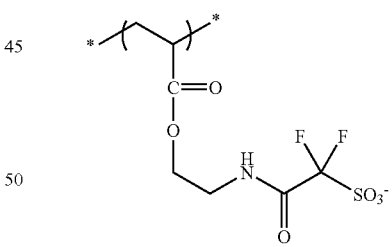
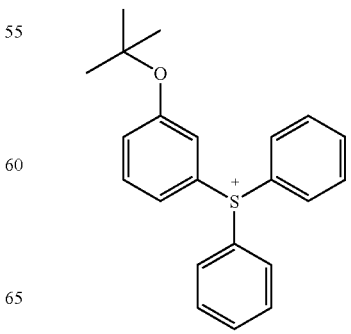

107
-continued
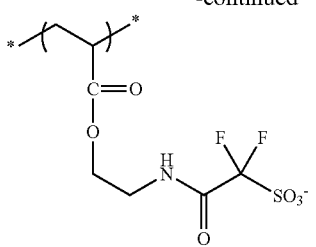
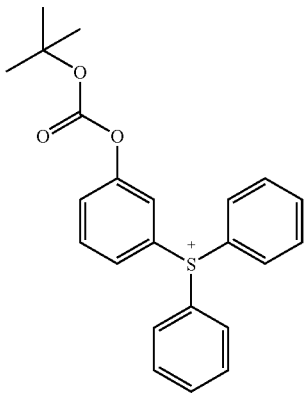
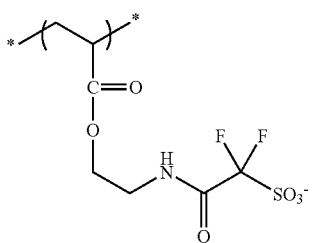
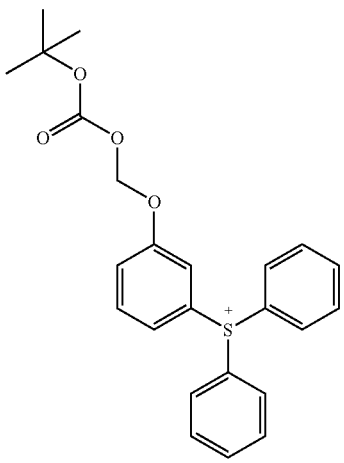
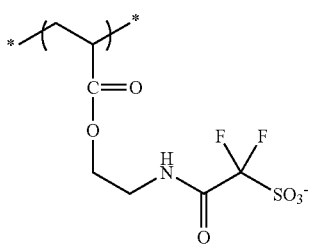
108
-continued
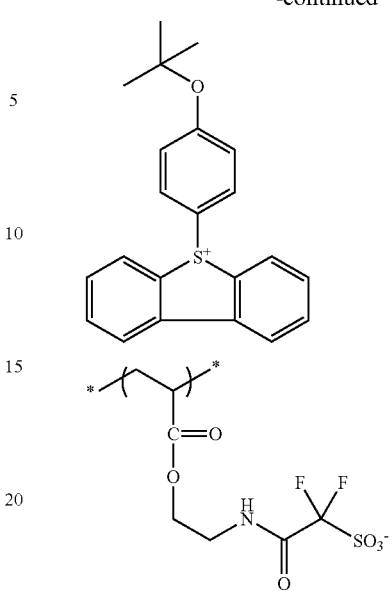

109
-continued
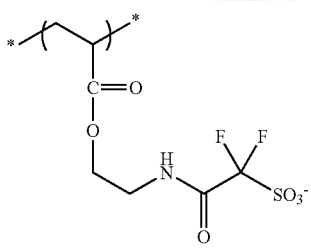
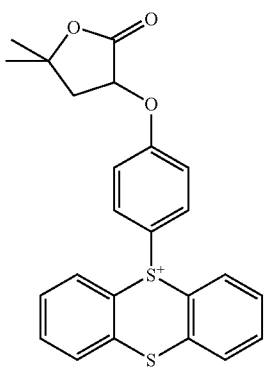
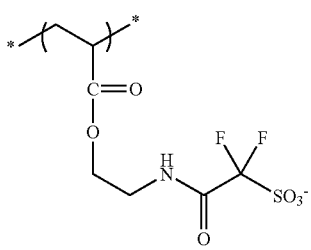
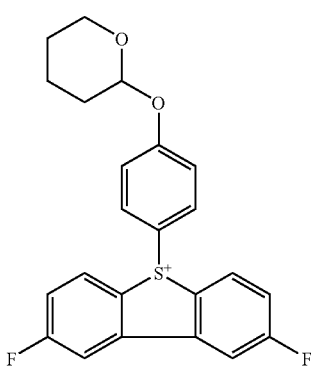
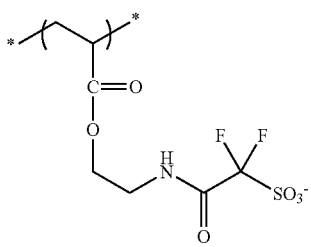
110
-continued
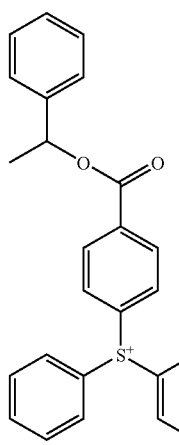
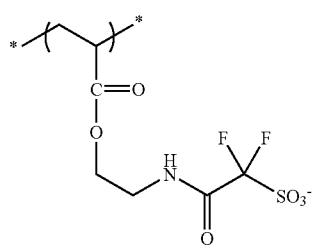
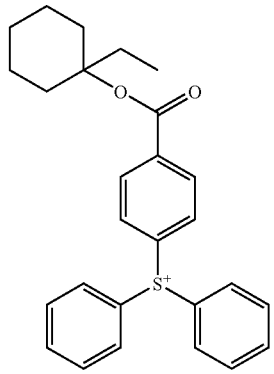
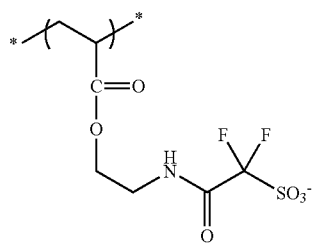

111
-continued
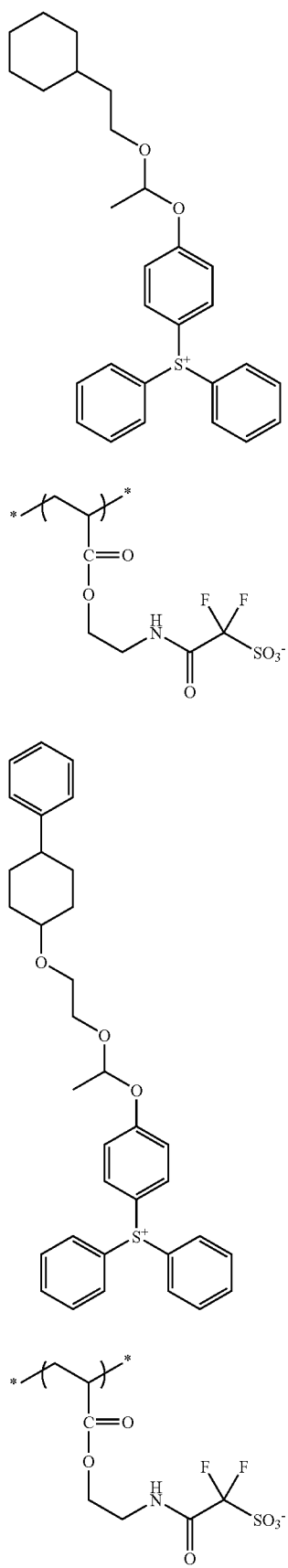
112
-continued
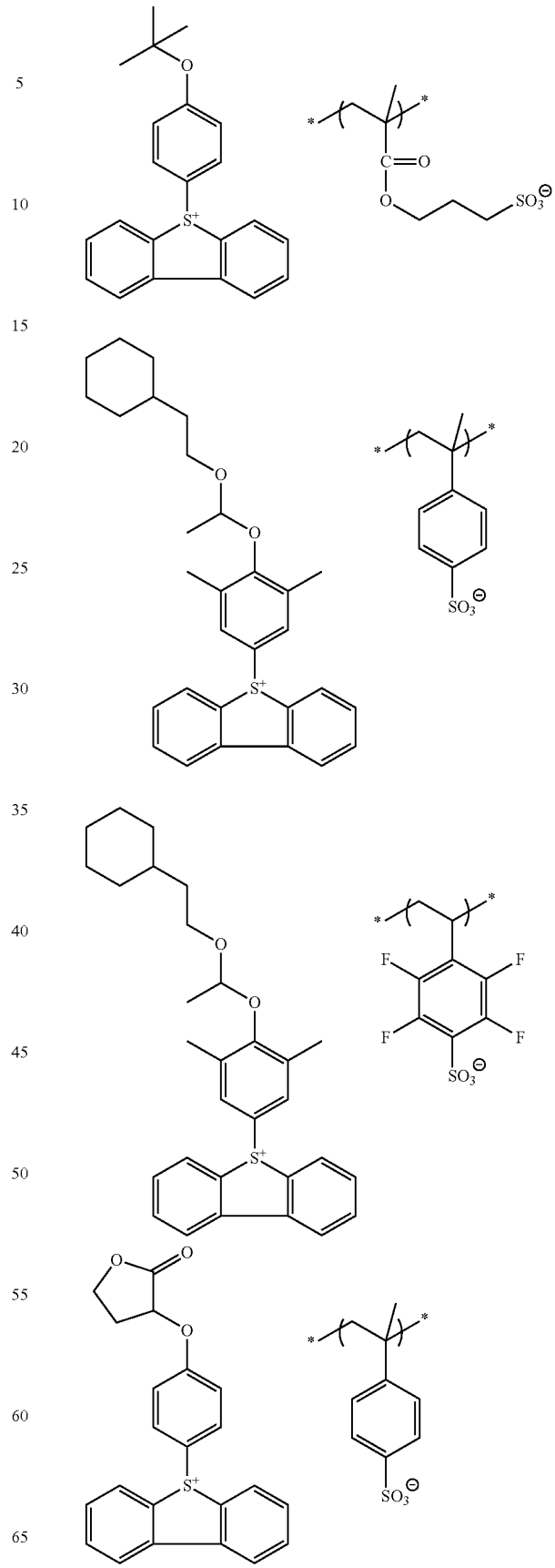

113
-continued
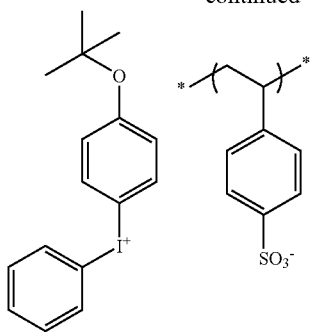
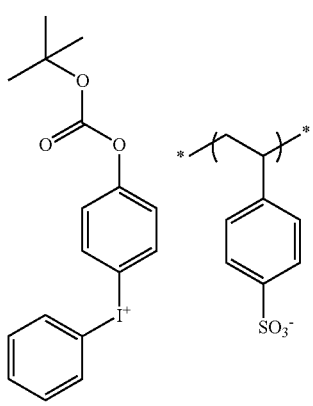
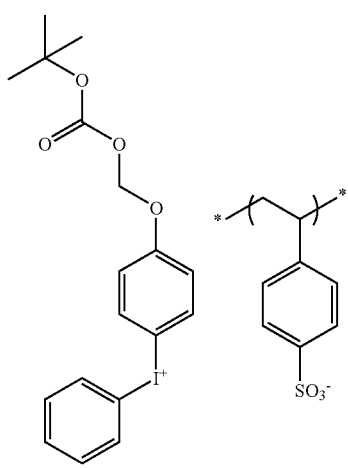
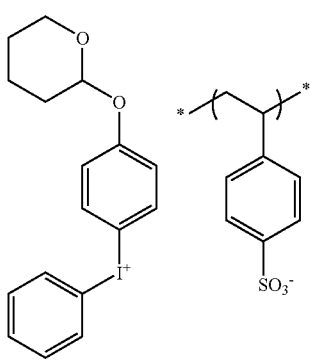
114
-continued
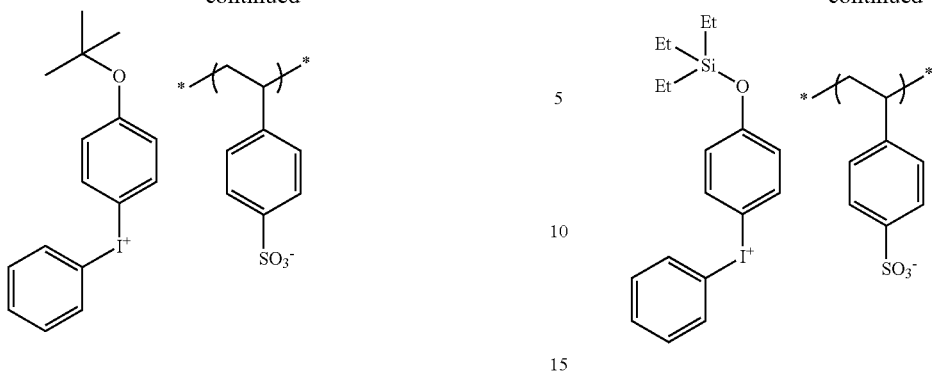
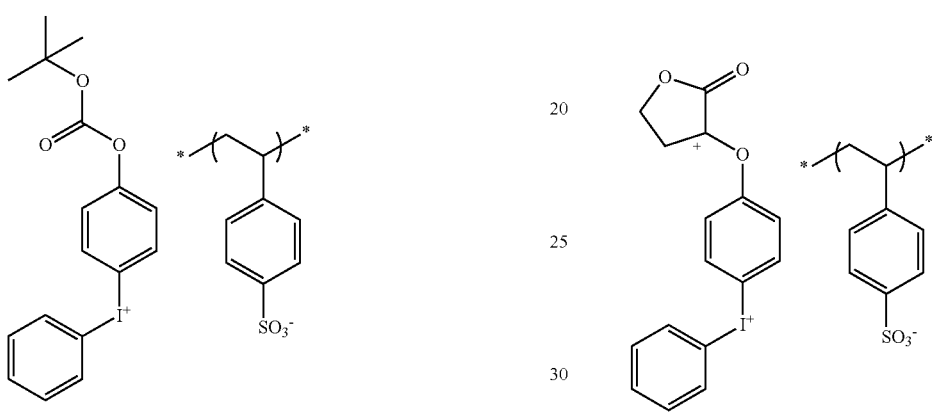
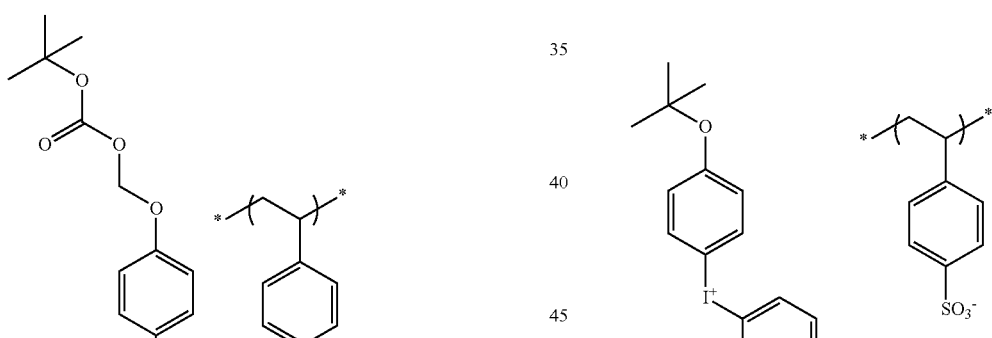
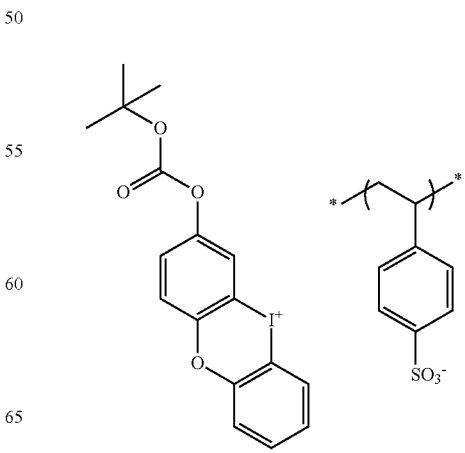

115
-continued
116
-continued
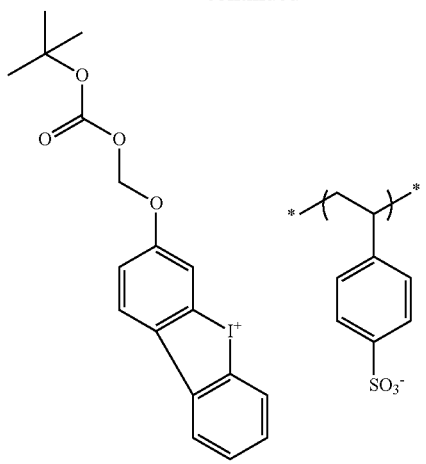
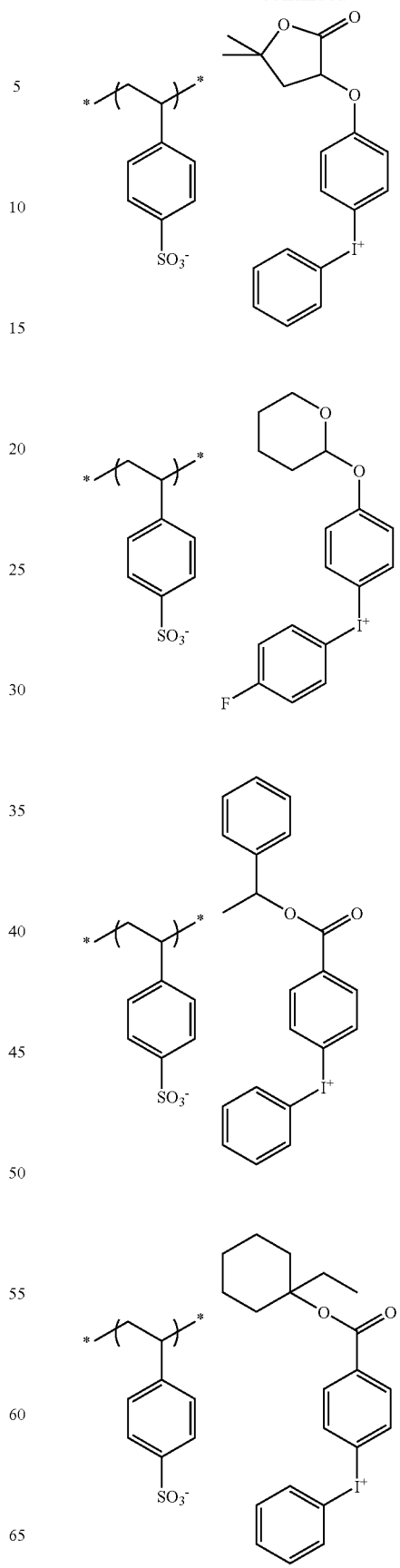

117
-continued
118
-continued
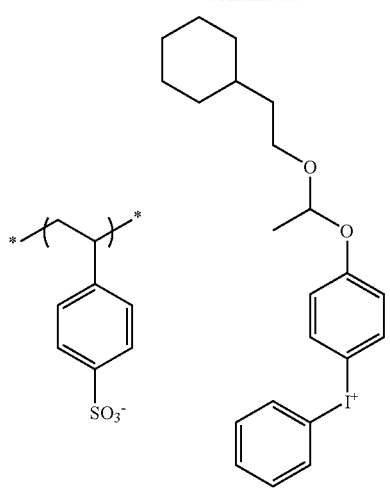
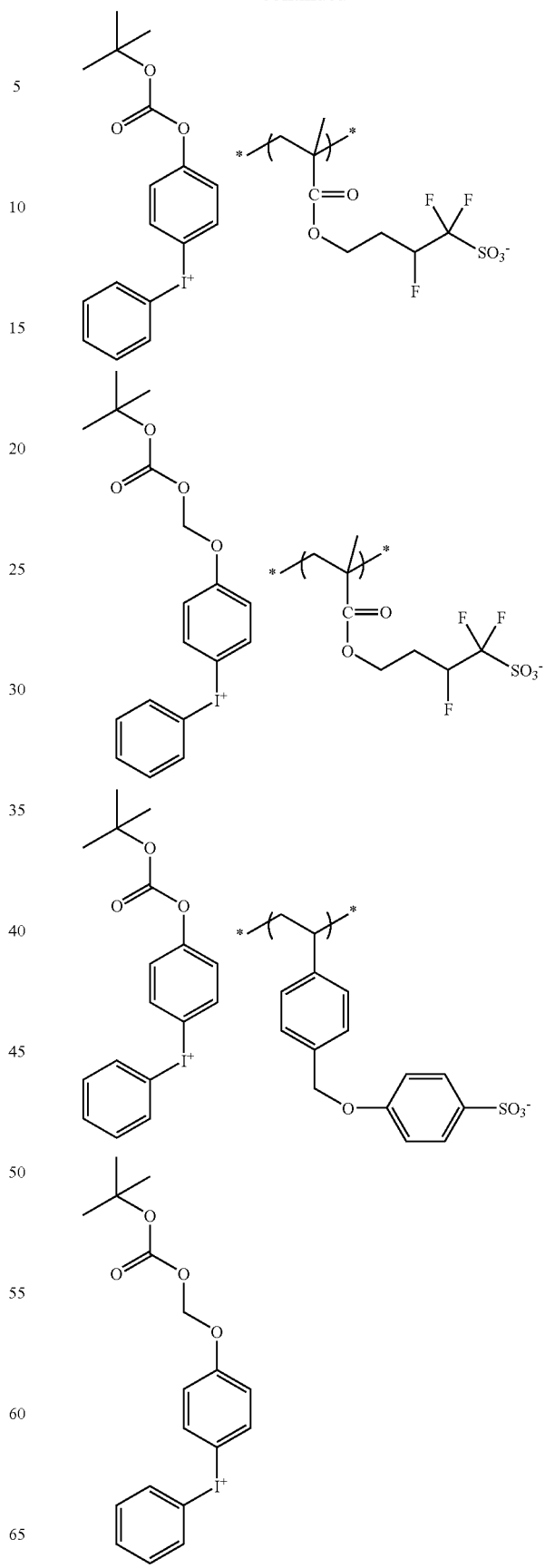

119
-continued
120
-continued
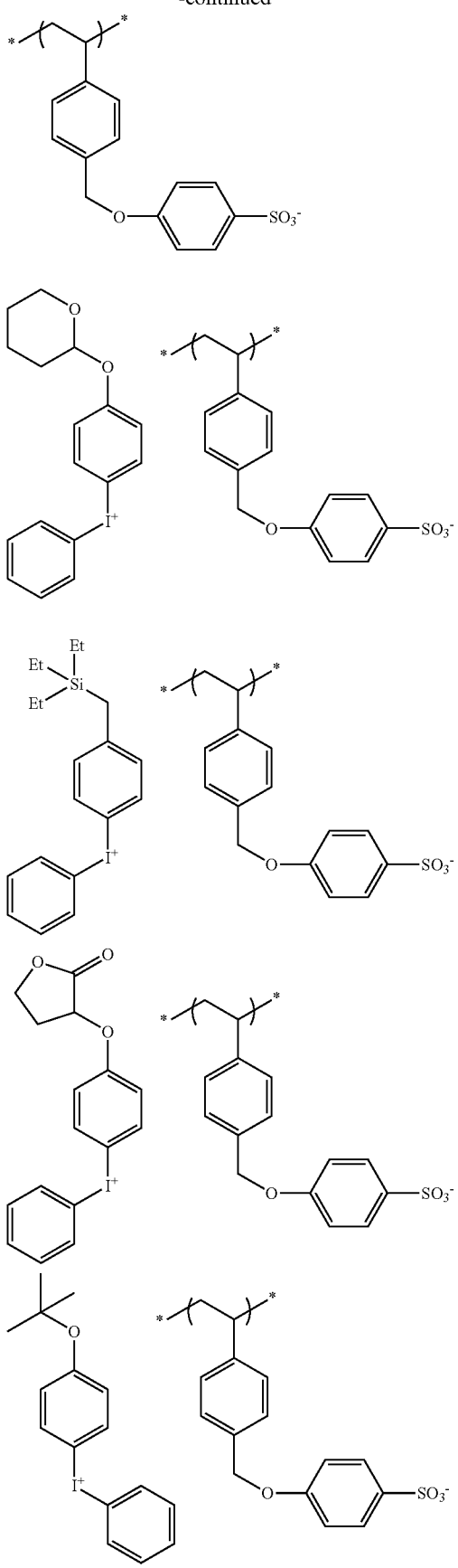
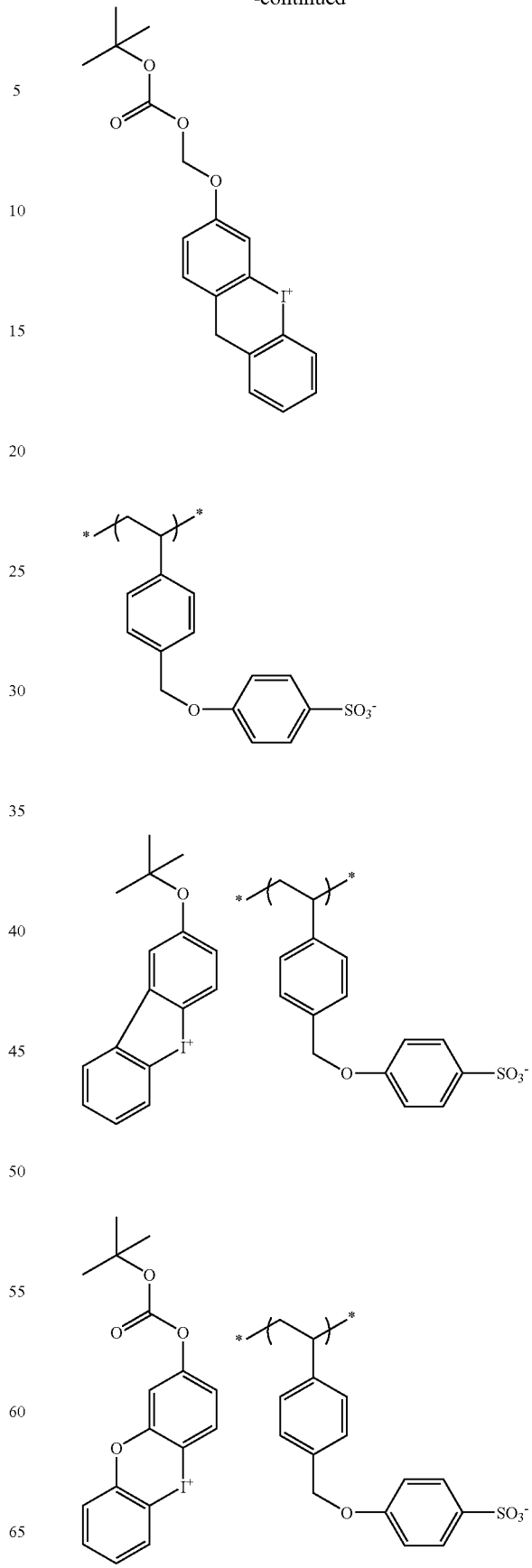

121
-continued
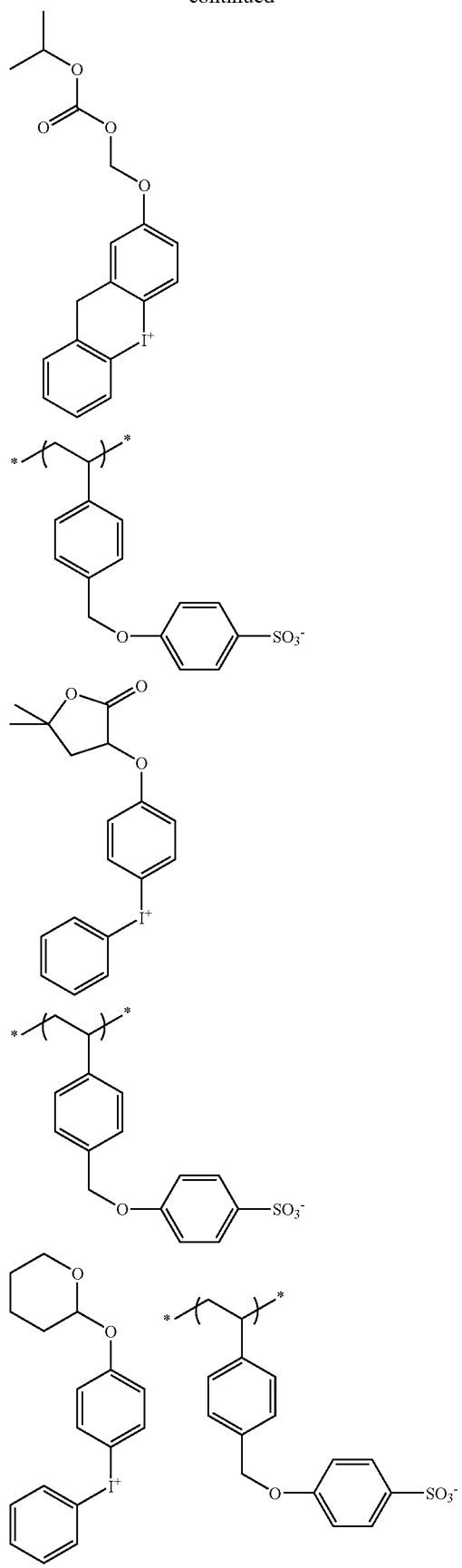
122
-continued
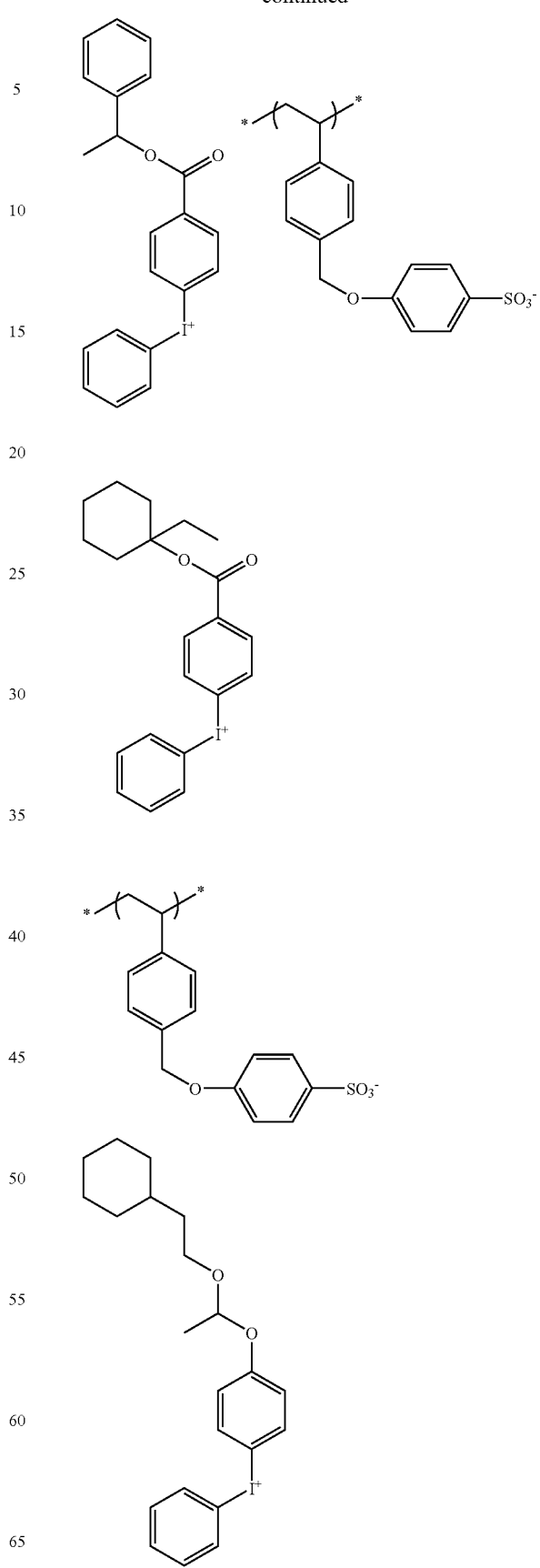

123
-continued
124
-continued
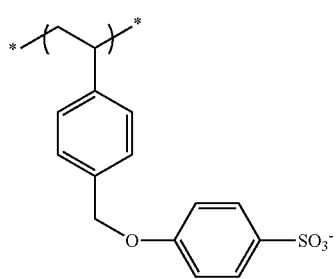
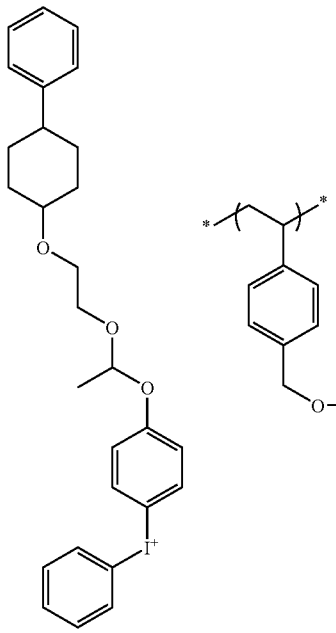
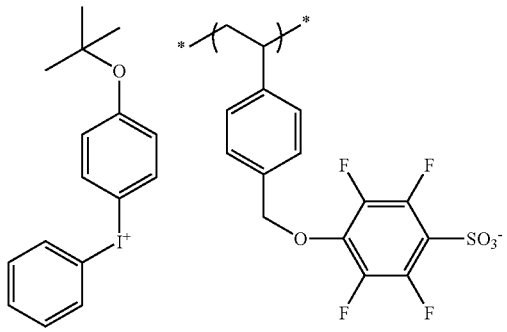
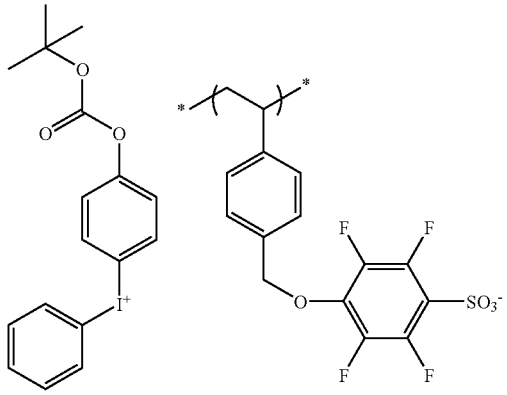
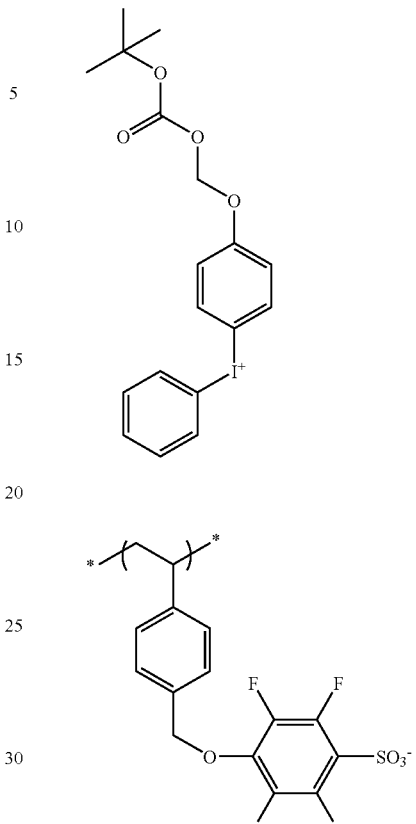
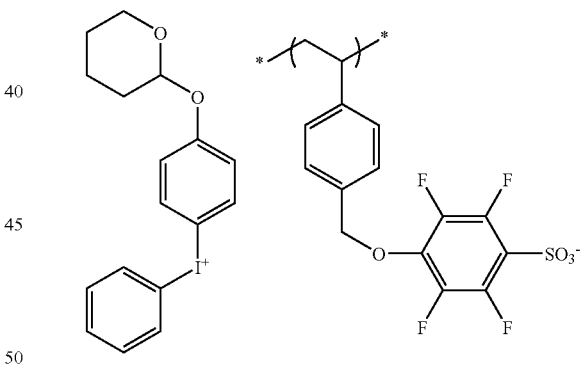
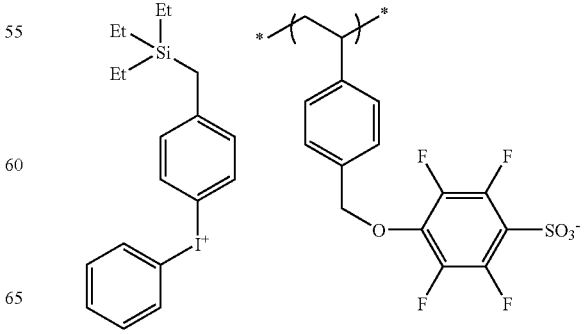

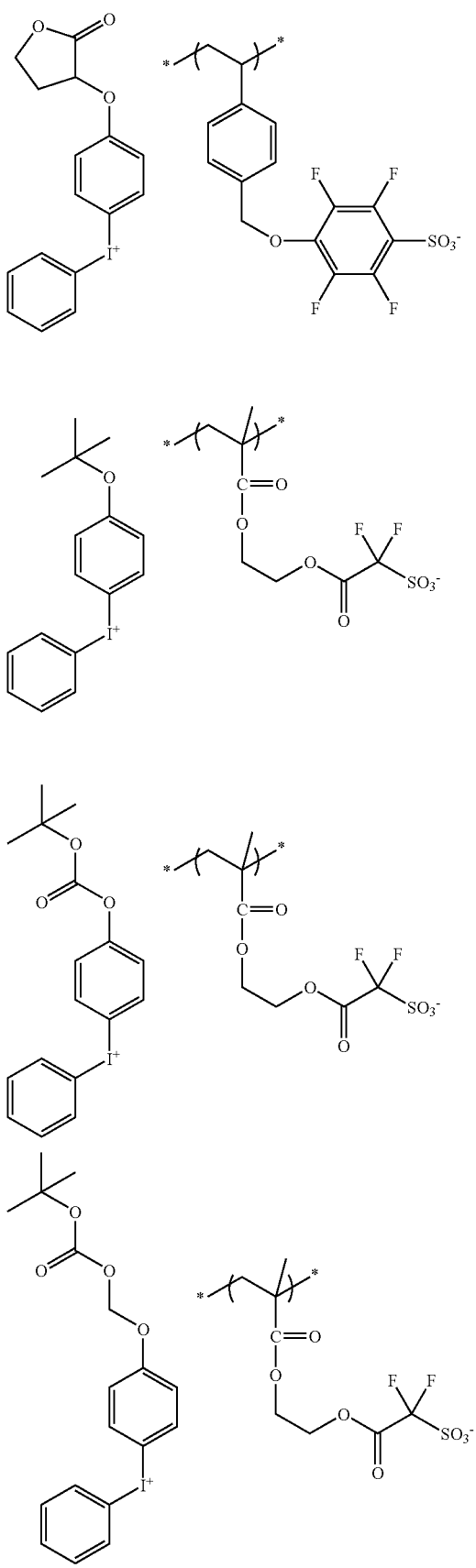
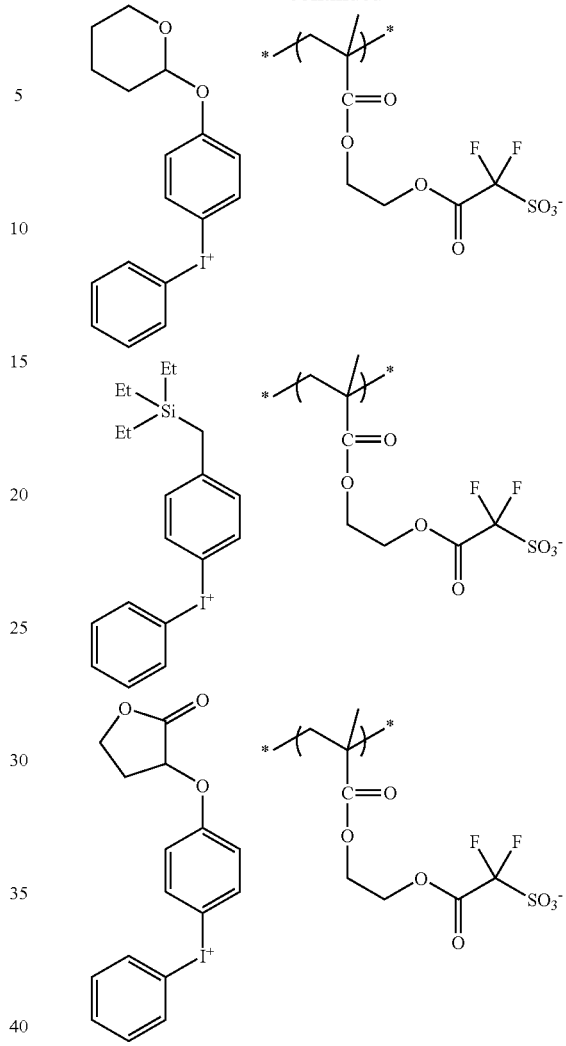

(2) Repeating Unit (B) Having a Group Capable of Decomposing by the Action of an Acid to Produce an Alkali-Soluble Group The resin for use in the present invention preferably contains a repeating unit having a group capable of decomposing by the action of an acid to produce an alkali-soluble group (hereinafter sometimes referred to as an "acid-decomposable group").

The acid-decomposable group is preferably a group obtained by replacing a hydrogen atom of an alkali-soluble group such as —COOH group and —OH group with a group capable of leaving by the action of an acid Examples of the group capable of leaving by the action of an acid include —C($R_{36}$)($R_{37}$)($R_{38}$), —C(=O)—O—C($R_{36}$)($R_{37}$)($R_{38}$), —C($R_{01}$)($R_{02}$)(O$R_{39}$), —C($R_{01}$)($R_{02}$)—C(=O)—O—C($R_{36}$)($R_{37}$)($R_{38}$) and —CH($R_{36}$)(Ar).

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

Ar represents an aryl group.

The alkyl group of $R_{36}$ to $R_{39}$, $R_{01}$ and $R_{02}$ is preferably an alkyl group having a carbon number of 1 to 8, and examples thereof include a methyl group, an ethyl group, a propyl group, an n-butyl group, a sec-butyl group, a hexyl group and an octyl group.

The cycloalkyl group of $R_{36}$ to $R_{39}$, $R_{01}$ and $R_{02}$ may be either monocyclic or polycyclic. The monocyclic cycloalkyl group is preferably a cycloalkyl group having a carbon number of 3 to 10, and examples thereof include a cyclopropyl group, a cyclobutyl group, a cyclopentyl group, a cyclohexyl group and a cyclooctyl group. The polycyclic cycloalkyl group is preferably a cycloalkyl group having a carbon number of 6 to 20, and examples thereof include an adamantyl, a norbornyl group, an isoboronyl group, a camphanyl group, a dicyclopentyl group, an α-pinel group, a tricyclodecanyl group, a tetracyclododecyl group and an androstanyl group. Incidentally, a part of carbon atoms in the cycloalkyl group may be substituted by a heteroatom such as oxygen atom.

The aryl group of $R_{36}$ to $R_{39}$, $R_{01}$, $R_{02}$ and Ar is preferably an aryl group having a carbon number of 6 to 10, and examples thereof include a phenyl group, a naphthyl group and an anthryl group.

The aralkyl group of $R_{36}$ to $R_{39}$, $R_{01}$ and $R_{02}$ is preferably an aralkyl group having a carbon number of 7 to 12, and examples thereof include a benzyl group, a phenethyl group and a naphthylmethyl group.

The alkenyl group of $R_{36}$ to $R_{39}$, $R_{01}$ and $R_{02}$ is preferably an alkenyl group having a carbon number of 2 to 8, and examples thereof include a vinyl group, an allyl group, a butenyl group and a cyclohexenyl group.

The ring formed by combining $R_{36}$ and $R_{37}$ with each other may be either monocyclic or polycyclic. The monocyclic ring is preferably a cycloalkane structure having a carbon number of 3 to 10, and examples thereof include a cyclopropane structure, a cyclobutane structure, a cyclopentane structure, a cyclohexane structure, a cycloheptane structure and a cyclooctane structure. The polycyclic ring is preferably a cycloalkane structure having a carbon number of 6 to 20, and examples thereof include an adamantane structure, a norbornane structure, a dicyclopentane structure, a tricyclodecane structure and a tetracyclododecane structure. Incidentally, a part of carbon atoms in the cycloalkane may be substituted by a heteroatom such as oxygen atom.

Each of the groups as $R_{36}$ to $R_{39}$, $R_{01}$, $R_{02}$ and Ar may have a substituent, and examples of the substituent include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group. The carbon number of the substituent is preferably 8 or less.

The repeating unit (B) is preferably, for example, a repeating unit represented by the following formula (I):

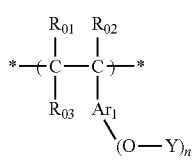
(I)

wherein each of $R_{01}$, $R_{02}$ and $R_{03}$ independently represents a hydrogen atom, an alkyl group, a cycloalkyl group, a halogen atom, a cyano group or an alkoxycarbonyl group, or $R_{03}$ may represent an alkylene group and combine with $Ar_1$ to form a 5- or 6-membered ring, $Ar_1$ represents (n+1) valent aromatic ring group, provided that $Ar_1$ represents (n+2) valent aromatic ring group when $Ar_1$ combines with $R_{03}$ to form a ring, each of n Ys independently represents a hydrogen atom or a group capable of leaving by the action of an acid, provided that at least one Y represents a group capable of leaving by the action of an acid, and n represents an integer of 1 to 4 and is preferably 1 or 2, more preferably 1.

The alkyl group of $R_{01}$ to $R_{03}$ in the formula may have a substituent and is preferably an alkyl group having a carbon number of 20 or less which may have a substituent, such as methyl group, ethyl group, propyl group, isopropyl group, n-butyl group, sec-butyl group, hexyl group, 2-ethylhexyl group, octyl group and dodecyl group, more preferably an alkyl group having a carbon number of 8 or less.

As for the alkyl group contained in the alkoxycarbonyl group, the same as those for the alkyl group in $R_{01}$ to $R_{03}$ are preferred.

The cycloalkyl group includes a cycloalkyl group which may be either monocyclic or polycyclic and may have a substituent. A monocyclic cycloalkyl group having a carbon number of 3 to 8 which may have a substituent, such as cyclopropyl group, cyclopentyl group and cyclohexyl group, is preferred.

The halogen atom includes a fluorine atom, a chlorine atom, a bromine atom and an iodine atom and is preferably a fluorine atom.

In the case where $R_{03}$ represents an alkylene group, the alkylene group is preferably an alkylene group having a carbon number of 1 to 8, such as methylene group, ethylene group, propylene group, butylene group, hexylene group and octylene group.

The aromatic ring group of $Ar_1$ is preferably an aromatic ring group having a carbon number of 6 to 14 which may have a substituent, and specific examples thereof include a benzene ring, a toluene ring and a naphthalene ring.

Examples of the substituent are the same as those of the substituent which each of the groups as $R_{36}$ to $R_{39}$, $R_{01}$, $R_{02}$ and Ar may have.

Each of n Ys independently represents a hydrogen atom or a group capable of leaving by the action of an acid, provided that at least one of n Ys represents a group capable of leaving by the action of an acid.

Examples of the group Y capable of leaving by the action of an acid include —C($R_{36}$)($R_{37}$)($R_{38}$), —C(=O)—O—C($R_{36}$)($R_{37}$)($R_{38}$), —C($R_{01}$)($R_{02}$)(O$R_{39}$), —C($R_{01}$)($R_{02}$)—C(=O)—O—C($R_{36}$)($R_{37}$)($R_{38}$) and —CH($R_{36}$)(Ar), as previously indicated as the group capable of leaving by the action of an acid.

Specific examples and preferred examples of $R_{36}$ to $R_{39}$, $R_{01}$, $R_{02}$ and Ar are the same as those described in relation to the "group capable of leaving by the action of an acid".

The group Y capable of leaving by the action of an acid is more preferably a structure represented by the following formula (II):

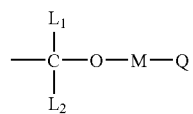
(II)

wherein each of $L_1$ and $L_2$ independently represents a hydrogen atom, an alkyl group, a cycloalkyl group, an aryl group or an aralkyl group, M represents a single bond or a divalent linking group, Q represents an alkyl group, an alicyclic group which may contain a heteroatom, an aromatic ring group which may contain a heteroatom, an amino group, an ammonium group, a mercapto group, a cyano group or an aldehyde group, and at least two members of Q, M and $L_1$ may combine to form a 5- or 6-membered ring.

The alkyl group as $L_1$ and $L_2$ is, for example, an alkyl group having a carbon number of 1 to 8, and specific preferred examples thereof include a methyl group, an ethyl group, a propyl group, an n-butyl group, a sec-butyl group, a hexyl group and an octyl group.

The cycloalkyl group as $L_1$ and $L_2$ is, for example, a cycloalkyl group having a carbon number of 3 to 15, and specific preferred examples thereof include a cyclopentyl group, a cyclohexyl group, a norbornyl group and an adamantyl group.

The aryl group as $L_1$ and $L_2$ is, for example, an aryl group having a carbon number of 6 to 15, and specific preferred examples thereof include a phenyl group, a tolyl group, a naphthyl group and an anthryl group.

The aralkyl group as $L_1$ and $L_2$ is, for example, an aralkyl group having a carbon number of 6 to 20, and examples thereof include a benzyl group and a phenethyl group.

Examples of the divalent organic linking group as M include an alkylene group (e.g., methylene, ethylene, propylene, butylene, hexylene, octylene), a cycloalkylene group (e.g., cyclopentylene, cyclohexylene), an alkenylene group (e.g., vinylene, propenylene, butenylene), an arylene group (e.g., phenylene, tolylene, naphthylene), —S—, —O—, —CO—, —SO$_2$—, —N(R$_0$)—, and a divalent linking group formed by combining a plurality of these groups. $R_0$ represents a hydrogen atom or an alkyl group (for example, an alkyl group having a carbon number of 1 to 8, specifically, a methyl group, an ethyl group, a propyl group, an n-butyl group, a sec-butyl group, a hexyl group or an octyl group).

The alkyl group as Q are the same as the alkyl group of $L_1$ and $L_2$.

Examples of the alicyclic group and aromatic ring group in the alicyclic group which may contain a heteroatom and the aromatic ring group which may contain a heteroatom, as Q, include the above-described cycloalkyl group and aryl group as $L_1$ and $L_2$, and the carbon number thereof is preferably from 3 to 15.

Examples of the heteroatom-containing alicyclic group and heteroatom-containing aromatic ring group include a group having a heterocyclic structure, such as thiirane, cyclothiolane, thiophene, furan, pyrrole, benzothiophene, benzofuran, benzopyrrole, triazine, imidazole, benzimidazole, triazole, thiadiazole, thiazole and pyrrolidone, but the ring structure is not limited thereto and may be sufficient if it is a structure generally called a hetero ring (a ring composed of carbon and a heteroatom, or a ring composed of a heteroatom).

The ring which may be formed by combining at least two members out of Q, M and $L_1$ includes a case where at least two members of Q, M and $L_1$ combine to form, for example, a propylene group or a butylene group, thereby forming an oxygen atom-containing ring. The ring which may be formed by combining at least two members out of Q, M and $L_1$ is preferably a 5- or 6-membered ring.

Each of the groups represented by $L_1$, $L_2$, M and Q in formula (II) may have a substituent, and examples of the substituent include those descried above for the substituent which $R_{36}$ to $R_{39}$, $R_{01}$, $R_{02}$, $R_{03}$, Ar and $Ar_1$ may have. The carbon number of the substituent is preferably 8 or less.

The group represented by -M-Q is preferably a group composed of 1 to 30 carbons, more preferably a group composed of 5 to 20 carbons.

Specific examples of the repeating unit represented by formula (I) are set forth below, but the present invention is not limited thereto.

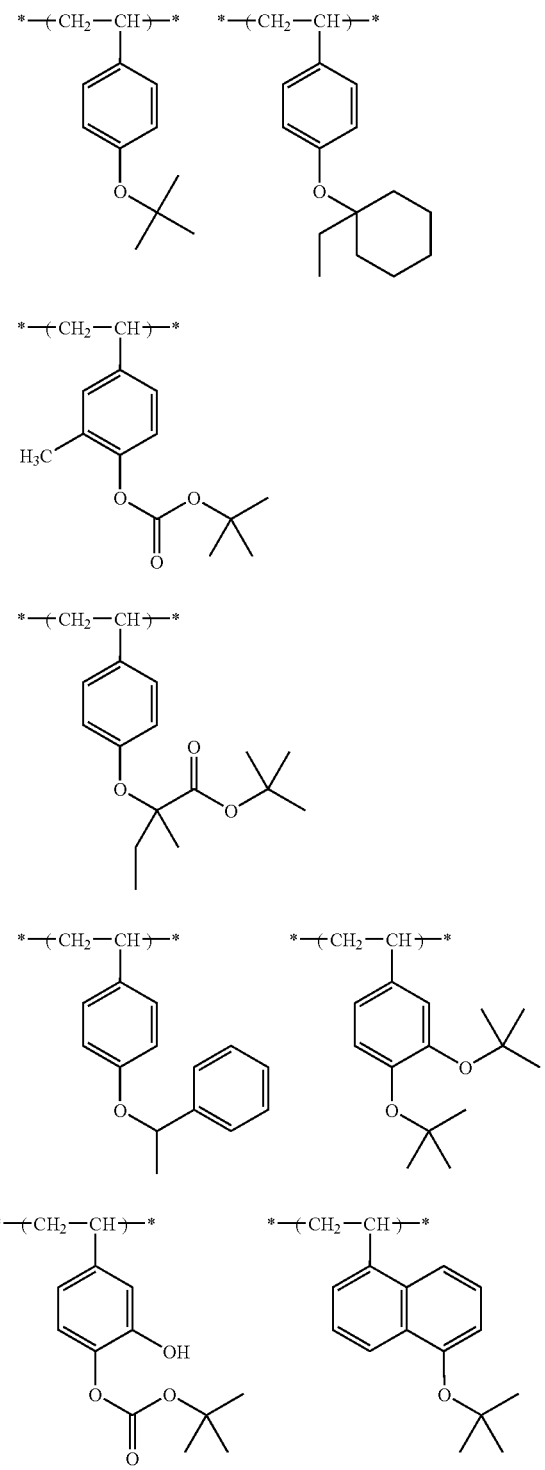

131
-continued
132
-continued
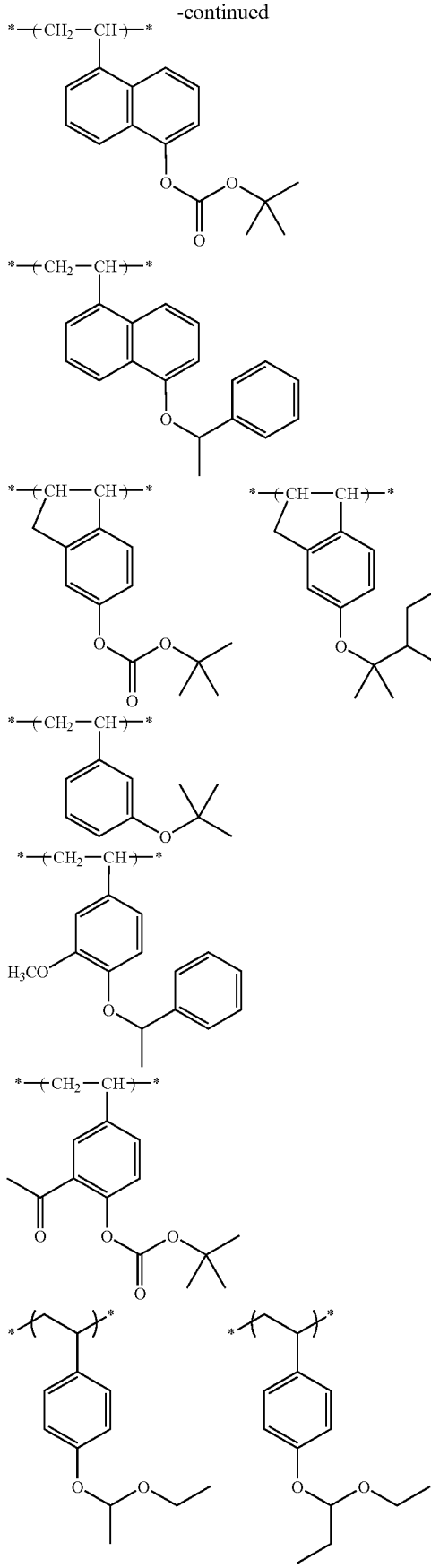
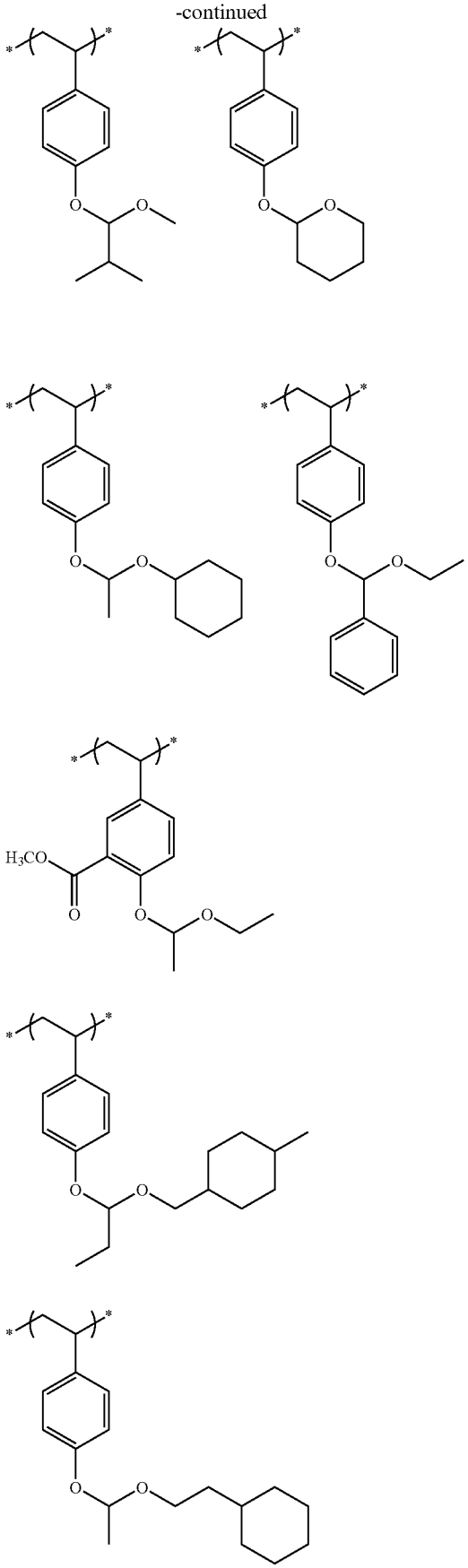

133
-continued
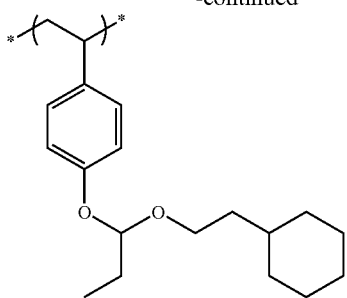
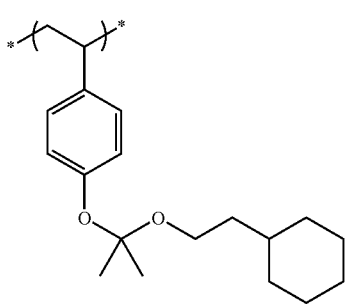
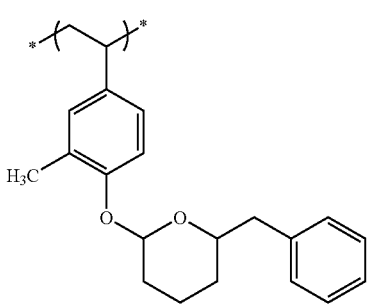
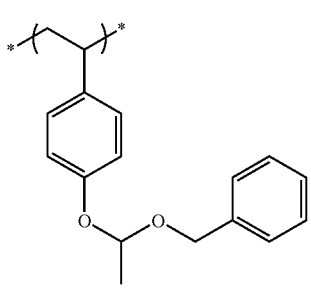
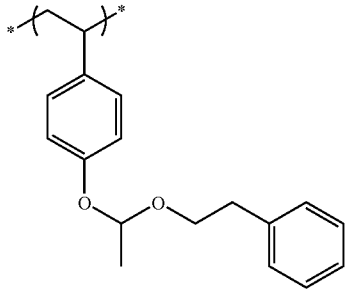
134
-continued
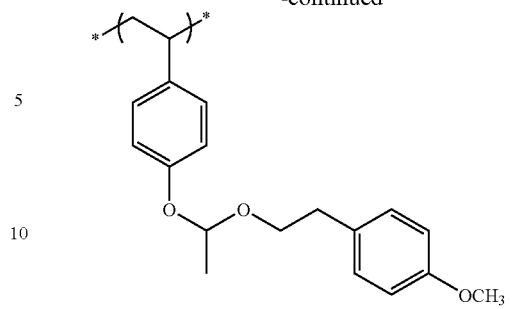
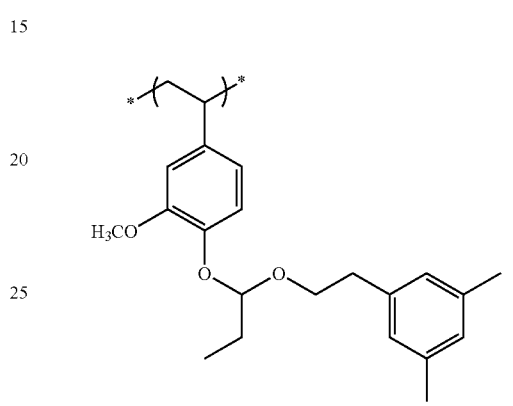
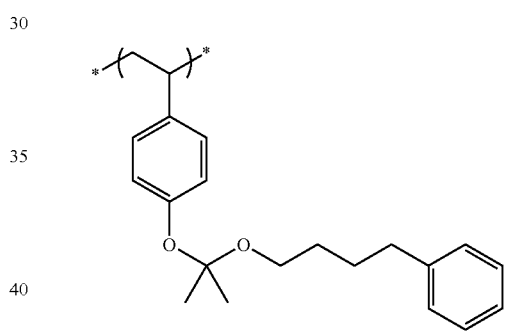
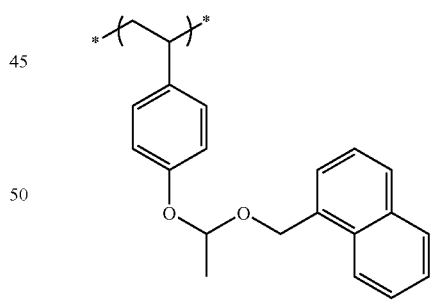
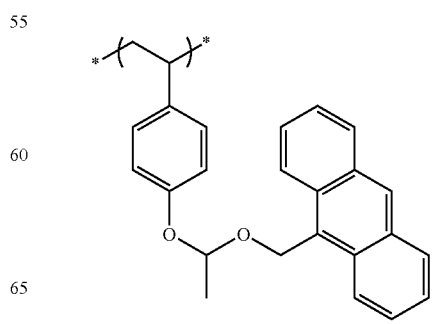

135
-continued
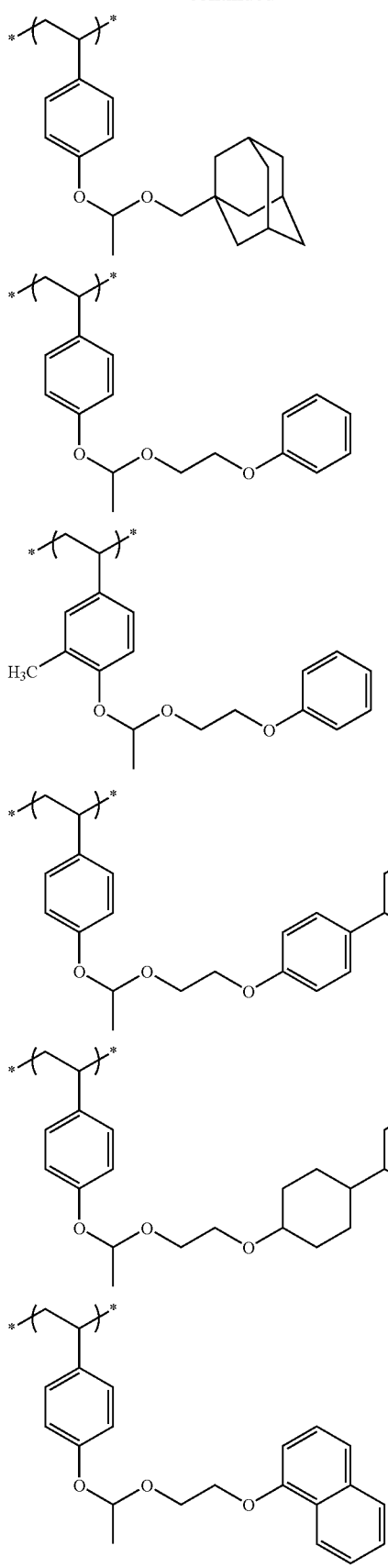
136
-continued
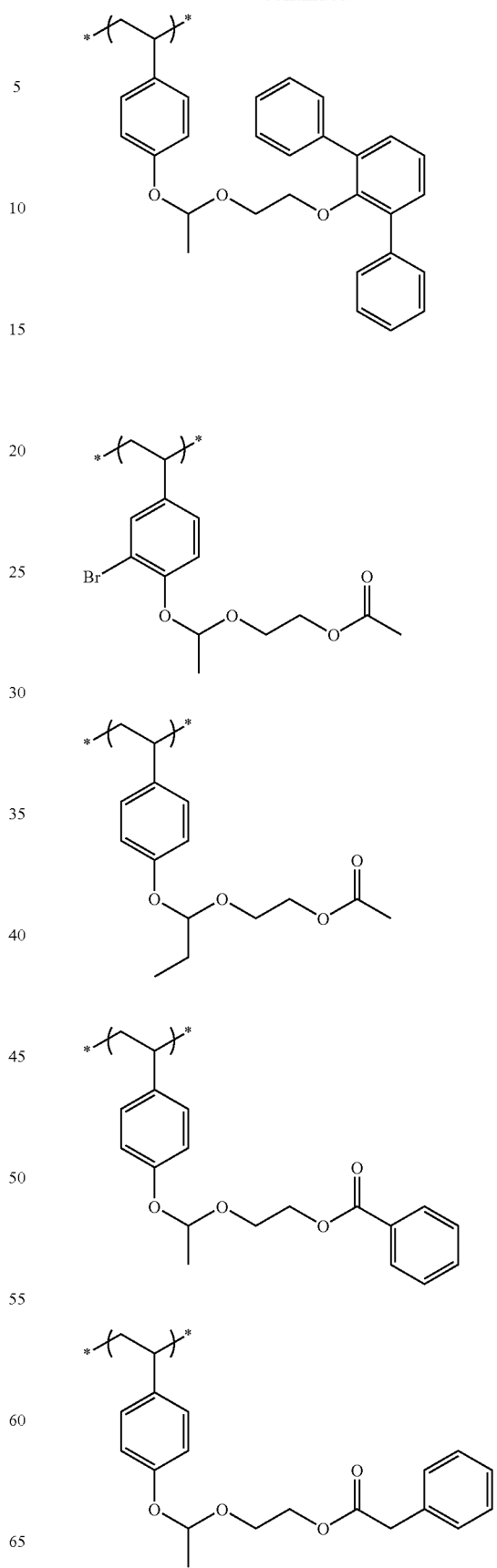

137
-continued
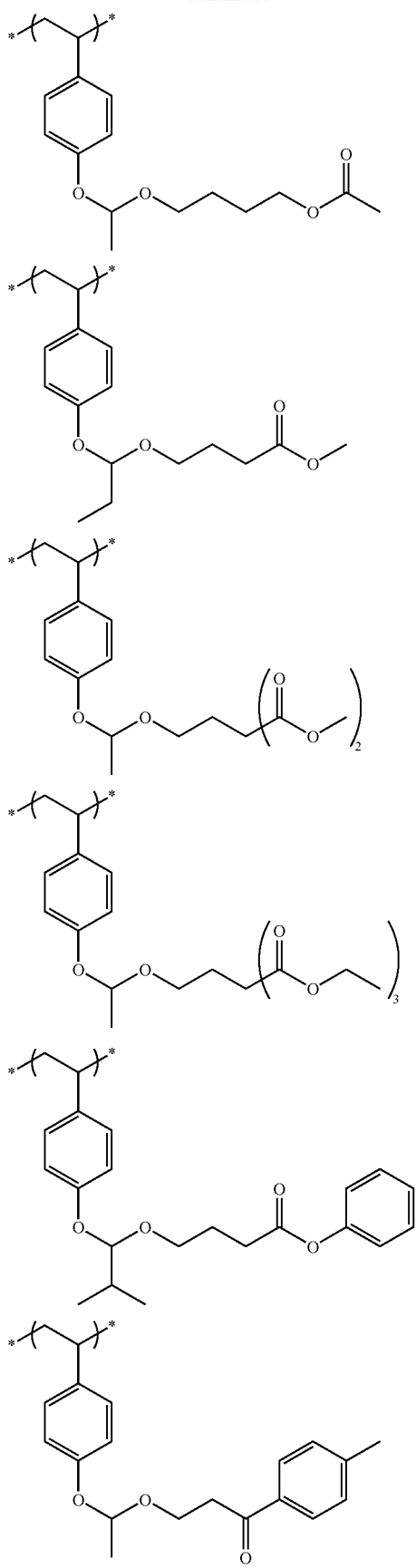
138
-continued
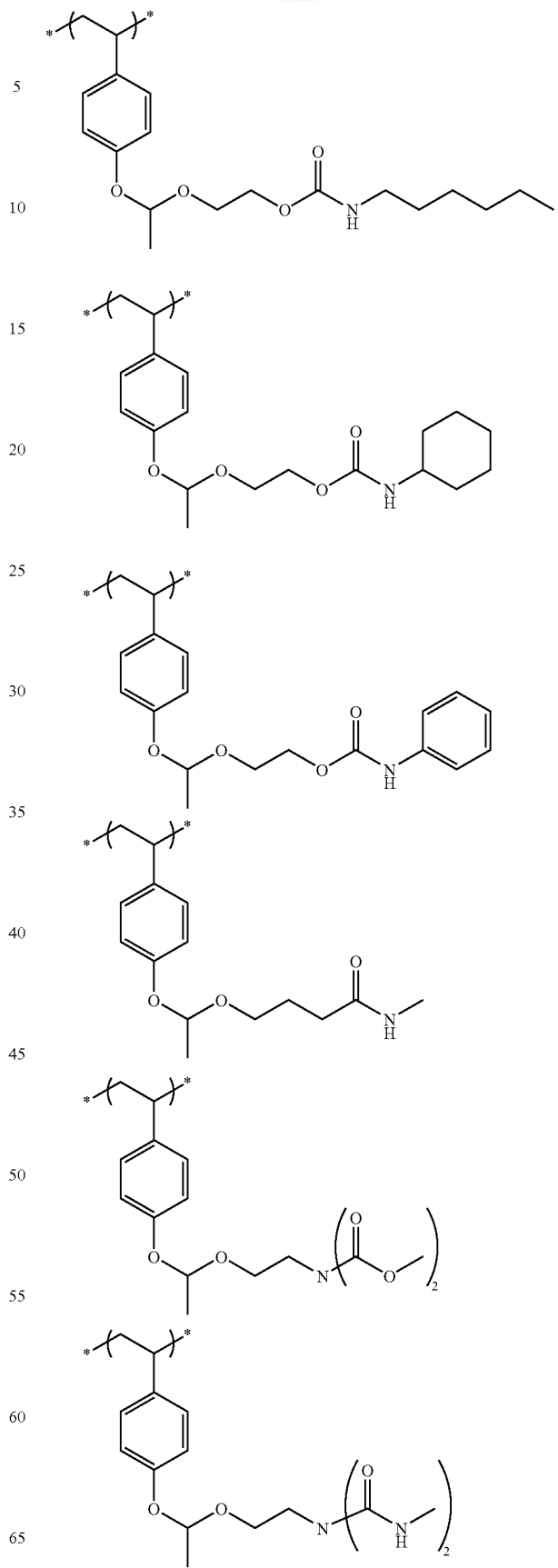

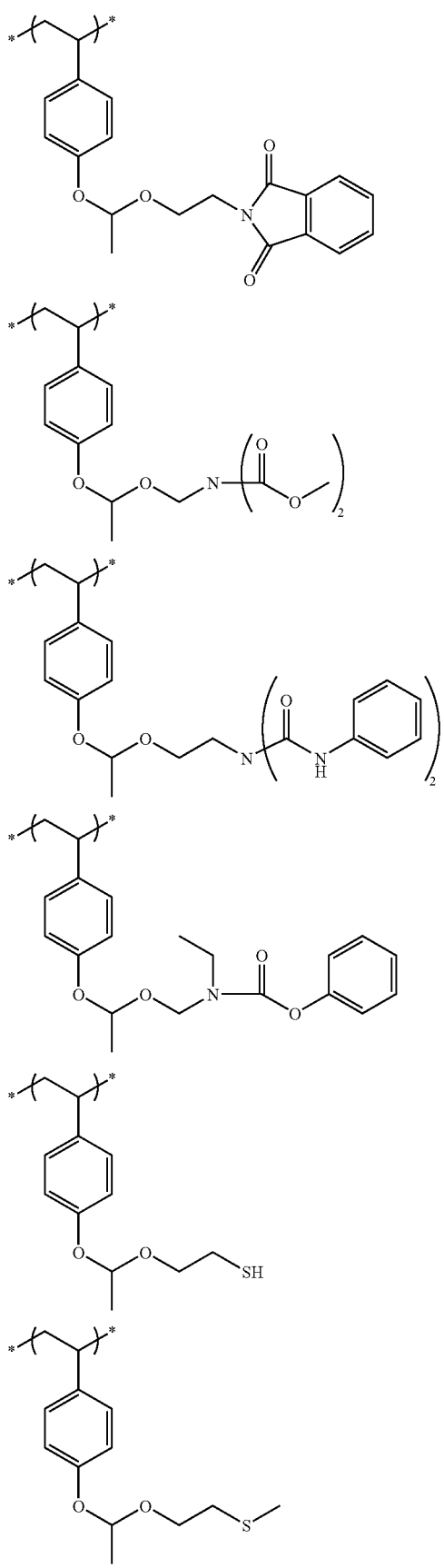
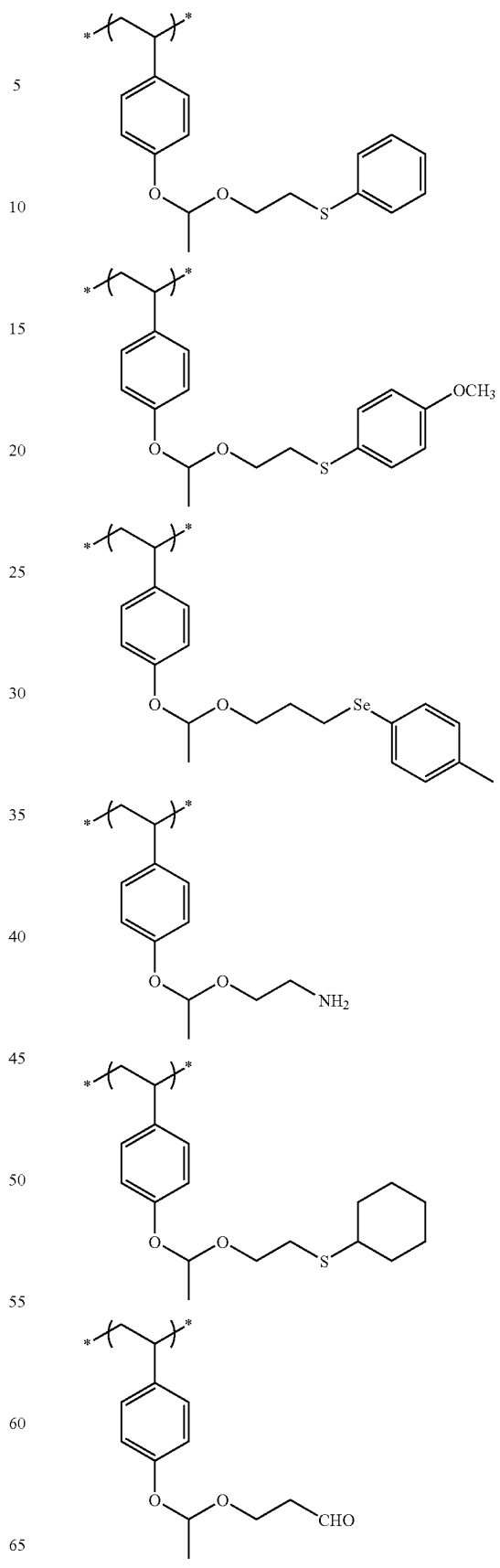

141
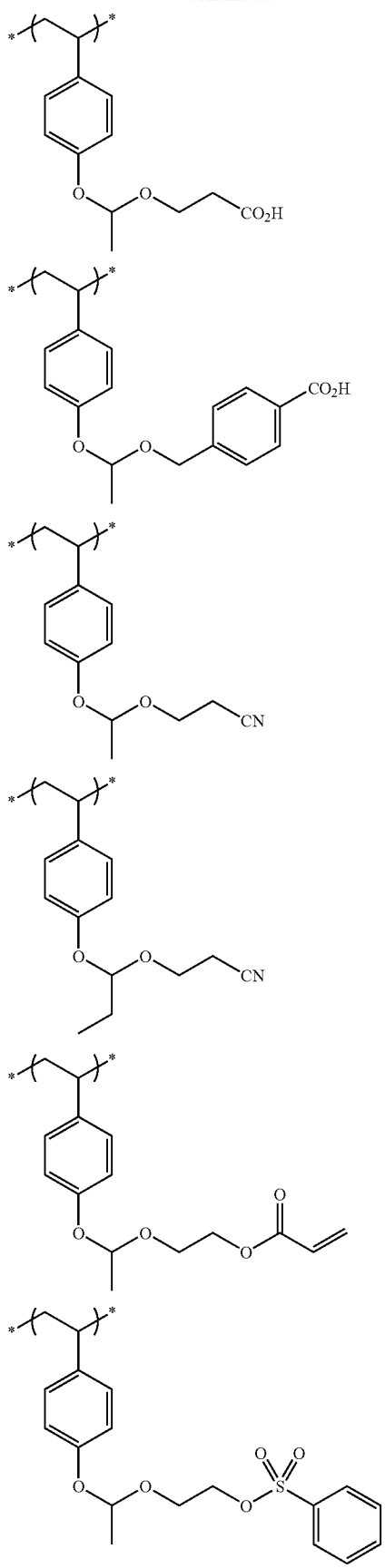
142
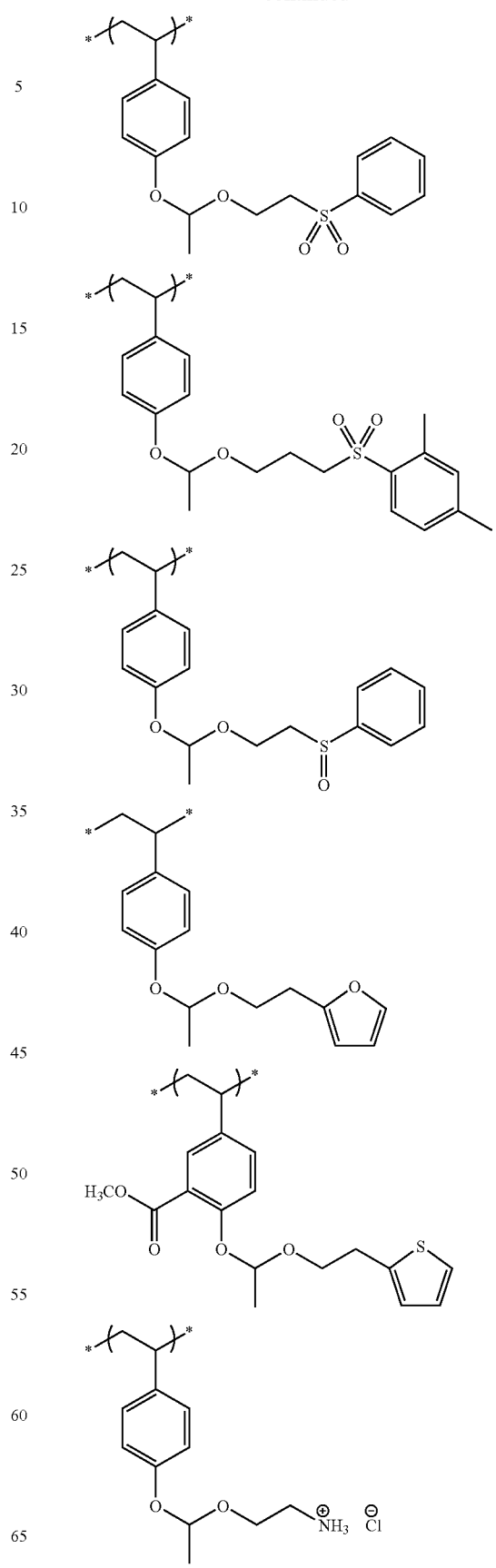

143
-continued
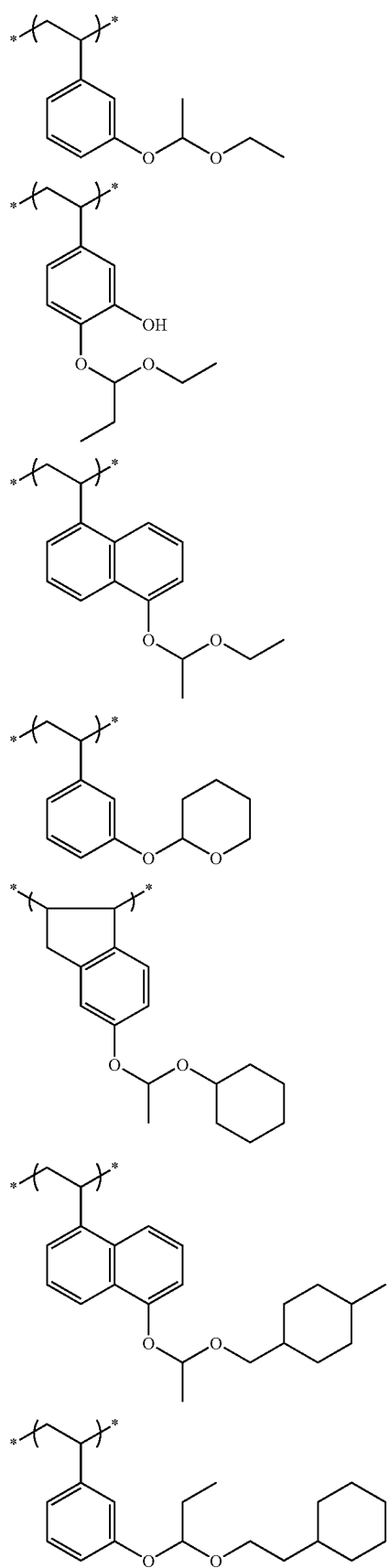
144
-continued
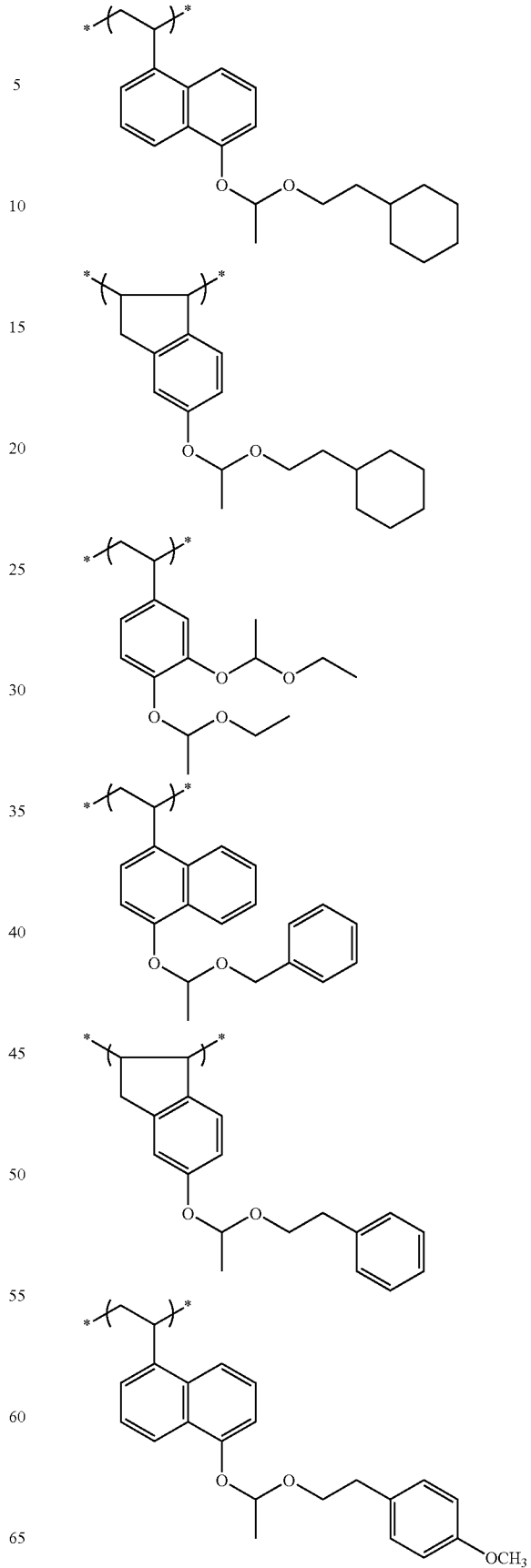

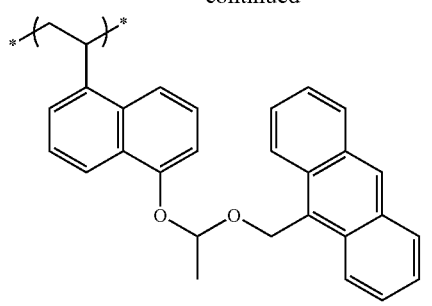
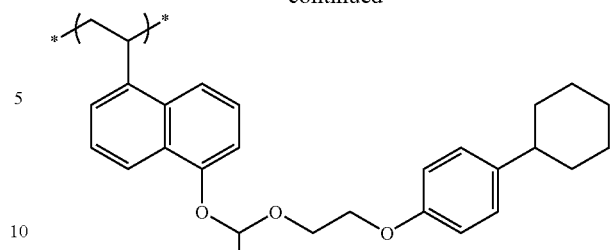
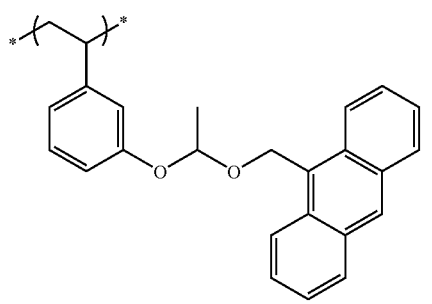
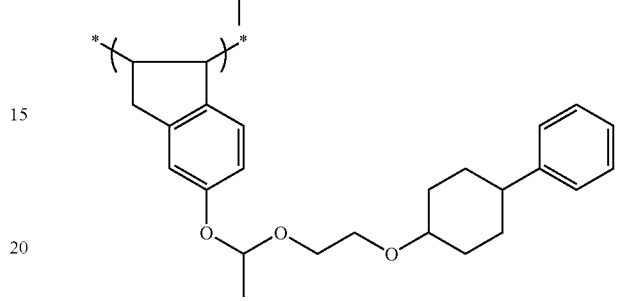
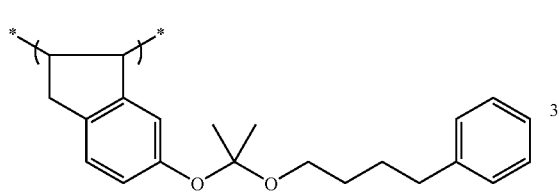
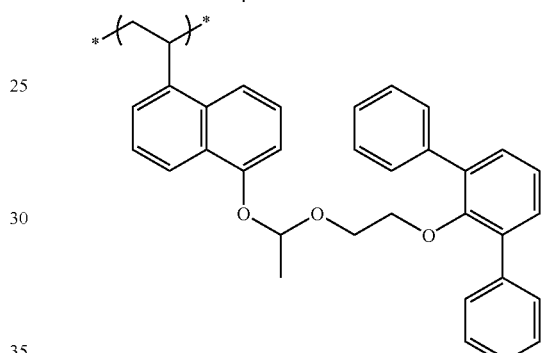
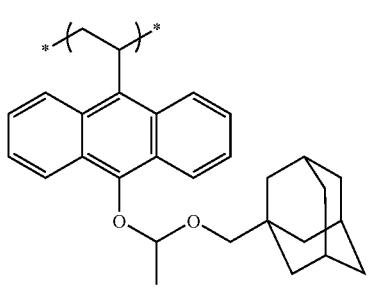
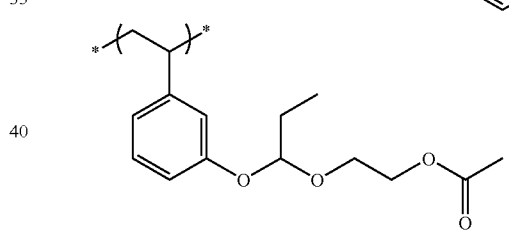
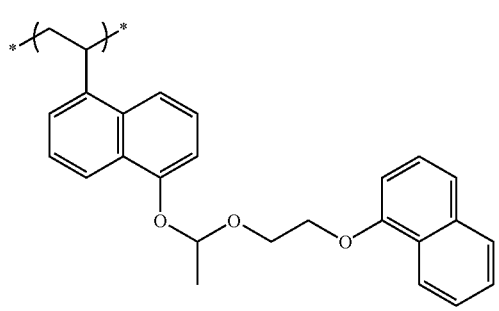
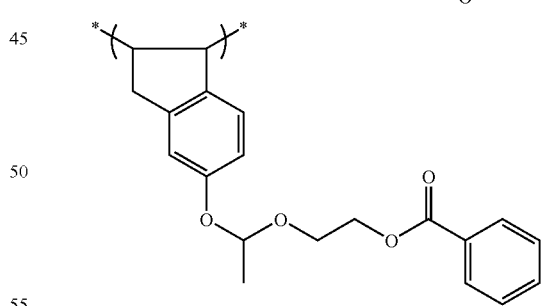
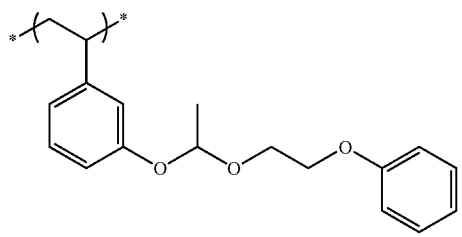
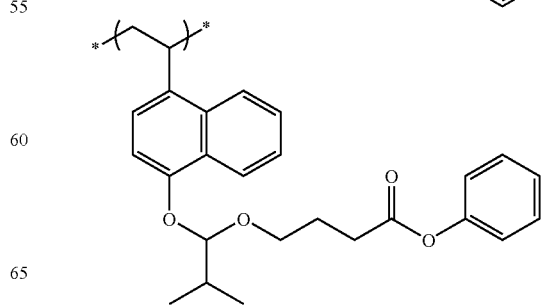

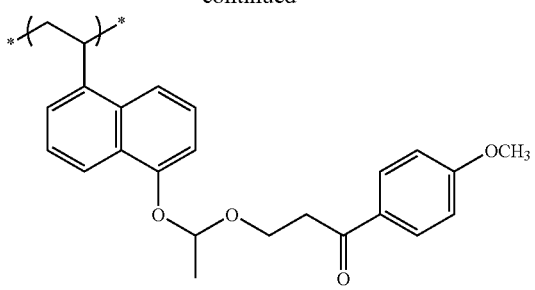

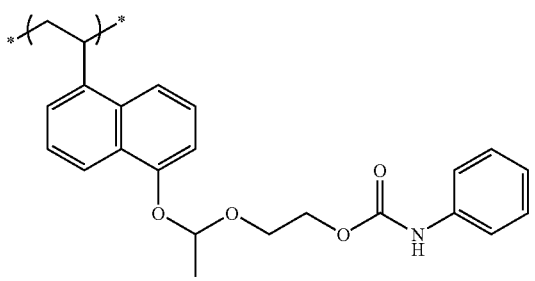

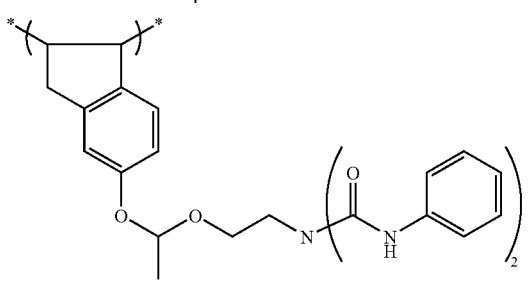

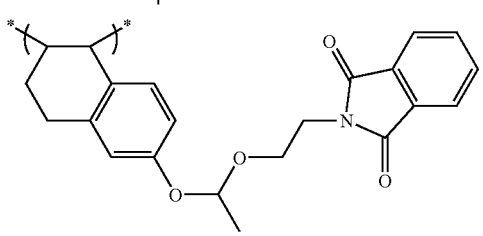

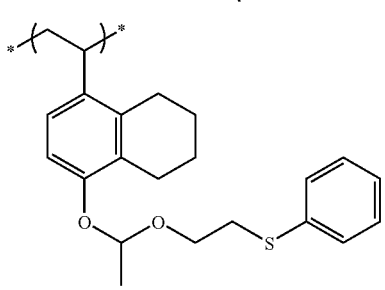

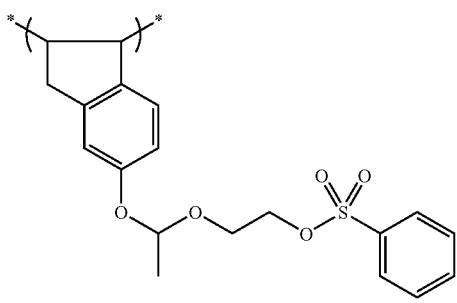

As for the repeating unit (B), a repeating unit represented by the following formula (X) is also applicable.

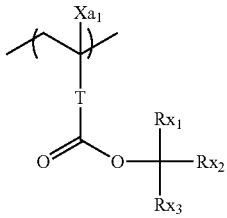

(X)

In formula (X), $Xa_1$ represents a hydrogen atom, a methyl group, a trifluoromethyl group or a hydroxymethyl group.

T represents a single bond or a divalent linking group.

Each of $Rx_1$ to $Rx_3$ independently represents a hydrogen atom, an alkyl group (linear or branched) or a cycloalkyl group (monocyclic or polycyclic).

Two members of $Rx_1$ to $Rx_3$ may combine to form a cycloalkyl group (monocyclic or polycyclic).

Examples of the divalent linking group of T include an alkylene group, a —COO—Rt- group and a —O—Rt- group, wherein Rt represents an alkylene group or a cycloalkylene group.

T is preferably a single bond or a —COO-Rt- group. Rt is preferably an alkylene group having a carbon number of 1 to 5, more preferably a —$CH_2$— group or a —$(CH_2)_3$— group.

The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining two members out of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group. A monocyclic cycloalkyl group having a carbon number of 5 to 6 is especially preferable.

An embodiment where $Rx_1$ is a methyl group or an ethyl group and $Rx_2$ and $Rx_3$ are combined to form the above-described cycloalkyl group is preferred.

Specific examples of the repeating unit represented by formula (X) are set forth below, but the present invention is not limited thereto.

(In formulae, Rx represents H, $CH_3$, $CF_3$ or $CH_2OH$, and each of Rxa and Rxb represents an alkyl group having a carbon number of 1 to 4.)

1

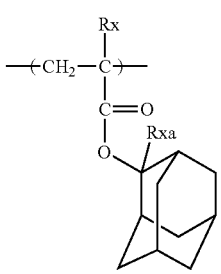

149
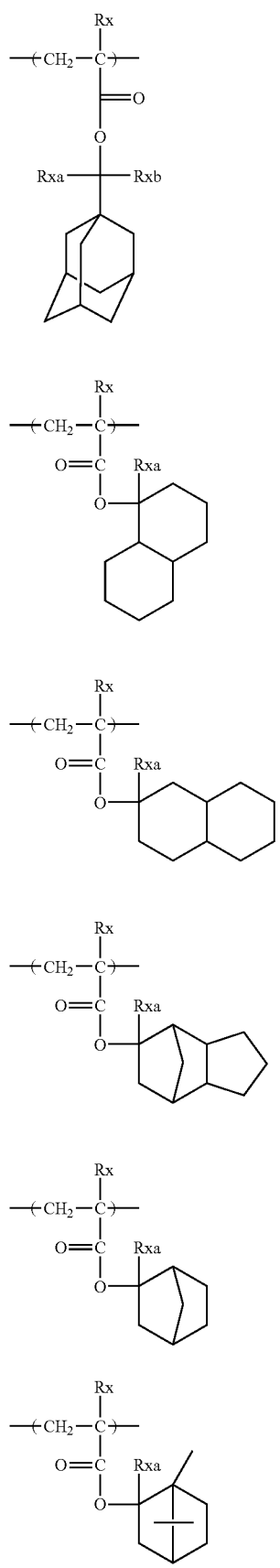
150
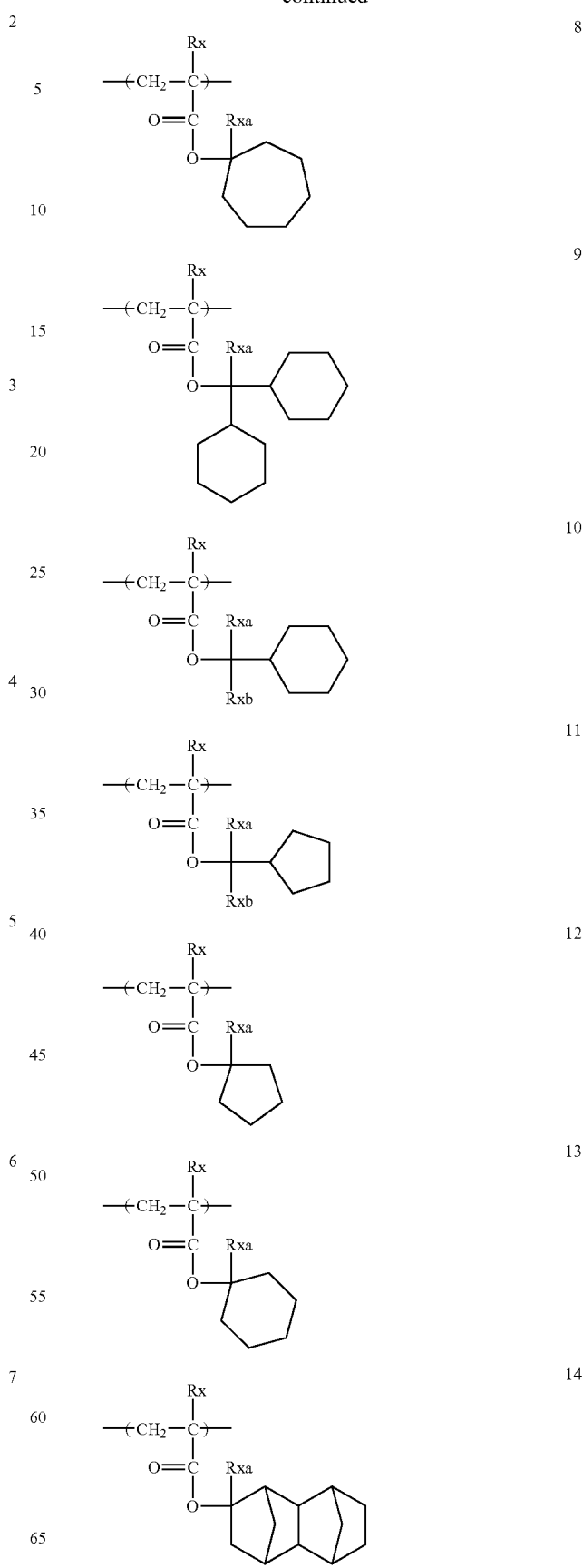

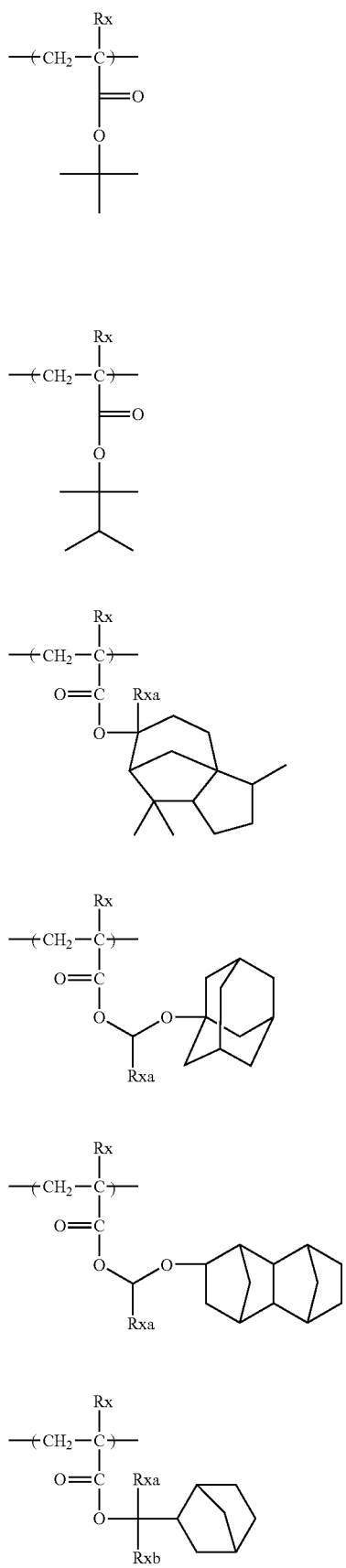
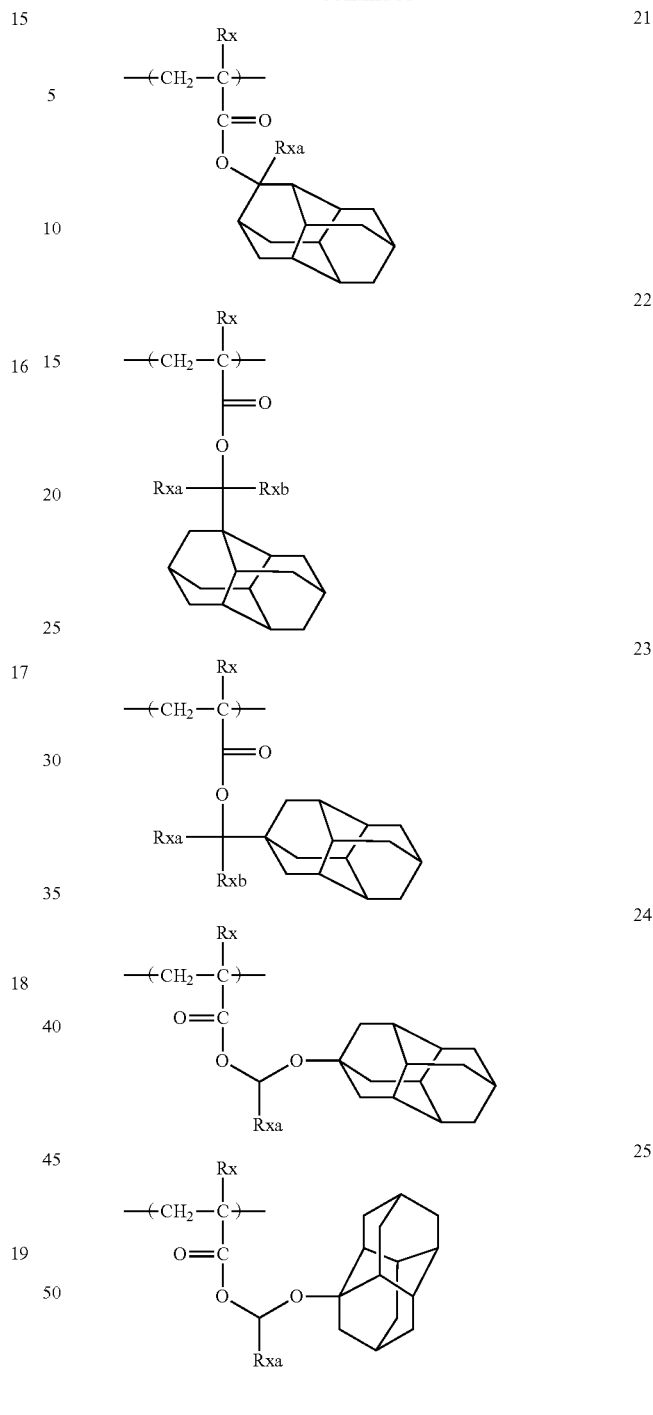

The content of the repeating unit (B) in the resin of the present invention is preferably from 3 to 90 mol %, more preferably from 5 to 80 mol %, still more preferably from 7 to 70 mol %, based on all repeating units.

The ratio of the repeating unit (A) to the repeating unit (B) in the resin (mole number of A/mole number of B) is preferably from 0.04 to 1.0, more preferably from 0.05 to 0.9, still more preferably from 0.06 to 0.8.

(3) Repeating unit (C)

The resin for use in the present invention preferably further contains (C) a repeating unit represented by the following formula (VI):

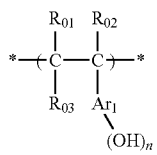

(VI)

wherein each of $R_{01}$, $R_{02}$ and $R_{03}$ independently represents a hydrogen atom, an alkyl group, a cycloalkyl group, a halogen atom, a cyano group or an alkoxycarbonyl group, or $R_{03}$ may represent an alkylene group and combine with $Ar_1$ to form a 5- or 6-membered ring, $Ar_1$ represents (n+1) valent aromatic ring group, provided that $Ar_1$ represents (n+2) valent aromatic ring group when $Ar_1$ combines with $R_{03}$ to form a ring, and n represents an integer of 1 to 4.

Specific examples and preferable examples of $R_{01}$, $R_{02}$, $R_{03}$ and $Ar_1$ in formula (VI) are the same as those for $R_{01}$, $R_{02}$, $R_{03}$ and $Ar_1$ in formula (I).

Specific examples of the repeating unit represented by formula (VI) are set forth below, but the present invention is not limited thereto.

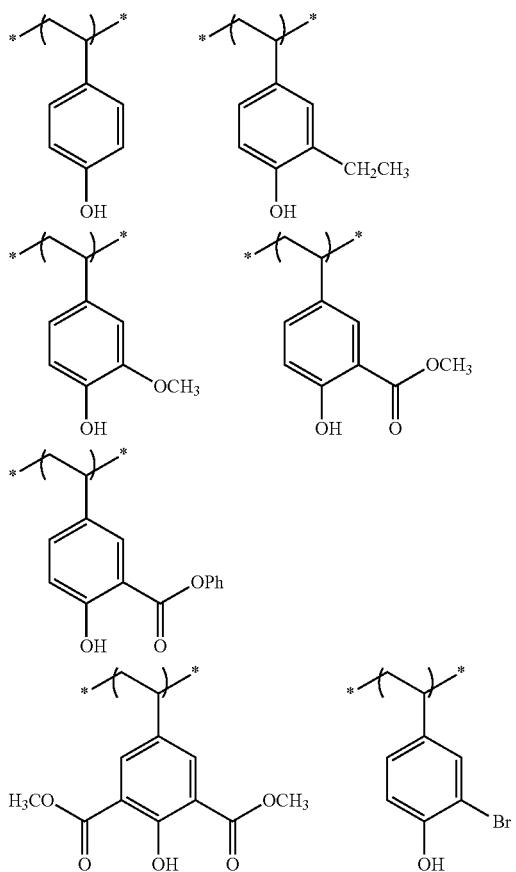

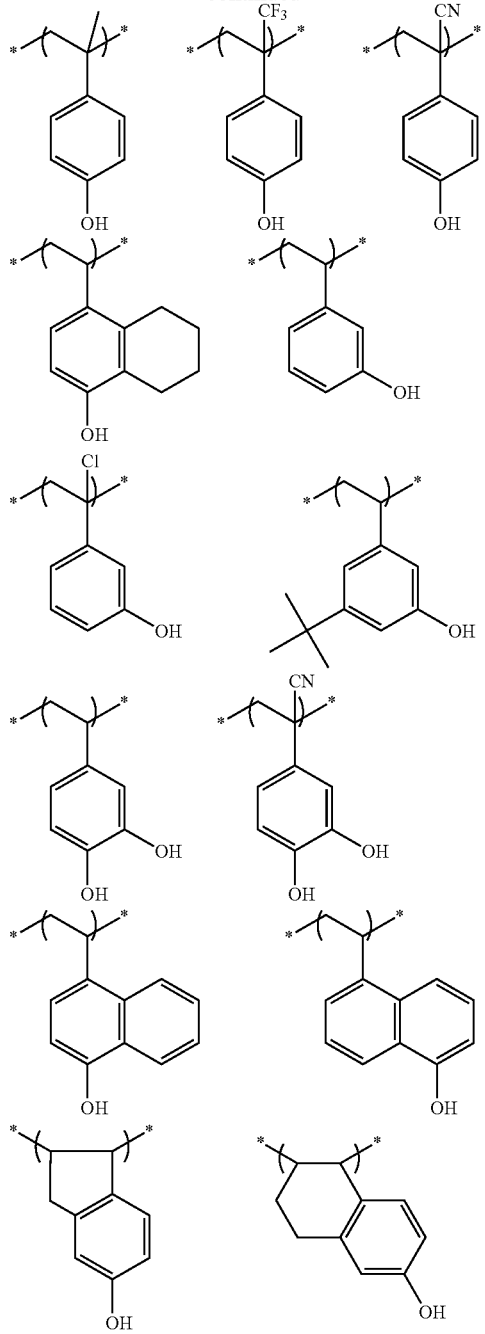

The content of the repeating unit (C) in the resin for use in the present invention is preferably from 3 to 90 mol %, more preferably from 5 to 80 mol %, still more preferably from 7 to 80 mol %, especially more preferably from 7 to 70 mol %, based on all repeating units.

The resin (P) may also contain a repeating unit having a lactone structure.

As for the lactone structure, any structure may be used as long as it has a lactone structure, but the lactone structure is preferably a 5- to 7-membered ring lactone structure, and a structure where another ring structure is condensed to a 5- to 7-membered ring lactone structure in the form of forming a bicyclo or spiro structure is preferred. The resin more preferably contains a repeating unit having a lactone structure represented by any one of the following formulae (LC1-1) to (LC1-17). The lactone structure may be bonded directly to the main chain. Among these lactone structures, preferred are (LC1-1), (LC1-4), (LC1-5), (LC1-6), (LC1-13), (LC1-14) and (LC1-17). By using a specific lactone structure, the resolution is improved.
LC1-1
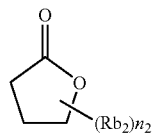
LC1-2
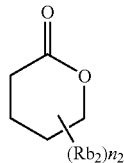
LC1-3
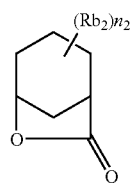
LC1-4
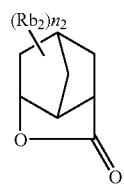
LC1-5
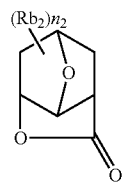
LC1-6
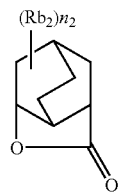
LC1-7
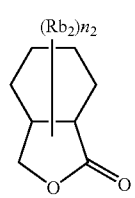
LC1-8
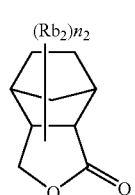
LC1-9
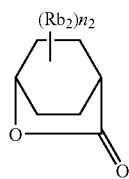
LC1-10
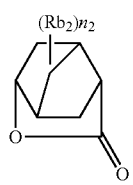
LC1-11
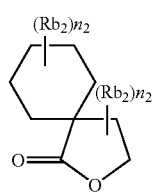
LC1-12
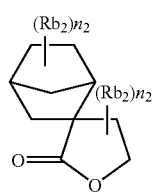
LC1-13
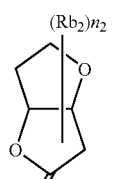
LC1-14
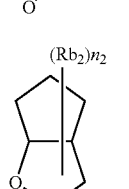
LC1-15
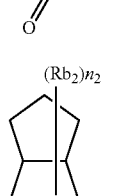
LC1-16
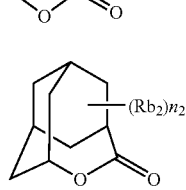

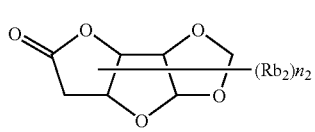
LC1-17

The lactone structure moiety may or may not have a substituent ($Rb_2$). Preferred examples of the substituent ($Rb_2$) include an alkyl group having a carbon number of 1 to 8, a cycloalkyl group having a carbon number of 3 to 7, an alkoxy group having a carbon number of 1 to 8, an alkoxycarbonyl group having a carbon number of 1 to 8, a carboxy group, a halogen atom, a hydroxyl group, a cyano group and an acid-decomposable group.

$n_2$ represents an integer of 0 to 4. When $n_2$ is an integer of 2 or more, each substituent ($Rb_2$) may be the same as or different from every other substituent ($Rb_2$). Also, in this case, the plurality of substituents ($Rb_2$) may combine with each other to form a ring structure.

In (LC1-1) to (LC1-17), $n_2$ is preferably 2 or less. The group having a lactone structure is preferably a monovalent organic group having an unsubstituted lactone structure, or a monovalent organic group having a lactone structure containing a methyl group, a cyano group or an alkoxycarbonyl group as the substituent, more preferably a monovalent organic group having a lactone structure containing a cyano group as the substituent (cyanolactone).

The repeating unit having a lactone structure represented by any one of formulae (LC1-1) to (LC1-17) includes a repeating unit represented by the following formula (AII):

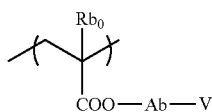
(AII)

In formula (AII), $Rb_0$ represents a hydrogen atom, a halogen atom or an alkyl group (preferably having a carbon number of 1 to 4).

The alkyl group of $Rb_0$ may have a substituent, and preferred examples of the substituent which the alkyl group of $Rb_0$ may have include a hydroxyl group and a halogen atom. The halogen atom includes a fluorine atom, a chlorine atom, a bromine atom and an iodine atom.

$Rb_0$ is preferably a hydrogen atom, a methyl group, a hydroxymethyl group or a trifluoromethyl group, more preferably a hydrogen atom or a methyl group.

Ab represents an alkylene group, a divalent linking group having a monocyclic or polycyclic alicyclic hydrocarbon structure, a single bond, an ether bond, an ester bond, a carbonyl group, or a combination thereof (preferably having a total carbon number of 20 or less). Ab is preferably a single bond or a linking group represented by -$Ab_1$-$CO_2$—.

$Ab_1$ represents an alkylene group (which may be linear or branched) or a monocyclic or polycyclic cycloalkylene group and is preferably a methylene group, an ethylene group, a cyclohexylene group, an adamantylene group or a norbornylene group.

V represents a group having a lactone structure represented by any one of formulae (LC1-1) to (LC1-17). The group having a lactone structure may be a monovalent group formed by replacing an arbitrary one hydrogen atom in the lactone structure represented by any one of formulae (LC1-1) to (LC1-17) with the bond to Ab.

The repeating unit having a lactone structure usually has an optical isomer, but any optical isomer may be used. One optical isomer may be used alone or a mixture of a plurality of optical isomers may be used. In the case of mainly using one optical isomer, the optical purity thereof is preferably 90% ee or more, more preferably 95% ee or more.

Particularly preferred examples of the repeating unit having a lactone structure include the following repeating unit. By selecting an optimal lactone structure, the pattern profile and the iso/dense bias can be improved. In the formulae, each of Rx and R represents H, $CH_3$, $CH_2OH$ or $CF_3$.

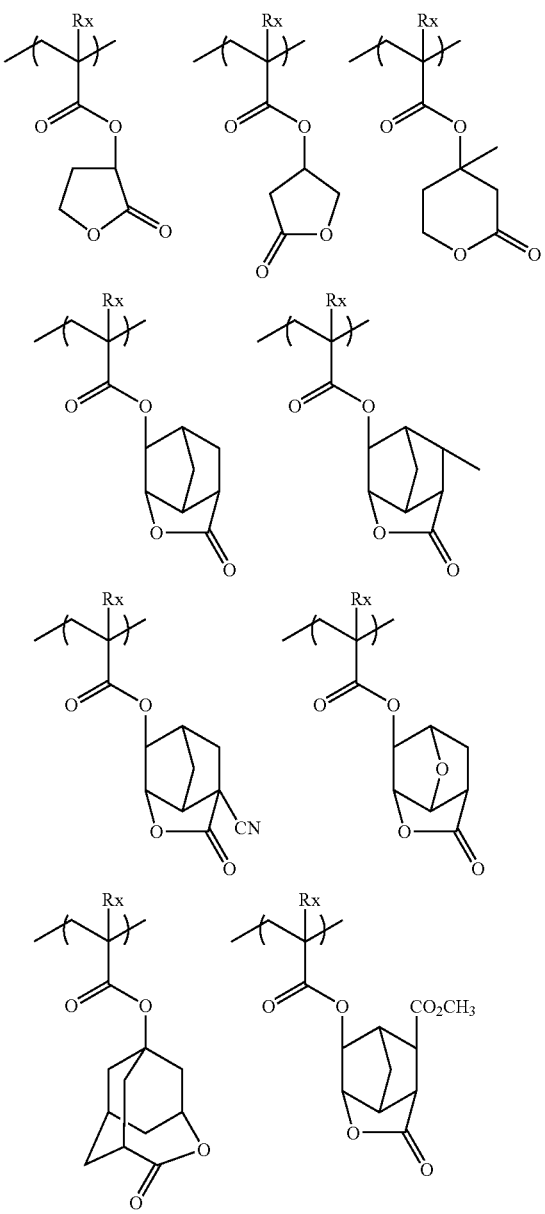

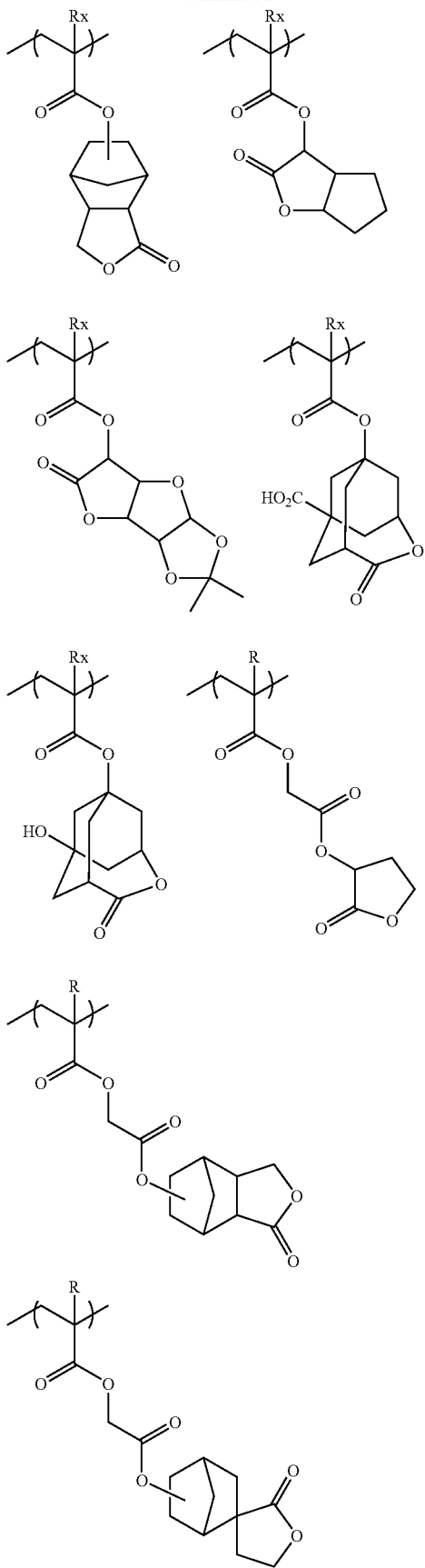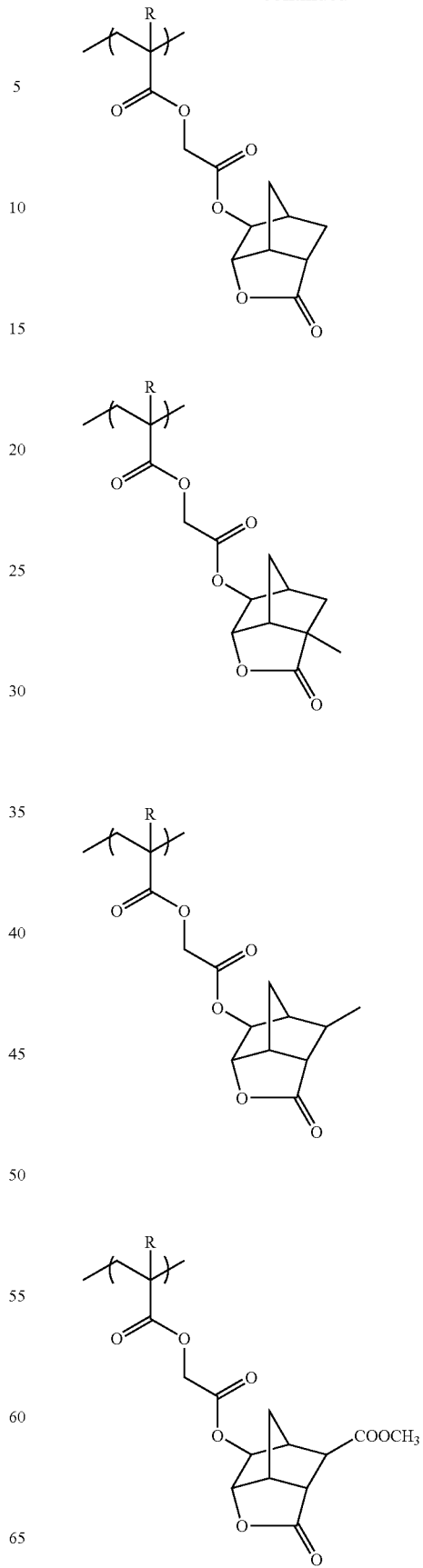

161
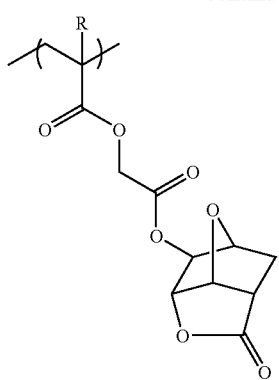
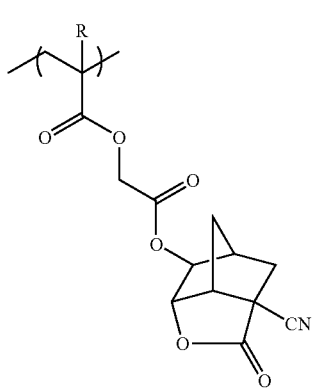
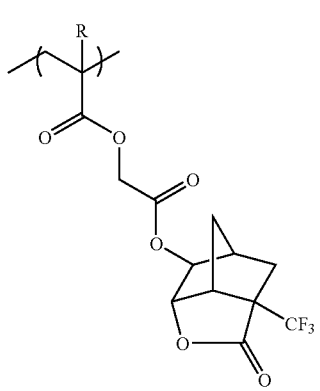
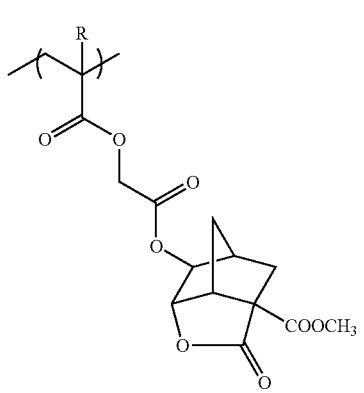
162
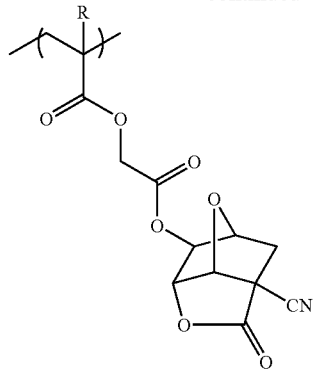
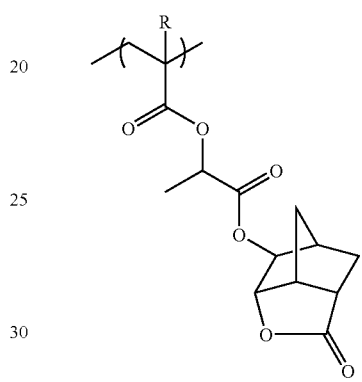
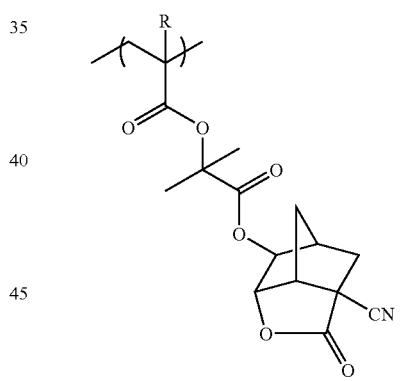
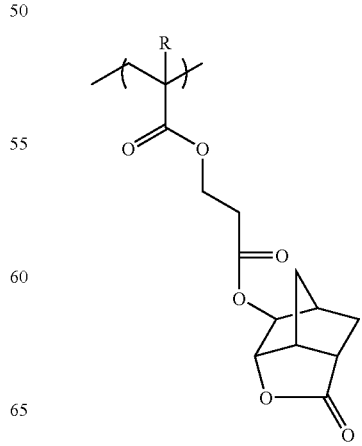

163
-continued
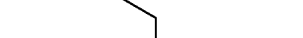
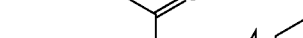
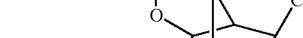
164
-continued
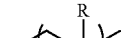
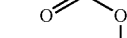
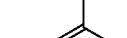
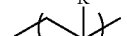
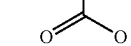

In the case where the resin (P) contains a repeating unit having a lactone structure, the content of the lactone structure-containing repeating unit occupying in the resin (P) is preferably from 1 to 60 mol %, more preferably from 3 to 50 mol %, still more preferably from 5 to 45 mol %, based on all repeating units in the resin (P).

(4) Form, polymerization method, molecular weight, etc. of the resin (P) for use in the present invention The form of the resin (P) may be any of random, block, comb and star forms.

The resin (P) for use in the present invention containing the above-described repeating units (A) and (B) or the resin (P) for use in the present invention containing the repeating units (A), (B) and (C) can be synthesized, for example, by radical, cationic or anionic polymerization of unsaturated monomers corresponding to respective structures. The objective resin may also be obtained by performing a polymer reaction after polymerization using unsaturated monomers corresponding precursors of respective structures.

The resin for use in the present invention preferably contains from 0.5 to 80 mol % of the repeating unit (A), from 3 to 90 mol % of the repeating unit (B) and from 3 to 90 mol % of the repeating unit (C), based on all repeating units constituting the resin.

The resin (P) for use in the present invention is not particularly limited in its molecular weight, but the weight average molecular weight thereof is preferably from 1,000 to 100,000, more preferably from 1,500 to 70,000, still more preferably from 2,000 to 50,000. Here, the weight average molecular weight of the resin indicates a polystyrene-equivalent molecular weight measured by GPC (carrier: THF or N-methyl-2-pyrrolidone (NMP)).

The polydispersity (Mw/Mn) is preferably from 1.00 to 5.00, more preferably from 1.03 to 3.50, still more preferably from 1.05 to 2.50.

For the purpose of enhancing the performance of the resin for use in the present invention, a repeating unit derived from other polymerizable monomers may be contained within the range not seriously impairing the dry etching resistance.

The content of the repeating unit derived from other polymerizable monomers in the resin is generally 50 mol % or less, preferably 30 mol % or less, based on all repeating units. Other polymerizable monomers which can be used include, for example, a compound having one addition-polymerizable unsaturated bond selected from (meth)acrylic acid esters, (meth)acrylamides, allyl compounds, vinyl ethers, vinyl esters, styrenes and crotonic acid esters.

Specifically, examples of the (meth)acrylic acid esters include methyl (meth)acrylate, ethyl (meth)acrylate, propyl (meth)acrylate, tert-butyl (meth)acrylate, amyl (meth)acrylate, cyclohexyl (meth)acrylate, ethylhexyl (meth)acrylate, octyl (meth)acrylate, tert-octyl (meth)acrylate, 2-chloroethyl (meth)acrylate, 2-hydroxyethyl (meth)acrylate, glycidyl (meth)acrylate, benzyl (meth)acrylate and phenyl (meth)acrylate.

Examples of the (meth)acrylamides include (meth)acrylamide, N-alkyl(meth)acrylamide (the alkyl group is an alkyl group having a carbon number of 1 to 10, such as methyl group, ethyl group, propyl group, butyl group, tert-butyl group, heptyl group, octyl group, cyclohexyl group, benzyl group and hydroxyethyl group), N-aryl(meth)acrylamide (the aryl group is, for example, a phenyl group, a tolyl group, a nitrophenyl group, a naphthyl group, a cyanophenyl group, a hydroxyphenyl group or a carboxyphenyl group), N,N-dialkyl(meth)acrylamide (the alkyl group is an alkyl group having a carbon number of 1 to 10, such as methyl group, ethyl group, butyl group, isobutyl group, ethylhexyl group and cyclohexyl group), N,N-aryl(meth)acrylamide (the aryl group is, for example, a phenyl group), N-methyl-N-phenylacrylamide, N-hydroxyethyl-N-methylacrylamide and N-2-acetamidoethyl-N-acetylacrylamide.

Examples of the allyl compounds include allyl esters (e.g., allyl acetate, allyl caproate, allyl caprylate, allyl laurate, allyl palmitate, allyl stearate, allyl benzoate, allyl acetoacetate, allyl lactate), and allyloxyethanol.

Examples of vinyl ethers include an alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether), and a vinyl aryl ether (e.g., vinyl phenyl ether, vinyl tolyl ether, vinyl chlorophenyl ether, vinyl 2,4-dichlorophenyl ether, vinyl naphthyl ether, vinyl anthranyl ether).

Examples of vinyl esters include vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-$\beta$-phenylbutyrate, vinyl cyclohexylcarboxylate, vinyl benzoate, vinyl salicylate, vinyl chlorobenzoate, vinyl tetrachlorobenzoate and vinyl naphthoate.

Examples of the styrenes include styrene, an alkylstyrene (e.g., methylstyrene, dimethylstyrene, trimethylstyrene, ethylstyrene, diethylstyrene, isoproylstyrene, butylstyrene, hexylstyrene, cyclohexylstyrene, decylstyrene, benzylstyrene, chloromethylstyrene, trifluoromethylstyrene, ethoxymethylstyrene and acetoxymethylstyrene), an alkoxystyrene (e.g., methoxystyrene, 4-methoxy-3-methylstyrene, dimethoxystyrene), an alkylcarbonyloxystyrene (e.g., 4-acetoxystyrene, 4-cyclohexylcarbonyloxystyrene), an arylcarbonyloxystyrene (e.g., 4-phenylcarbonyloxystyrene), a halogen styrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene), cyanostyrene and carboxystyrene.

Examples of the crotonic acid esters include an alkyl crotonate (e.g., butyl crotonate, hexyl crotonate, glycerin monocrotonate).

As to the resin (P) for use in the present invention, one kind may be used alone, or two or more kinds may be used in combination. The content of the resin (P) is preferably from 30 to 100 mass %, more preferably from 50 to 100 mass %, still more preferably from 70 to 100 mass %, based on the entire solid content in the actinic ray-sensitive or radiation-sensitive resin composition of the present invention.

Specific examples of the resin (P) include, but are not limited to, the followings.

Specific examples of the resin (P) include a resin containing one or more kinds of repeating units selected from specific examples of formulae (III) to (IV)/one or more kinds of repeating units selected from specific examples of formula (VI), a resin containing one or more kinds of repeating units selected from specific examples of formulae (III) to (IV)/one or more kinds of repeating units selected from specific examples of formula (VI)/one or more kinds of repeating units selected from specific examples of formula (I), and a resin containing one or more kinds of repeating units selected from specific examples of formulae (III) to (IV)/one or more kinds of repeating units selected from specific examples of formula (VI)/one or more kinds of repeating units selected from specific examples of formula (X).
More preferred specific examples include resins of the following structures.
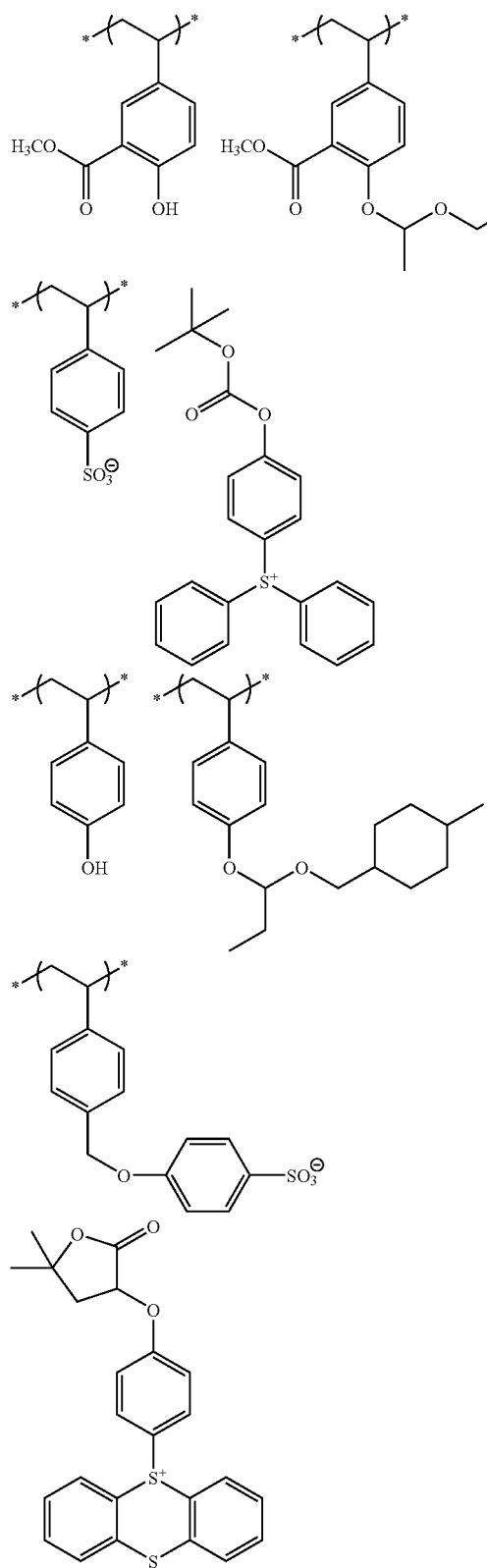
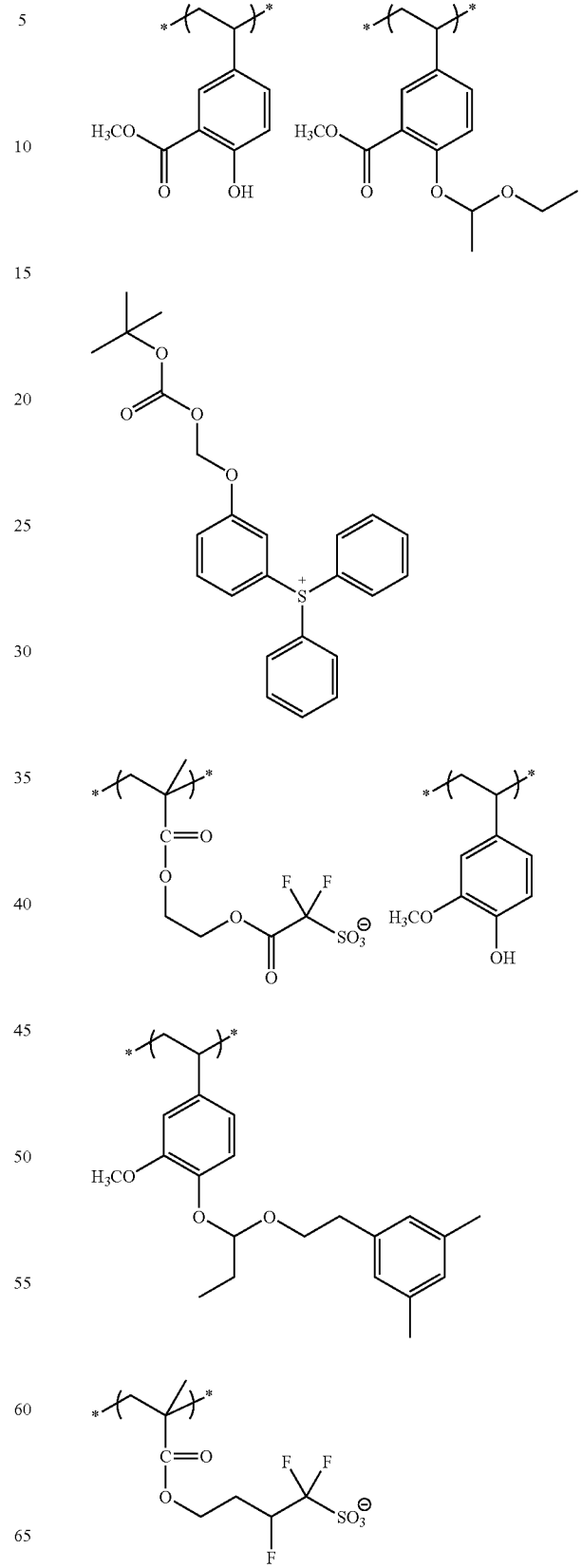

169
-continued
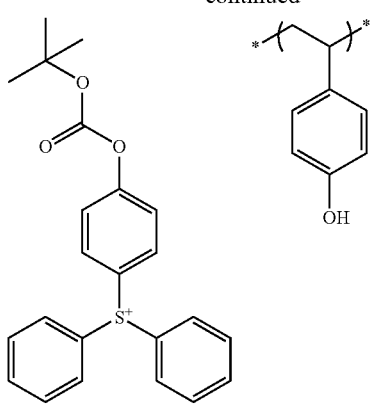
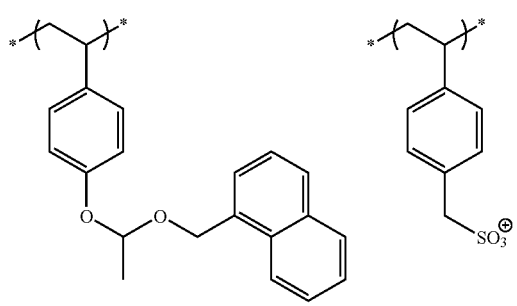
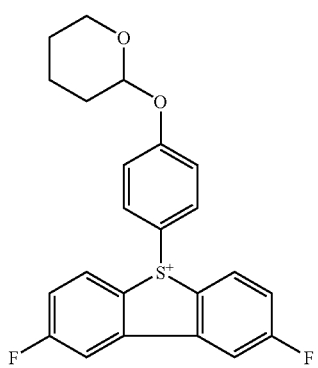
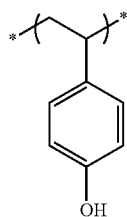
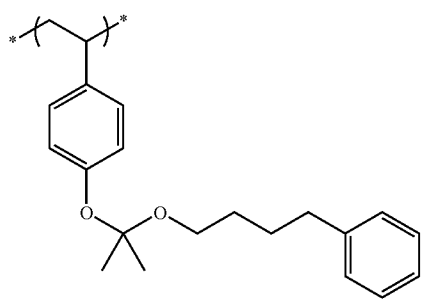
170
-continued
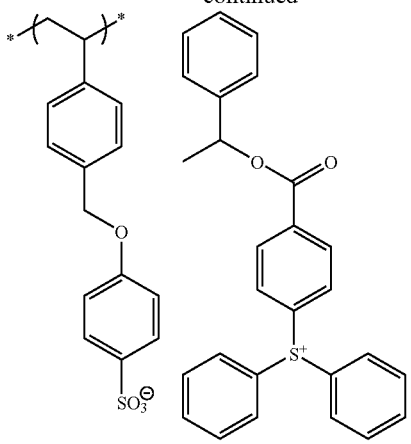
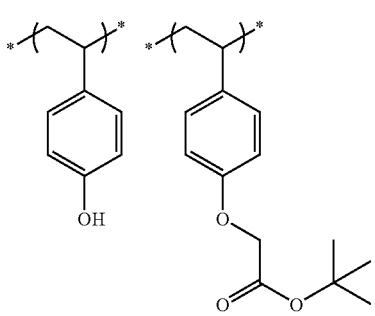
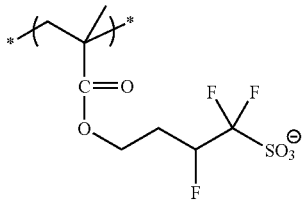
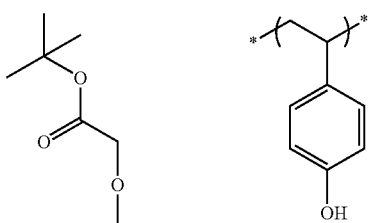
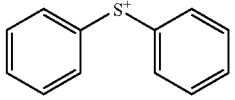
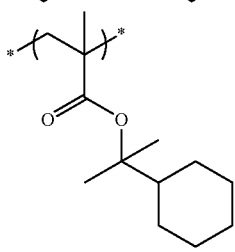

171
-continued
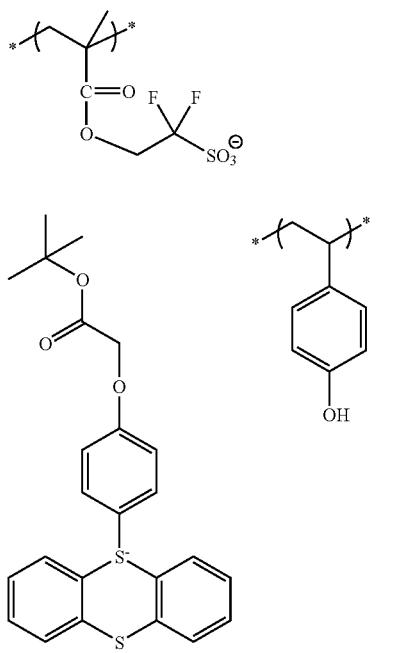
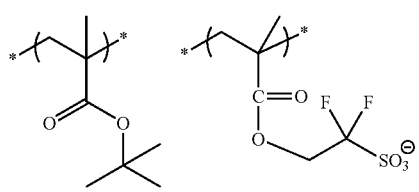
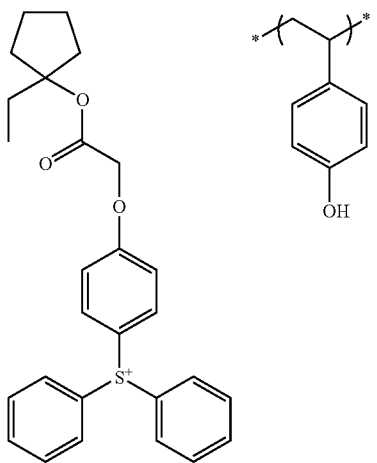
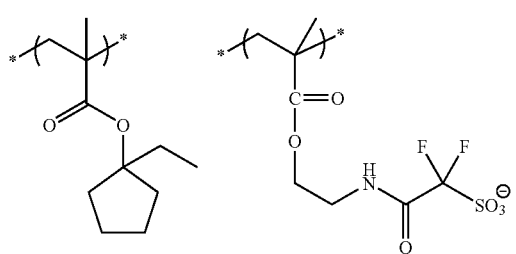
172
-continued
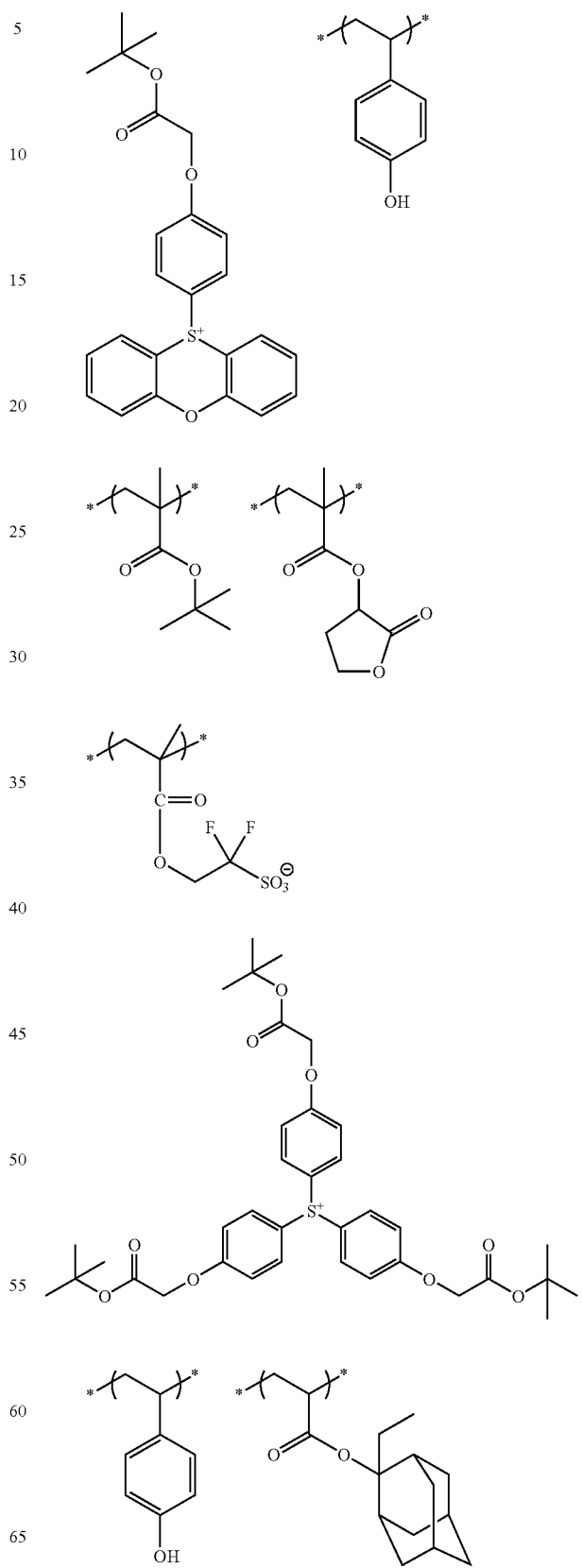

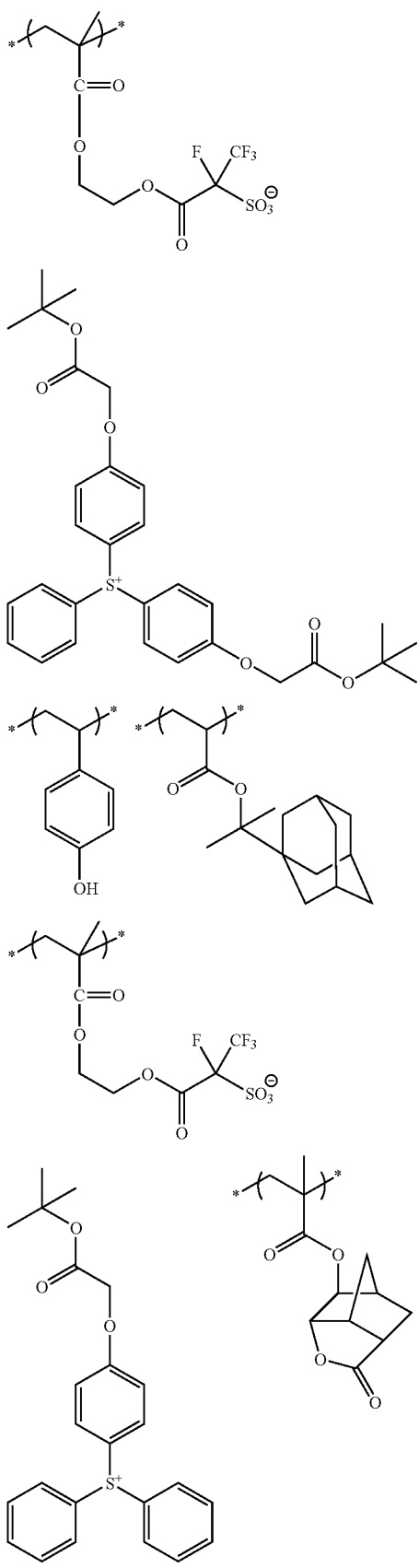
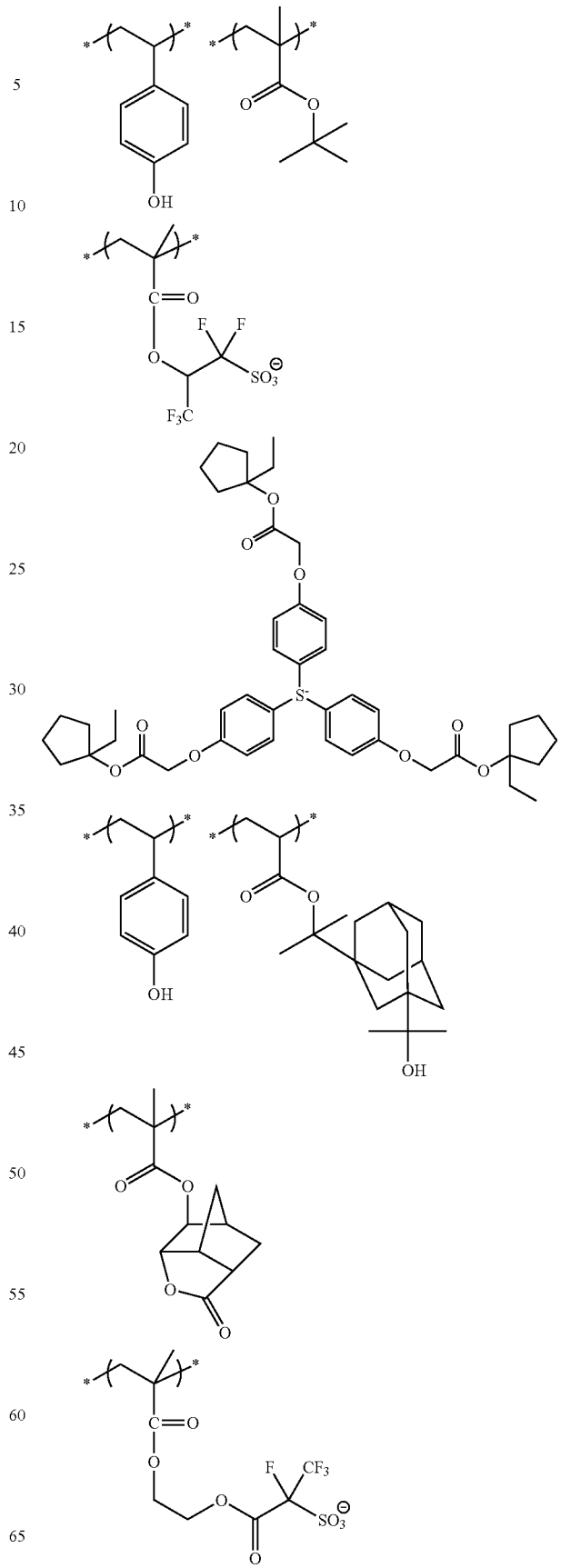

175
-continued
176
-continued
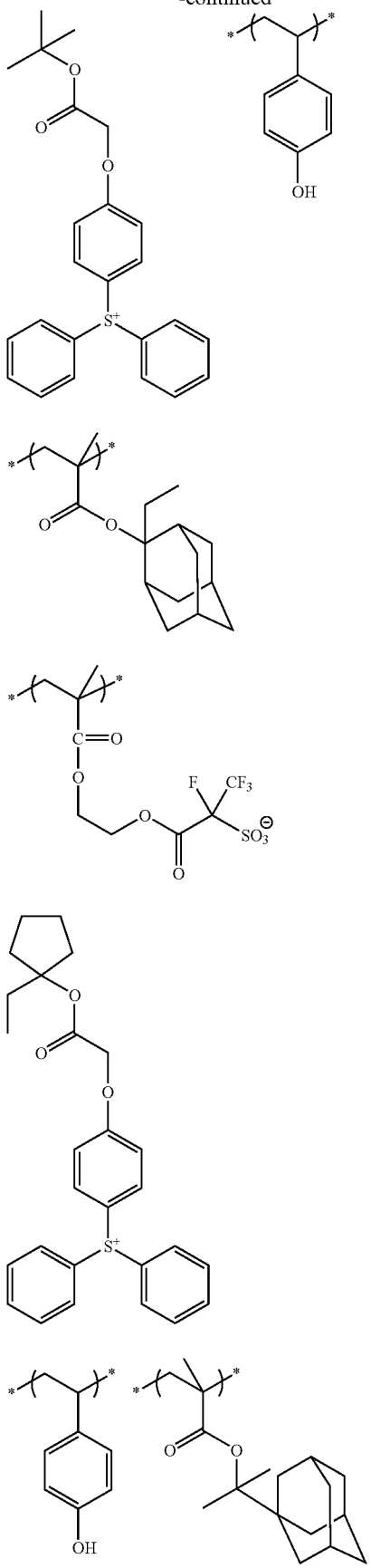
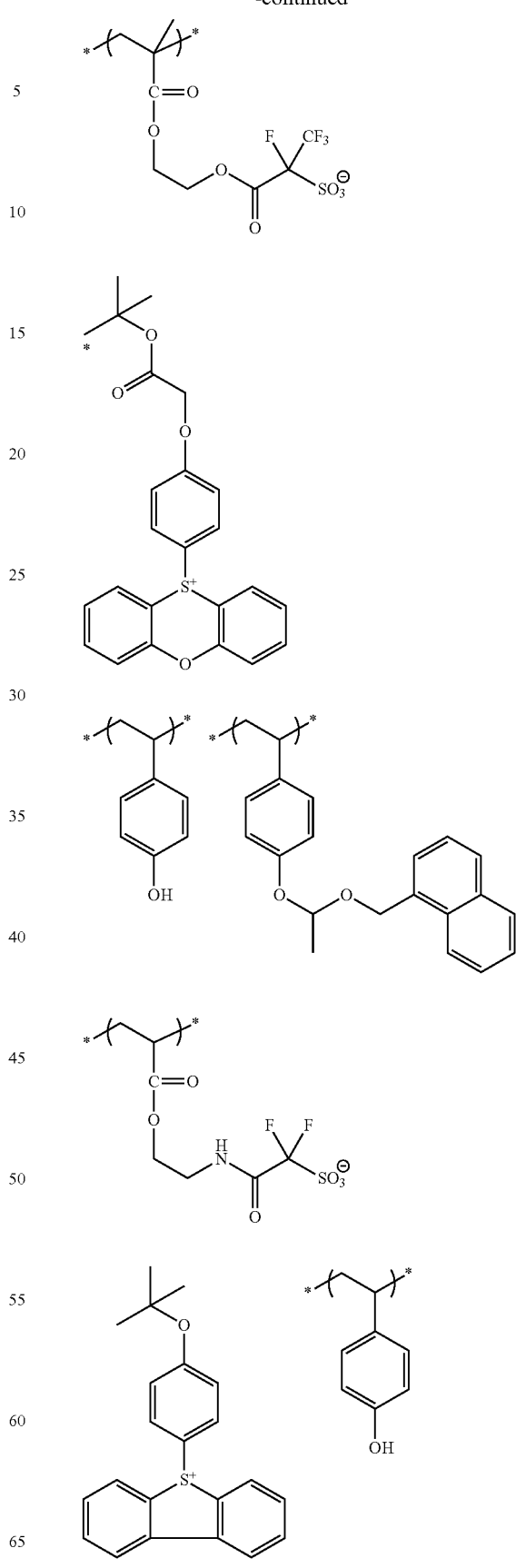

177
-continued
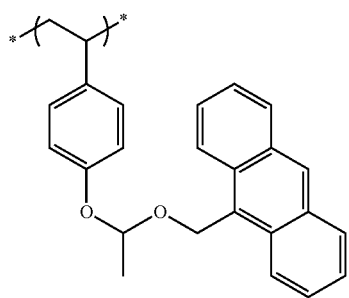
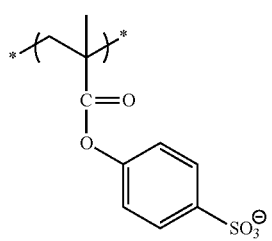
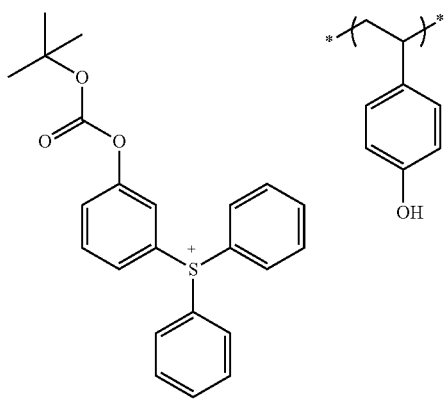
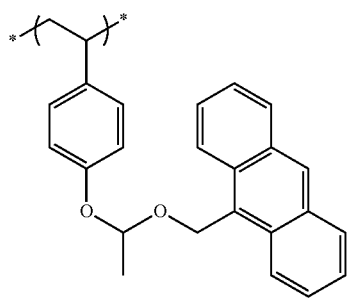
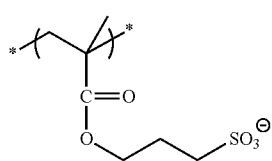
178
-continued
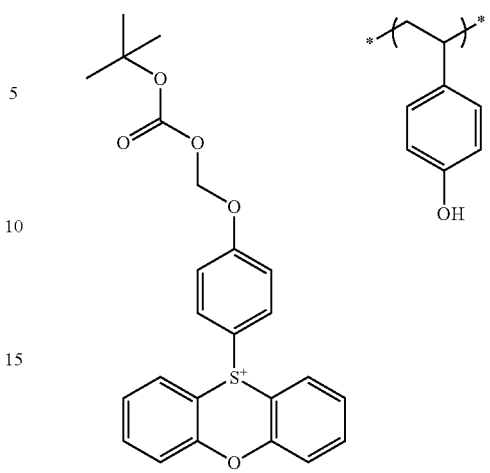
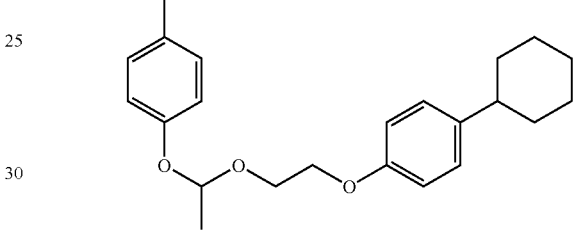
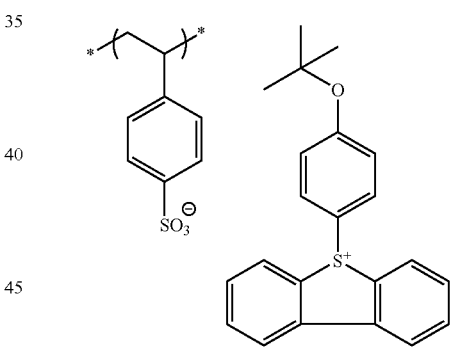
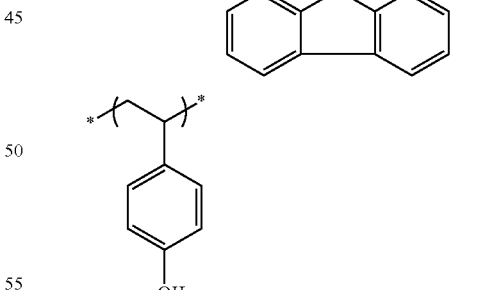
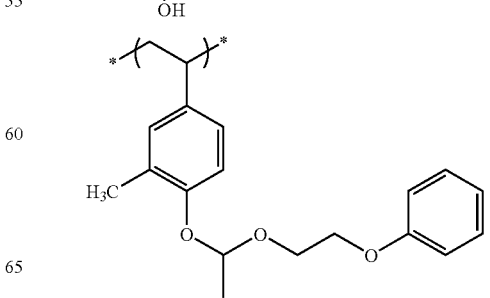

179
-continued
180
-continued
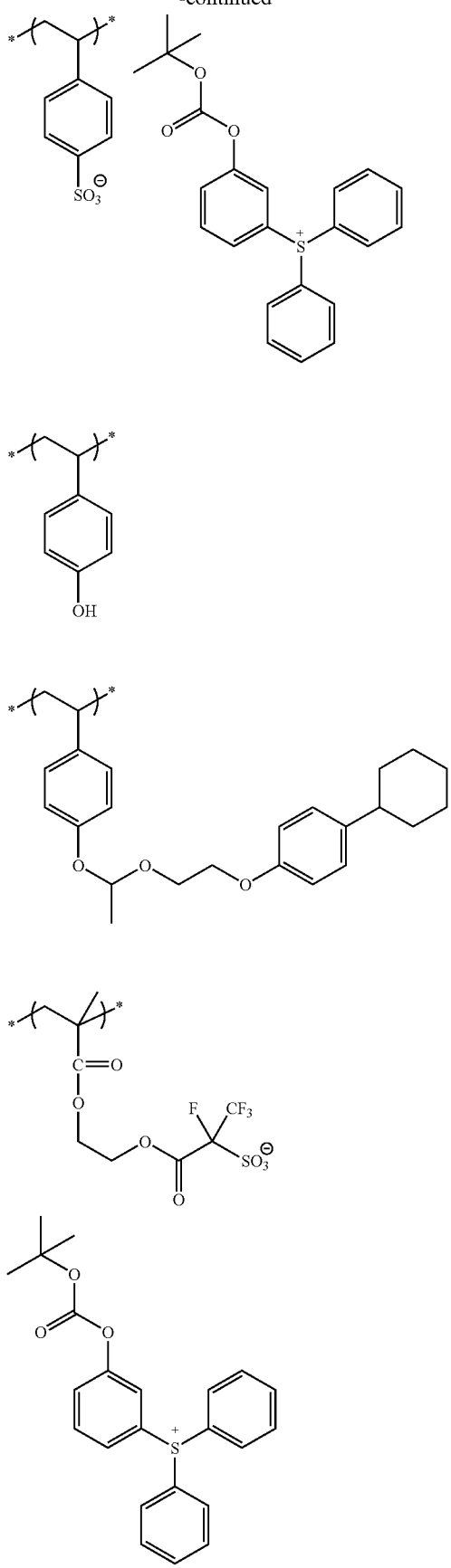
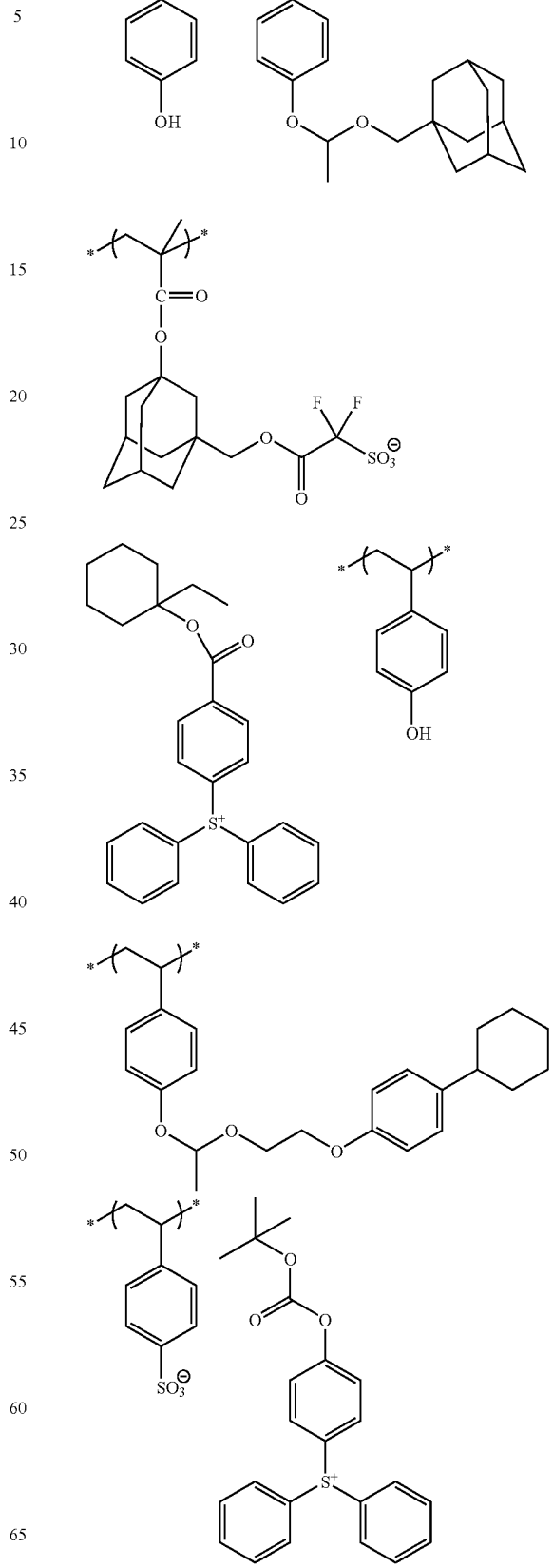

181
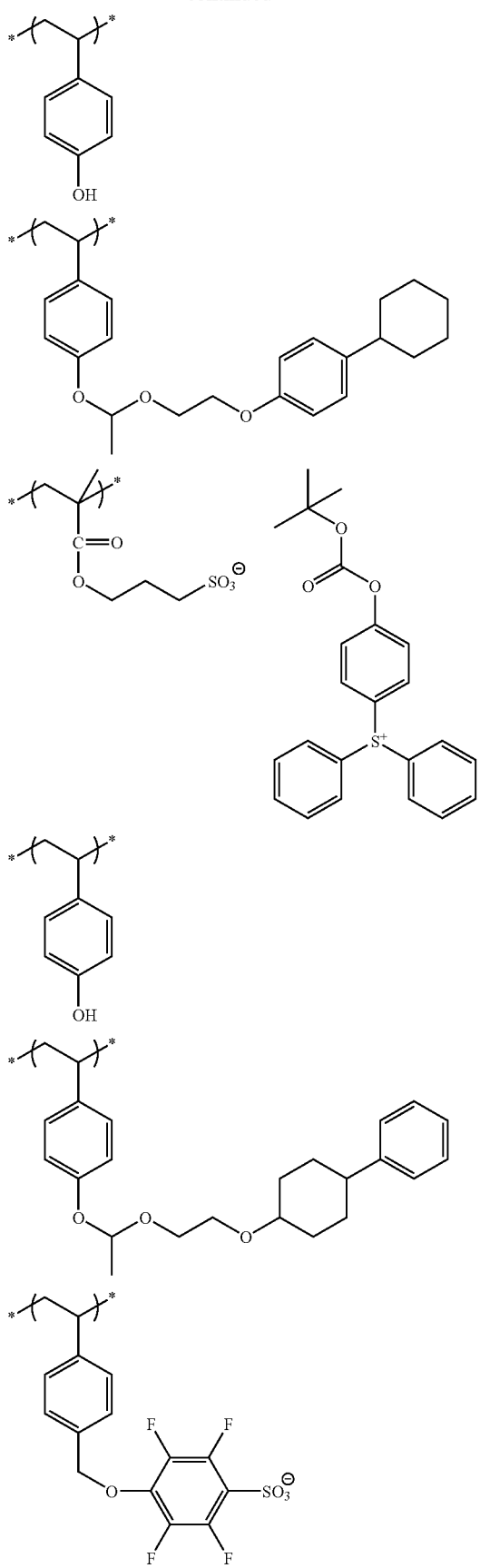
182
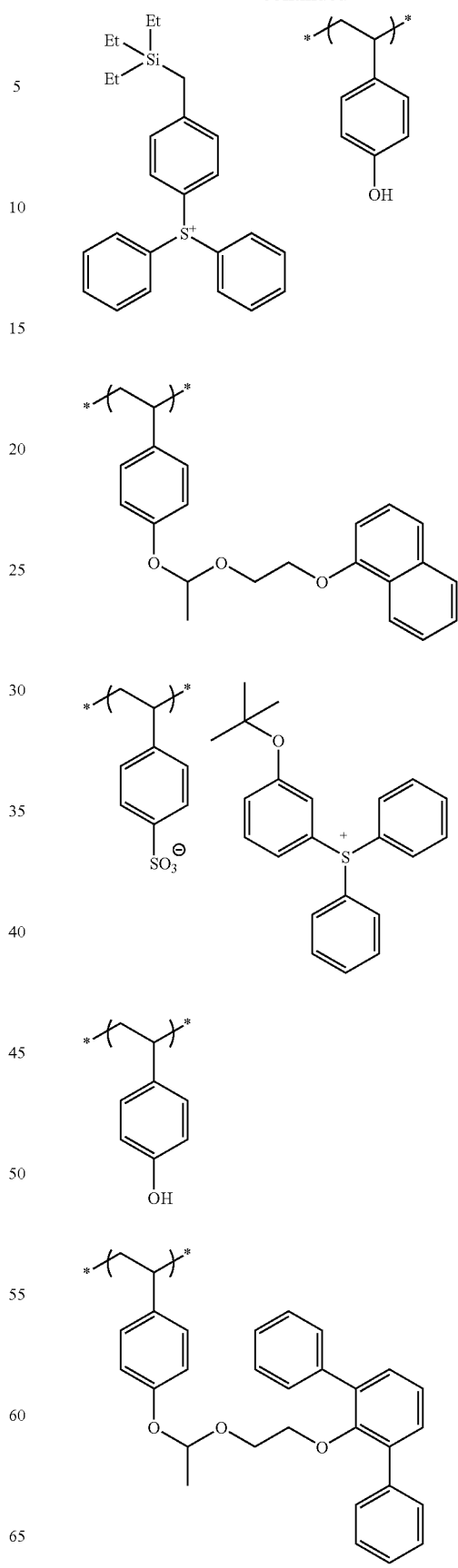

183
-continued
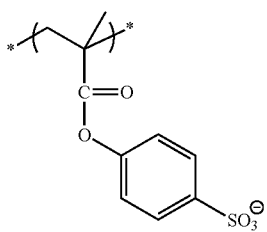
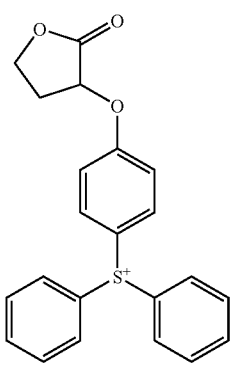
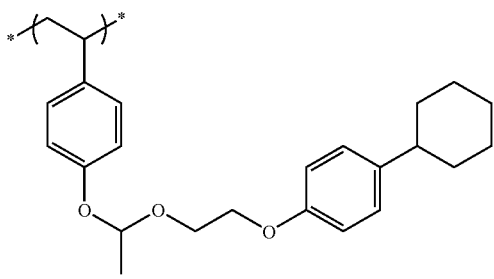
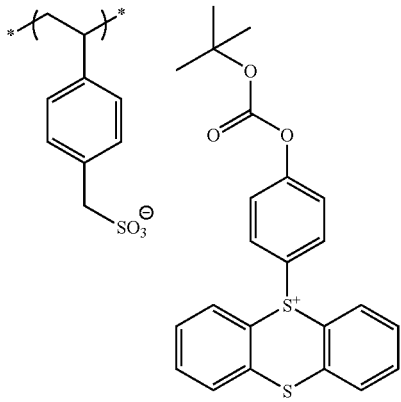
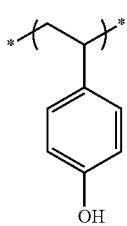
184
-continued
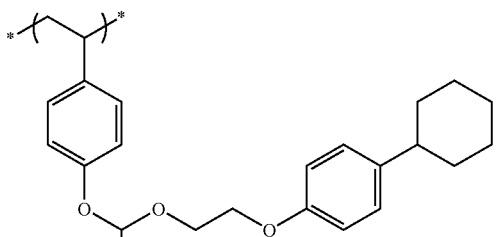
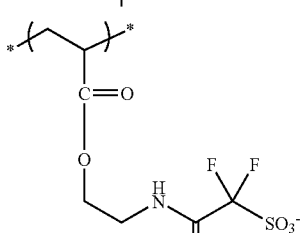
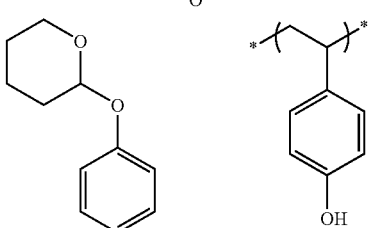
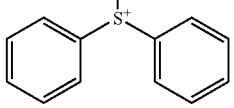
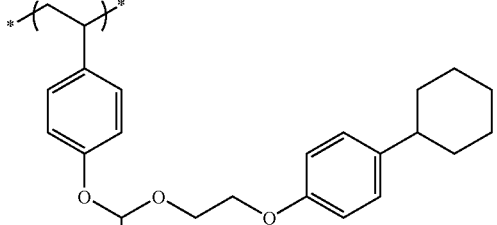
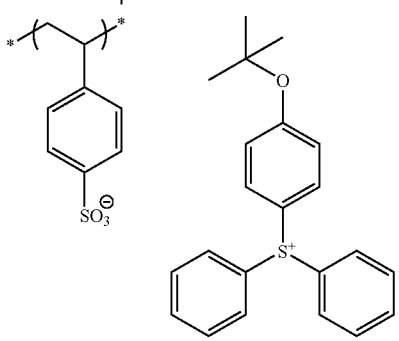
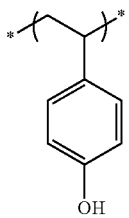

185
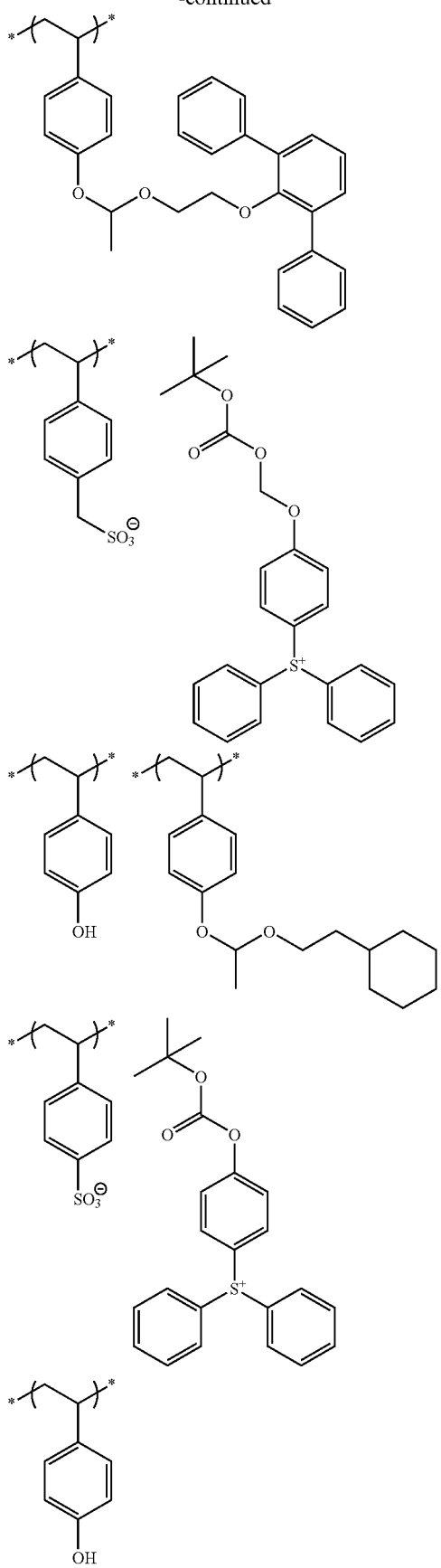
186
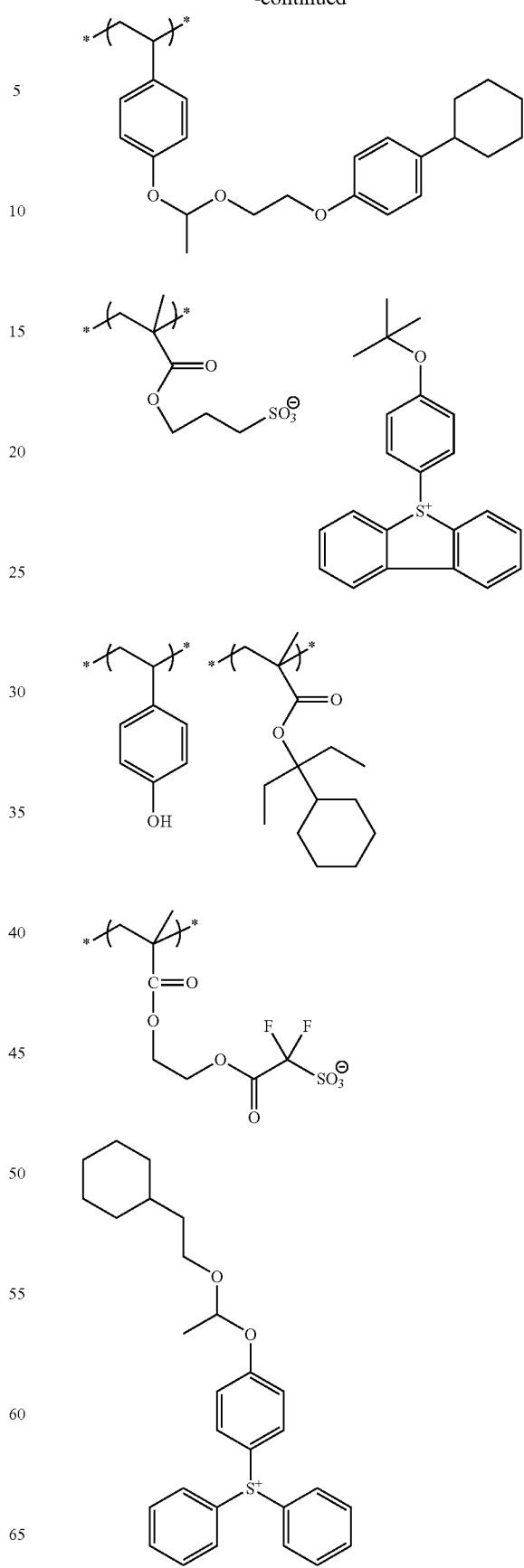

-continued

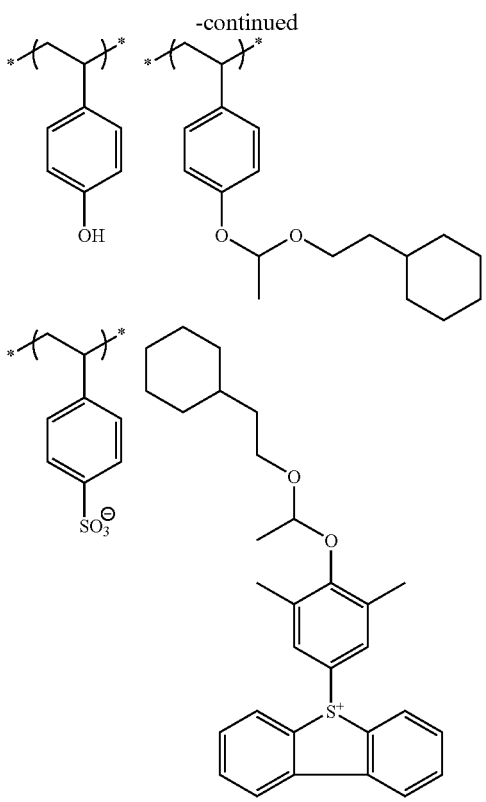

<Other Components>

The actinic ray-sensitive or radiation-sensitive resin composition of the present invention may further contain, for example, a basic compound, a resin capable of decomposing by the action of an acid to increase the dissolution rate in an aqueous alkali solution, a conventional photo-acid generator, an organic solvent, a surfactant, an acid-decomposable dissolution inhibiting compound, a dye, a plasticizer, a photosensitizer, a compound for accelerating dissolution in a developer, and a proton acceptor functional group-containing compound, if desired.

<Basic Compound>

The actinic ray-sensitive or radiation-sensitive resin composition of the present invention may contain a basic compound so as to reduce the change in performance with aging from exposure to heating or prevent the acid generated upon exposure from diffusing in the film.

The basic compound is preferably a basic compound having a structure represented by the following formulae (A) to (E):

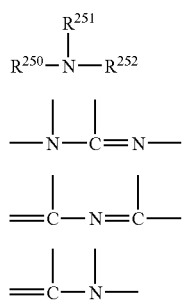

(A)

(B)

(C)

(D)

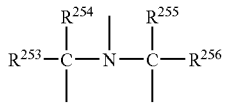

(E)

In the formulae, each of $R^{250}$, $R^{251}$ and $R^{252}$ independently represents a hydrogen atom, an alkyl group (preferably having a carbon number of 1 to 20), a cycloalkyl group (preferably having a carbon number of 3 to 20) or an aryl group (preferably having a carbon number of 6 to 20), and $R^{250}$ and $R^{251}$ may combine together to form a ring.

These groups may have a substituent, and the alkyl or cycloalkyl group having a substituent is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20.

Each of these groups may contain an oxygen atom, a sulfur atom or a nitrogen atom in the alkyl chain.

In the formulae, each of $R^{253}$, $R^{254}$, $R^{255}$ and $R^{256}$ independently represents an alkyl group (preferably having a carbon number of 1 to 6) or a cycloalkyl group (preferably having a carbon number of 3 to 6).

Preferred examples of the compound include guanidine, aminopyrrolidine, pyrazole, pyrazoline, piperazine, aminomorpholine, aminoalkylmorpholine and piperidine, and these compounds may have a substituent. More preferred examples of the compound include a compound having an imidazole structure, a diazabicyclo structure, an onium hydroxide structure (more preferably ammonium hydroxide structure, particularly preferably tetraalkylammonium hydroxide), an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Furthermore, at least one kind of a nitrogen-containing compound selected from a phenoxy group-containing amine compound, a phenoxy group-containing ammonium salt compound, a sulfonic acid ester group-containing amine compound and a sulfonic acid ester group-containing ammonium salt compound may be used. Examples of these compounds include, but are not limited to, Compounds (C1-1) to (C3-3) illustrated in paragraph [0066] of U.S. Patent Application Publication 2007/0224539.

A photosensitive basic compound may also be used as the basic compound. The photosensitive basic compound is not particularly limited, but compounds described, for example, in JP-T-2003-524799 (the teen "JP-T" as used herein means a "published Japanese translation of a PCT patent application") and J. Photopolym. Sci. & Tech., Vol. 8, pp. 543-553 (1995) may be used.

Among basic compounds, a compound having an onium hydroxide structure is preferred, and a compound having an ammonium hydroxide structure is more preferred.

The molecular weight of the basic compound is preferably from 250 to 2,000, more preferably from 400 to 1,000.

These basic compounds are used individually or in combination of two or more thereof.

The actinic ray-sensitive or radiation-sensitive resin composition of the present invention may or may not contain a basic compound, and in the case of containing a basic compound, the content of the basic compound is preferably from 0.0001 to 8.0 mass %, more preferably from 0.0001 to 5.0 mass %, still more preferably from 0.001 to 4.0 mass %, based on the entire solid content of the actinic ray-sensitive or radiation-sensitive resin composition.

<Resin Capable of Decomposing by the Action of an Acid to Increase the Dissolution Rate in an Aqueous Alkali Solution>

The actinic ray-sensitive or radiation-sensitive resin composition of the present invention may contain a resin capable of decomposing by the action of an acid to increase the dissolution rate in an aqueous alkali solution, in addition to the resin (P).

The resin capable of decomposing by the action of an acid to increase the dissolution rate in an aqueous alkali solution (hereinafter, sometimes referred to as an "acid-decomposable resin") is a resin having a group capable of decomposing by the action of an acid to produce an alkali-soluble group (acid-decomposable group), in either one or both of the main and side chains of the resin. Of these, a resin having an acid-decomposable group in the side chain is preferred.

The acid-decomposable resin can be obtained, as disclosed in European Patent 254853, JP-A-2-25850, JP-A-3-223860, JP-A-4-251259 and the like, by reacting an alkali-soluble resin with a precursor of a group capable of decomposing by the action of an acid or by copolymerizing various monomers with an alkali-soluble resin monomer having bonded thereto a group capable of decomposing by the action of an acid.

The acid-decomposable group is preferably a group obtained by replacing, for example in a resin having an alkali-soluble group such as —COOH group and —OH group, the hydrogen atom of the alkali-soluble group with a group capable of leaving by the action of an acid.

Specific preferred examples of the acid-decomposable group are the same as those of the acid-decomposable group described above with respect to the resin for use in the present invention (for example, the acid-decomposable group described as the repeating unit (B) in the resin (P)).

The resin having an alkali-soluble group is not particularly limited, but examples thereof include an alkali-soluble resin having a hydroxystyrene structure unit, such as poly(o-hydroxystyrene), poly(m-hydroxystyrene), poly(p-hydroxystyrene) or their copolymer, hydrogenated poly(hydroxystyrene), poly(hydroxystyrene) having a substituent represented by the following structures, a phenolic hydroxyl group-containing resin, styrene-hydroxystyrene copolymer, α-methylstyrene-hydroxystyrene copolymer and hydrogenated novolak resin; and an alkali-soluble resin containing a repeating unit having a carboxyl group, such as (meth)acrylic acid and norbornene carboxylic acid.

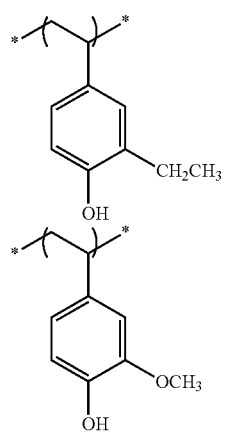
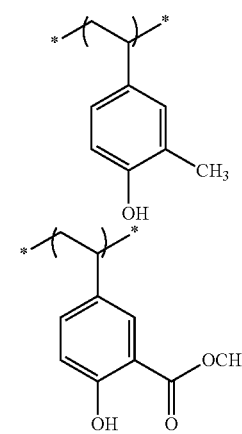
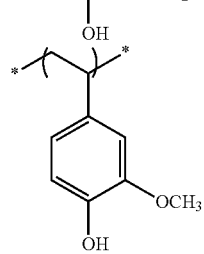
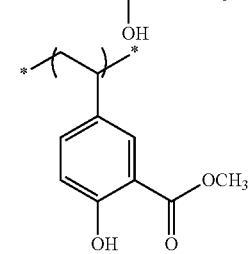

-continued

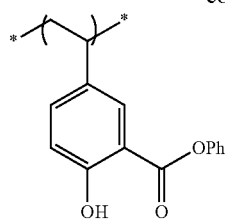
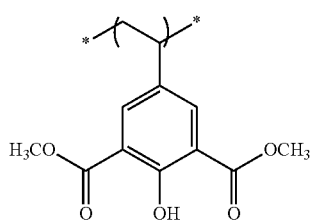
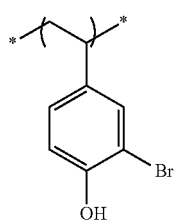
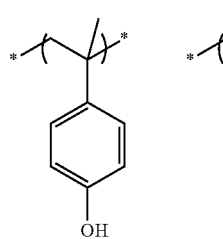
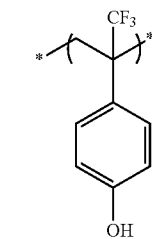
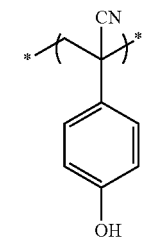
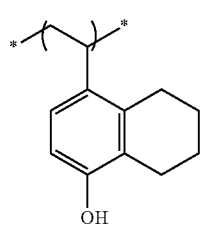
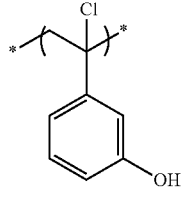
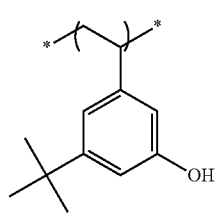
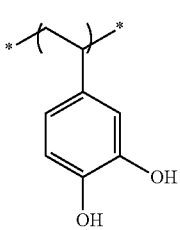
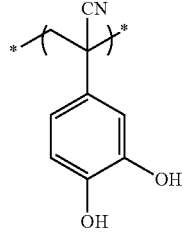
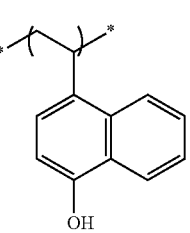
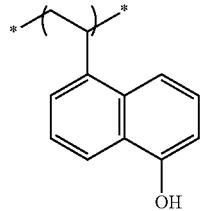
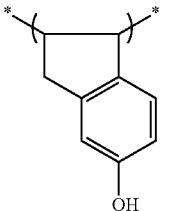

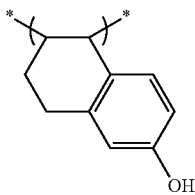

The alkali dissolution rate of the alkali-soluble resin is preferably 170 Å/sec or more, more preferably 330 Å/sec or more, as measured (at 23° C.) in 2.38 mass % tetramethylammonium hydroxide (TMAH).

The alkali-soluble resin monomer is not particularly limited, but examples thereof include an alkylcarbonyloxystyrene (e.g., tert-butoxycarbonyloxystyrene), an alkoxystyrene (e.g., 1-alkoxyethoxystyrene, tert-butoxystyrene) and a tertiary alkyl (meth)acrylate (e.g., tert-butyl (meth)acrylate, 2-alkyl-2-adamantyl (meth)acrylate, dialkyl(1-adamantyl) methyl (meth)acrylate).

The content of the group capable of decomposing by the action of an acid is expressed by B/(B+S) using the number (B) of repeating units having a group capable of decomposing by the action of an acid and the number (S) of repeating units having an alkali-soluble group not protected by a group capable of leaving by the action of an acid, in the resin. The content is preferably from 0.01 to 0.7, more preferably from 0.05 to 0.50, still more preferably from 0.05 to 0.40.

The acid-decomposable resin is not particularly limited but is preferably a resin containing a repeating unit having an aromatic group, more preferably an acid-decomposable resin containing hydroxystyrene as a repeating unit (for example, a poly(hydroxystyrene/hydroxystyrene protected by an acid-decomposable group) and a poly(hydroxystyrene/(meth) acrylic acid protected by an acid-decomposable group)).

In particular, the acid-decomposable resin is preferably a resin containing a repeating unit represented by the following formula (VI) and a repeating unit represented by formula (I).

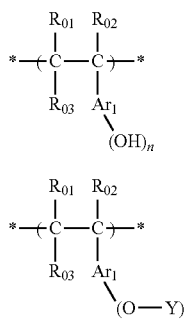

Formula (VI) is the same as the above-described formula (VI), and formula (I) is the same as the above-described formula (I).

Also, the acid-decomposable resin may contain a repeating unit derived from other polymerizable monomers.

The content of the repeating unit derived from other polymerizable monomers in the resin is generally 50 mol % or less, preferably 30 mol % or less, based on all repeating units. The repeating unit derived from other polymerizable monomers, which can be used, includes the same repeating units as the above-described repeating unit derived from other polymerizable monomers.

The content of the repeating unit having an alkali-soluble group such as hydroxyl group, carboxy group and sulfonic acid group is preferably from 1 to 99 mol %, more preferably from 3 to 95 mol %, still more preferably from 5 to 90 mol %, based on all repeating units constituting the acid-decomposable resin.

The content of the repeating unit having an acid-decomposable group is preferably from 3 to 95 mol %, more preferably from 5 to 90 mol %, still more preferably from 10 to 85 mol %, based on all repeating units constituting the acid-decomposable resin.

The weight average molecular weight of the acid-decomposable resin is preferably 50,000 or less, more preferably from 1,000 to 30,000, still more preferably from 1,000 to 20,000, in terms of polystyrene by the GPC method.

The polydispersity (Mw/Mn) of the acid-decomposable resin is preferably from 1.0 to 3.0, more preferably from 1.05 to 2.0, still more preferably from 1.1 to 1.7.

Two or more kinds of acid-decomposable resins may be used in combination.

Specific preferred examples of the acid-decomposable resin are set forth below, but the present invention is not limited thereto.

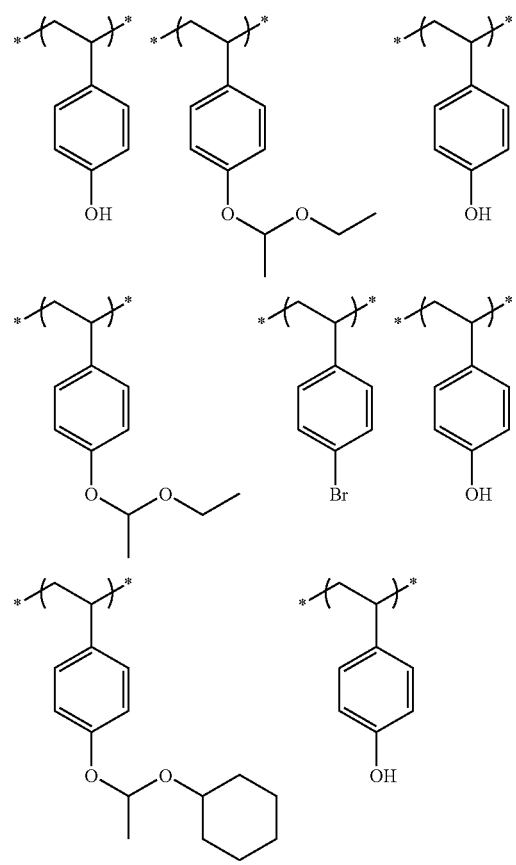

193
-continued
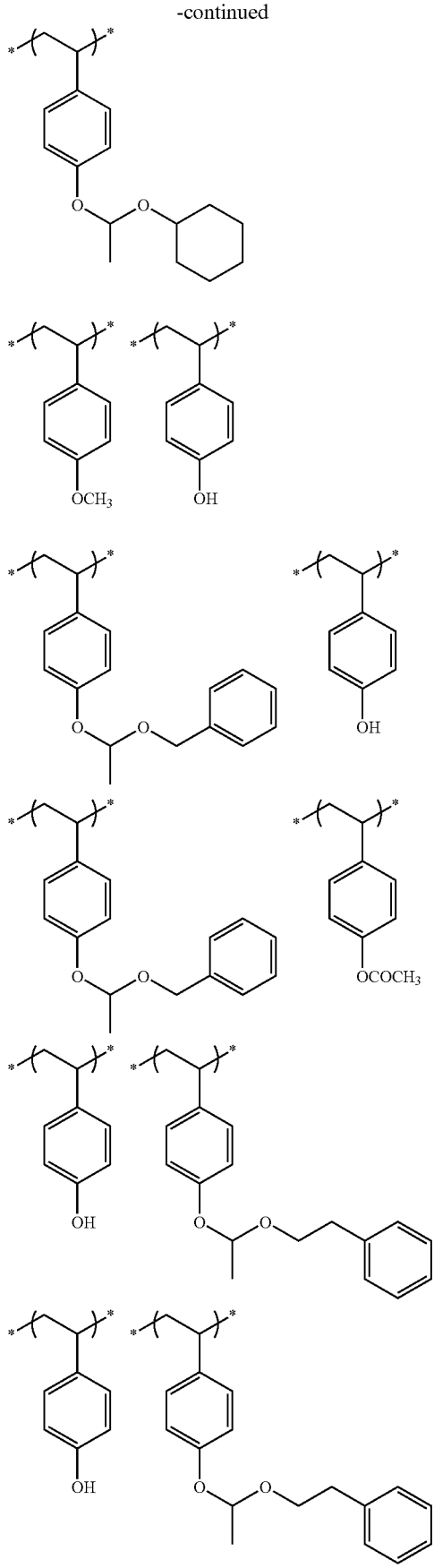
194
-continued
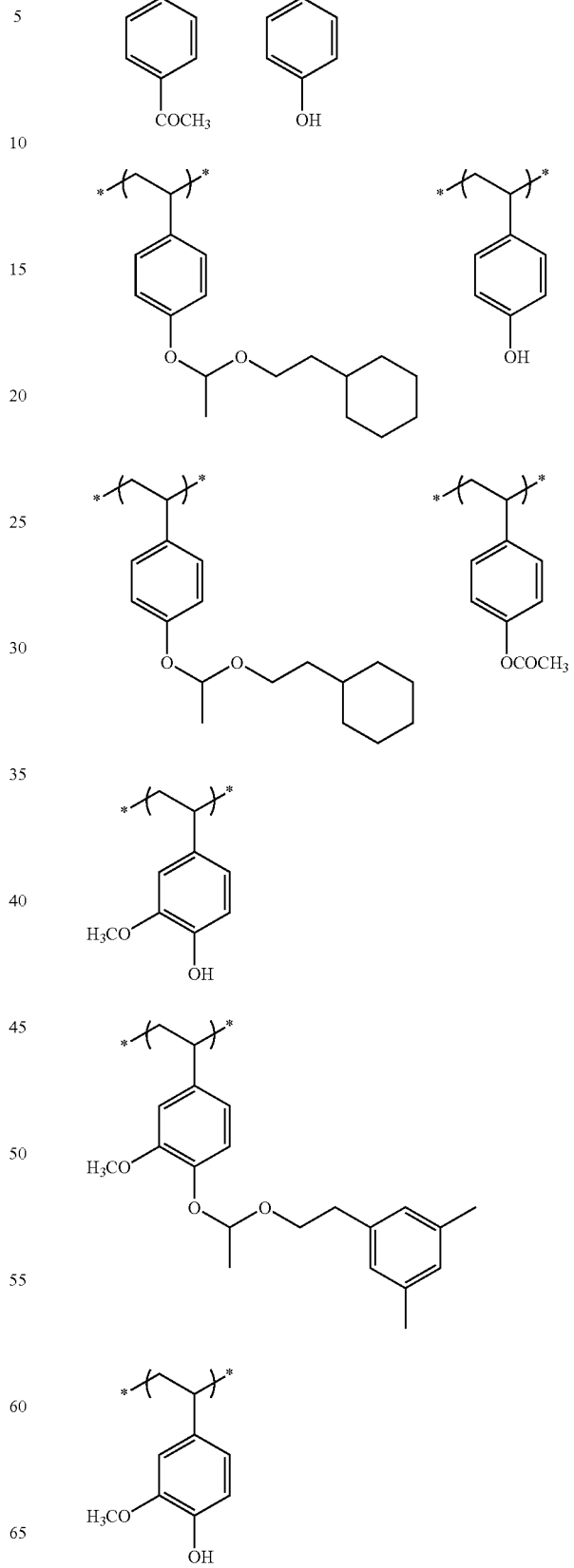

195
-continued
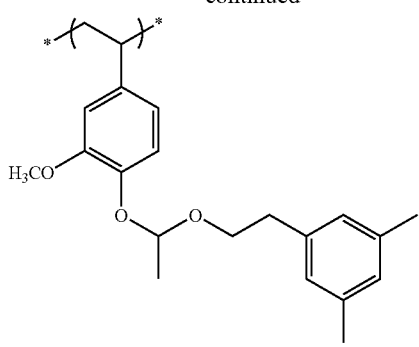
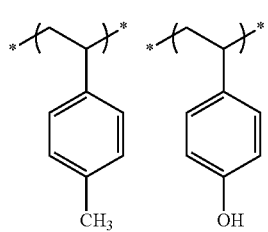
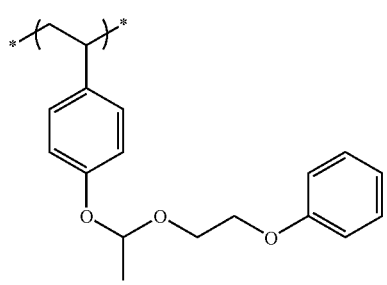
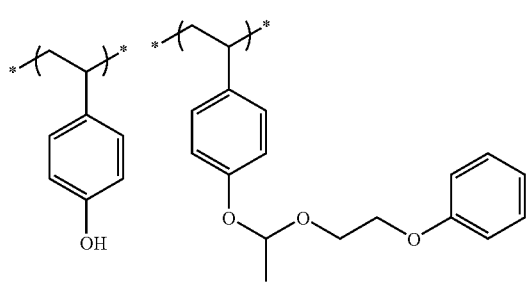
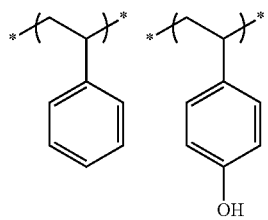
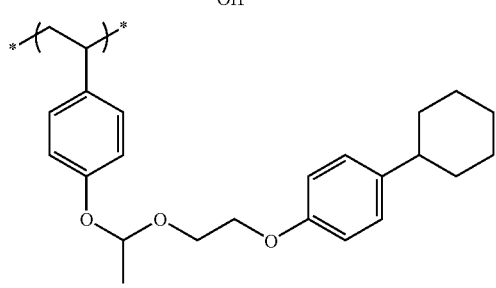
196
-continued
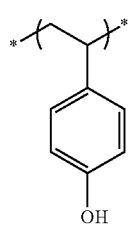
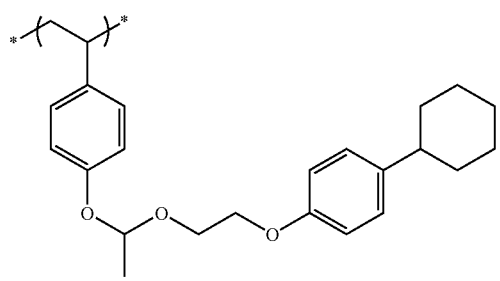
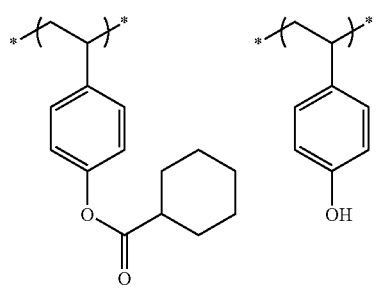
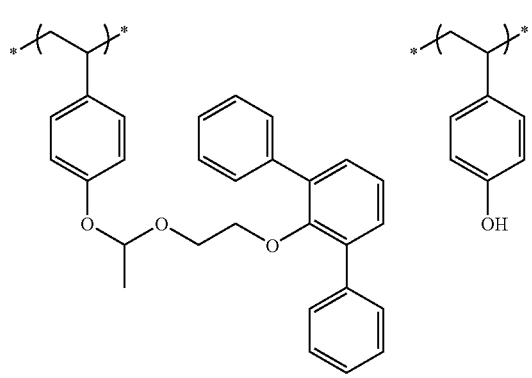
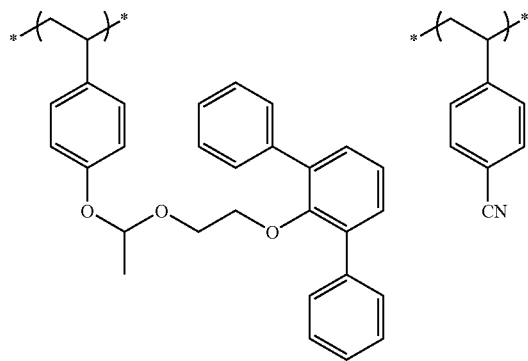

197
-continued
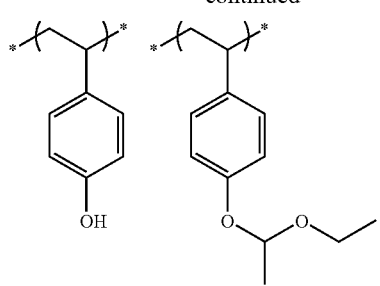
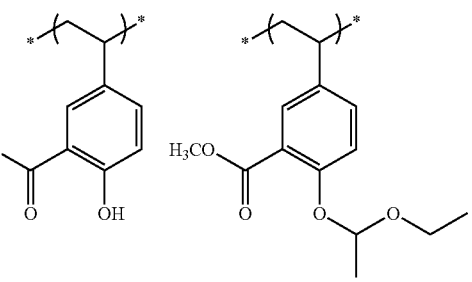
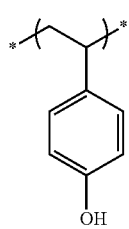
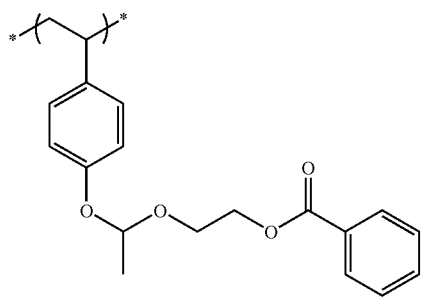
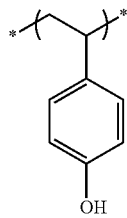
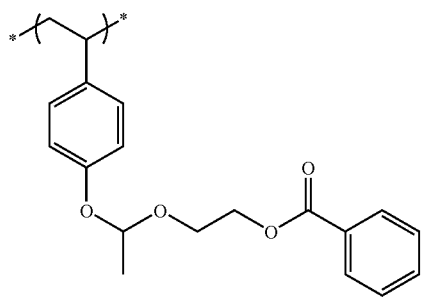
198
-continued
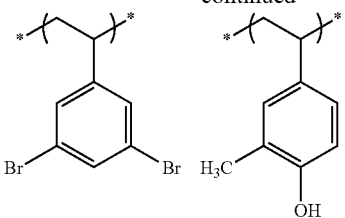
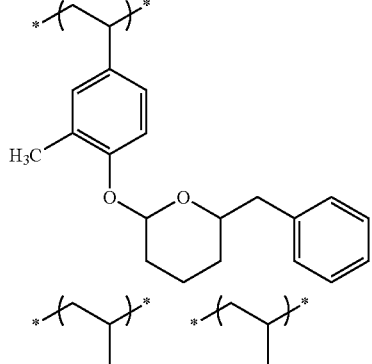
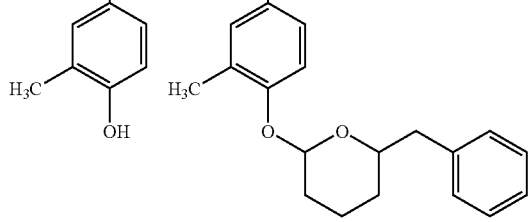
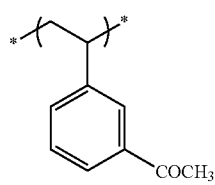
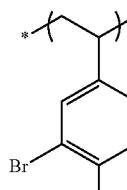
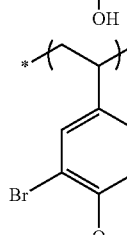
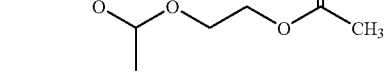
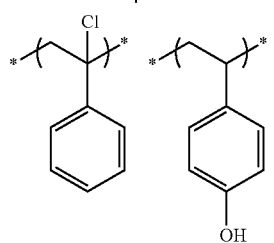

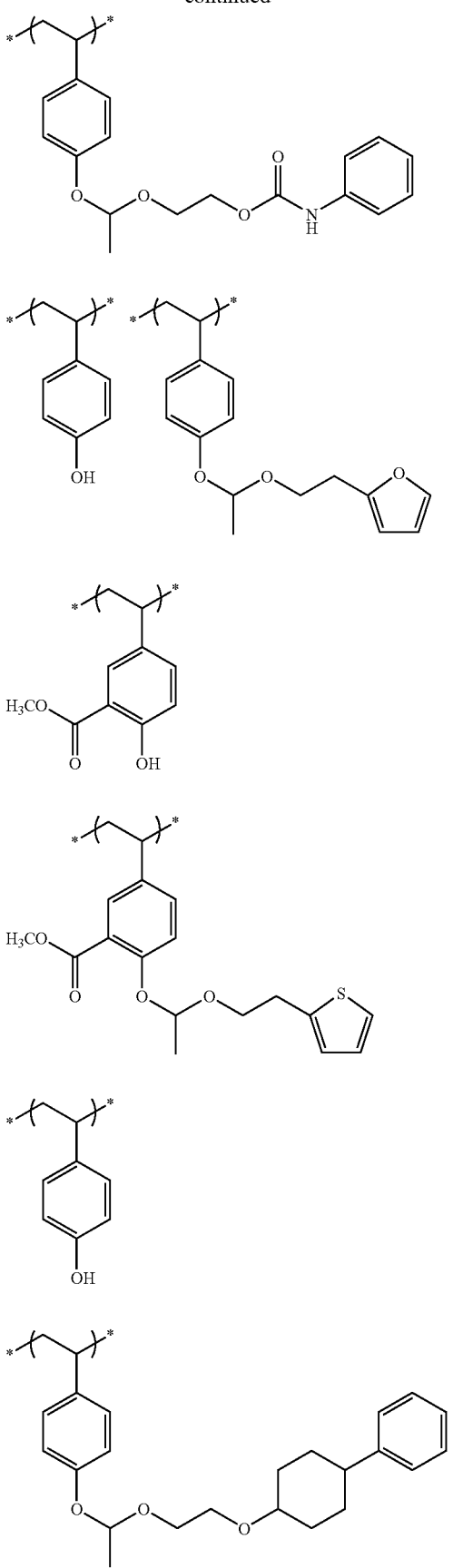
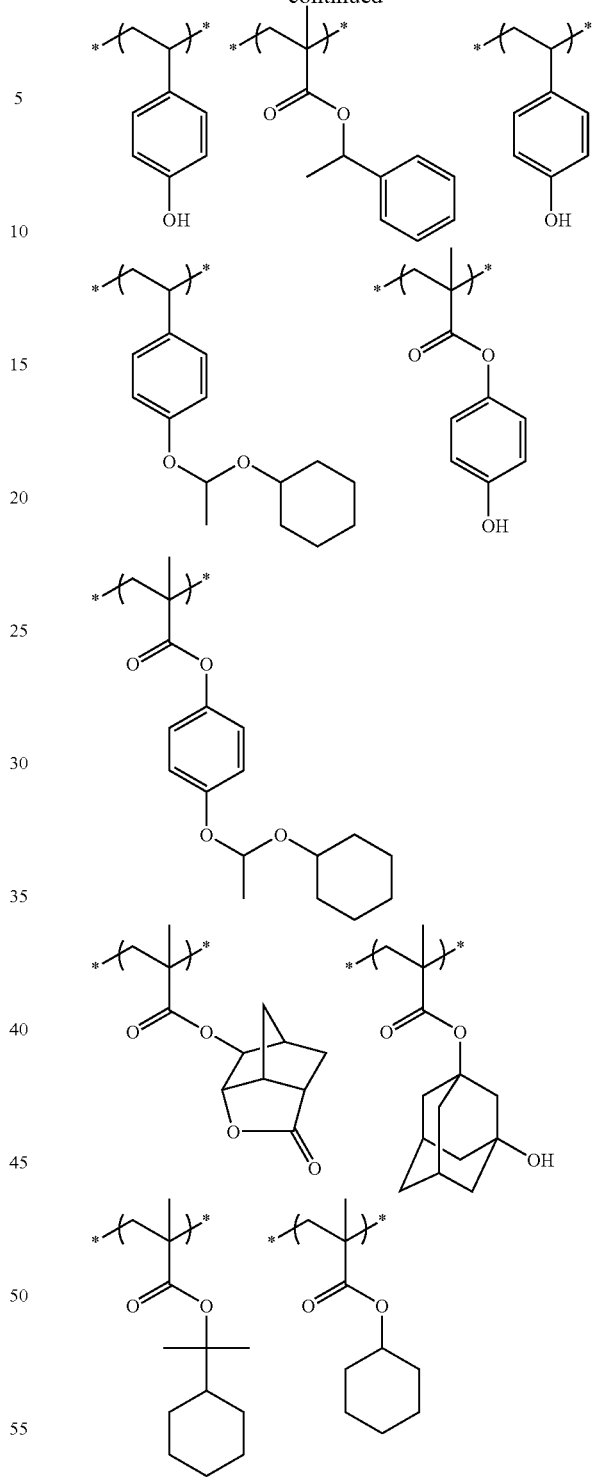

In the actinic ray-sensitive or radiation-sensitive resin composition of the present invention, the amount of the acid-decomposable resin blended in the composition, except for the resin (P), is preferably from 0 to 70 mass %, more preferably from 0 to 50 mass %, still more preferably from 0 to 30 mass %, based on the entire solid content of the composition.

<Acid Generator>

The actinic ray-sensitive or radiation-sensitive resin composition of the present invention contains (P) a resin having a photo-acid generating structure but, in addition to the resin (P), may contain a low molecular compound capable of generating an acid upon irradiation with an actinic ray or radiation (hereinafter sometimes referred to as an "acid generator").

The molecular weight of the acid generator is preferably from 200 to 5,000, more preferably from 300 to 3,000.

The acid generator which can be used may be appropriately selected from a photo-initiator for cationic photopolymerization, a photo-initiator for radical photopolymerization, a photo-decoloring agent for dyes, a photo-discoloring agent, a known compound capable of generating an acid upon irradiation with an actinic ray or radiation, which is used for microresist and the like, and a mixture thereof.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate.

Out of the compounds capable of decomposing upon irradiation with an actinic ray or radiation to generate an acid, compounds represented by the following formulae (ZI'), (ZII') and (ZIII') are preferred.

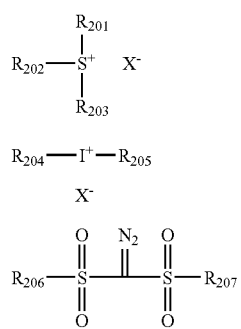

In formulae (ZP) and (ZIP), each of $R_{201}$, $R_{202}$ and $R_{203}$ independently represents an organic group, and each of $R_{204}$ and $R_{205}$ independently represents an aryl group, an alkyl group or a cycloalkyl group.

The carbon number of the organic group as $R_{201}$, $R_{202}$ and $R_{203}$ is generally from 1 to 30, preferably from 1 to 20, and examples of the organic group include an aryl group, an alkyl group, a cycloalkyl group, an allyl group and a vinyl group.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

The aryl group of $R_{201}$ to $R_{205}$ preferably has a carbon number of 6 to 30, more preferably from 6 to 20, and is preferably, for example, a phenyl group or a naphthyl group, more preferably a phenyl group. The aryl group of $R_{201}$ to $R_{205}$ may be an aryl group having a heterocyclic structure containing an oxygen atom, a nitrogen atom, a sulfur atom or the like. Examples of the heterocyclic structure include a pyrrole, a furan, a thiophene, an indole, a benzofuran and a benzothiophene.

The alkyl group and cycloalkyl group of $R_{204}$ and $R_{205}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl).

Each of the groups as $R_{201}$ to $R_{203}$ may be further substituted, for example, by a halogen atom, an alkoxy group (for example, having a carbon number of 1 to 5), a hydroxyl group, a cyano group or a nitro group.

Moreover, the aryl group, alkyl group and cycloalkyl group of $R_{204}$ and $R_{205}$ may have a substituent. Examples of the substituent which the aryl group, alkyl group and cycloalkyl group of $R_{204}$ and $R_{205}$ may have include an alkyl group (for example, having a carbon number of 1 to 15), a cycloalkyl group (for example, having a carbon number of 3 to 15), an aryl group (for example, having a carbon number of 6 to 15), an alkoxy group (for example, having a carbon number of 1 to 15), a halogen atom, a hydroxyl group and a phenylthio group.

$X^-$ represents a non-nucleophilic anion, and preferred examples thereof include sulfonate anion, carboxylate anion, bis(alkylsulfonyl)amide anion, tris(alkylsulfonyl)methide anion, $BF_4^-$, $PF_6^-$ and $SbF_6^-$. The anion is preferably an organic anion containing a carbon atom.

The more preferred organic anion includes organic anions represented by the following formulae (AN1) to (AN4):

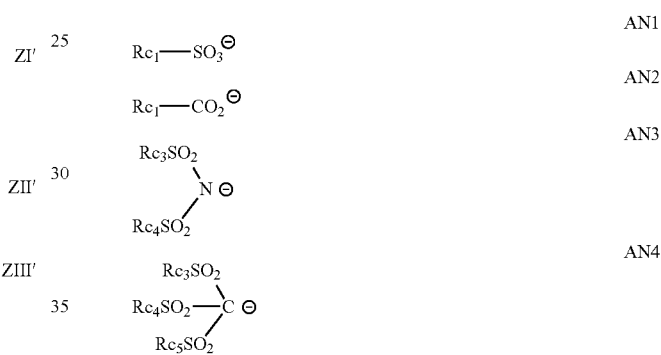

In formulae (AN1) and (AN2), $Rc_1$ represents an organic group.

The organic group of $Rc_1$ includes an organic group having a carbon number of 1 to 30 and is preferably an alkyl group (preferably an alkyl group having a carbon number of 1 to 8, such as methyl group, ethyl group, propyl group, n-butyl group, sec-butyl group, hexyl group and octyl group) which may be substituted, an aryl group (preferably an aryl group having carbon number of 6 to 15, such as phenyl group, tolyl group, naphthyl group and anthryl group), or a group where a plurality of these groups are connected through a single bond or a linking group such as —O—, —CO$_2$—, —S—, —SO$_3$— and —SO$_2$N(Rd$_1$)-.

Rd$_1$ represents a hydrogen atom or an alkyl group and may form a ring structure with the alkyl or aryl group to which Rd$_1$ is bonded.

The organic group of $Rc_1$ is more preferably an alkyl group substituted by a fluorine atom or a fluoroalkyl group at the 1-position, or a phenyl group substituted by a fluorine atom or a fluoroalkyl group. By virtue of having a fluorine atom or a fluoroalkyl group, the acidity of the acid generated upon irradiation with light increases and the sensitivity is enhanced. When $Rc_1$ has 5 or more carbon atoms, at least one carbon atom preferably allows a part of hydrogen atoms to remain without replacing all hydrogen atoms with fluorine atoms, and it is more preferred that the number of hydrogen atoms is larger than the number of fluorine atoms. The absence of a perfluoroalkyl group having a carbon number of 5 or more enables reduction in the toxicity to ecology.

A most preferred embodiment of $Rc_1$ is a group represented by the following formula:

$Rc_7$-$Ax$-$Rc_6$-

In the formula above, $Rc_6$ represents a perfluoroalkylene group having a carbon number of 4 or less, preferably from 2 to 4, more preferably 2 to 3, or a phenylene group substituted by from 1 to 4 fluorine atoms and/or from 1 to 3 fluoroalkyl groups.

Ax is a linking group (preferably a single bond, —O—, —$CO_2$—, —S—, —$SO_3$— or —$SO_2N(Rd_1)$-).

$Rd_1$ represents a hydrogen atom or an alkyl group (preferably an alkyl group having a carbon number of 1 to 8, such as methyl group, ethyl group, propyl group, n-butyl group, sec-butyl group, hexyl group and octyl group) and may combine with $Rc_7$ to form a ring structure.

$Rc_7$ represents a hydrogen atom, a fluorine atom, a linear or branched alkyl group which may have a substituent, a monocyclic or polycyclic cycloalkyl group which may have a substituent, or an aryl group which may have a substituent.

Specific examples of the alkyl group, cycloalkyl group and aryl group of $Rc_7$ are the same as specific examples of the alkyl group and aryl group as $R_{201}$, $R_{202}$ and $R_{203}$ in formula (ZI').

Each of the alkyl group, cycloalkyl group and aryl group, which may have a substituent, preferably contains no fluorine atom as the substituent.

Examples of the substituent are the same as those of the substituent which $R_{204}$ and $R_{205}$ may have.

In formulae (AN3) and (AN4), each of $Rc_3$, $Rc_4$ and $Rc_5$ represents an organic group.

The preferred organic groups for $Rc_3$, $Rc_4$ and $Rc_5$ in formulae (AN3) and (AN4) are the same as the preferred organic groups in $Rc_1$.

$Rc_3$ and $Rc_4$ may combine to form a ring.

The group formed by combining $Rc_3$ and $Rc_4$ includes an alkylene group and an arylene group and is preferably a perfluoroalkylene group having a carbon number of 2 to 4. Combining $Rc_3$ and $Rc_4$ to form a ring is preferred because the acidity of the acid generated upon irradiation with light increases and the sensitivity is enhanced.

The compound may be a compound having a plurality of structures represented by formula (ZI'). For example, the compound may be a compound having a structure where at least one of $R_{201}$ to $R_{203}$ in the compound represented by formula (ZI') is bonded to at least one of $R_{201}$ to $R_{203}$ in another compound represented by formula (ZI').

In formula (ZIII'), each of $R_{206}$ and $R_{207}$ independently represents an aryl group, an alkyl group or a cycloalkyl group.

Specific examples and preferred examples of the aryl group of $R_{206}$ and $R_{207}$ are the same as those of the aryl group in formulae (ZI') and (ZII').

Specific examples and preferred examples of the alkyl group and cycloalkyl group of $R_{206}$ and $R_{207}$ are the same as those of the alkyl group and cycloalkyl group in formulae (ZI') and (ZII').

The aryl group, alkyl group and cycloalkyl group of $R_{206}$ and $R_{207}$ may have a substituent, and specific examples of the substituent are the same as specific examples of the substituent which the aryl group, alkyl group and cycloalkyl group of $R_{204}$ and $R_{205}$ may have.

Out of the compounds capable of generating an acid upon irradiation with an actinic ray or radiation, the compounds represented by the following formulae (ZIV'), (ZV') and (ZVI') are also preferred.

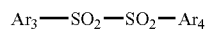

(ZIV')

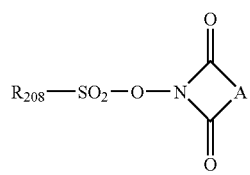

(ZV')

(ZVI')

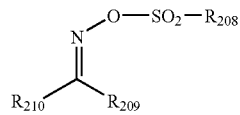

In formulae (ZIV') to (ZVI'), each of $Ar_3$ and $Ar_4$ independently represents an aryl group.

Each $R_{208}$ independently represents an alkyl group, a cycloalkyl group or an aryl group.

Each of $R_{209}$ and $R_{210}$ represents an alkyl group, a cycloalkyl group, an aryl group or an electron-withdrawing group. $R_{209}$ is preferably an aryl group, and $R_{210}$ is preferably an electron-withdrawing group, more preferably a cyano group or a fluoroalkyl group.

A represents an alkylene group, an alkenylene group or an arylene group. These groups may have a substituent, and examples of the substituent are the same as those of the substituent which $R_{204}$ to $R_{207}$ may have.

Specific examples of the aryl group of $Ar_3$, $Ar_4$, $R_{208}$, $R_{209}$ and $R_{210}$ are the same as specific examples of the aryl group as $R_{201}$ to $R_{205}$ in formula (ZI').

Specific examples of the alkyl group and cycloalkyl group of $R_{208}$, $R_{209}$ and $R_{210}$ are the same as specific examples of the alkyl group and cycloalkyl group as $R_{201}$ to $R_{205}$ in formula (ZI').

Examples of the alkylene group of A include an alkylene group having a carbon number of 1 to 12 (e.g., methylene, ethylene, propylene, isopropylene, butylene, isobutylene); examples of the alkenylene group of A include an alkenylene group having a carbon number of 2 to 12 (e.g., vinylene, propenylene, butenylene); and examples of the arylene group of A include an arylene group having a carbon number of 6 to 10 (e.g., phenylene, tolylene, naphthylene).

Among the compounds capable of generating an acid upon irradiation with an actinic ray or radiation, the compounds represented by formulae (ZI'), (ZIII') and (ZVI') are preferred, and the compound represented by formula (ZI') is more preferred.

Out of the compounds capable of decomposing upon irradiation with an actinic ray or radiation to generate an acid, particularly preferred examples are set forth below.

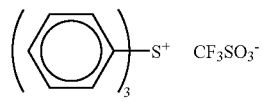

(z1)

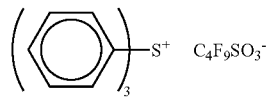

(z2)

-continued
(z3) 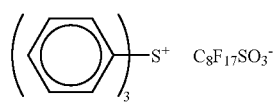
(z4) 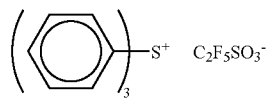
(z5) 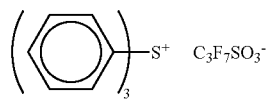
(z6) 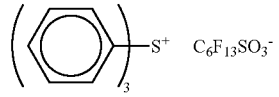
(z7) 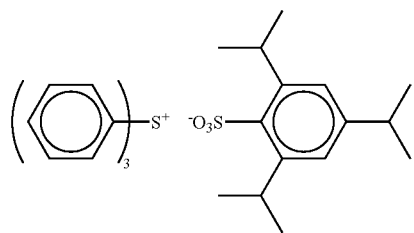
(z8) 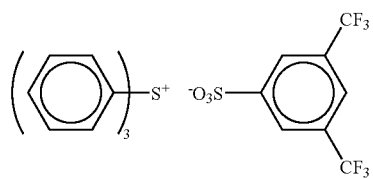
(z9) 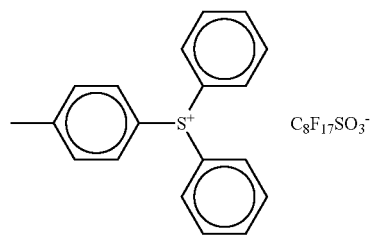
(z10) 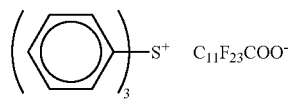
(z11) 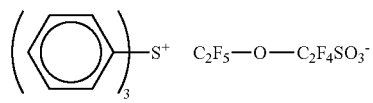
(z12) 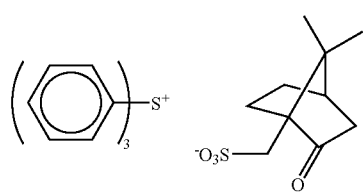
-continued
(z13) 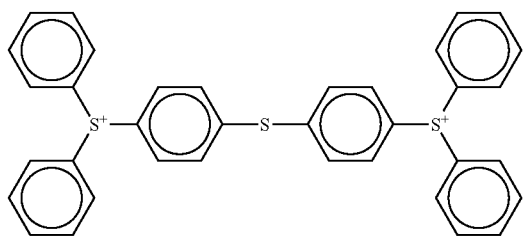
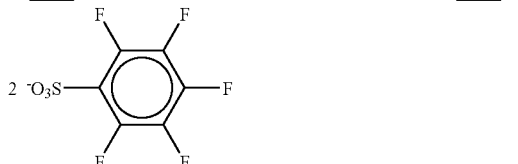
(z14) 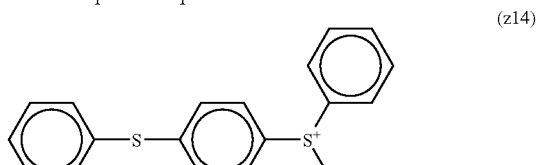
(z15) 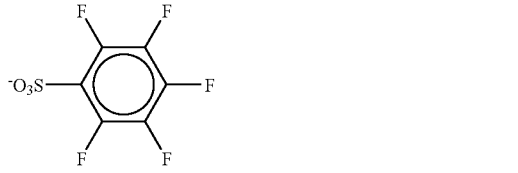
(z16) 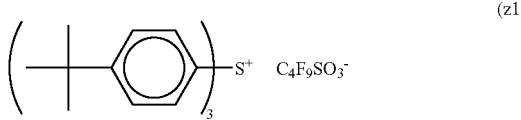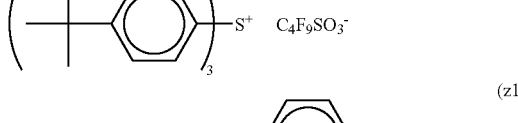
(z17) 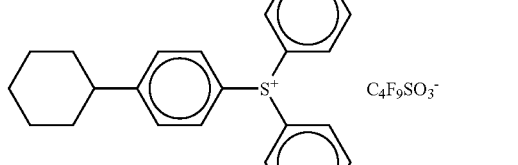
(z18) 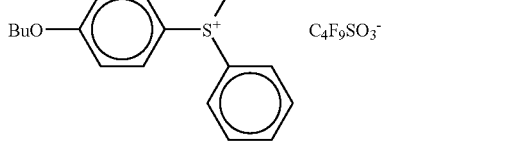

-continued
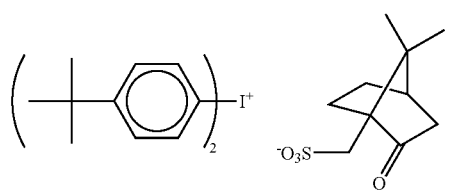 (z19)
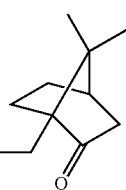 (z20)
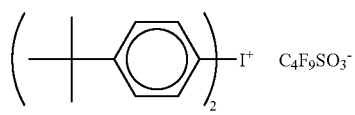 (z21)
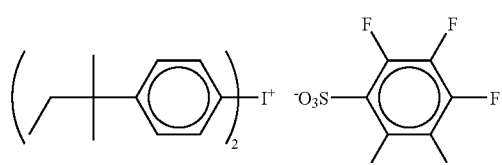 (z22)
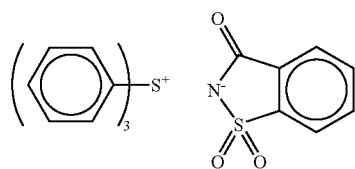 (z23)
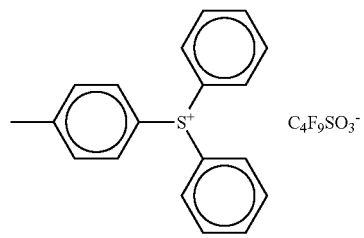 
 (z24)
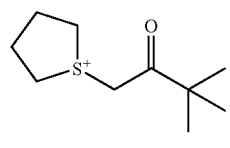 (z25)
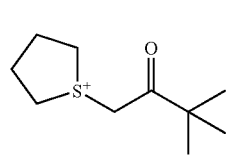 (z26)
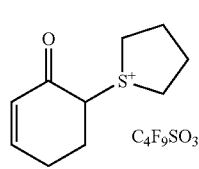 (z27)
-continued
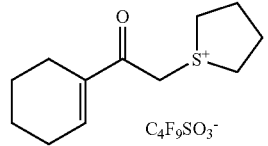 (z28)
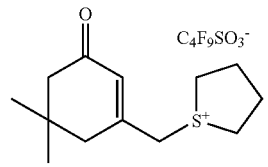 (z29)
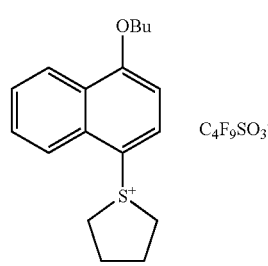 (z30)
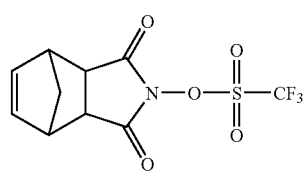 (z31)
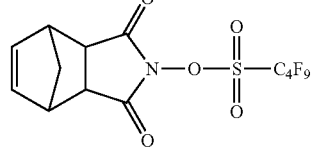 (z32)
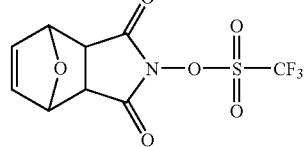 (z33)
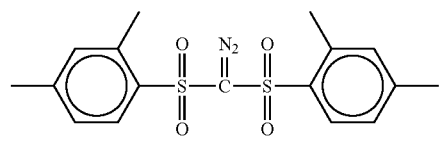 (z34)
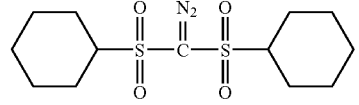 (z35)
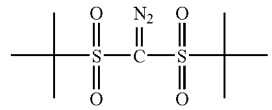 (z36)

-continued
(z37)
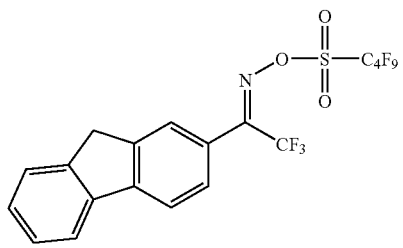
(z38)
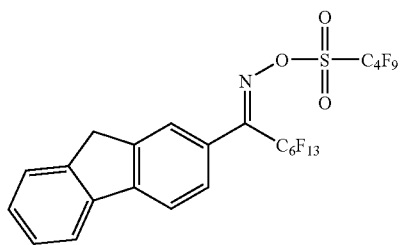
(z39)
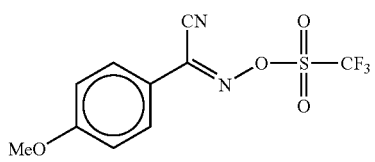
(z40)
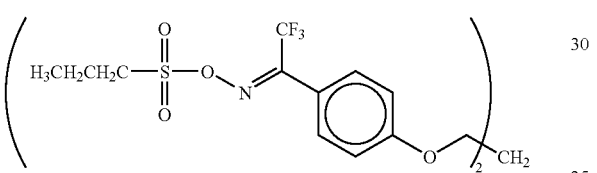
(z41)
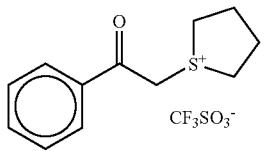
(z42)
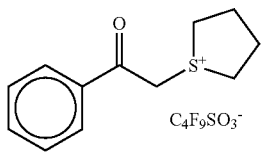
(z43)
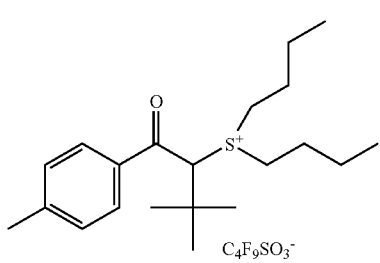
(z44)
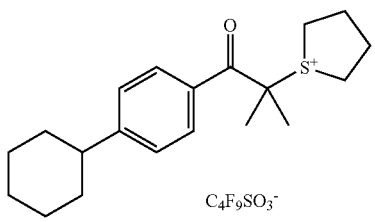
-continued
(z45)
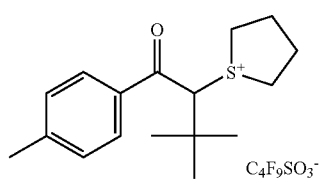
(z46)
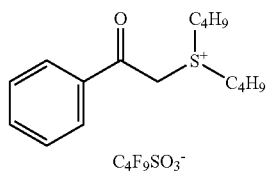
(z47)
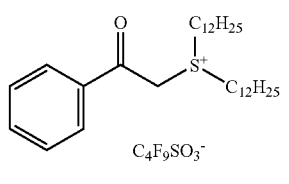
(z48)
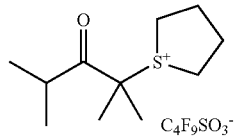
(z49)
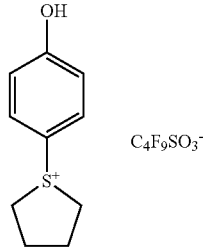
(z50)
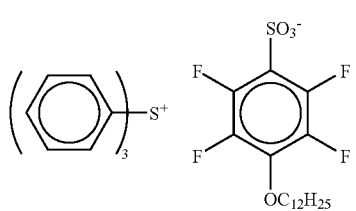
(z51)
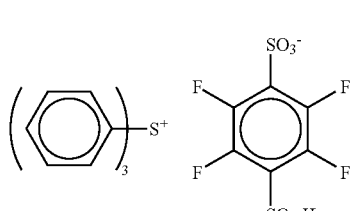
(z52)
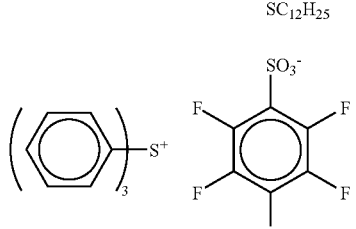

211
-continued
(z53)
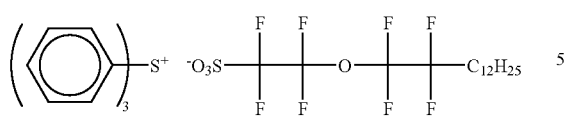
(z54)
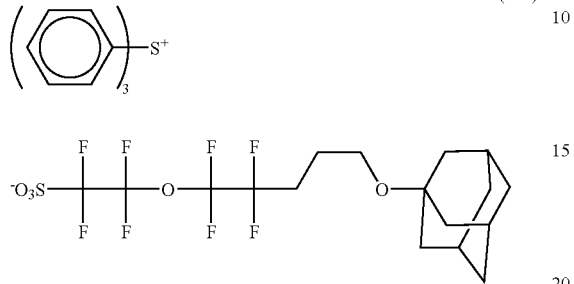
(z55)
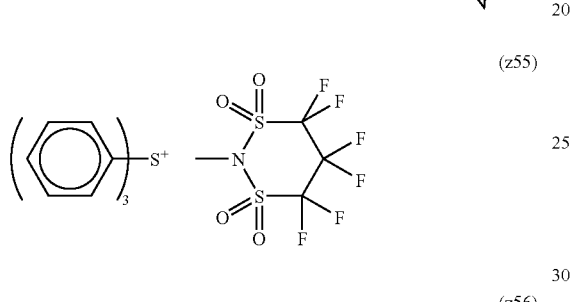
(z56)
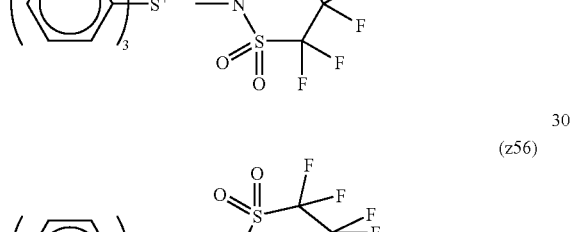
(z57)
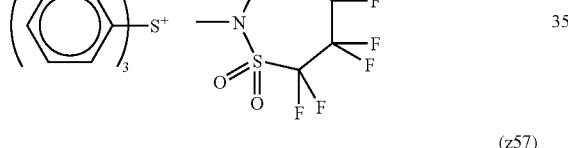
(z58)
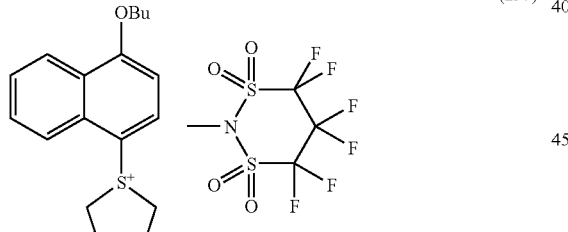
(z59)
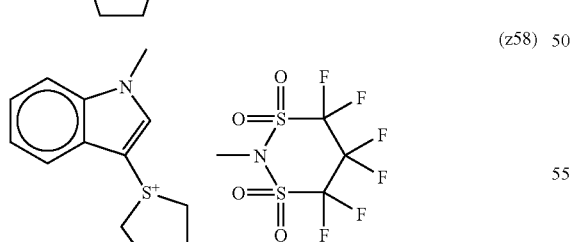
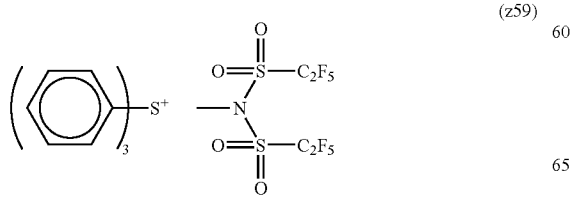
212
-continued
(z60)
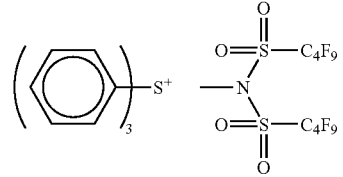
(z61)
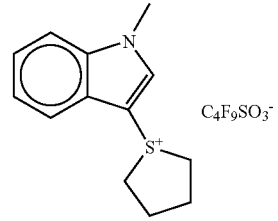
(z62)
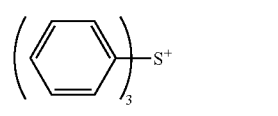
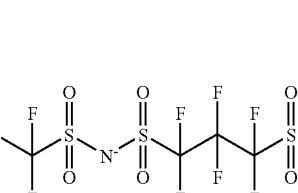
(z63)
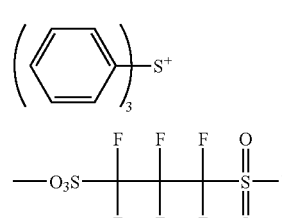
(z64)
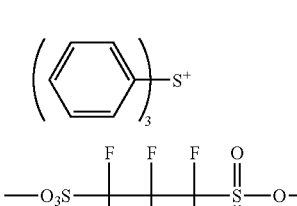
(z65)
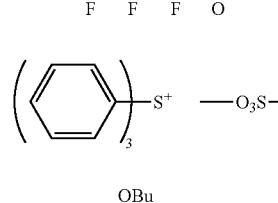
(z66)
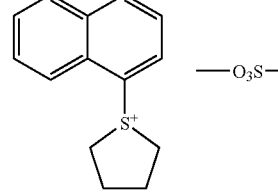

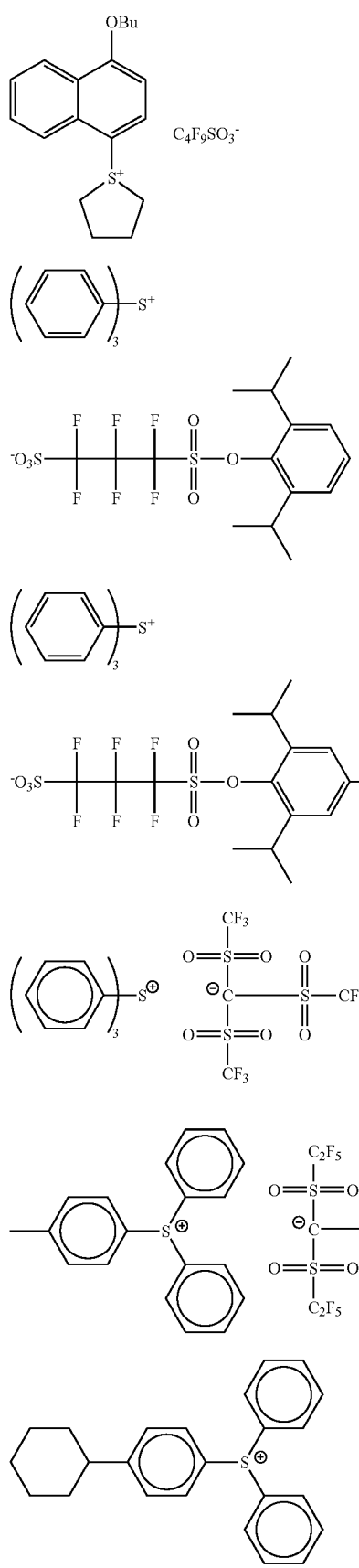
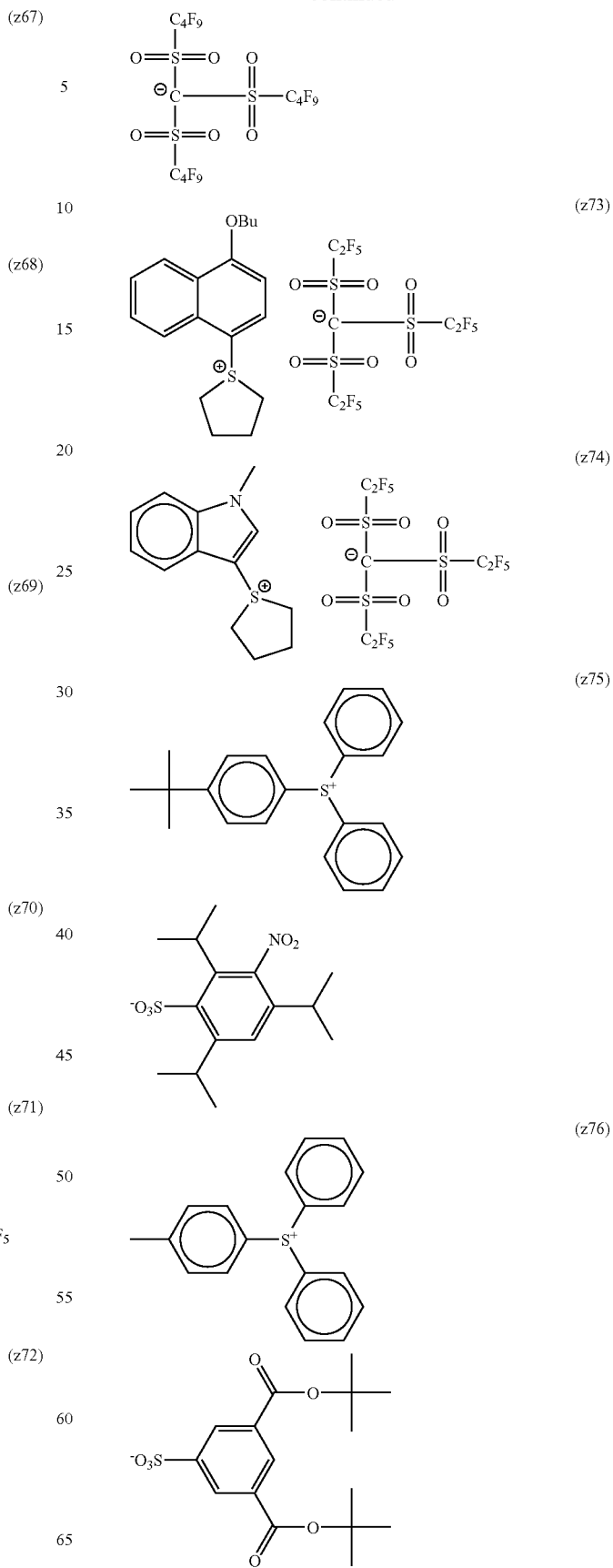

(z77)
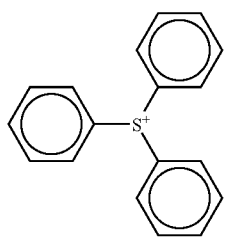
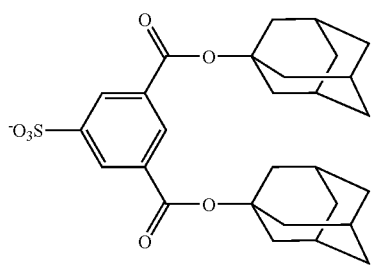
(z78)
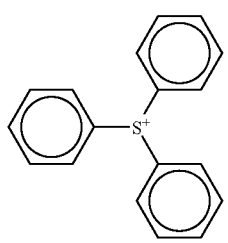
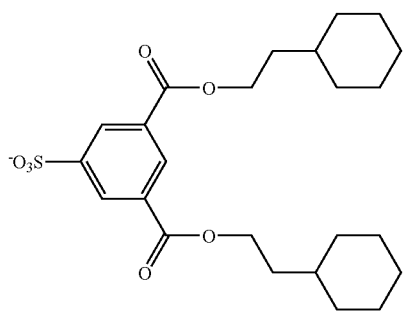
(z79)
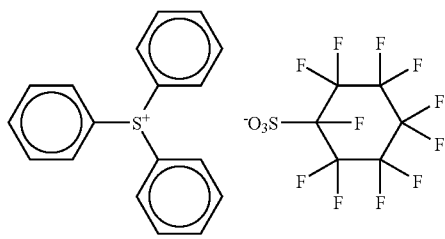
(z80)
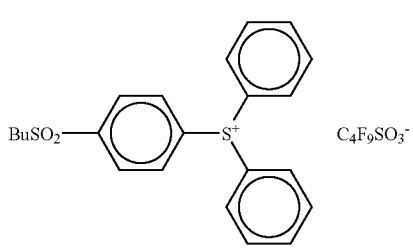
(z81)
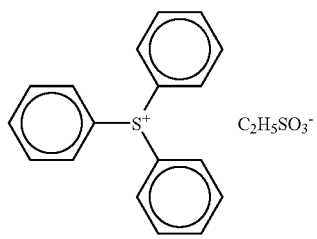 $C_2H_5SO_3^-$
(z82)
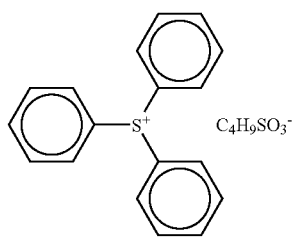 $C_4H_9SO_3^-$
(z83)
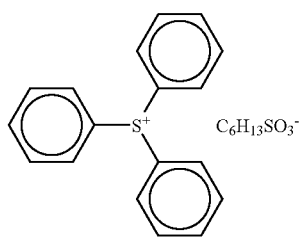 $C_6H_{13}SO_3^-$
(z84)
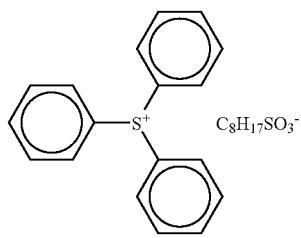 $C_8H_{17}SO_3^-$
(z85)
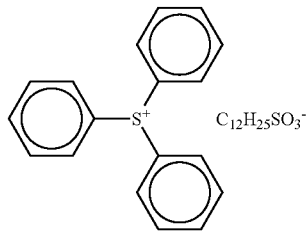 $C_{12}H_{25}SO_3^-$
(z86)
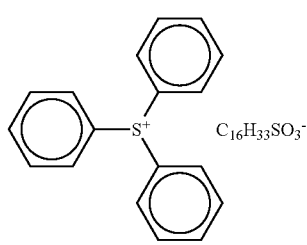 $C_{16}H_{33}SO_3^-$

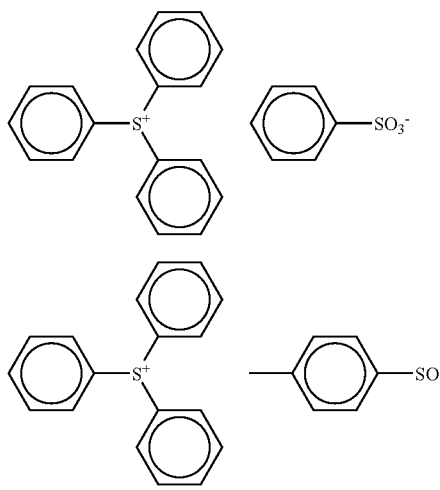

(z87)

(z88)

In the actinic ray-sensitive or radiation-sensitive resin composition of the present invention, when an acid generator is used in addition to the resin (P) having a photo-acid generating structure, one kind of an acid generator may be used alone, or two or more kinds of acid generators may be used in combination. In using two or more kinds of acid generators in combination, compounds capable of generating two kinds of organic acids differing in the total number of atoms excluding hydrogen atom by 2 or more are preferably combined.

The actinic ray-sensitive or radiation-sensitive resin composition of the present invention may or may not contain an acid generator, and in the case of containing an acid generator, the content of the acid generator in the composition is preferably from 0.001 to 20 mass %, more preferably from 0.001 to 10 mass %, still more preferably from 0.001 to 7 mass %, based on the entire solid content of the resist composition.

<Surfactant>

The actinic ray-sensitive or radiation-sensitive resin composition of the present invention preferably further contains a surfactant. The surfactant is preferably a fluorine-containing and/or silicon-containing surfactant.

Examples of the surfactant above include Megaface F176 and Megaface R08 produced by Dainippon Ink & Chemicals, Inc.; PF656 and PF6320 produced by OMNOVA; Troysol S-366 produced by Troy Chemical; Florad FC430 produced by Sumitomo 3M Inc.; and polysiloxane polymer KP-341 produced by Shin-Etsu Chemical Co., Ltd.

A surfactant other than the fluorine-containing and/or silicon-containing surfactant may also be used. Specific examples thereof include polyoxyethylene alkyl ethers and polyoxyethylene alkylaryl ethers.

In addition, known surfactants may be appropriately used. Examples of the surfactant which can be used include surfactants described in paragraph [0273] et seq. of U.S. Patent Application Publication 2008/0248425A1.

One kind of a surfactant may be used alone, or two or more kinds of surfactants may be used in combination.

The actinic ray-sensitive or radiation-sensitive resin composition of the present invention may or may not contain a surfactant, and in the case of containing a surfactant, the amount of the surfactant used is preferably from 0.0001 to 2 mass %, more preferably from 0.001 to 1 mass %, based on the entire solid content of the composition.

<Solvent>

The solvent which can be used at the preparation of the composition is not particularly limited as long as it dissolves respective components, but examples thereof include an alkylene glycol monoalkyl ether carboxylate (e.g., propylene glycol monomethyl ether acetate (PGMEA, alias 1-methoxy-2-acetoxypropane)), an alkylene glycol monoalkyl ether (e.g., propylene glycol monomethyl ether), an alkyl lactate (e.g., ethyl lactate, methyl lactate), a cyclic lactone (e.g., γ-butyrolactone; preferably having a carbon number of 4 to 10), a chain or cyclic ketone (e.g., 2-heptanone, cyclohexanone; preferably having a carbon number of 4 to 10), an alkylene carbonate (e.g., ethylene carbonate, propylene carbonate), an alkyl carboxylate (preferably an alkyl acetate such as butyl acetate) and an alkyl alkoxyacetate (e.g., ethyl ethoxypropionate). Other examples of the solvent which can be used include solvents described in paragraph [0244] et seq. of U.S. Patent Application Publication 2008/0248425A1.

Among the solvents above, an alkylene glycol monoalkyl ether carboxylate and an alkylene glycol monoalkyl ether are preferred.

One of these solvents may be used alone, or two or more kinds thereof may be mixed and used. In the case of mixing two or more kinds of solvents, it is preferred to mix a solvent having a hydroxyl group and a solvent having no hydroxyl group. The ratio by mass of the solvent having a hydroxyl group and the solvent having no hydroxyl group is from 1/99 to 99/1, preferably from 10/90 to 90/10, more preferably from 20/80 to 60/40.

The solvent having a hydroxy group is preferably an alkylene glycol monoalkyl ether, and the solvent having no hydroxyl group is preferably an alkylene glycol monoalkyl ether carboxylate.

The amount of the solvent used is not particularly limited, but the composition is preferably prepared to have an entire solid content concentration of 0.5 to 30 mass %, more preferably from 1.0 to 10 mass %, still more preferably from 2.0 to 6.0 mass %, yet still more preferably from 2.0 to 4.5 mass %.

<Dissolution Inhibiting Compound Having a Molecular Weight of 3,000 or Less and Being Capable of Decomposing by the Action of an Acid to Increase the Solubility in an Alkali Developer>

As for the dissolution inhibiting compound having a molecular weight of 3,000 or less and being capable of decomposing by the action of an acid to increase the solubility in an alkali developer (hereinafter, sometimes referred to as a "dissolution inhibiting compound"), alicyclic or aliphatic compounds containing an acid-decomposable group, such as acid-decomposable group-containing cholic acid derivative described in *Proceeding of SPIE*, 2724, 355 (1996), are preferred, because these compounds do not reduce the transparency to light at 220 nm or less. Examples of the acid-decomposable group and alicyclic structure are the same as those described above with respect to the acid-decomposable resin.

In the case where the actinic ray-sensitive or radiation-sensitive resin composition of the present invention is exposed by a KrF excimer laser or irradiated with an electron beam, the dissolution inhibiting compound is preferably a compound having a structure where the phenolic hydroxyl group of a phenol compound is replaced with an acid-decomposable group. The phenol compound is preferably a compound containing from 1 to 9 phenol skeletons, more preferably from 2 to 6 phenol skeletons.

The actinic ray-sensitive or radiation-sensitive resin composition of the present invention may or may not contain a dissolution inhibiting compound, and in the case of containing a dissolution inhibiting compound, the content of the dissolution inhibiting compound is preferably from 3 to 50 mass %, more preferably from 5 to 40 mass %, based on the solid content of the actinic ray-sensitive or radiation-sensitive resin composition.

Specific examples of the dissolution inhibiting compound are set forth below, but the present invention is not limited thereto.

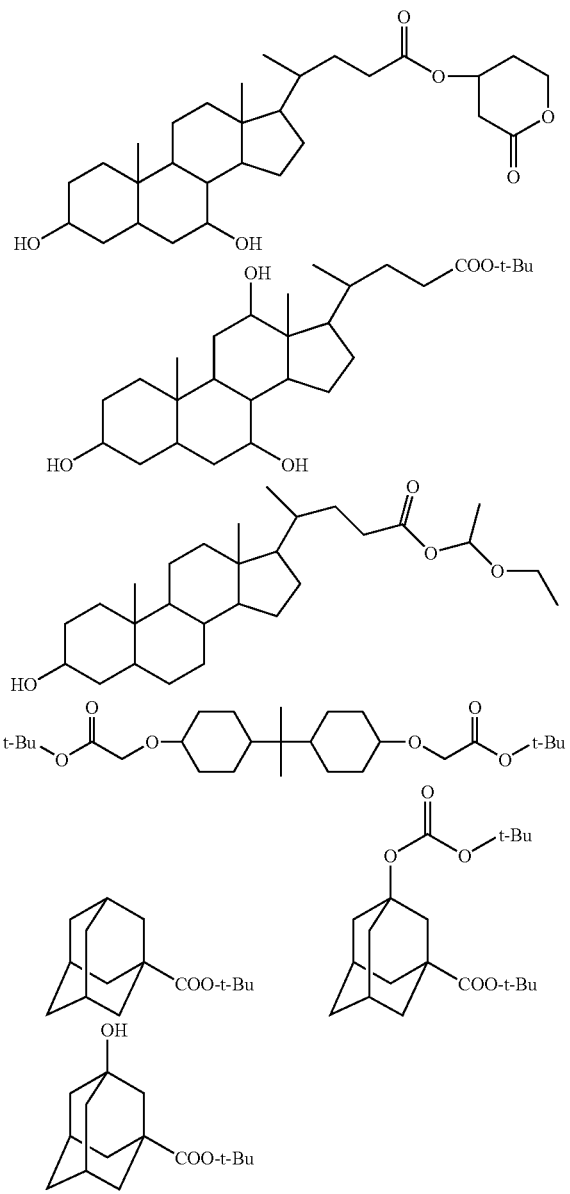

Other Additives:

The actinic ray-sensitive or radiation-sensitive resin composition of the present invention may further contain, for example, a dye, a plasticizer, a photosensitizer, a light absorber and a compound for accelerating dissolution in a developer (for example, a phenol compound having a molecular weight of 1,000 or less, or a carboxyl group-containing alicyclic or aliphatic compound), if desired.

Furthermore, a compound having a proton acceptor functional group described, for example, in JP-A-2006-208781 and JP-A-2007-286574 may also be suitably used in the composition of the present invention.

<Resist Film and Pattern Forming Method>

The resist film of the present invention is formed of the actinic ray-sensitive or radiation-sensitive resin composition of the present invention. More specifically, the resist film is preferably formed by coating the composition on a support such as substrate. The thickness of the resist film of the present invention is preferably from 0.02 to 0.1 μm.

The method of applying the composition on a substrate is preferably spin coating, and the rotation speed is preferably from 1,000 to 3,000 rpm.

The pattern forming method of the present invention includes a step of exposing the resist film obtained above, and a step of developing the exposed resist film.

More specifically, in the pattern forming method of the present invention, the actinic ray-sensitive or radiation-sensitive resin composition is coated on such a substrate (e.g., silicon/silicon dioxide-coated substrate) as used in the production of a precision integrated circuit device by an appropriate coating method such as spinner or coater and dried to form a resist film. Here, it is also possible to previously coat a known antireflection film.

In the pattern forming method of the present invention, the resist film is exposed usually through a mask. After exposure, the resist film is preferably baked (heated) and then developed, whereby a good pattern can be obtained. In the present invention, the exposure is preferably exposure using an electron beam, X-ray or EUV light.

In the development step in the pattern forming method of the present invention, an alkali developer can be used. The alkali developer which can be used is an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide (TMAH) and tetraethylammonium hydroxide, or cyclic amines such as pyrrole and piperidine. TMAH is preferable.

Furthermore, this alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

EXAMPLES

The present invention is described in greater detail below by referring to Examples, but the contents of present invention should not be construed as being limited thereto.

Synthesis Example 1

Synthesis of Resin (P-1)

4.66 Parts by mass of 1-methoxy-2-propanol was heated at 80° C. under a nitrogen stream. While stirring this solution, a mixed solution containing 4.22 parts by mass of 4-hydroxystyrene (hereinafter, sometimes referred to as "HOST"), 4.45 parts by mass of Monomer (M-1), 1.32 parts by mass of Monomer (M-4), 18.6 parts by mass of 1-methoxy-2-propanol and 1.25 parts by mass of dimethyl 2,2'-azobisisobutyrate [V-601, produced by Wako Pure Chemical Industries, Ltd.] was added dropwise over 2 hours. After the completion of dropwise addition, the solution was further stirred at 80° C. for 1 hour. The reaction solution was left standing to cool, then reprecipitated from a large amount of hexane/ethyl acetate and vacuum-dried to obtain 5.0 parts by mass of Resin (P-1) of the present invention.

The weight average molecular weight (Mw, in terms of polystyrene) determined from GPC (carrier: N-methyl-2-pyrrolidone (NMP)) was Mw=17,200, and Mw/Mn (hereinafter, sometimes referred to as "MWD")=1.79.

Synthesis Examples 2 to 14

Synthesis of Resins (P-2) to (P-7), (H-7), (H-8) and (H-10) to (H-14)

Resins (P-2) to (P-7), (H-7), (H-8) and (H-10) to (H-14) for use in the present invention were synthesized in the same manner as in Synthesis Example 1 except for changing the monomers to monomers corresponding to each resin and changing the charged amounts of monomers and polymerization initiator. Structural formulae of monomers used are shown below.

M-1

M-2

M-3

M-4

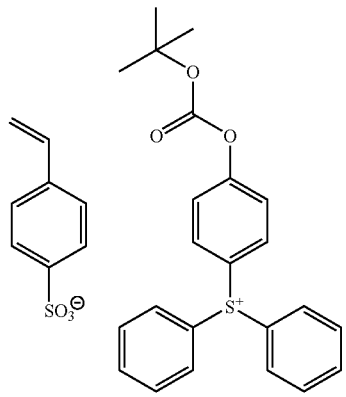

M-5

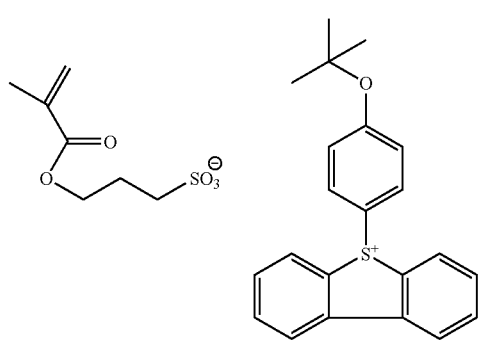

M-6

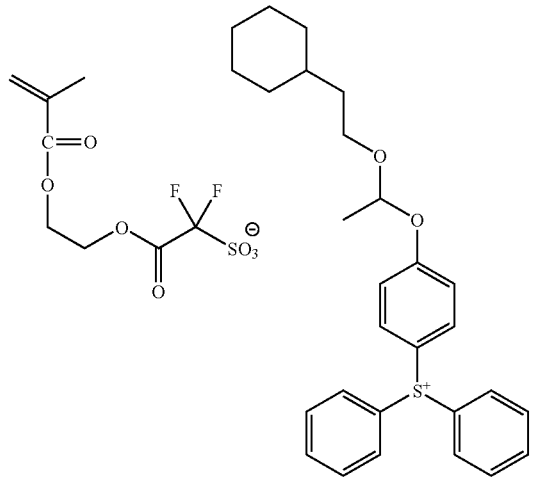

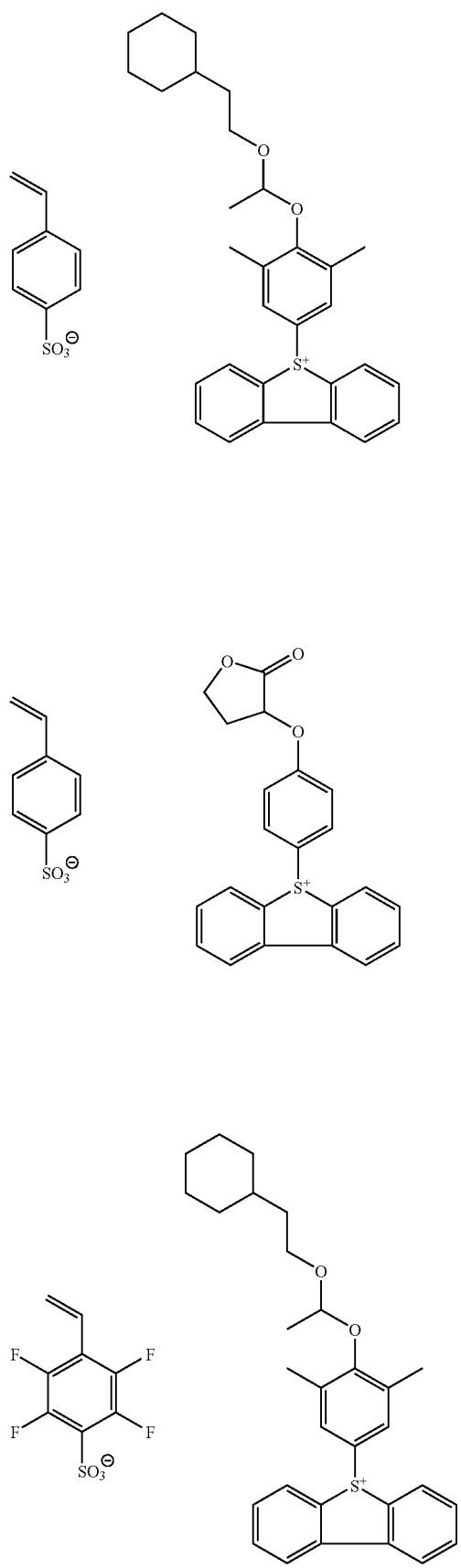
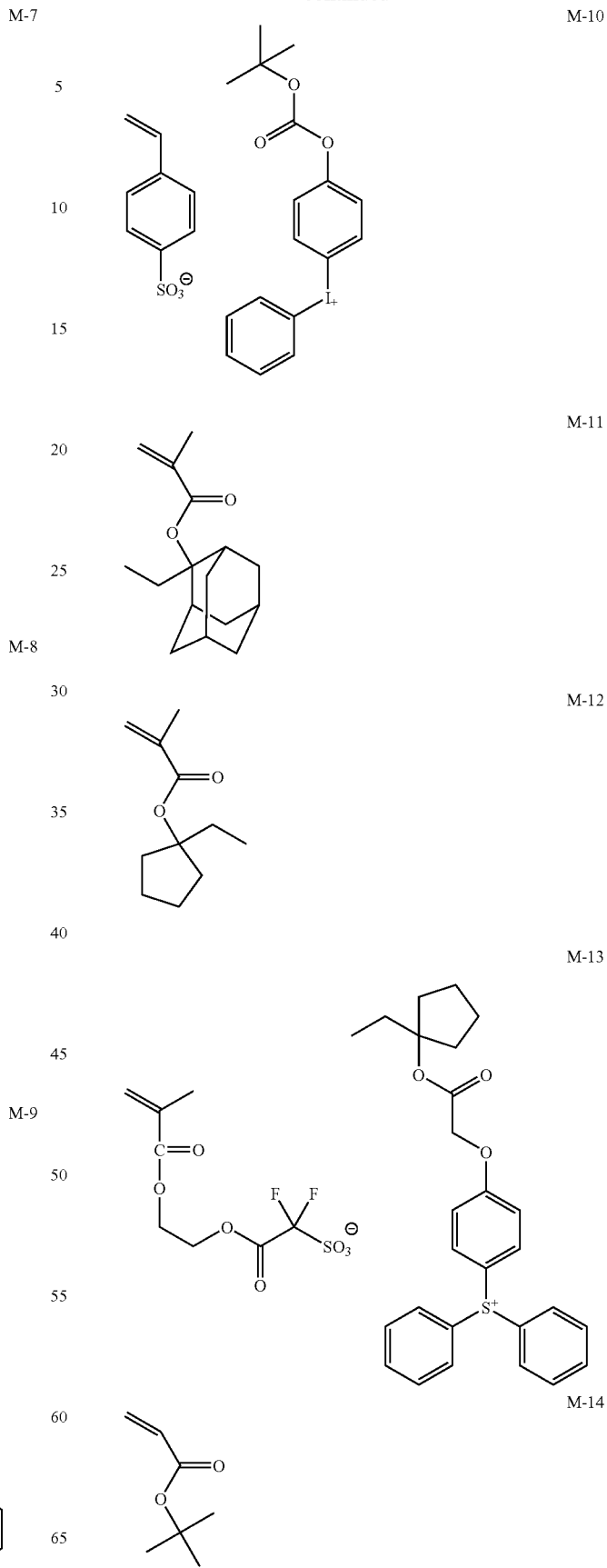

-continued

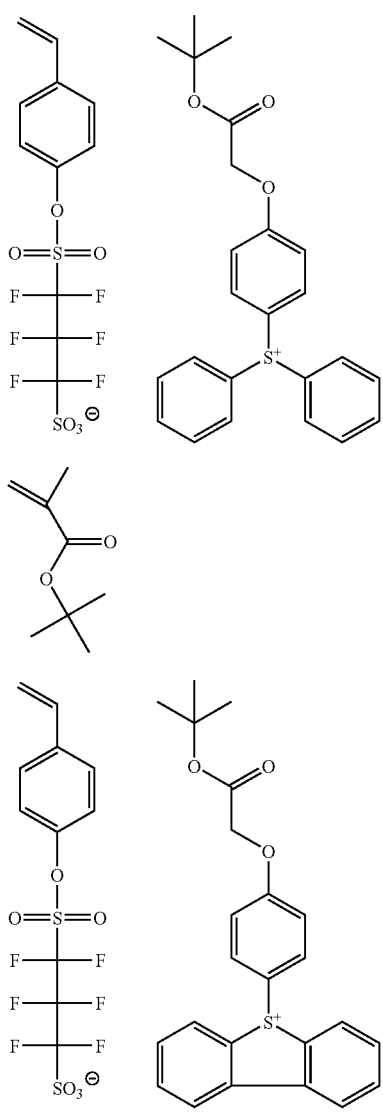

M-15

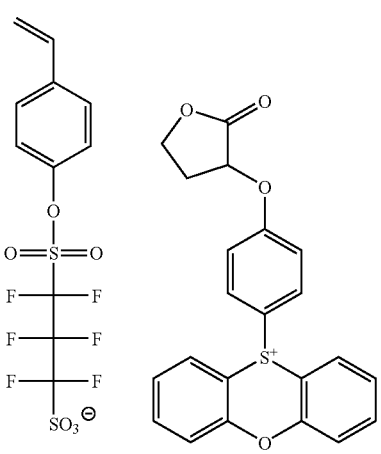

M-16

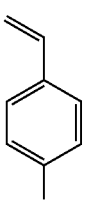

M-17

-continued

M-18

HOST

The monomers used, the charged amounts thereof (parts by mass), the polymerization concentration (concentration of reaction solution, mass %), the charged amount of polymerization initiator (parts by mass), the compositional ratio of resin produced (ratio by mol), the weight average molecular weight, the number average molecular weight and the polydispersity (MWD) are shown in Table 1 below.

TABLE 1

| | Charged Composition (parts by mass) | | | | | | V-601 | Polymer Composition (mol %) | | | | | | Molecular Weight | | |
| | Repeating Unit C | | Repeating Unit B | | Repeating Unit A | | Polymerization | parts | Repeating Unit C | | Repeating Unit B | | Repeating Unit A | | (NMP GPC) | | |
| Resin | | | | | | | Concentration | by mass | | | | | | | Mw | Mn | MWD |
| P-1 | HOST | 4.22 | M-1 | 4.45 | M-4 | 1.32 | 30 | 1.25 | HOST | 65 | M-1 | 30 | M-4 | 5 | 17200 | 9600 | 1.79 |
| P-2 | HOST | 3.42 | M-1 | 3.91 | M-4 | 2.67 | 30 | 1.09 | HOST | 60 | M-1 | 30 | M-4 | 10 | 20400 | 11500 | 1.77 |
| P-3 | HOST | 5.36 | M-2 | 3.07 | M-5 | 1.57 | 30 | 1.28 | HOST | 80 | M-2 | 15 | M-5 | 5 | 16800 | 9200 | 1.83 |
| P-4 | HOST | 4.61 | M-1 | 2.10 | M-7 | 3.29 | 30 | 1.18 | HOST | 75 | M-1 | 15 | M-7 | 10 | 21500 | 12100 | 1.78 |
| P-5 | HOST | 4.00 | M-3 | 3.42 | M-6 | 2.58 | 30 | 1.18 | HOST | 65 | M-3 | 28 | M-6 | 7 | 19100 | 10900 | 1.75 |
| P-6 | HOST | 3.42 | M-1 | 3.91 | M-4 | 2.67 | 30 | 2.18 | HOST | 60 | M-1 | 30 | M-4 | 10 | 4600 | 2500 | 1.84 |
| P-7 | HOST | 4.61 | M-1 | 2.10 | M-7 | 3.29 | 30 | 3.36 | HOST | 75 | M-1 | 15 | M-7 | 10 | 5100 | 2800 | 1.82 |
| H-7 | HOST | 4.85 | M-1 | 2.22 | M-8 | 2.93 | 30 | 1.24 | HOST | 75 | M-1 | 15 | M-8 | 10 | 22500 | 13000 | 1.73 |
| H-8 | HOST | 4.44 | M-11 | 2.03 | M-9 | 3.53 | 30 | 1.14 | HOST | 75 | M-11 | 15 | M-9 | 10 | 22000 | 12800 | 1.72 |
| H-10 | HOST | 4.76 | M-1 | 2.17 | M-10 | 3.07 | 30 | 1.22 | HOST | 75 | M-1 | 15 | M-10 | 10 | 23500 | 13200 | 1.78 |
| H-11 | HOST | 3.17 | M-12 | 4.18 | M-13 | 2.66 | 30 | 1.82 | HOST | 50 | M-12 | 43 | M-13 | 7 | 3000 | 4230 | 1.41 |
| H-12 | HOST | 3.80 | M-14 | 3.65 | M-15 | 2.55 | 30 | 2.19 | HOST | 50 | M-14 | 45 | M-15 | 5 | 5000 | 6750 | 1.35 |
| H-13 | HOST | 3.66 | M-16 | 3.89 | M-17 | 2.45 | 30 | 2.10 | HOST | 50 | M-16 | 45 | M-17 | 5 | 5000 | 6900 | 1.38 |
| H-14 | HOST | 3.67 | M-16 | 3.91 | M-18 | 2.42 | 30 | 2.11 | HOST | 50 | M-16 | 45 | M-18 | 5 | 5000 | 6050 | 1.21 |

With respect to Resins (P-1) to (P-7), (H-7), (H-8) and (H-10) to (H-14) of the present invention, the structure, compositional ratio, weight average molecular weight and polydispersity of each resin are shown below.
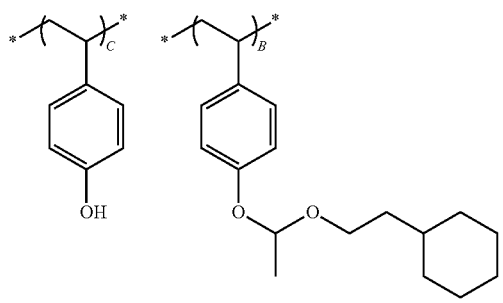
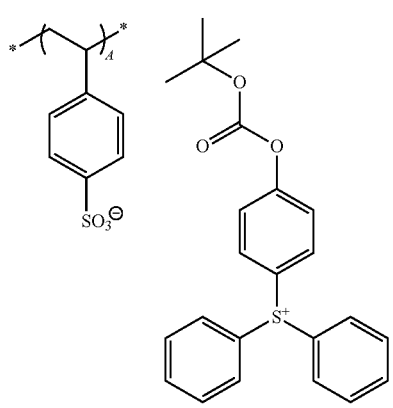
P-1
C/B/A = 65/30/5 mol %
Mw = 17200 (Mw/Mn = 1.79)
P-2
C/B/A = 60/30/10 mol %
Mw = 20400 (Mw/Mn = 1.77)
P-6
C/B/A = 60/30/10 mol %
Mw = 4600 (Mw/Mn = 1.84)
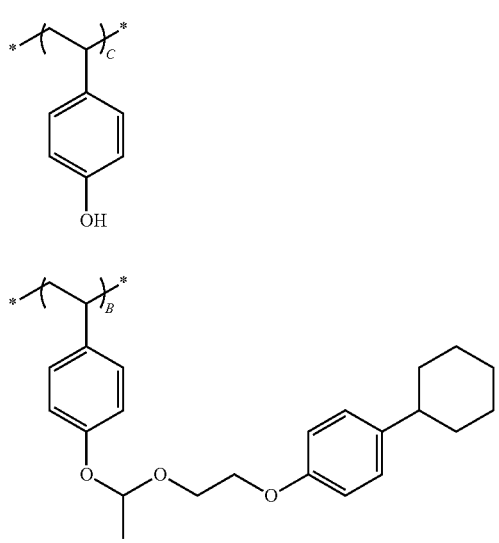
-continued
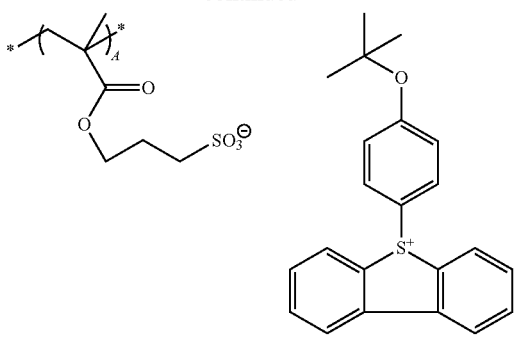
P-3
C/B/A = 80/15/5 mol %
Mw = 16800 (Mw/Mn = 1.83)
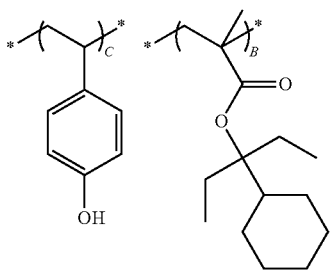
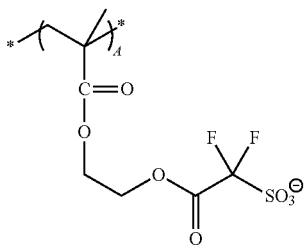
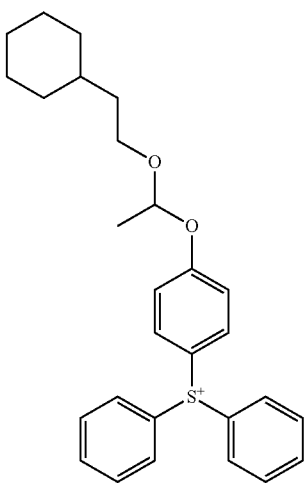
P-5
C/B/A = 65/28/7 mol %
Mw = 19100 (Mw/Mn = 1.75)

-continued
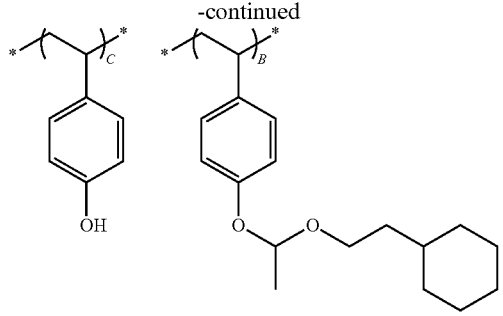
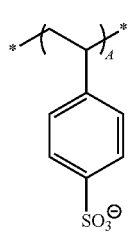
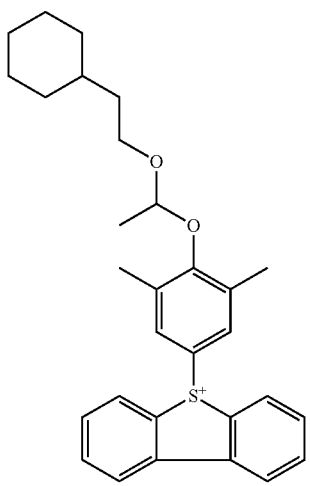
P-4
C/B/A = 75/15/10 mol %
Mw = 21500 (Mw/Mn = 1.78)
P-7
C/B/A = 75/15/10 mol %
Mw = 5100 (Mw/Mn = 1.82)
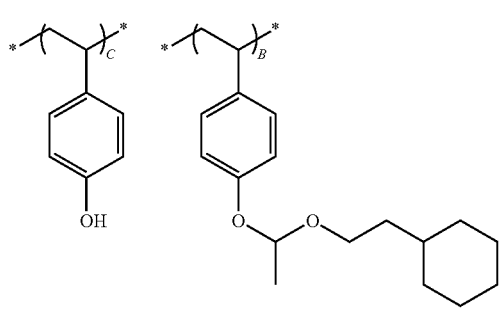
-continued
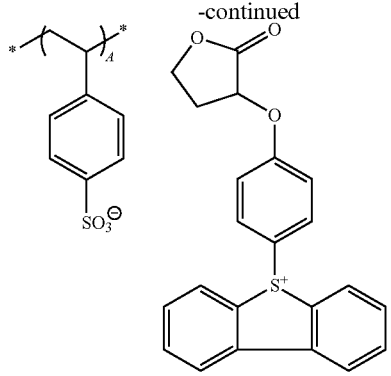
H-7
C/B/A = 75/15/10 mol %
Mw = 22500 (Mw/Mn = 1.73)
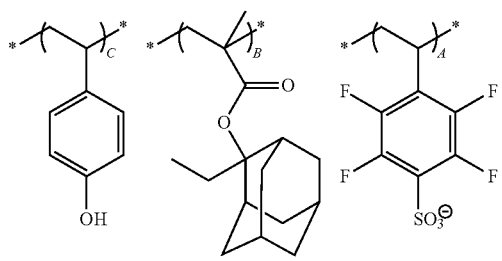
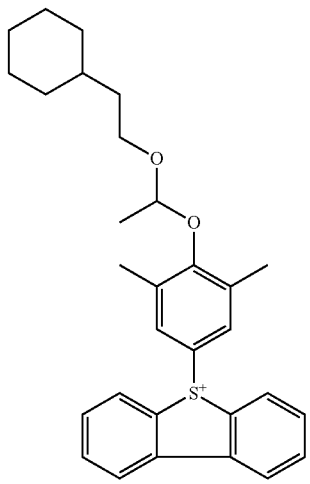
H-8
C/B/A = 75/15/10 mol %
Mw = 22000 (Mw/Mn = 1.72)
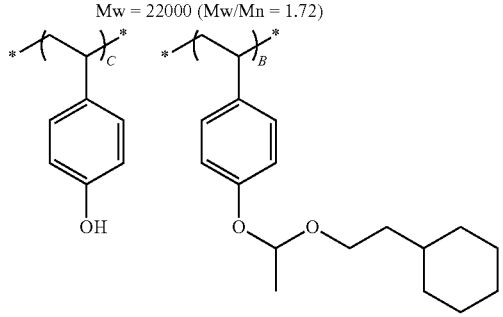

-continued
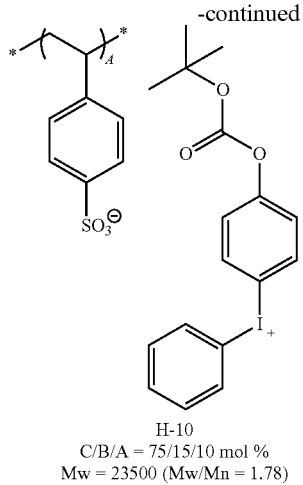
H-10
C/B/A = 75/15/10 mol %
Mw = 23500 (Mw/Mn = 1.78)
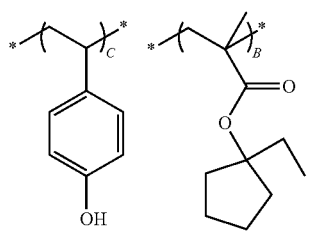
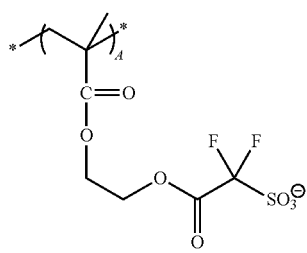
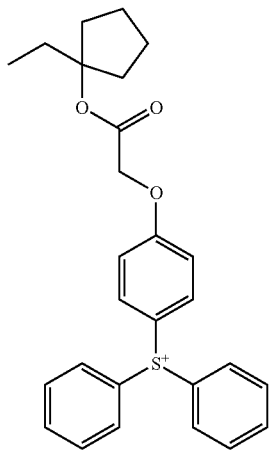
H-11
C/B/A = 50/43/7 mol %
Mw = 3000 (Mw/Mn = 1.41)
-continued
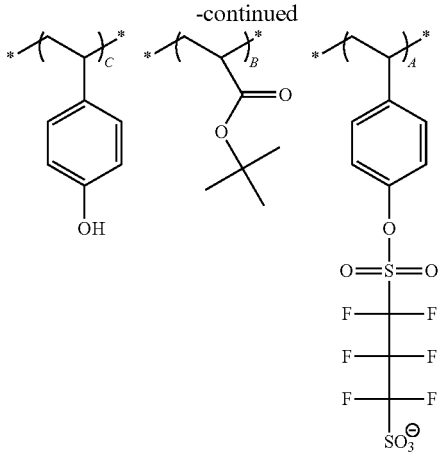
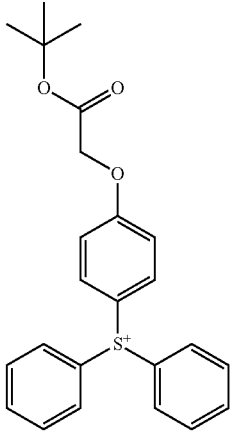
H-12
C/B/A = 50/45/5 mol %
Mw = 5000 (Mw/Mn = 1.35)
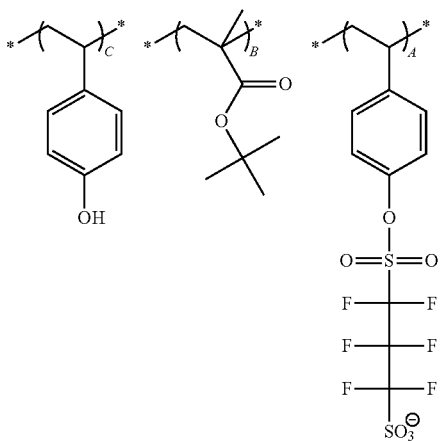

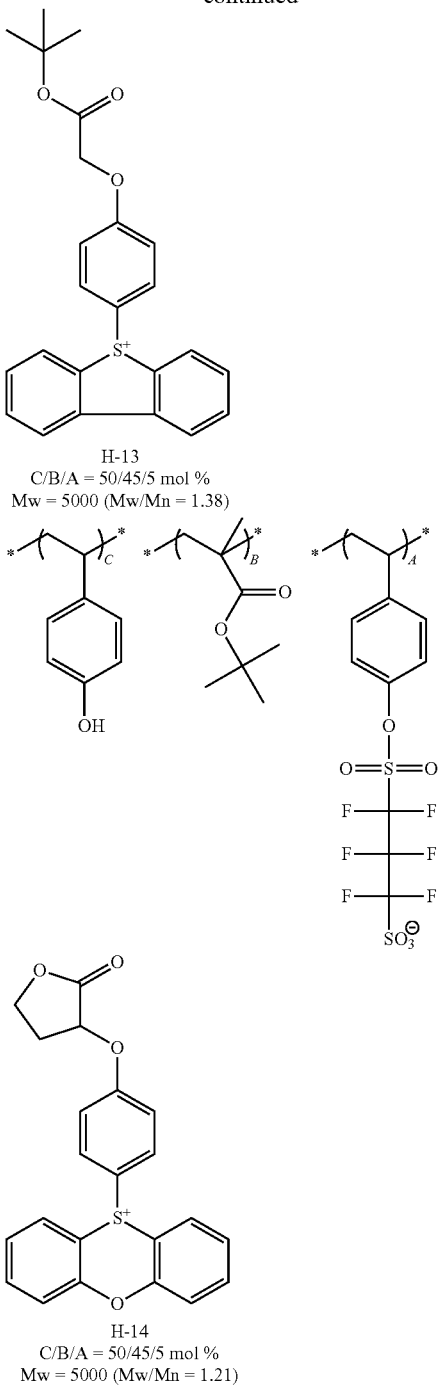

as follows. In Table 2, the concentration (mass %) of each component is based on the entire solid content. The amount of the surfactant added is 0.05 mass % based on the entire solid content of the positive resist solution.

<Evaluation of Resist (EB)>

The prepared positive resist solution was uniformly applied by a spin coater on a silicon substrate treated with hexamethyldisilazane, and dried under heating on a hot plate at 120° C. for 90 seconds to form a 100 nm-thick resist film.

This resist film was irradiated with electron beams by using an electron beam irradiation apparatus (HL750, manufactured by Hitachi Ltd., accelerating voltage: 50 keV) and immediately after irradiation, heated on a hot plate at 110° C. for 90 seconds. Furthermore, the resist film was developed with an aqueous tetramethylammonium hydroxide solution in a concentration of 2.38 mass % at 23° C. for 60 seconds, rinsed with pure water for 30 seconds and then dried to form a line-and-space pattern. The obtained pattern was evaluated by the following methods.

[Sensitivity]

The cross-sectional profile of the obtained pattern was observed using a scanning electron microscope (S-9220, manufactured by Hitachi Ltd.). The minimum irradiation energy when resolving a line pattern (line:space=1:1) having a line width of 100 nm is defined as the sensitivity.

[Resolution]

The limiting resolution (the minimum line width when a line and a space at 1:1 were separated and resolved) at the irradiation dose of giving the above-described sensitivity was defined as the resolution.

[Line Edge Roughness (LER)]

At arbitrary 30 points in the longitudinal range of 50 μm of a line pattern (line:space=1:1) having a line width of 100 nm at the irradiation dose of giving the above-described sensitivity, the distance from the reference line where the edge should be present was measured by a scanning electron microscope (S-9220, manufactured by Hitachi Ltd.), and after determining the standard deviation, 3σ was computed.

[Pattern Profile]

The cross-sectional profile of a line pattern (line:space=1:1) having a line width of 100 nm at the irradiation dose of giving the above-described sensitivity was observed using a scanning electron microscope (S-4300, manufactured by Hitachi, Ltd.) and evaluated on a three-stage scale of rectangular, slightly tapered and tapered.

[Outgassing (Evaluation of Film Thickness Variation after Exposure)]

The resist film was irradiated at an irradiation dose 2 times the irradiation dose of giving the above-described sensitivity, the film thickness after exposure (before post-heating) was measured, and the variation was determined from the thickness of the unexposed film according to the following formula:

Film thickness variation=100×(thickness of unexposed film−film thickness after exposure)/thickness of unexposed film A smaller variation of film thickness indicates better performance in terms of lowering of outgassing.

[Development Defect]

A line pattern having a line width of 100 nm was exposed at 78 portions in the wafer plane of 200 mm in diameter with an irradiation dose at which a line pattern (line:space=1:1) having a line width of 100 nm can be obtained. Immediately after exposure, the wafer was heated on a hot plate at 110° C. for 90 seconds, thereafter developed with an aqueous 2.38 mass % tetramethylammonium hydroxide solution at 23° C.

Examples 1 to 18 and Comparative Examples 1 to 6

Preparation of Resist

The components shown in Table 2 below were dissolved in the mixed solvent shown in Table 2, and the obtained solution was filtered through a polytetrafluoroethylene filter having a pore size of 0.1 μm to prepare an actinic ray-sensitive or radiation-sensitive resin composition (positive resist solution) having the entire solid content concentration (mass %) shown in Table 2. The compositions prepared were evaluated for 60 seconds, rinsed with pure water for 30 seconds and then dried. The obtained wafer with a pattern was measured for the number of development defects by KLA-2360 manufactured by KLA-Tencor Corporation. At this time, the inspection area was 205 cm$^2$ in total, the pixel size was 0.25 μm, the thresh hold was 30, and visible light was used for the inspection light. The value obtained by dividing the measured numerical value by the inspection area was evaluated as the number of defects (defects/cm$^2$).

TABLE 2

Evaluation Results in EB Exposure

| | Resin of Invention | Concentration | Other Resin | Concentration | Conventional Acid Generator | Concentration | Basic Compound | Concentration | Organic Solvent (D) |
|---|---|---|---|---|---|---|---|---|---|
| Example 1 | P-1 | 99.95 | none | | none | | none | | S1/S2 |
| Example 2 | P-2 | 99.95 | none | | none | | none | | S1/S2 |
| Example 3 | P-3 | 99.95 | none | | none | | none | | S1/S2 |
| Example 4 | P-4 | 99.95 | none | | none | | none | | S1/S2 |
| Example 5 | P-5 | 99.95 | none | | none | | none | | S1/S2 |
| Example 6 | P-6 | 99.95 | none | | none | | none | | S1/S2 |
| Example 7 | P-7 | 99.95 | none | | none | | none | | S1/S2 |
| Example 8 | P-4 | 84.95 | P-8 | 15 | none | | none | | S1/S2 |
| Example 9 | P-4 | 99.85 | none | | none | | TBAH | 0.1 | S1/S2 |
| Example 10 | P-4 | 98.65 | none | | PAG-1 | 1 | TPI | 0.3 | S1/S2 |
| Example 11 | P-4 | 97.45 | none | | PAG-1 | 2 | TBAH | 0.5 | S1/S2 |
| Example 12 | H-7 | 99.95 | none | | none | | none | | S1/S2 |
| Example 13 | H-8 | 99.95 | none | | none | | none | | S1/S2 |
| Example 14 | H-10 | 99.95 | none | | none | | none | | S1/S2 |
| Example 15 | H-11 | 98.45 | none | | none | | TPI | 1.5 | S1/S2/S3 |
| Example 16 | H-12 | 98.45 | none | | none | | TBAH | 1.5 | S1/S2 |
| Example 17 | H-13 | 99.45 | none | | none | | TBAH | 0.5 | S1/S2/S4 |
| Example 18 | H-14 | 98.45 | none | | none | | TPI | 1.5 | S1/S2 |
| Comparative Example 1 | none | | P-8 | 91.95 | PAG-1 | 8 | none | | S1/S2 |
| Comparative Example 2 | none | | P-8 | 90.45 | PAG-1 | 8 | TPI | 1.5 | S1/S2 |
| Comparative Example 3 | none | | P-8 | 90.45 | PAG-2 | 8 | TPI | 1.5 | S1/S2 |
| Comparative Example 4 | none | | P-8 P-9 | 50 49.95 | none | | none | | S1/S2 |
| Comparative Example 5 | none | | P-10 | 99.95 | none | | none | | S1/S2 |
| Comparative Example 6 | none | | P-11 | 99.95 | none | | none | | S1/S2 |

| | Ratio by Mass | Surfactant | Entire Solid Content Concentration | Sensitivity (μC/cm$^2$) | Resolution (nm) | Pattern Profile | LER (nm) | Outgassing (%) | Development Defect |
|---|---|---|---|---|---|---|---|---|---|
| Example 1 | 40/60 | W-1 | 4.0 | 19.7 | 60 | rectangular | 4.2 | 5.1 | 10 |
| Example 2 | 40/60 | W-1 | 4.0 | 18.6 | 55 | rectangular | 4.3 | 5.1 | 10 |
| Example 3 | 40/60 | W-2 | 4.0 | 21.3 | 60 | rectangular | 4.6 | 3.1 | 10 |
| Example 4 | 40/60 | W-3 | 4.0 | 19.1 | 55 | rectangular | 4.5 | 1.5 | 11 |
| Example 5 | 40/60 | W-1 | 4.0 | 23.8 | 70 | rectangular | 5.1 | 3.2 | 10 |
| Example 6 | 40/60 | W-1 | 4.0 | 16.9 | 55 | rectangular | 3.9 | 5.0 | 10 |
| Example 7 | 40/60 | W-1 | 4.0 | 18.2 | 55 | rectangular | 3.8 | 1.9 | 2 |
| Example 8 | 40/60 | W-1 | 4.0 | 25.0 | 70 | rectangular | 5.8 | 1.9 | 10 |
| Example 9 | 40/60 | W-3 | 4.0 | 34.5 | 60 | rectangular | 4.2 | 1.8 | 10 |
| Example 10 | 40/60 | W-2 | 4.0 | 29.6 | 65 | rectangular | 5.2 | 1.9 | 10 |
| Example 11 | 40/60 | W-1 | 4.0 | 13.8 | 55 | rectangular | 4.7 | 2.1 | 10 |
| Example 12 | 40/60 | W-1 | 4.0 | 18.5 | 55 | rectangular | 4.5 | 1.9 | 10 |
| Example 13 | 40/60 | W-1 | 4.0 | 18.2 | 55 | rectangular | 4.8 | 1.9 | 9 |
| Example 14 | 40/60 | W-1 | 4.0 | 18.0 | 55 | rectangular | 4.8 | 5.0 | 9 |
| Example 15 | 60/30/10 | W-1 | 4.0 | 21.0 | 70 | rectangular | 5.1 | 1.9 | 9 |
| Example 16 | 40/60 | W-2 | 4.0 | 20.0 | 70 | rectangular | 5.2 | 1.9 | 9 |
| Example 17 | 40/50/10 | W-1 | 4.0 | 21.0 | 70 | rectangular | 5.1 | 4.0 | 9 |
| Example 18 | 60/40 | W-1 | 4.0 | 20.1 | 70 | rectangular | 5.2 | 1.9 | 2 |
| Comparative Example 1 | 40/60 | W-1 | 4.0 | A 100-nm L/S pattern could not be formed. | | | | 8.8 | 50 |
| Comparative Example 2 | 40/60 | W-1 | 4.0 | 22.8 | 90 | tapered | 12.6 | 9.1 | 30 |
| Comparative Example 3 | 40/60 | W-1 | 4.0 | 23.5 | 75 | tapered | 8.5 | 9.1 | 30 |
| Comparative Example 4 | 40/60 | W-1 | 4.0 | 27.6 | 85 | tapered | 10.2 | 15.1 | 32 |
| Comparative Example 5 | 40/60 | W-1 | 4.0 | A 100-nm L/S pattern could not be formed. | | | | 9.8 | 34 |
| Comparative Example 6 | 40/60 | W-1 | 4.0 | 25.0 | 75 | tapered | 6.8 | 10.3 | 50 |

The concentration of each component indicates the concentration (mass %) based on the entire solid content concentration.

Structures of materials (other resins, conventional acid generator, basic compound) used in Examples and Comparative Examples are shown below.

P-8

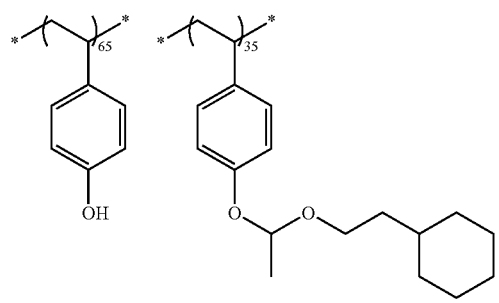

Mw = 20000 (Mw/Mn = 1.15)

P-9

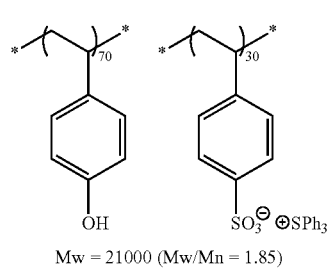

Mw = 21000 (Mw/Mn = 1.85)

P-10

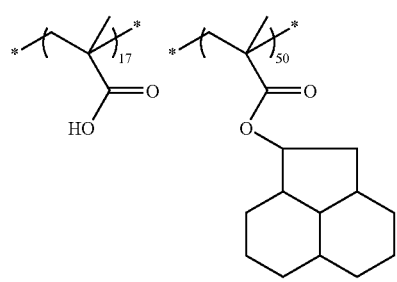

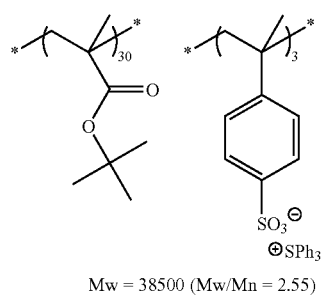

Mw = 38500 (Mw/Mn = 2.55)

P-11

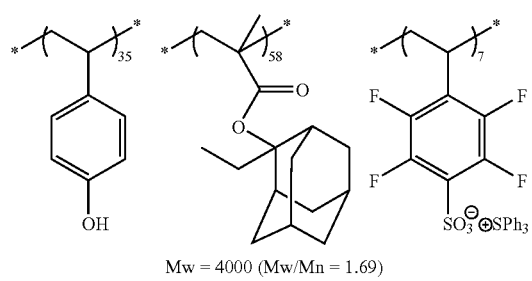

Mw = 4000 (Mw/Mn = 1.69)

PAG-1

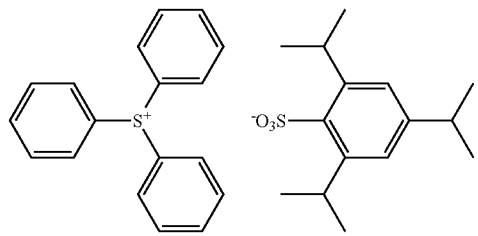

PAG-2

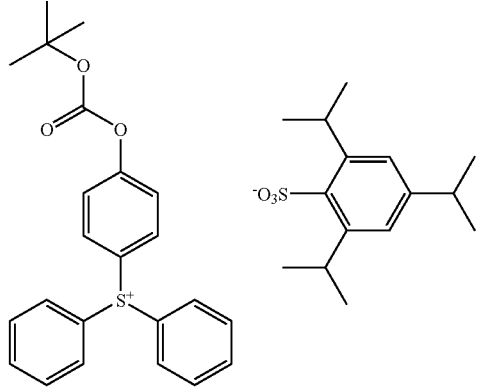

TPI

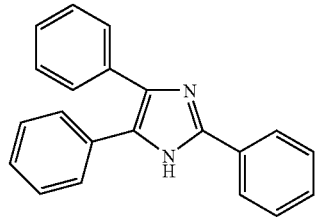

TBAH

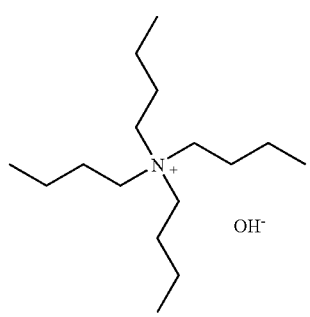

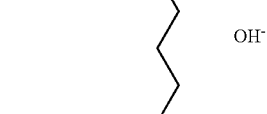

Basic compounds, surfactants and solvents used in Examples and Comparative Examples are shown below.
TBAH: Tetrabutylammonium hydroxide
TPI: 2,4,5-Triphenylimidazole
W-1: Megaface F176 (produced by Dainippon Ink & Chemicals, Inc.) (fluorine-containing)
W-2: Megaface R08 (produced by Dainippon Ink & Chemicals, Inc.) (fluorine- and silicon-containing)
W-3: Polysiloxane polymer (produced by Shin-Etsu Chemical Co., Ltd.) (silicon-containing)
S1: Propylene glycol monomethyl ether acetate (PGMEA, another name: 1-methoxy-2-acetoxypropane)
S2: Propylene glycol monomethyl ether (PGME, another name: 1-methoxy-2-propanol)
S3: Ethyl lactate
S4: Propione carbonate
In Comparative Examples 1 and 5, a 100-nm line-and-space pattern (L/S=1/1) could not be formed.

As apparent from Table 2, the actinic ray-sensitive or radiation-sensitive resin composition of the present invention satisfies high sensitivity, high resolution, good pattern profile, good line edge roughness and low outgassing at the same time. Also, it is seen that in Examples 1 to 18 where the cation moiety of the ionic structure moiety in the resin has an acid-decomposable group or an alkali-decomposable group, the number of development defects is small, and above all, in Examples 7 and 18 where the cation moiety has a lactone-type alkali-decomposable group, the number of development defects is more reduced Examples 19 to 23

Evaluation of Resist (EUV Light)

The components shown in Table 3 below were dissolved in the mixed solvent shown in Table 3, and the obtained solution was filtered through a polytetrafluoroethylene filter having a pore size of 0.1 μm to prepare an actinic ray-sensitive or radiation-sensitive resin composition (positive resist solution) having the entire solid content concentration (mass %) shown in Table 3. The compositions prepared were evaluated as follows. In Table 3, the concentration (mass %) of each component is based on the entire solid content. The amount of the surfactant added is 0.05 mass % based on the entire solid content of the positive resist solution. The denotations of compounds in Table 3 are the same as those in Table 2.

The prepared positive resist solution was uniformly applied by a spin coater on a silicon substrate treated with hexamethyldisilazane, and dried under heating on a hot plate at 120° C. for 90 seconds to form a 100 nm-thick resist film.

This resist film was irradiated by an EUV exposure apparatus (manufactured by Litho Tech Japan Corp., wavelength: 13 nm) and immediately after irradiation, heated on a hot plate at 110° C. for 90 seconds. Furthermore, the resist film was developed with an aqueous tetramethylammonium hydroxide solution in a concentration of 2.38 mass % at 23° C. for 60 seconds, rinsed with pure water for 30 seconds and then dried to form a line-and-space pattern (line:space=1:1). The obtained pattern was evaluated by the following methods.

[Sensitivity]

The cross-sectional profile of the obtained pattern was observed using a scanning electron microscope (S-9220, manufactured by Hitachi Ltd.). The minimum irradiation energy when resolving a line pattern (line:space=1:1) having a line width of 100 nm is defined as the sensitivity.

[Line Edge Roughness (LER)]

At arbitrary 30 points in the longitudinal range of 50 μm of a line pattern (line:space=1:1) having a line width of 100 nm at the irradiation dose of giving the above-described sensitivity, the distance from the reference line where the edge should be present was measured by a scanning electron microscope (S-9220, manufactured by Hitachi Ltd.), and after determining the standard deviation, $3\sigma$ was computed.

[Pattern Profile]

The cross-sectional profile of a line pattern (line:space=1:1) having a line width of 100 nm at the irradiation dose of giving the above-described sensitivity was observed using a scanning electron microscope (S-4300, manufactured by Hitachi, Ltd.) and evaluated on a three-stage scale of rectangular, slightly tapered and tapered.

[Outgassing (Evaluation of Film Thickness Variation after Exposure)]

The resist film was irradiated at an irradiation dose 2 times the irradiation dose of giving the above-described sensitivity, the film thickness after exposure (before post-heating) was measured, and the variation was determined from the thickness of the unexposed film according to the following formula:

Film thickness variation=100×(thickness of unexposed film−film thickness after exposure)/thickness of unexposed film A smaller variation of film thickness indicates better performance in terms of outgassing.

TABLE 3

| | Evaluation Results in EUV Exposure | | | | | | | |
|---|---|---|---|---|---|---|---|---|
| | Resin of Invention | Concentration | Other Resin | Concentration | Conventional Acid Generator | Concentration | Basic Compound | Concentration |
| Example 19 | P-2 | 99.95 | none | | none | | none | |
| Example 20 | P-4 | 99.95 | none | | none | | none | |
| Example 21 | P-6 | 99.95 | none | | none | | none | |
| Example 22 | H-11 | 99.95 | none | | none | | none | |
| Example 23 | H-14 | 99.95 | none | | none | | none | |

| | Organic Solvent (D) | Ratio by Mass | Surfactant | Entire Solid Content Concentration | Sensitivity (mJ/cm$^2$) | LER (nm) | Pattern Profile | Outgassing (%) |
|---|---|---|---|---|---|---|---|---|
| Example 19 | S1/S2 | 40/60 | W-1 | 4.0 | 26.5 | 4.2 | rectangular | 5.3 |
| Example 20 | S1/S2 | 40/60 | W-1 | 4.0 | 26.0 | 4.3 | rectangular | 1.6 |
| Example 21 | S1/S2 | 40/60 | W-1 | 4.0 | 25.6 | 4.3 | rectangular | 5.2 |
| Example 22 | S1/S2 | 40/60 | W-1 | 4.0 | 27.0 | 4.5 | rectangular | 1.9 |
| Example 23 | S1/S2 | 40/60 | W-1 | 4.0 | 27.2 | 4.6 | rectangular | 1.9 |

The concentration of each component indicates the concentration (mass %) based on the entire solid content concentration.

As apparent from Table 3, also when exposed to EUV light, the actinic ray-sensitive or radiation-sensitive resin composition of the present invention can satisfy all of high sensitivity, good pattern profile, good line edge roughness and low outgassing at the same time.

According to the present invention, an actinic ray-sensitive or radiation-sensitive resin composition (preferably a positive resist composition) that satisfies, at a high level, all of high sensitivity, high resolution, good pattern profile and good line edge roughness in the ultrafine region, particularly in the electron beam, X-ray or EUV light lithography, and satisfactorily reduces the outgassing problem at the exposure, and a resist film and a pattern forming method using the composition can be provided.

More specifically, according to the present invention, an actinic ray-sensitive or radiation-sensitive resin composition (preferably a positive resist composition) capable of suppressing the development defect by having an acid-decomposable group or an alkali-decomposable group in the cation moiety of the ionic structure moiety in the resin, and a resist film and a pattern forming method each using the composition can be provided, and the development defect can be suppressed particularly by having a lactone-type alkali-decomposable group in the cation moiety.

The entire disclosure of Japanese Patent Application No. 2009-075253 filed on Mar. 25, 2009 and Japanese Patent Application No. 2010-49872 filed on Mar. 5, 2010, from which the benefit of foreign priority has been claimed in the present application, is incorporated herein by reference, as if fully set forth.

What is claimed is:

1. An actinic ray-sensitive or radiation-sensitive resin composition comprising:
  (P) a resin which contains (A) a repeating unit having an ionic structure moiety capable of producing an acid upon irradiation with an actinic ray or radiation, wherein
  a cation moiety of the ionic structure moiety has an acid-decomposable group or an alkali-decomposable group, provided that an anionic moiety of the ionic structure moiety is bonded to a main chain of the resin (P) via covalent bond, and the cationic moiety is free as a counter cation;
  wherein the repeating unit (A) is a repeating unit represented by any one of the following formulas (III) to (V):

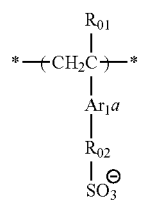 (III)

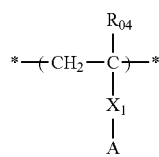 (IV)

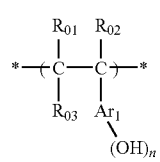 (V)

wherein in formulas (III) to (V), each of $R_{04}$, $R_{05}$ and $R_{07}$ to $R_{09}$ independently represents a hydrogen atom, a substituted or unsubstituted alkyl group, a cycloalkyl group, a halogen atom, a cyano group or an alkoxycarbonyl group;
$R_{06}$ represents a cyano group, a carboxyl group, —CO—$OR_{25}$ or —CO—N($R_{26}$)($R_{27}$), provided that $R_{26}$ and $R_{27}$ may combine to form a ring together with the nitrogen atom;
each of $X_1$ to $X_3$ comprises an arylene group;
$R_{25}$ represents an alkyl group, a cycloalkyl group, an alkenyl group, an aryl group or an aralkyl group;

each of $R_{26}$, $R_{27}$ and $R_{33}$ independently represents a hydrogen atom, an alkyl group, a cycloalkyl group, an alkenyl group, an aryl group or an aralkyl group, and A represents the ionic structure moiety which produces an acid upon irradiation with an actinic ray or radiation and in which the counter cation is a cation having an acid-decomposable group or an alkali-decomposable group, and the repeating unit (A) contains a repeating unit represented by formula (III), and an acid generated from the repeating unit represented by formula (III) has an acid anion represented by the following formula:

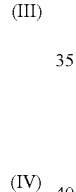

wherein $R_{01}$ represents a hydrogen atom, a methyl group, a chloromethyl group, a trifluoromethyl group or a cyano group;
$Ar_1$ a represents an arylene group which may have a substituent; and
$R_{02}$ represents an arylene group, an alkylene group, a cycloalkylene group, —O—, —$SO_2$—, —CO—, —N($R_{33}$)— or a divalent linking group formed by combining a plurality of these groups,
$R_{33}$ represents a hydrogen atom, an alkyl group, a cycloalkyl group, an alkenyl group, an aryl group or an aralkyl group.

2. The actinic ray-sensitive or radiation-sensitive resin composition as claimed in claim 1, wherein
the resin (P) further contains (B) a repeating unit having a group capable of decomposing by the action of an acid to produce an alkali-soluble group.

3. The actinic ray-sensitive or radiation-sensitive resin composition as claimed in claim 1, wherein
the resin (P) further contains (C) a repeating unit represented by the following formula (VI):

(VI)

wherein
each of $R_{01}$, $R_{02}$ and $R_{03}$ independently represents a hydrogen atom, an alkyl group, a cycloalkyl group, a halogen atom, a cyano group or an alkoxycarbonyl group, or $R_{03}$ may represent an alkylene group and combine with $Ar_1$ to form a 5- or 6-membered ring,
$Ar_1$ represents (n+1) valent aromatic ring group, provided that $Ar_1$ represents (n+2) valent aromatic ring group when $Ar_1$ combines with $R_{03}$ to form a ring, and
n represents an integer of 1 to 4.

4. The actinic ray-sensitive or radiation-sensitive resin composition as claimed in claim 2, wherein the repeating unit (B) is a repeating unit represented by the following formula (I):

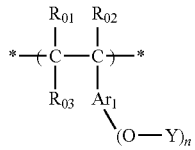
(I)

wherein each of $R_{01}$, $R_{02}$ and $R_{03}$ independently represents a hydrogen atom, an alkyl group, a cycloalkyl group, a halogen atom, a cyano group or an alkoxycarbonyl group, or $R_{03}$ may represent an alkylene group and combine with $Ar_1$ to form a 5- or 6-membered ring, $Ar_1$ represents (n+1) valent aromatic ring group, provided that $Ar_1$ represents (n+2) valent aromatic ring group when $Ar_1$ combines with $R_{03}$ to form a ring, each of n Ys independently represents a hydrogen atom or a group capable of leaving by the action of an acid, provided that at least one Y represents a group capable of leaving by the action of an acid, and n represents an integer of 1 to 4.

5. The actinic ray-sensitive or radiation-sensitive resin composition as claimed in claim 4, wherein Y in formula (I) is represented by the following formula (II):

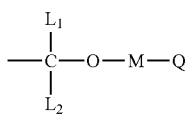
(II)

wherein each of $L_1$ and $L_2$ independently represents a hydrogen atom, an alkyl group, a cycloalkyl group, an aryl group or an aralkyl group, M represents a single bond or a divalent linking group, Q represents an alkyl group, an alicyclic group which may contain a heteroatom, an aromatic ring group which may contain a heteroatom, an amino group, an ammonium group, a mercapto group, a cyano group or an aldehyde group, and at least two members of Q, M and $L_1$ may combine to form a ring.

6. The actinic ray-sensitive or radiation-sensitive resin composition as claimed in claim 1, wherein the cation moiety of the ionic structure moiety has an acid-decomposable group.

7. The actinic ray-sensitive or radiation-sensitive resin composition as claimed in claim 1, wherein the cation moiety of the ionic structure moiety is represented by formula (a) or (b):

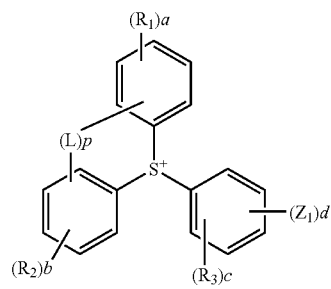
(a)

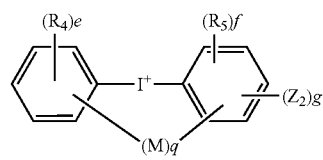
(b)

wherein each of $Z_1$ and $Z_2$ independently represents said acid-decomposable group or alkali-decomposable group, each of $R_1$ to $R_5$ independently represents a monovalent substituent, each of L and M independently represents a single bond or a divalent linking group, each of p and q independently represents 0 or 1, each of a and b independently represents an integer of 0 to (5-p), e represents an integer of 0 to (5-q), each of d and g independently represents an integer of 1 to 5, c represents an integer of 0 to (5-d), and f represents an integer of 0 to (5-g-q), provided that g+q≤5.

8. The actinic ray-sensitive or radiation-sensitive resin composition as claimed in claim 1, which is exposed to an electron beam, X-ray or EUV light.

9. The actinic ray-sensitive or radiation-sensitive resin composition as claimed in claim 6, wherein the acid-decomposable group is selected from the group consisting of a tertiary alkoxy group, a carbonic acid ester group, a tertiary carboxylic acid ester group, a trialkylsilyloxy group, an acetal group, and a ketal group.

10. The actinic ray-sensitive or radiation-sensitive resin composition as claimed in claim 1, wherein the repeating unit (A) contains a repeating unit represented by formula (III), and the repeating unit represented by formula (III) is a repeating unit represented by formula (III-1):

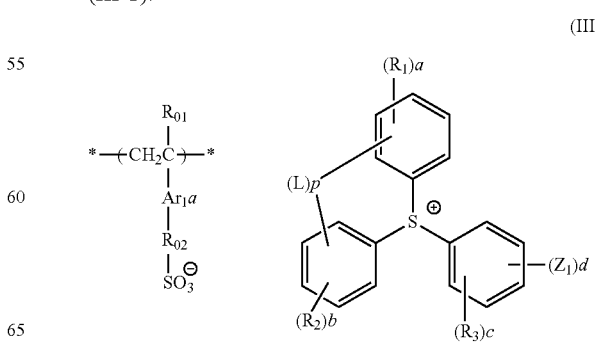
(III-1)

wherein $R_{01}$ represents a hydrogen atom, a methyl group, a chloromethyl group, a trifluoromethyl group or a cyano group;

$Ar_1$ a represents an arylene group which may have a substituent;

$R_{02}$ represents an arylene group, an alkylene group, a cycloalkylene group, —O—, —SO$_2$—, —CO—, —N($R_{33}$)— or a divalent linking group formed by combining a plurality of these groups, $R_{33}$ represents a hydrogen atom, an alkyl group, a cycloalkyl group, an alkenyl group, an aryl group or an aralkyl group, each of $R_1$ to $R_3$ independently represents a monovalent substituent;

$Z_1$ represents an acid-decomposable group or an alkali-decomposable group;

L represents a single bond or a divalent linking group;

p represents 0 or 1;

each of a and b independently represents an integer of 0 to (5-p);

d represents an integer of 1 to 5, and c represents an integer of 0 to (5-d).

* * * * *